(12) United States Patent
Takemura et al.

(10) Patent No.: US 8,968,979 B2
(45) Date of Patent: Mar. 3, 2015

(54) POSITIVE RESIST COMPOSITION AND PATTERNING PROCESS

(75) Inventors: Katsuya Takemura, Joetsu (JP); Keiichi Masunaga, Joetsu (JP); Daisuke Domon, Joetsu (JP); Masayoshi Sagehashi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 840 days.

(21) Appl. No.: 12/623,155

(22) Filed: Nov. 20, 2009

(65) Prior Publication Data

US 2010/0129738 A1  May 27, 2010

(30) Foreign Application Priority Data

Nov. 21, 2008  (JP) .................. 2008-297828

(51) Int. Cl.
*G03F 7/039* (2006.01)
*G03F 7/11* (2006.01)
*G03F 7/20* (2006.01)
*G03F 7/30* (2006.01)
*G03F 7/38* (2006.01)

(52) U.S. Cl.
USPC .......... 430/270.1; 430/273.1; 430/275.1; 430/311; 430/326; 430/330; 430/905; 430/907; 430/910; 430/942

(58) Field of Classification Search
None
See application file for complete search history.

(56) References Cited

U.S. PATENT DOCUMENTS

| | | | |
|---|---|---|---|
| 5,650,483 A | 7/1997 | Malik et al. | |
| 6,312,867 B1 | 11/2001 | Kinsho et al. | |
| 6,329,125 B2 | 12/2001 | Takechi et al. | |
| 7,498,126 B2 | 3/2009 | Ohsawa et al. | |
| 7,569,326 B2 | 8/2009 | Ohsawa et al. | |
| 7,625,690 B2 | 12/2009 | Mizutani et al. | |
| 7,887,988 B2 | 2/2011 | Mizutani et al. | |
| 2004/0214102 A1* | 10/2004 | DiPietro et al. | 430/270.1 |
| 2005/0147920 A1* | 7/2005 | Lin et al. | 430/311 |
| 2007/0218407 A1* | 9/2007 | Mizutani et al. | 430/270.1 |
| 2008/0153030 A1 | 6/2008 | Kobayashi et al. | |
| 2009/0170029 A1* | 7/2009 | Choi et al. | 430/285.1 |

FOREIGN PATENT DOCUMENTS

| | | | |
|---|---|---|---|
| JP | 7-325402 A | | 12/1995 |
| JP | 9-73173 A | | 3/1997 |
| JP | 9-90637 A | | 4/1997 |
| JP | 2000-171977 A | | 6/2000 |
| JP | 2000-336121 A | | 12/2000 |
| JP | 2002-372785 | * | 12/2002 |
| JP | 2004-85657 A | | 3/2004 |
| JP | 2004-292740 | * | 10/2004 |
| JP | 2006-178317 A | | 7/2006 |
| JP | 2007-140289 A | | 6/2007 |

(Continued)

OTHER PUBLICATIONS

Derwent English abstract of JP2004-292740 (2004).*

(Continued)

*Primary Examiner* — Sin Lee
(74) *Attorney, Agent, or Firm* — Birch, Stewart, Kolasch & Birch, LLP

(57) ABSTRACT

A positive resist composition comprises a polymer comprising repeat units having formula (1) or (2).

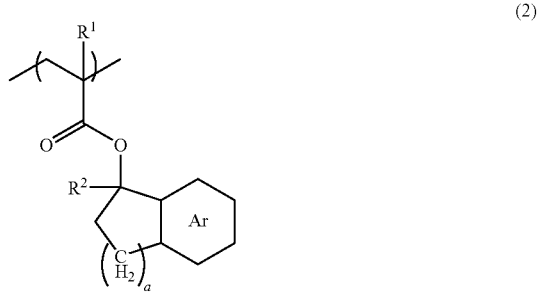

Herein

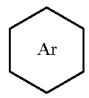

denotes an aromatic hydrocarbon group, $R^1$ is H, methyl or trifluoromethyl, $R^2$ is H, $C_1$-$C_{12}$ alkyl or aromatic hydrocarbon group, $R^3$ is $C_1$-$C_{12}$ alkyl, or $R^2$ and $R^3$ may bond together to form a ring, and a is 1 or 2. When used in the ArF lithography, the resist composition exhibits high resolution. When used in the EB image writing for mask processing, the resist composition exhibits high resolution and sensitivity sufficient to comply with high-accelerating-voltage EB irradiation, and high etch resistance.

16 Claims, No Drawings

(56) References Cited

FOREIGN PATENT DOCUMENTS

| JP | 2007-279699 A | 10/2007 |
| JP | 2007-333933 A | 12/2007 |
| JP | 2008-96951 A | 4/2008 |
| JP | 2008-133448 A | 6/2008 |
| JP | 2008-158339 A | 7/2008 |

OTHER PUBLICATIONS

Derwent English abstract for JP 2002-372785 (2002).*
Machine-assisted English translation for JP 2002-372785, provided by JPO (2002).*
Arimitsu et al., "Effect of Phenolic Hydroxyl Residues on the Improvement of Acid-Proliferation-Type Photoimaging Materials", vol. 9, No. 1, pp. 29-30, 1996, Japan.
Arimitsu et al., "Sensitivity Enhancement of Chemical-Amplification-Type Photoimaging Materials by Acetoacetic Acid Derivatives", vol. 8, No. 1, pp. 43-44, 1995, Japan.
Kudo et al., "Enhancement of the Sensitivity of Chemical-Amplification-Type Photoimaging Materials by Beta-Tosyloxyketone Acetals", vol. 8, No. 1, pp. 45-46, 1995, Japan.
Japanese Office Action dated May 16, 2012, for Application No. 2008-297828.

* cited by examiner

POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2008-297828 filed in Japan on Nov. 21, 2008, the entire contents of which are hereby incorporated by reference.

TECHNICAL FIELD

This invention relates to (1) a positive resist composition suited in the micropatterning technology for the manufacture of LSI devices which exhibits improved resolution, pattern density dependency and mask fidelity as well as good etch resistance and a high sensitivity and thus contributes to an improvement in productivity, (2) a positive resist composition suited in the micropatterning technology for the production of masks which exhibits improved resolution, etch resistance and sensitivity, and thus contributes to an improvement in productivity, and (3) patterning processes using the resist compositions.

BACKGROUND OF THE INVENTION

In the recent drive for higher integration and operating speeds in LSI devices, it is desired to miniaturize the pattern rule. Great efforts have been devoted for the development of the micropatterning technology using deep-ultraviolet (deep-UV) or vacuum-ultraviolet (VUV) lithography. The photolithography using KrF excimer laser (wavelength 248 nm) as the light source has already established the main role in the commercial manufacture of semiconductor devices. The photolithography using ArF excimer laser (wavelength 193 nm) is at the start of its application to the advanced micropatterning process on a commercial scale. For the ArF excimer laser lithography, however, partly because the succeeding technology has not been established, it is strongly desired to improve the performance of resist material in order to gain a further stretch of resolution. Efforts are also made to develop the immersion lithography process that intends to gain a stretch of resolution by interposing a high refractive index liquid between a resist coating film and a projection lens. There is a need for a resist material meeting such requirements.

The requisite properties for the resist materials complying with the ArF excimer laser lithography include transparency at wavelength 193 nm and dry etch resistance. Resist materials comprising as a base resin poly(meth)acrylic acid derivatives having bulky acid-labile protective groups as typified by 2-ethyl-2-adamantyl and 2-methyl-2-adamantyl groups were proposed as having both the properties (JP-A H09-73173 and JP-A H09-90637). Since then, a variety of materials have been proposed. Most of them commonly use resins having a highly transparent backbone and a carboxylic acid moiety protected with a bulky tertiary alkyl group.

While prior art resist materials adapted to the ArF excimer laser lithography suffer from many problems, the most serious problem is a decline of resolution due to excessive diffusion of the acid generated by the photoacid generator. Generally speaking, in the ArF excimer laser lithography, the acid generated upon exposure triggers deprotection reaction on the base resin which proceeds during heat treatment following exposure (post-exposure bake or PEB). Migration of the acid occurs during PEB. Since chemically amplified resist materials depend on the function of the acid to act as a catalyst to promote deprotection reaction, moderate acid migration is necessary. However, acid migration degrades an optical image, indicating that excess acid migration detracts from resolution. To comply with the outstanding demands for a further size reduction in the ArF excimer laser lithography and a higher resolution due to a good command of the immersion lithography, there is a need for a resist material featuring controlled acid migration and higher resolution capability.

In the ArF excimer laser lithography, on the other hand, it has been practiced to reduce the thickness of resist film for the purpose of achieving a higher resolution. Since the resist pattern tends to collapse down as the feature size is reduced, thinning of resist film is a logical approach. Thinning of resist film means that the film itself is improved in transmittance, which is advantageous for resolution enhancement. This eliminates a need for improvement in transmittance of resist material. However, since thinning of resist film undesirably deprives the film of etch resistance, it is necessary to improve the etch resistance of resist material.

For high-energy radiation with very short wavelength such as EB and x-rays, since light elements such as hydrocarbons used in resist materials have little absorption, resist materials based on polyhydroxystyrene have been under investigation.

In practice, resist materials for EB have been used in mask-writing application while the mask production technology is lately regarded problematic. Since the g-line age, reducing projection aligners have been used, with their demagnifying power being $1/5$. Recently, a demagnifying power of $1/4$ is employed in accordance with the enlargement of chip size and the increasing aperture of projection lens. Not only a reduction in line width as a result of progress of micropatterning, but also a reduction in line width as a result of magnifying power change pose serious problems to the mask production technology.

The exposure system for use in mask production has changed from a laser beam exposure system to an electron beam (EB) exposure system in order to increase the line width accuracy. Since definition of a finer feature size becomes possible by increasing the accelerating voltage in an electron gun in the system, the accelerating voltage has increased from 10 keV to 30 keV. An accelerating voltage of 50 keV now becomes the mainstream.

In conjunction with the increasing accelerating voltage, a lowering of resist film sensitivity becomes a problem. As the accelerating voltage increases, the influence of forward scattering within the resist film is reduced so that the contrast of electron writing energy is improved, resulting in improvements in resolution and dimensional control. However, since such electrons can penetrate straight through the resist film, the sensitivity of the resist film lowers. Since the mask exposure system carries out exposure by direct writing along a continuous stroke, the lowering of resist film sensitivity undesirably leads to a lowering of productivity.

To meet the recent demand for finer feature size, research efforts have been made to further increase the accelerating voltage. EB exposure at an accelerating voltage of 100 keV is under consideration. There is thus a need to compensate for a concomitant decline of sensitivity.

While the pattern rule to be applied to devices is being reduced, the KrF excimer laser lithography survives nearly to a device size of 100 nm, and the ArF lithography starts application from 90 nm, enables processing nearly to a size of 60 nm, and is expected to reach even a size of 40 nm in the case of immersion ArF lithography, namely when combined with a high refractive index liquid having a refractive index of at least 1.0 interposed between the resist film and the projection lens. Research is also made on processing of a finer line width by exposure to soft x-ray (or EUV) having a wavelength of 5 to 20 nm, which is expected to process a pattern with a line width of nearly 20 nm. With a progress toward finer size patterns on wafers or processable substrates, the demand for a higher resolution capability of resist material becomes stronger. The same applies to the EB image writing for mask production, and there is a strong demand for a higher resolution capability. Because of ¼-demagnifying power projection onto a wafer, the line width for mask processing is 4 times the line width on the wafer. A progress in finer size processing requires higher resolution performance factors including not only the line width, but also the line width uniformity. This necessitates a resolution enhancement on the resist material side.

In the case of mask processing, a resist film is thinned for the purpose of enhancing the resolution capability thereof as in the case of device processing. Since the substrate used in mask production is flat and the thickness of a processable substrate (e.g., Cr, MoSi or $SiO_2$) is predetermined so as to achieve a desired percent light shielding and phase difference control, it is impossible to improve the processable substrate. Also in the case of mask processing, the resist material must be improved in dry etching resistance before the resist film can be thinned.

CITATION LIST

Patent Document 1: JP-A H09-73173
Patent Document 2: JP-A H09-90637

SUMMARY OF INVENTION

An object of the invention is to provide a positive resist composition suited in the photolithography technology for the manufacture of LSI devices using ArF excimer laser as a light source, which composition exhibits improved resolution, pattern density dependency and mask fidelity as well as good etch resistance, and a positive resist composition suited in the EB image writing technology for the processing of masks, which composition exhibits a high resolution and sensitivity sufficient to comply with high-accelerating-voltage EB irradiation, and high etch resistance. Another object is to provide a patterning process using the resist compositions.

The inventors have found that a positive resist composition comprising a polymer composed of specific repeat units as a base resin has a very high resolution capability and is fully effective in precise micropatterning. In addition, the specific repeat units are highly reactive, leading to a high sensitivity.

One embodiment of the invention is a positive resist composition comprising a polymer comprising repeat units having the general formula (1) or (2).

(1)
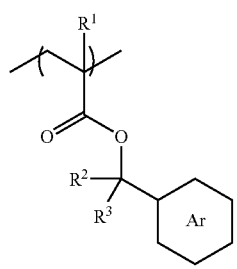

(2)
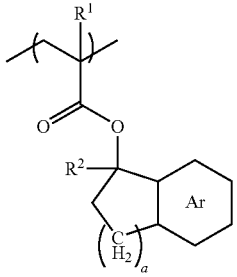

Herein

denotes a substituted or unsubstituted aromatic hydrocarbon group, $R^1$ is each independently hydrogen, methyl or trifluoromethyl, $R^2$ is hydrogen or a straight, branched or cyclic $C_1$-$C_{12}$ alkyl or aromatic hydrocarbon group, $R^3$ is a straight, branched or cyclic $C_1$-$C_{12}$ alkyl group, or $R^2$ and $R^3$ may bond together to form a ring with the carbon atom to which they are attached, wherein $R^2$ and $R^3$, taken together, denote a $C_5$-$C_{12}$ alkylene group, and a is 1 or 2.

One preferred embodiment of the invention is a positive resist composition comprising a polymer comprising repeat units having the general formula (3) or (4).

(3)
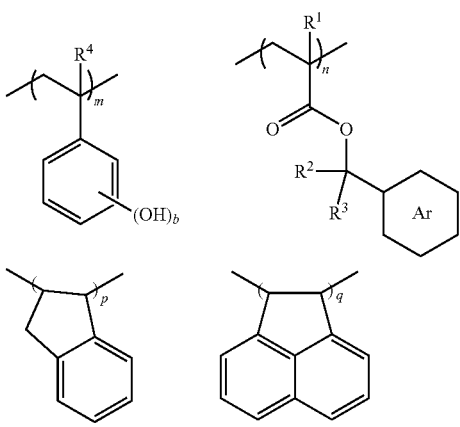

(4)
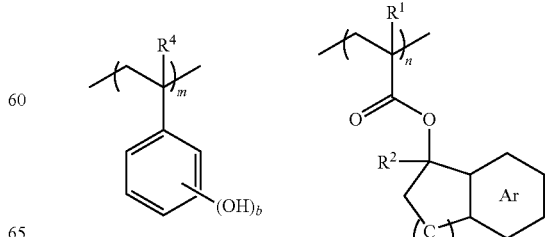

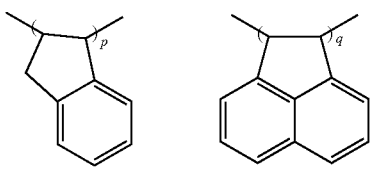

Herein

denotes a substituted or unsubstituted aromatic hydrocarbon group, $R^1$, $R^2$, and $R^3$ are as defined above, $R^4$ is hydrogen or methyl, a is 1 or 2, b is an integer of 1 to 5, m, n, p and q are numbers in the range: $0 \leq m < 1.0$, $0 < n < 1.0$, $0 \leq p < 0.5$, and $0 \leq q < 0.5$.

Another preferred embodiment of the invention is a positive resist composition comprising a polymer comprising repeat units having the general formula (5) or (6).

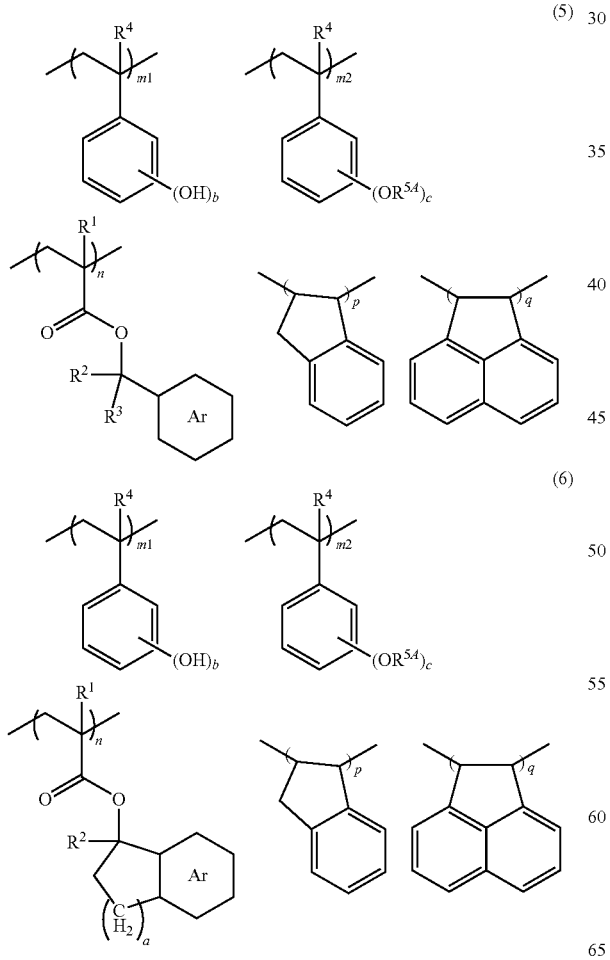

Herein

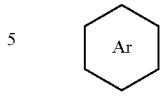

denotes a substituted or unsubstituted aromatic hydrocarbon group, $R^1$, $R^2$, and $R^3$ are as defined above, $R^4$ is hydrogen or methyl, $R^{5A}$ is an acid labile group, a is 1 or 2, b and c each are an integer of 1 to 5, m1, m2, n, p and q are numbers in the range: $0 < m1 < 1.0$, $0 < m2 < 1.0$, $0 < n < 1.0$, $0 \leq p < 0.5$, and $0 \leq q < 0.5$.

A further preferred embodiment of the invention is a positive resist composition comprising a polymer comprising repeat units having the general formula (7) or (8).

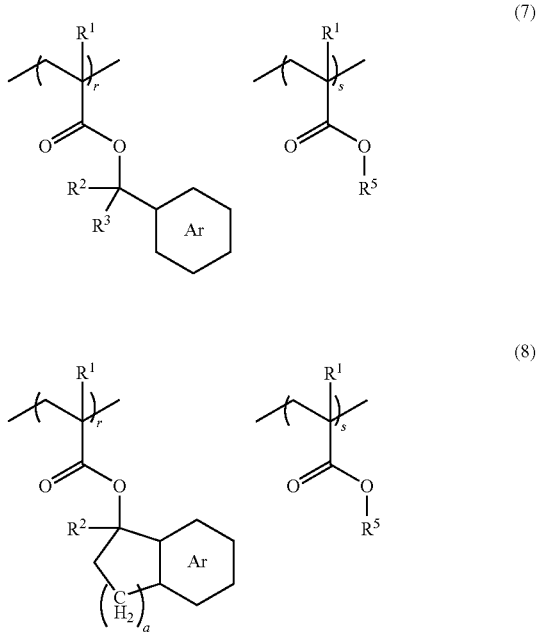

Herein

denotes a substituted or unsubstituted aromatic hydrocarbon group, $R^1$, $R^2$, and $R^3$ are as defined above, $R^5$ is an acid labile group or lactone-containing adhesive group, a is 1 or 2, r and s are numbers in the range: $0 < r < 1.0$ and $0 < s \leq 0.8$.

A still further preferred embodiment of the invention is a positive resist composition comprising a polymer comprising repeat units having the general formula (9) or (10).

(9)

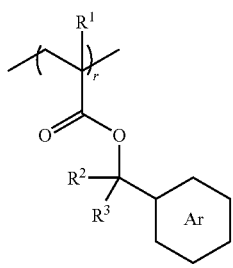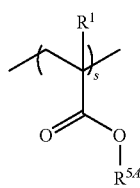

(10)

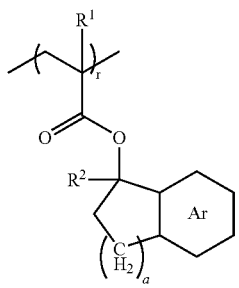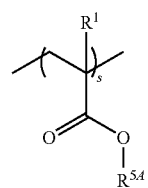

Herein

denotes a substituted or unsubstituted aromatic hydrocarbon group, $R^1$, $R^2$, and $R^3$ are as defined above, $R^{5A}$ is an acid labile group, $R^{5B}$ is a lactone-containing adhesive group, a is 1 or 2, r, s and t are numbers in the range: $0<r<1.0$, $0<s\leq0.8$, and $0<t\leq0.8$.

A still further preferred embodiment of the invention is a positive resist composition comprising a polymer comprising repeat units having the general formula (11) or (12).

(11)

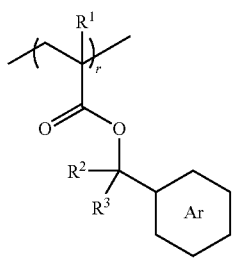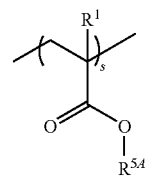

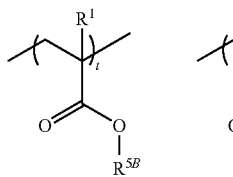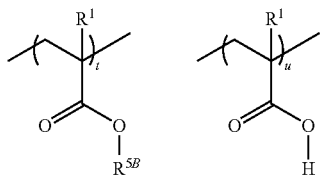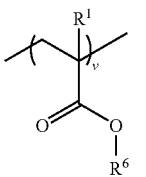

(12)

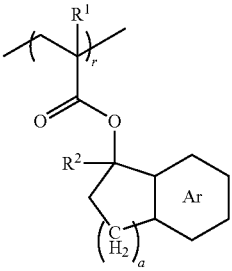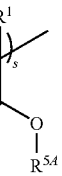

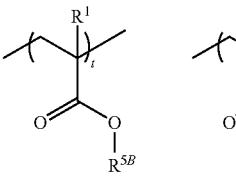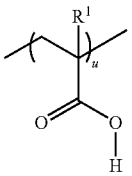

Herein

denotes a substituted or unsubstituted aromatic hydrocarbon group, $R^1$, $R^2$, and $R^3$ are as defined above, $R^{5A}$ is an acid labile group, $R^{5B}$ is a lactone-containing adhesive group. $R^6$ is a substituent group of the formula (13) or (14).

(13)

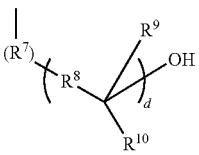

Herein $R^7$ is a divalent $C_1$-$C_{20}$ hydrocarbon group which may contain a heteroatom, $R^8$ is a single bond, a $C_1$-$C_4$ alkylene, or a substituted $C_1$-$C_4$ alkylene in which all or some hydrogen atoms are substituted by fluorine, $R^9$ and $R^{10}$ are each independently hydrogen, fluorine, a $C_1$-$C_4$ alkyl, or a substituted $C_1$-$C_4$ alkyl in which all or some hydrogen atoms are substituted by fluorine, at least either one of $R^9$ and $R^{10}$ contains fluorine, or either one of $R^9$ and $R^{10}$ may bond with $R^8$ to form a ring, and d is 1 or 2.

(14)

Herein denotes a $C_3$-$C_{12}$ cyclic hydrocarbon group or a bridged cyclic hydrocarbon group, which may contain hydroxyl, —O— or —S—, $R^{11}$, $R^{12}$ and $R^{13}$ are each independently hydrogen, fluorine or trifluoromethyl, at least either one of $R^{11}$, $R^{12}$ and $R^{13}$ contains at least one fluorine atom. The subscript a is 1 or 2, r, s, t, u and v are numbers in the range: $0<r<1.0$, $0<s\leq0.8$, $0<t\leq0.8$, $0<u\leq0.2$, and $0<v\leq0.2$.

Also provided is a chemically amplified positive resist composition comprising (A) an organic solvent, (B) a base resin comprising the polymer of any one of the foregoing embodiments, (C) a photoacid generator, and (D) a basic compound.

In another aspect, the invention provides a process for forming a pattern, comprising the steps of applying the positive resist composition of any one of the foregoing embodiments onto a substrate to form a resist coating; heat treating the resist coating, then exposing it to high-energy radiation, EUV or electron beam through a photomask; and optionally heat treating the exposed resist coating, then developing with a developer.

In a further aspect, the invention provides a process for forming a pattern, comprising the steps of applying the positive resist composition of any one of the foregoing embodiments onto a substrate to form a resist coating; heat treating the resist coating, then exposing it to high-energy radiation or electron beam through a photomask; and heat treating the exposed resist coating, then developing with a developer. In one embodiment, the exposing step is performed by immersion lithography including holding a high refractive index liquid having a refractive index of at least 1.0 between the resist coating and a projection lens. In another embodiment, a protective film is formed on the resist coating, and the exposing step is performed by immersion lithography including holding a high refractive index liquid having a refractive index of at least 1.0 between the protective film and a projection lens.

In a still further aspect, the invention provides a photomask blank comprising a chromium compound film and a coating of the resist composition of any one of the foregoing embodiment. A pattern is formed by heat treating the photomask blank defined above, subjecting the resist coating to patternwise exposure to high-energy radiation through a photomask or patternwise exposure to high-energy beam, optionally heat treating the exposed resist coating, and developing it with a developer.

Advantageous Effects of Invention

When used in the micropatterning technology, especially ArF lithography, the resist composition of the invention exhibits a very high resolution capability. The composition is thus useful in precise micropatterning. When used in the EB image writing for processing of masks, the resist composition exhibits a high resolution of fine size pattern and sensitivity sufficient to comply with high-accelerating-voltage EB irradiation, and high etch resistance. The composition is also useful in mask production.

DESCRIPTION OF EMBODIMENTS

In the disclosure, the singular forms "a," "an" and "the" include plural referents unless the context clearly dictates otherwise. The notation (Cn-Cm) means a group containing from n to m carbon atoms per group. The abbreviation Me stands for methyl.

In the prior art, chemically amplified positive resist compositions use a base resin comprising repeat units having a potentially alkaline-soluble acidic substituent group which is protected with a protective group (or acid labile group) which will be eliminated under the action of acid. Exemplary potentially alkaline-soluble acidic substituent groups include hydroxyphenyl groups and carboxylic acids. The acid labile groups for protecting the former include acetal and tert-butoxycarbonyl groups, and the acid labile groups for protecting the latter are often tertiary alkyl groups. A typical base resin comprising repeat units containing hydroxyphenyl is polyhydroxystyrene. Typical base resins comprising repeat units containing carboxylic acid include poly(methacrylic acid) and poly(acrylic acid). These resins in which some or all acidic substituent groups are protected with the above-mentioned acid labile groups are used as the base resin in chemically amplified positive resist compositions.

The potentially alkaline-soluble acidic substituent group which is protected with an acid labile group reacts with the acid which is generated by an acid generator upon exposure to high-energy radiation such as ArF excimer laser radiation, EUV or EB whereby the substituent group turns into an alkaline-soluble substituent group. In this way, the exposed regions are dissolved in an alkaline developer, yielding a positive resist pattern. It is known that in the microlithography of a positive resist pattern, carboxylic acid surpasses hydroxyphenyl as the acidic substituent group protected with an acid labile group. This is because the carboxylic acid resulting from deprotection by reaction with acid has a higher acidity than hydroxyphenyl, offering a higher alkali solubility to enable micropatterning.

However, it is also known that the reactivity with acid of the acid labile group (e.g., t-alkyl) for protecting carboxylic acid is very low as compared with the reactivity with acid of the acid labile group (e.g., acetal) for protecting hydroxyphenyl. That is, the reaction with acid for deprotection of t-alkyl-protected polymethacrylic acid is very weak as compared with the reaction with acid for deprotection of acetal-protected polyhydroxystyrene. As a result, a chemically amplified positive resist composition using t-alkyl-protected polymethacrylate has a very low sensitivity upon patterning.

For example, the chemically amplified resist composition using t-alkyl-protected polymethacrylate has a lower sensitivity than the composition using acetal-protected polyhydroxystyrene. Since the chemically amplified resist composition using t-alkyl-protected polymethacrylate is low reactive, the post-exposure baking (PEB) step for promoting the reaction with acid to facilitate deprotection must be at a higher temperature. Differently stated, for the chemically amplified resist composition using t-alkyl-protected polymethacrylate, the acid generated by the acid generator must be a very strong acid such as perfluoroalkanesulfonic acid.

In the event where the acidic substituent group protected with an acid labile group is carboxylic acid, a positive resist composition using the same is favorable in processing of a fine size resist pattern, but has a drawback of low sensitivity because of low reactivity with acid of the acid labile group.

Then the inventors sought for a resin comprising repeat units containing carboxylic acid protected with an acid labile group which can provide a sufficiently high resolution to enable micropatterning and also impart a high sensitivity because of very high reactivity of the acid labile group with the acid generated by the acid generator. In a first aspect, the invention provides a positive resist composition comprising a polymer comprising repeat units having the general formula (1) or (2).

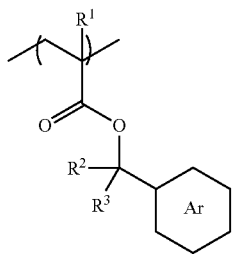

(1)

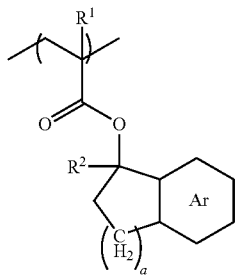

(2)

Herein

denotes a substituted or unsubstituted aromatic hydrocarbon group. $R^1$ is each independently hydrogen, methyl or trifluoromethyl. $R^2$ is hydrogen or a straight, branched or cyclic $C_1$-$C_{12}$ alkyl or aromatic hydrocarbon group, and $R^3$ is a straight, branched or cyclic $C_1$-$C_{12}$ alkyl group, or $R^2$ and $R^3$ may bond together to form a ring with the carbon atom to which they are attached, wherein $R^2$ and $R^3$, taken together, denote a $C_5$-$C_{12}$ alkylene group. The subscript "a" is 1 or 2.

The positive resist composition comprising a polymer comprising acid labile groups of formula (1) or (2) exhibits a very high sensitivity and a high resolution because it allows the PEB step (for promoting the reaction with acid) to be effected at a lower temperature. That is, deprotection reaction can occur without a need for a strong acid such as perfluoroalkanesulfonic acid. Since the acidic substituent group resulting from deprotection of the acid labile group on the repeat units of formula (1) or (2) is carboxylic acid, the exposed regions are highly alkali soluble. There is thus available a chemically amplified positive resist composition which is expected to exhibit a high resolution and lends itself to micropatterning.

Herein, non-limiting examples of

include the following.

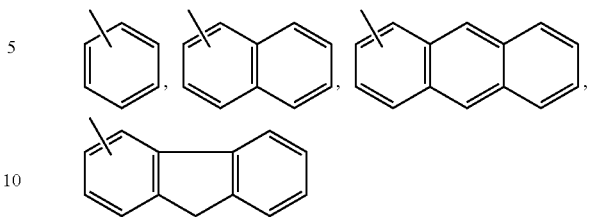

Suitable aromatic hydrocarbon groups represented by $R^2$ include aryl groups such as phenyl and tolyl. Suitable alkyl groups represented by $R^2$ and $R^3$ include methyl, ethyl, propyl, isopropyl, butyl, isobutyl, tert-butyl, cyclopentyl, and cyclohexyl. When $R^2$ and $R^3$ bond together to form a ring, typical rings are cyclopentyl and cyclohexyl.

The acid labile groups on the repeat units of formulae (1) and (2) have a common structure having an ester bond to the benzyl site on aromatic ring. Due to stability of carbocation in the reaction transition state and formation of an olefin conjugate to a stable aromatic ring as a result of elimination reaction, these acid labile groups need low activation energy for acid-catalyzed elimination reaction, indicating a high reactivity. Their reactivity can be controlled by properly selecting the type (the number of carbon atoms and the number of hydrogen atoms attached to the central carbon atom) of $R^2$ and $R^3$ in formula (1) or the type of $R^2$ and the number of members in the aliphatic ring fused to aromatic ring in formula (2).

Most preferred among those units meeting the above requirements are the repeat units of formula (1) or (2). Specifically, examples of the repeat units of formula (1) are given below.

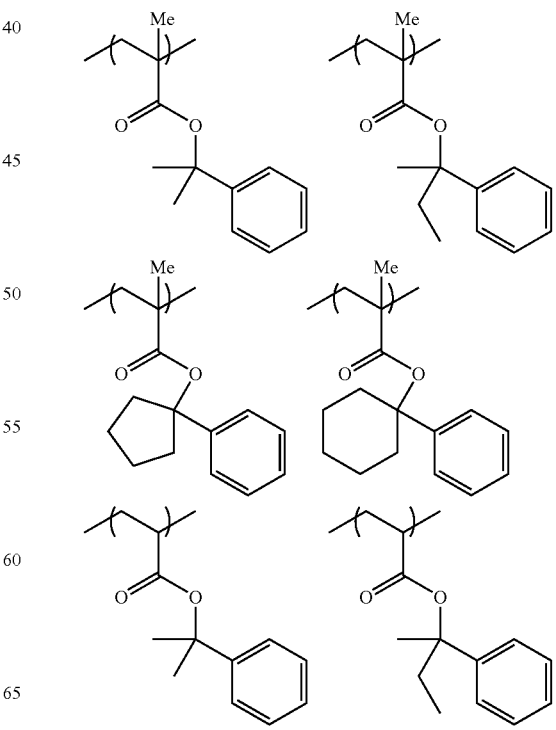

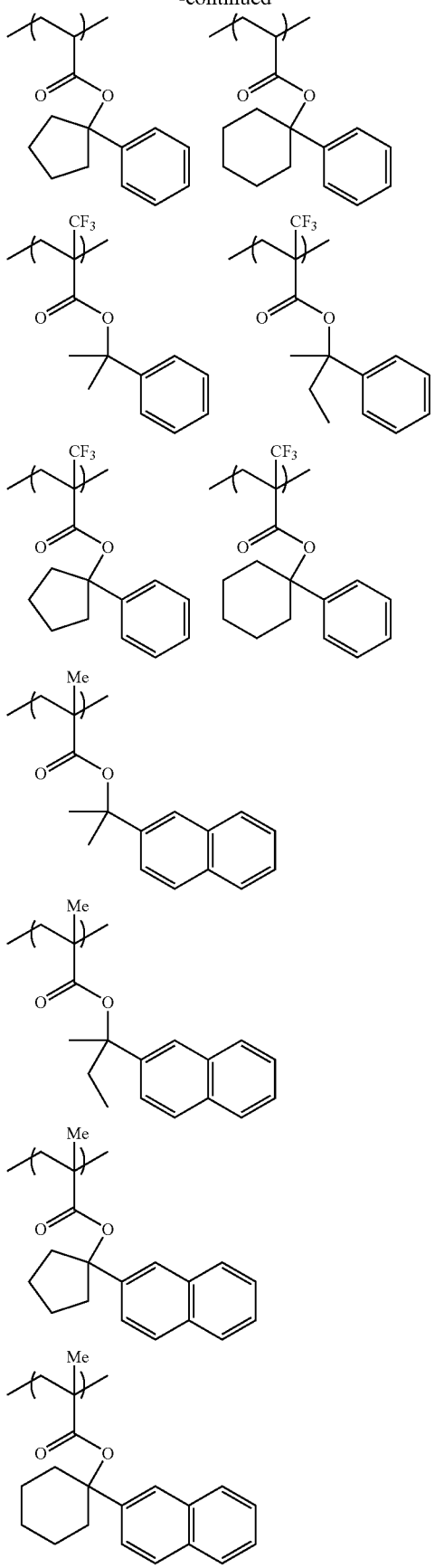
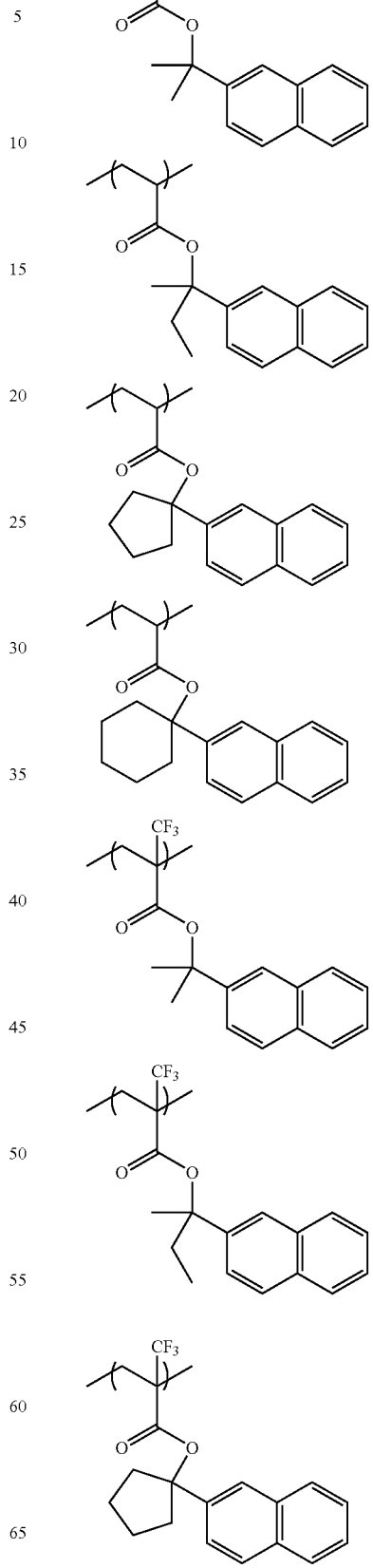

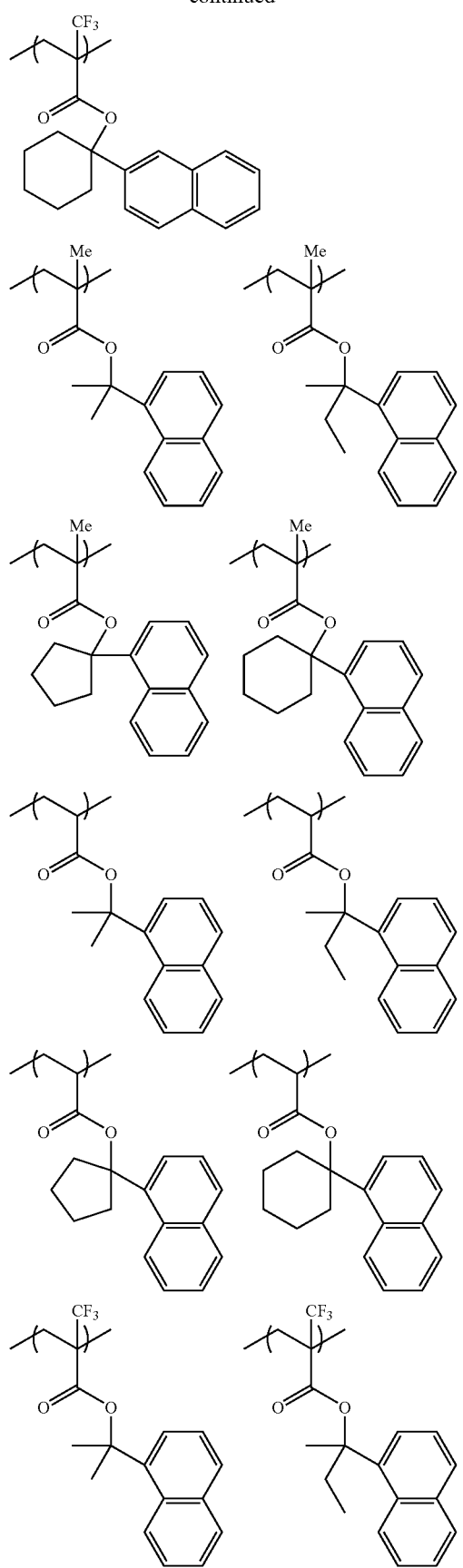
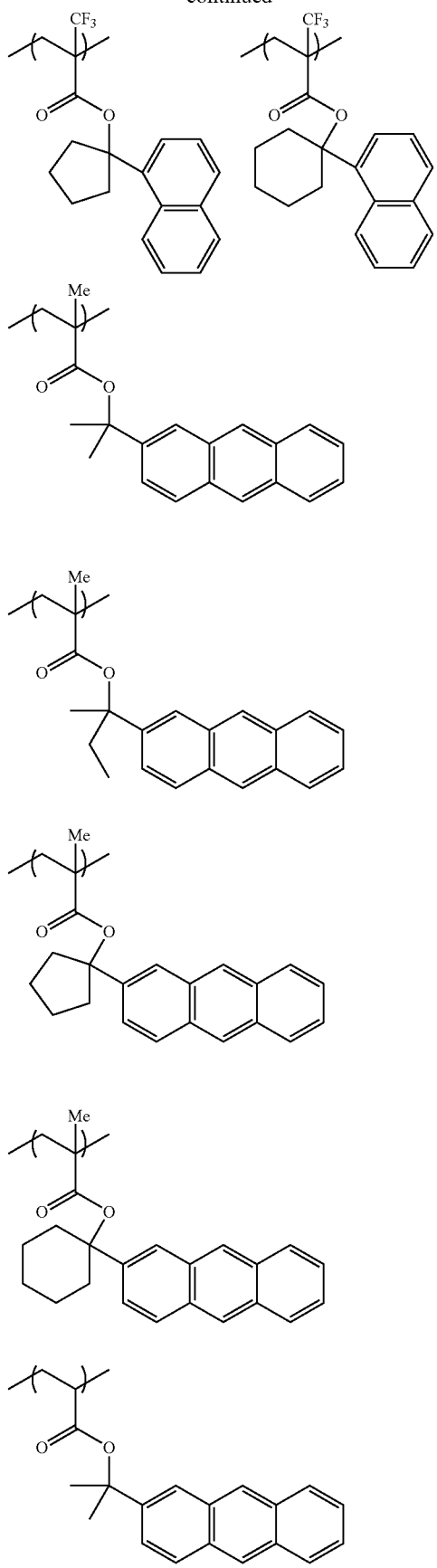

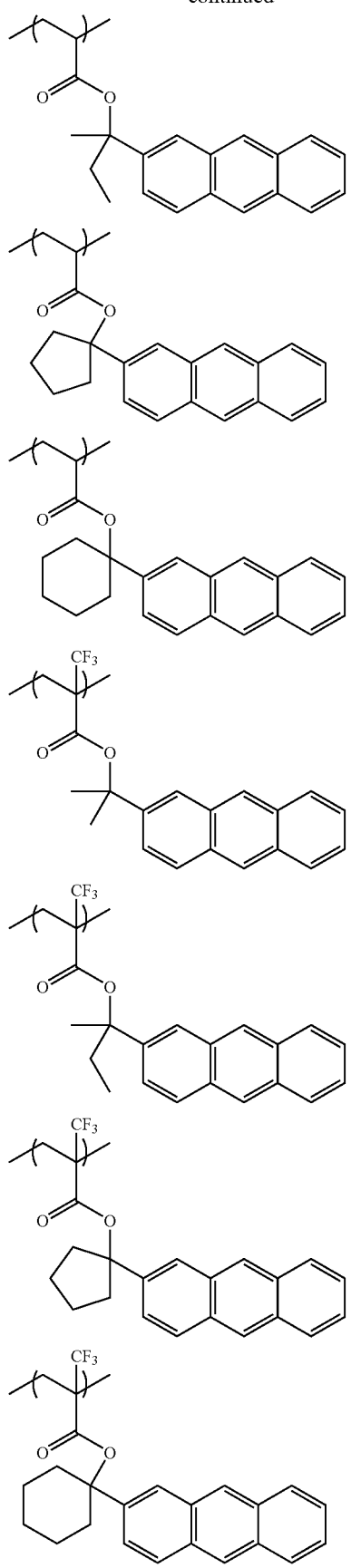
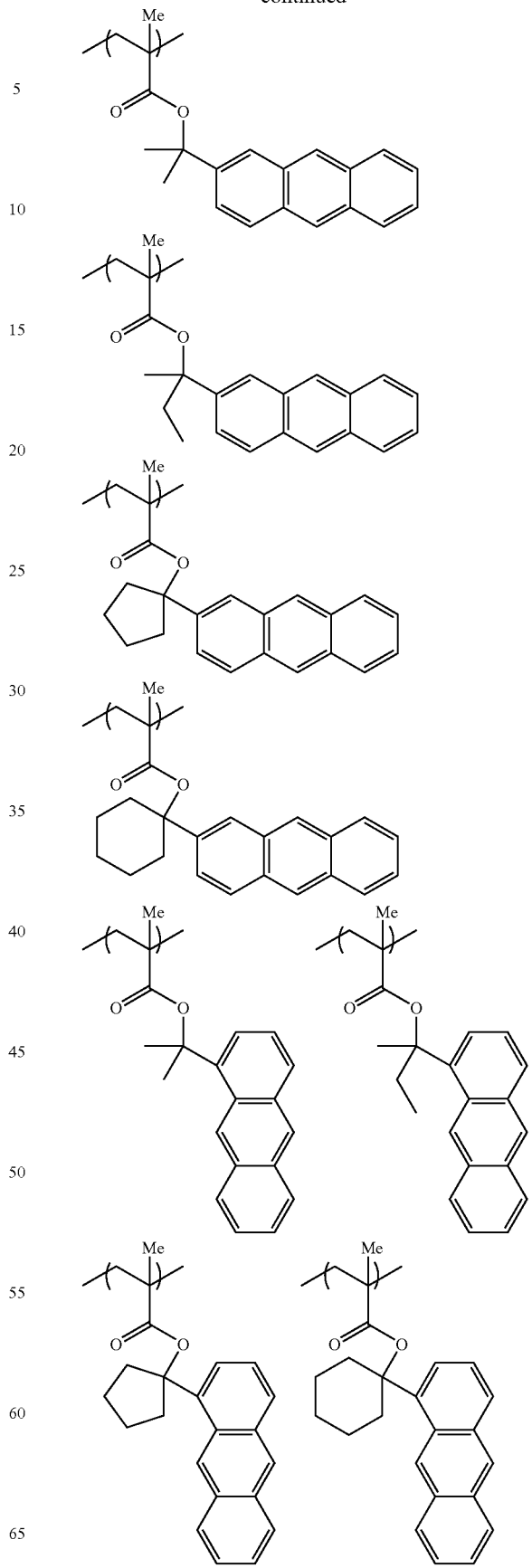

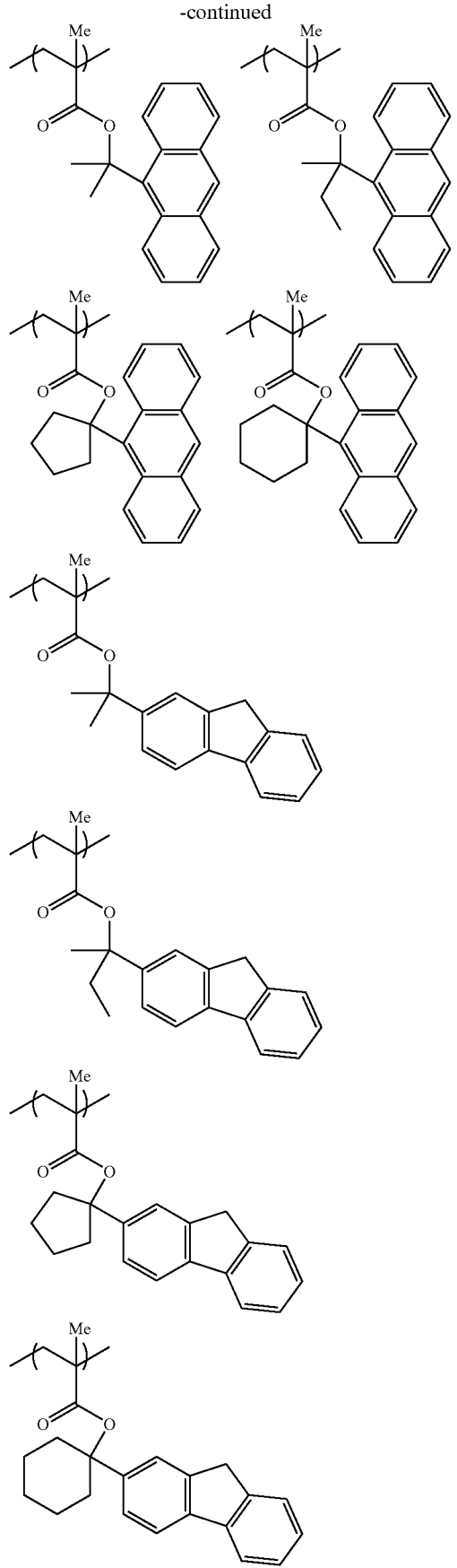
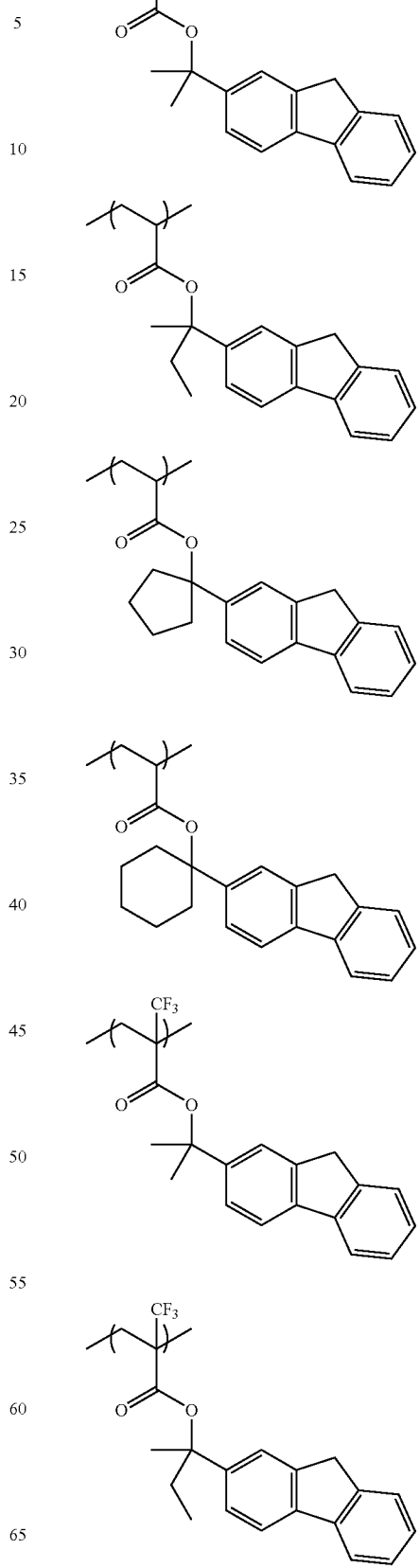

-continued
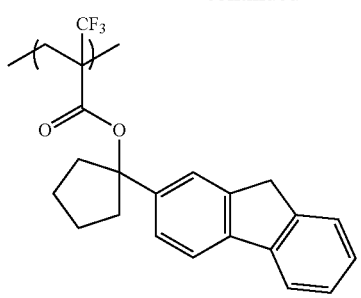
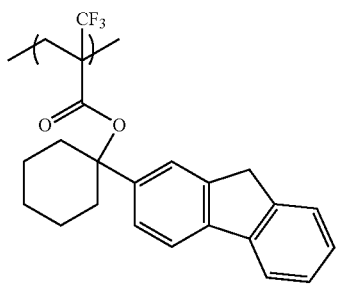
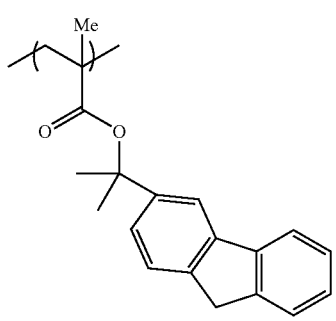
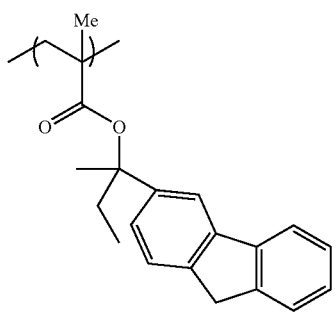
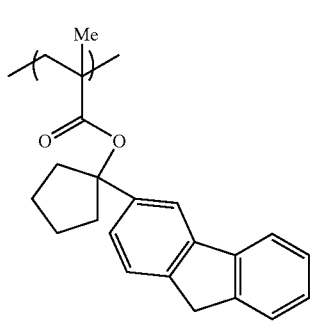
-continued
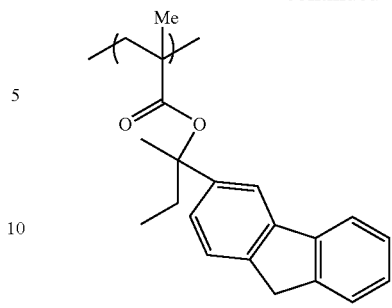
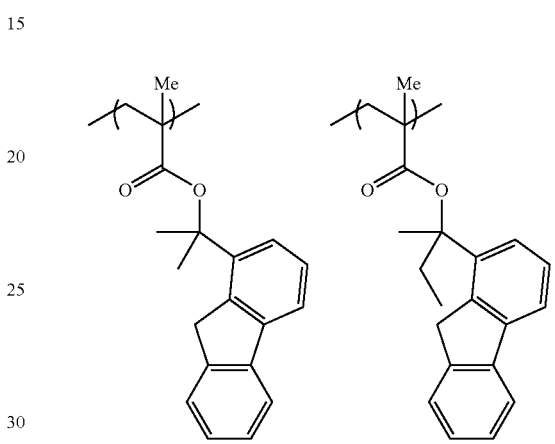
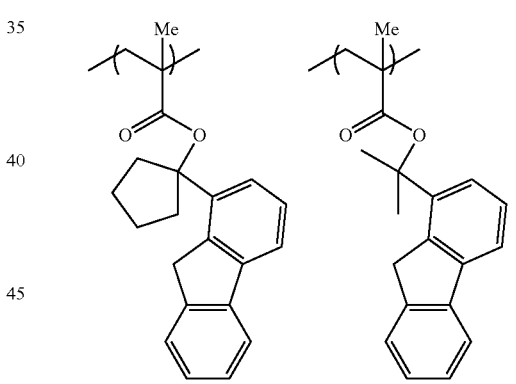
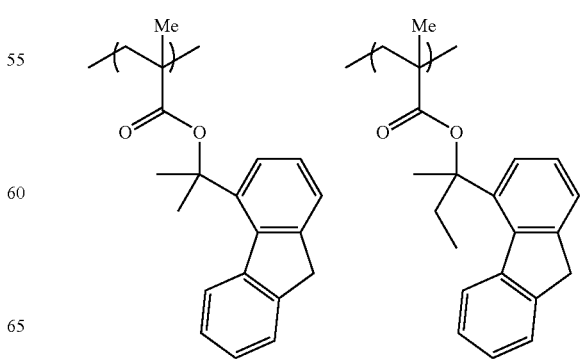

-continued
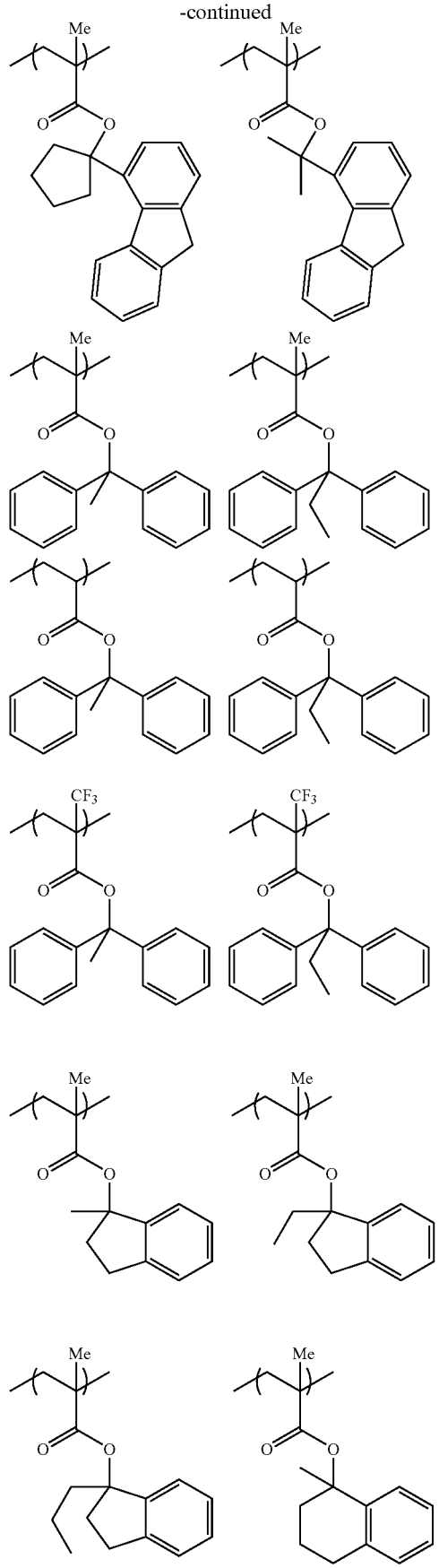
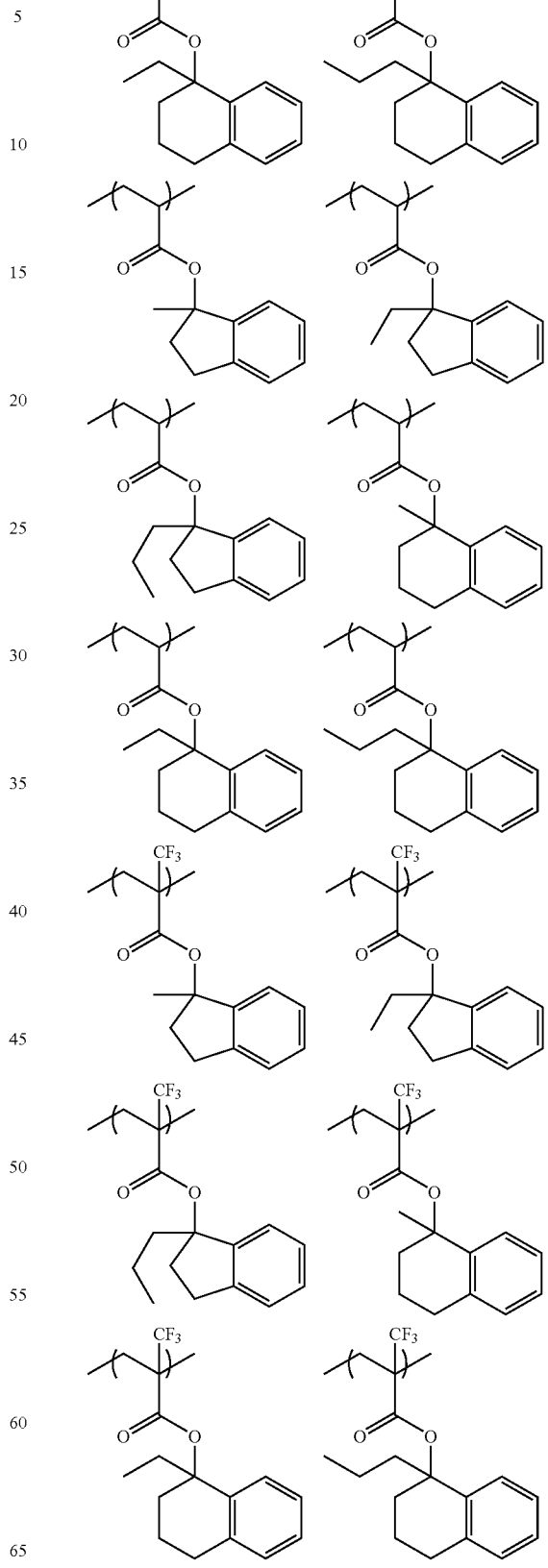

Exemplary monomers from which the repeat units of formula (2) are derived include monomers of formula (2a).

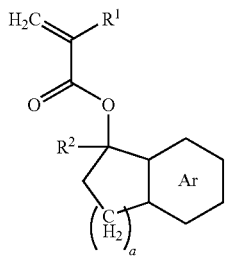

Herein

denotes a substituted or unsubstituted aromatic hydrocarbon group, $R^1$ is each independently hydrogen, methyl or trifluoromethyl, $R^2$ is hydrogen or a straight, branched or cyclic $C_1$-$C_{12}$ alkyl or aromatic hydrocarbon group, and "a" is 1 or 2.

Specifically, non-limiting examples of

include the following.

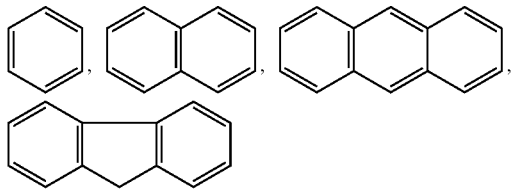

Suitable aromatic hydrocarbon groups represented by $R^2$ include aryl groups such as phenyl and tolyl. Suitable alkyl groups represented by $R^2$ include methyl, ethyl, propyl, isopropyl, butyl, isobutyl, tert-butyl, cyclopentyl, and cyclohexyl.

Shown below are examples of the monomers of formula (2a) from which the repeat units of formula (2) are derived.

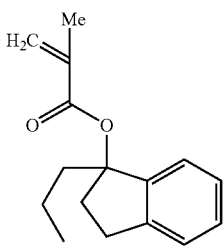
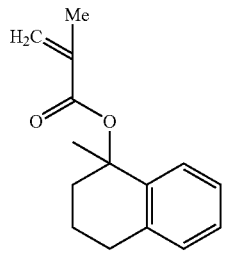
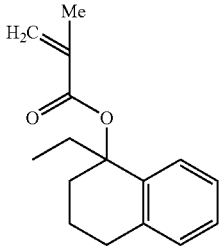
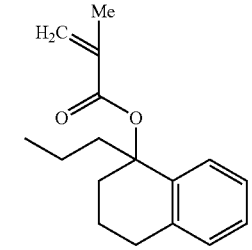
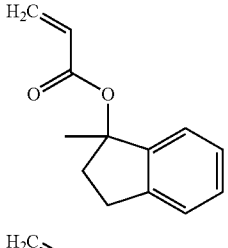
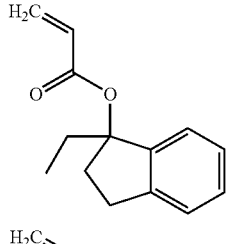
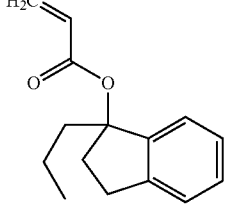
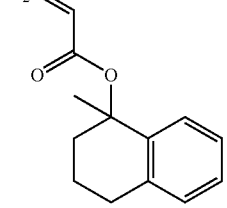
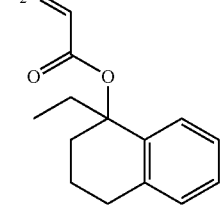
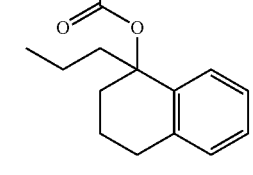
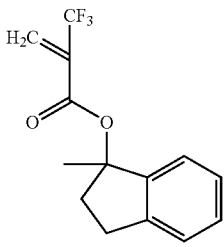
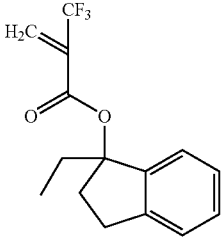
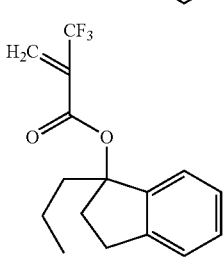
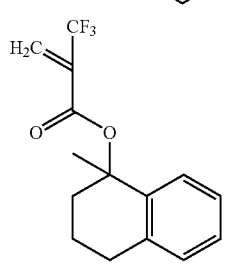

-continued

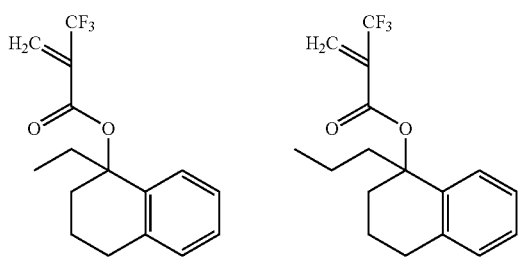

Examples of the repeat units of formula (2) are shown below.

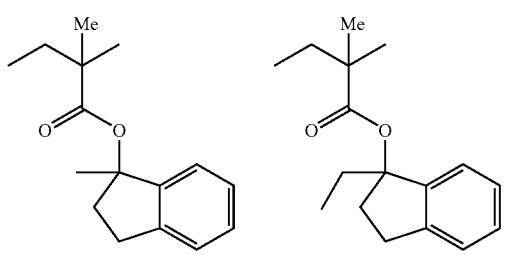

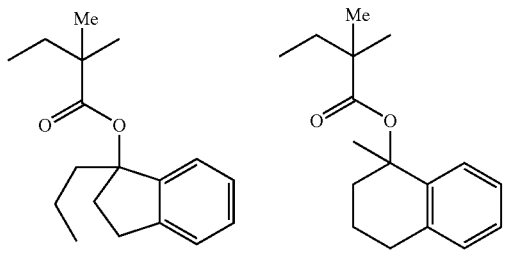

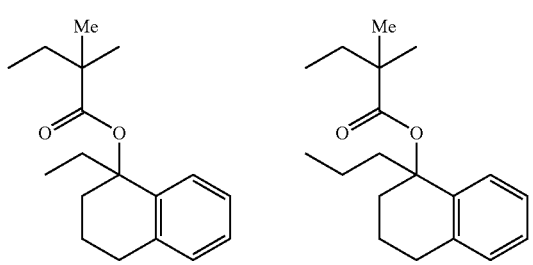

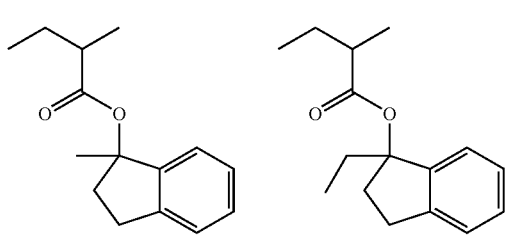

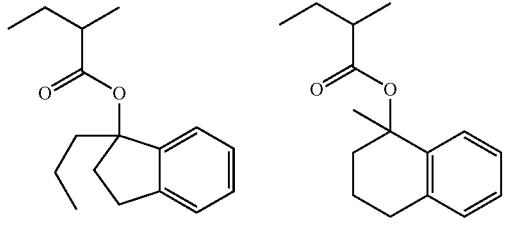

-continued

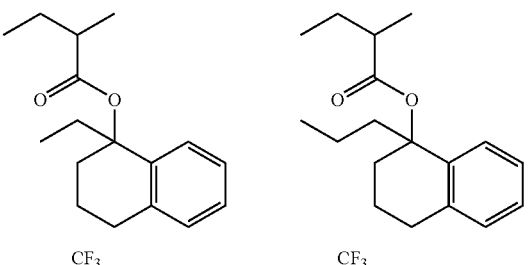

Using a polymer comprising acid labile group-containing repeat units represented by formula (1) or (2), a chemically amplified positive resist composition having a high resolution and sensitivity can be formulated. For use in EB image writing for mask production, the resist composition should preferably have higher etching resistance. In this embodiment, the polymer may comprise aromatic ring-containing repeat units represented by the general formula (3) or (4) or the general formula (5) or (6). More preferably the polymer may comprise indene or acenaphthylene groups, whereby dissolution contrast and line edge roughness are improved.

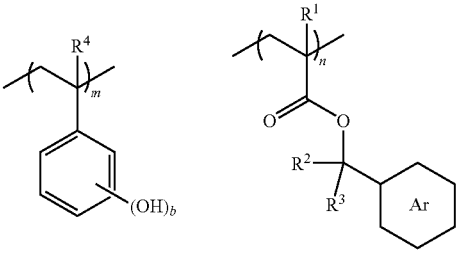

(3)

-continued

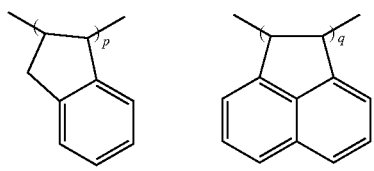
(4)
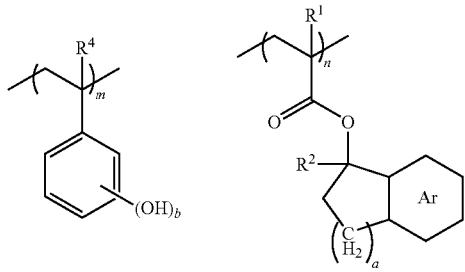
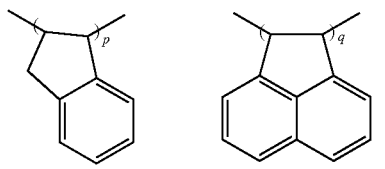
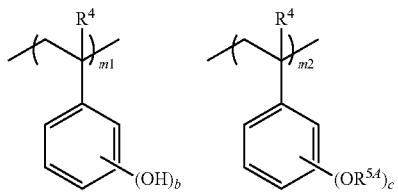
(5)
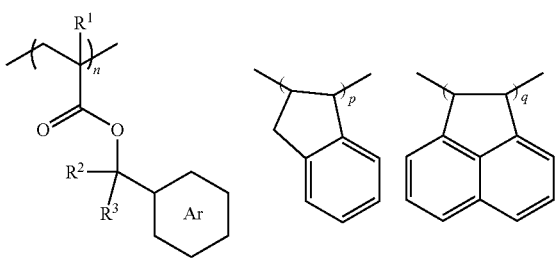
(6)
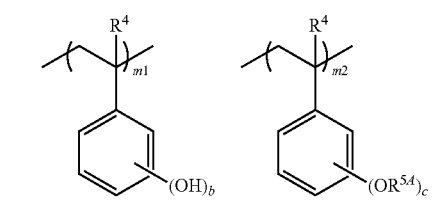
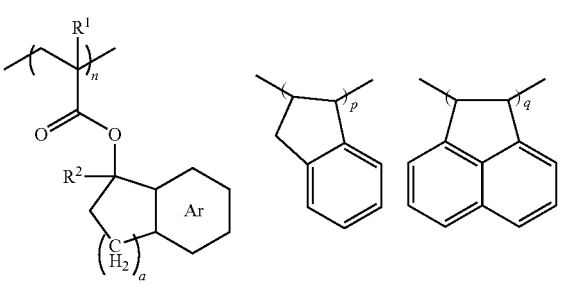

Herein

denotes a substituted or unsubstituted aromatic hydrocarbon group as described above. $R^1$ is each independently hydrogen, methyl or trifluoromethyl. $R^2$ is hydrogen or a straight, branched or cyclic $C_1$-$C_{12}$ alkyl or aromatic hydrocarbon group, $R^3$ is a straight, branched or cyclic $C_1$-$C_{12}$ alkyl group, or $R^2$ and $R^3$ may bond together to form a ring with the carbon atom to which they are attached, wherein $R^2$ and $R^3$, taken together, denote a $C_5$-$C_{12}$ alkylene group. $R^4$ is hydrogen or methyl, $R^{5A}$ is an acid labile group, a is 1 or 2, and b is an integer of 1 to 5.

In formulae (3), (4), (5) and (6), suitable examples of the repeat units represented by

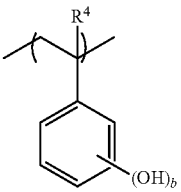

include p-hydroxystyrene units as shown below.

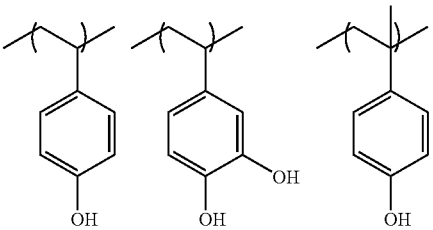

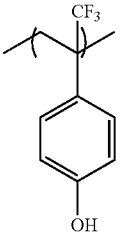

In formulae (3) and (4), m is a number in the range: $0 \leq m < 1.0$, and preferably $0 \leq m < 0.8$. In formulae (5) and (6), m1 and m2 are numbers in the range: $0 < m1 < 1.0$ and $0 < m2 < 1.0$, preferably $0.1 \leq m1 \leq 0.9$ and $0 < m2 < 0.5$, and more preferably $0.3 \leq m1 \leq 0.8$ and $0.05 \leq m2 \leq 0.3$. The subscript n is a number in the range: $0 < n < 1.0$, preferably $0.1 < n < 0.5$, and more preferably $0.1 < n < 0.3$. If n has a lower value, especially less than 0.1, a rather low alkaline solubility after deprotection of an acid labile group may lead to an insufficient dissolution contrast, failing to achieve the desired resolution performance. The subscripts p and q are numbers in the range: $0 \leq p < 0.5$ and $0 \leq q < 0.5$, and preferably $0.1 \leq p < 0.5$ and $0.1 \leq q < 0.5$. If values of p and q are too low, especially less than 0.1, sufficient etching resistance may not be obtainable. If values of p and q are too high, undesirably a balance of resist properties may be broken and a high resolution capability may not be obtainable. It is noted that m+n+p+q≤100 mol %, and m1+m2+n+p+q≤100 mol %.

Use of a polymer comprising aromatic ring-containing repeat units represented by any one of formulae (3) to (6) is advantageous in enhancing the etch resistance of the resist composition which is used for mask production. However, since the aromatic ring is absorptive to ArF excimer laser radiation having wavelength 193 nm, the resist film has a lower transmittance and is difficult to provide a high resolution. In the embodiment wherein the resist composition is used in the ArF excimer laser lithography for micropatterning of devices, use of these repeat units should be avoided.

Where the polymer comprising repeat units of formula (1) or (2) is formulated in the chemically amplified positive resist composition which is used in the ArF excimer laser lithography for micropatterning of devices, those polymers comprising repeat units having formulae (7) to (12) are preferred.

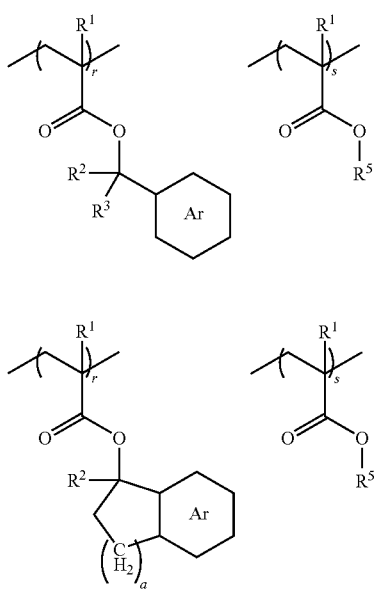

(7)

(8)

Herein

denotes a substituted or unsubstituted aromatic hydrocarbon group, $R^1$ is each independently hydrogen, methyl or trifluoromethyl, $R^2$ is hydrogen or a straight, branched or cyclic $C_1$-$C_{12}$ alkyl or aromatic hydrocarbon group, $R^3$ is a straight, branched or cyclic $C_1$-$C_{12}$ alkyl group, or $R^2$ and $R^3$ may bond together to form a ring with the carbon atom to which they are attached, wherein $R^2$ and $R^3$, taken together, denote a $C_5$-$C_{12}$ alkylene group, $R^5$ is an acid labile group or lactone-containing adhesive group, a is 1 or 2, r and s are numbers in the range: 0<r<1.0, 0<s≤0.8, and r+s≤100 mol %.

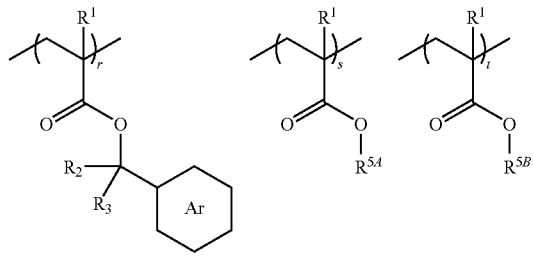

(9)

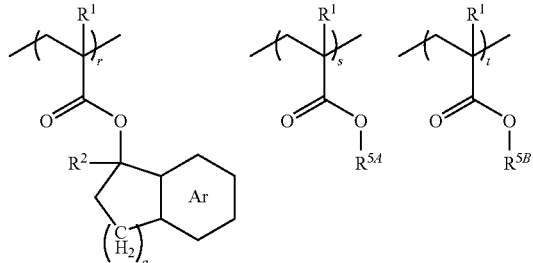

(10)

Herein

denotes a substituted or unsubstituted aromatic hydrocarbon group, $R^1$ is each independently hydrogen, methyl or trifluoromethyl, $R^2$ is hydrogen or a straight, branched or cyclic $C_1$-$C_{12}$ alkyl or aromatic hydrocarbon group, $R^3$ is a straight, branched or cyclic $C_1$-$C_{12}$ alkyl group, or $R^2$ and $R^3$ may bond together to form a ring with the carbon atom to which they are attached, wherein $R^2$ and $R^3$, taken together, denote a $C_5$-$C_{12}$ alkylene group, $R^{5A}$ is an acid labile group, $R^{5B}$ is a lactone-containing adhesive group, a is 1 or 2, r, s and t are numbers in the range: 0<r<1.0, 0<s≤0.8, 0<t≤0.8, and r+s+t≤100 mol %.

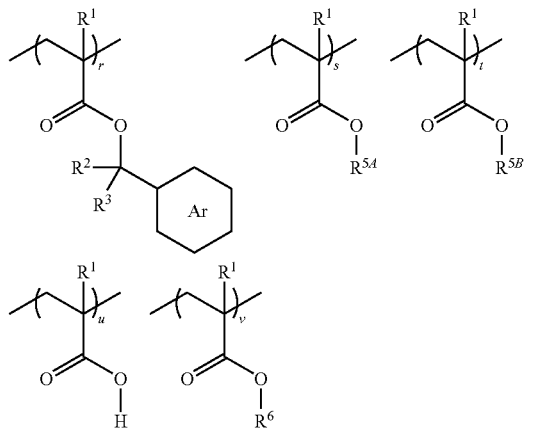

(11)

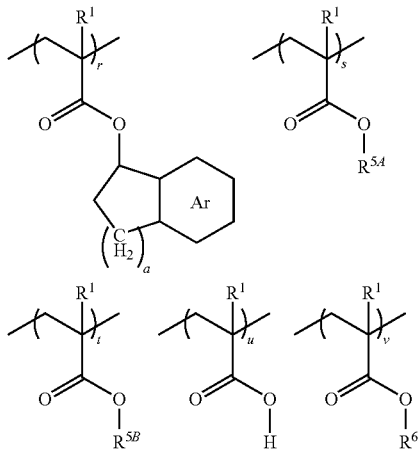

Herein

denotes a substituted or unsubstituted aromatic hydrocarbon group, $R^1$ is each independently hydrogen, methyl or trifluoromethyl, $R^2$ is hydrogen or a straight, branched or cyclic $C_1$-$C_{12}$ alkyl or aromatic hydrocarbon group, $R^3$ is a straight, branched or cyclic $C_1$-$C_{12}$ alkyl group, or $R^2$ and $R^3$ may bond together to form a ring with the carbon atom to which they are attached, wherein $R^2$ and $R^3$, taken together, denote a $C_5$-$C_{12}$ alkylene group, $R^{5A}$ is an acid labile group, $R^{5B}$ is a lactone-containing adhesive group. $R^6$ is a substituent group of the formula (13) or (14).

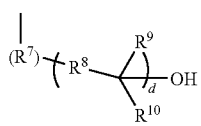 (13)

Herein $R^7$ is a divalent $C_1$-$C_{20}$ hydrocarbon group which may contain a heteroatom, $R^8$ is a single bond, a $C_1$-$C_4$ alkylene, or a substituted $C_1$-$C_4$ alkylene in which all or some hydrogen atoms are substituted by fluorine, $R^9$ and $R^{10}$ are each independently hydrogen, fluorine, a $C_1$-$C_4$ alkyl, or a substituted $C_1$-$C_4$ alkyl in which all or some hydrogen atoms are substituted by fluorine, at least either one of $R^9$ and $R^{10}$ contains fluorine, or either one of $R^9$ and $R^{10}$ may bond with $R^8$ to form a ring, and d is 1 or 2.

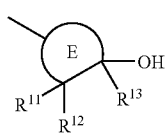 (14)

Herein

denotes a $C_3$-$C_{12}$ cyclic hydrocarbon group or a bridged cyclic hydrocarbon group, which may contain hydroxyl, —O— or —S—, for example, cyclopentyl, cyclohexyl, cycloheptyl, cyclooctyl, 3-oxocyclohexyl or 3-thiocyclohexyl. $R^{11}$, $R^{12}$ and $R^{13}$ are each independently hydrogen, fluorine or trifluoromethyl, at least either one of $R^{11}$, $R^{12}$ and $R^{13}$ contains at least one fluorine atom.

In formulae (11) and (12), a is 1 or 2, r, s, t, u and v are numbers in the range: $0 < r < 1.0$, $0 \leq s \leq 0.8$, $0 < t \leq 0.8$, $0 < u \leq 0.2$, $0 < v \leq 0.2$, and $r+s+t+u+v \leq 100$ mol %.

While the acid labile group-containing repeat units represented by formula (1) or (2) which can afford a high resolution capability and a high sensitivity are included in formulae (7) to (12), a proportion "r" of repeat units of formula (1) or (2) in formulae (7) to (12) is preferably $0 < r < 1.0$ and more preferably $0.05 < r < 0.5$. Since the repeat unit of formula (1) or (2) itself has an aromatic ring, it has absorption in ArF excimer laser exposure, indicating that the resist film has a lower transmittance as a proportion of these repeat units becomes higher. This leads to a risk that the pattern profile can be tapered or the resolution capability can be degraded. For this reason, preferably the value of r is not more than 0.5, and more preferably not more than 0.3. However, since the current advanced technology for device or mask processing uses a thinner film of resist material, a little drop of transmittance of resist film is acceptable. This permits the acid labile group-containing repeat units represented by formula (1) or (2) to exert their effects of providing a high resolution capability and a high sensitivity. Then an optimum proportion "r" of repeat units of formula (1) or (2) is $0.1 < r < 0.3$.

For the purposes of acquiring a balance with other performance factors, specifically for achieving improvements in resolution performance, process margins (e.g., exposure latitude and focal depth), mask fidelity, and pattern roughness, the polymer may have incorporated therein acid labile groups $R^5$ and $R^{5A}$ other than the acid labile group-containing repeat units represented by formula (1) or (2) which can afford a high resolution capability and a high sensitivity. Such other acid labile groups $R^5$ and $R^{5A}$ are incorporated as in formulae (5) to (12).

The acid labile groups represented by $R^5$ and $R^{5A}$ may be selected from a variety of such groups. The acid labile groups are the groups which may be deprotected under the action of the acid generated by the photoacid generator to be described later and include well-known acid labile groups used in prior art resist compositions, typically chemically amplified resist compositions. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

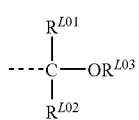 (L1)

-continued $$\text{-----}(CH_2)_y\text{---}\overset{O}{\underset{\|}{C}}\text{---}OR^{L04} \quad (L2)$$

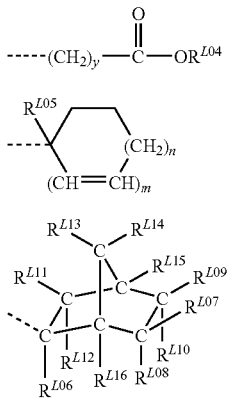

(L3)

(L4)

In these formulae, the broken line denotes a valence bond. In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Suitable straight, branched or cyclic alkyl groups are as exemplified for $R^{L01}$ and $R^{L02}$, and suitable substituted alkyl groups are shown below.

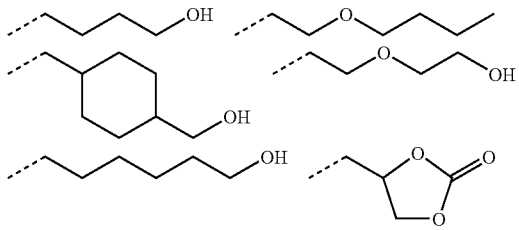

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 2-(tricyclo[5.2.1.0$^{2,6}$]decan-8-yl)propan-2-yl, 2-(tetracyclo[4.4.0.1$^{2,5}$.1$^{7,10}$]dodecan-3-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, and 3-ethyl-3-tetracyclo[4.4.0.1$^{2,5}$.1$^{7,10}$]dodecyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is a substituted or unsubstituted, straight, branched or cyclic $C_1$-$C_{10}$ alkyl group or a substituted or unsubstituted $C_6$-$C_{20}$ aryl group. Examples of the optionally substituted alkyl group include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, substituted forms of such groups in which some hydrogen atoms are substituted by hydroxyl, alkoxy, carboxy, alkoxycarbonyl, oxo, amino, alkylamino, cyano, mercapto, alkylthio, sulfo or other groups, and similar groups in which one or more methylene moiety is replaced by oxygen or sulfur atom. Examples of the optionally substituted aryl groups include phenyl, methylphenyl, naphthyl, anthryl, phenanthryl, and pyrenyl. Letter m is equal to 0 or 1, n is equal to 0, 1, 2 or 3, and 2m+n is equal to 2 or 3.

In formula (L4), $R^{L06}$ is a substituted or unsubstituted, straight, branched or cyclic $C_1$-$C_{10}$ alkyl group or a substituted or unsubstituted $C_6$-$C_{20}$ aryl group. Examples of these groups are the same as exemplified for $R^{L05}$. $R^{L07}$ to $R^{L16}$ independently represent hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$, taken together, form a ring with the carbon atom to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or similar pair from a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

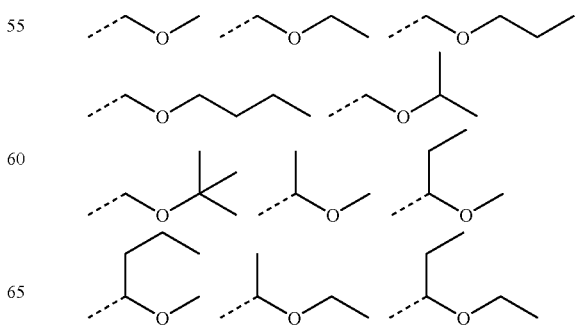

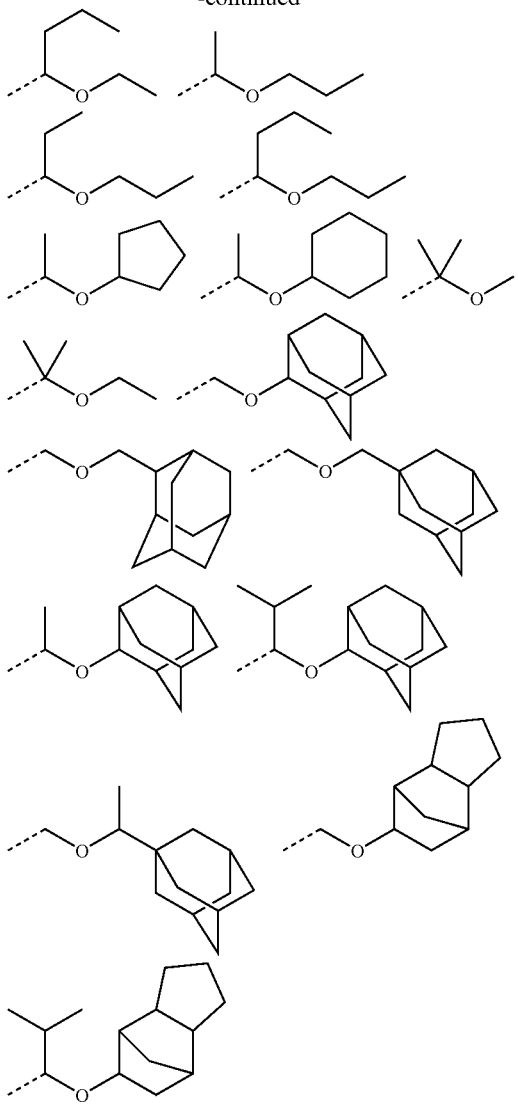

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxybutyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 1-methyl-2-cyclopentenyl, 1-ethyl-2-cyclopentenyl, 1-methyl-2-cyclohexenyl, and 1-ethyl-2-cyclohexenyl groups.

Of the acid labile groups having formula (L4), groups having the following formulas (L4-1) to (L4-4) are preferred.

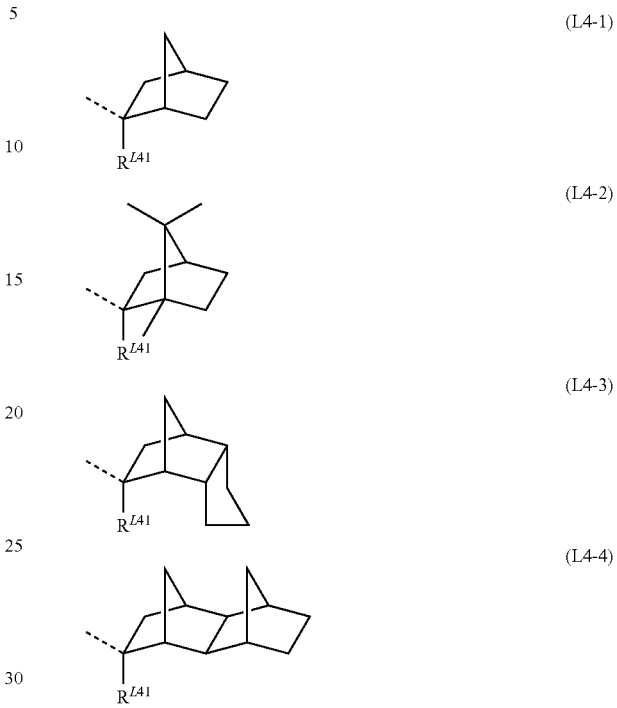

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

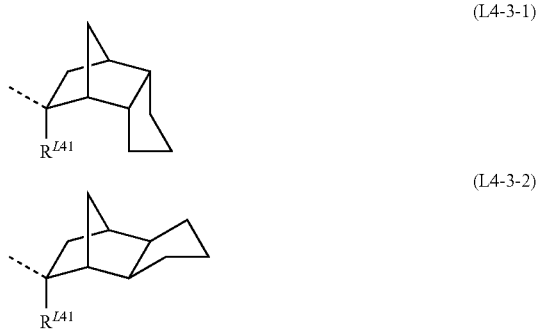

Similarly, the general formula (L4-4) represents one or a mixture of two or more selected from groups having the following general formulas (L4-4-1) to (L4-4-4).

(L4-4-1)

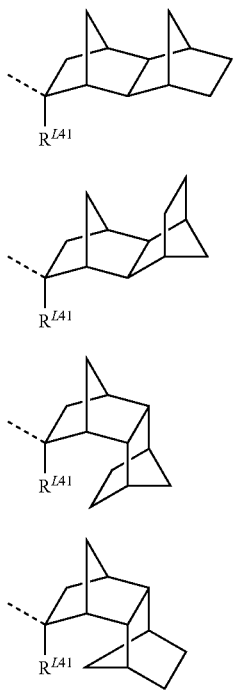

(L4-4-2)

(L4-4-3)

(L4-4-4)

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)

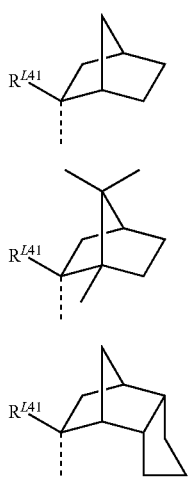

(L4-2-endo)

(L4-3-endo)

(L4-4-endo)

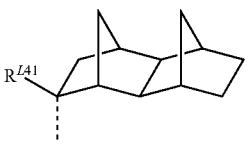

Illustrative examples of the acid labile group of formula (L4) are given below.

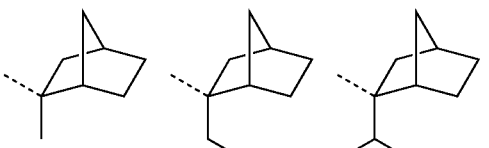

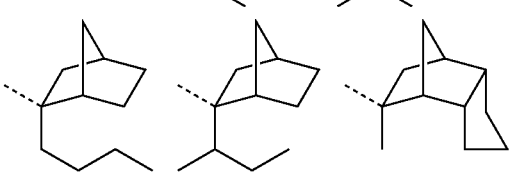

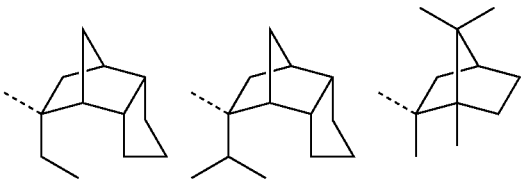

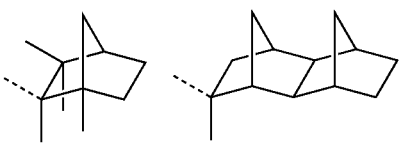

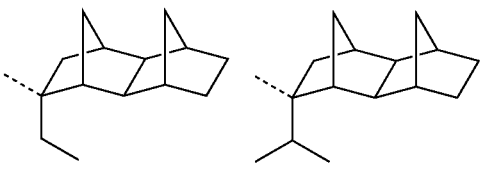

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups are as exemplified for $R^{LO4}$.

An appropriate proportion "s" of repeat units having acid labile group $R^{5A}$ is $0 < s \leq 0.8$, and more preferably $0.1 < s \leq 0.5$. A proportion "r" of the acid labile group-containing repeat units of formula (1) or (2) and a proportion "s" of repeat units having acid labile group $R^{5A}$ are preferably so related to provide the range: $0.1 < r+s \leq 0.8$, and more preferably $0.2 < r+s \leq 0.65$. Although values of r and s outside the range need not be positively excluded, sometimes a balance of properties required of resist material may be broken.

$R^{5B}$ has a lactone structure as its partial structure and preferably stands for a group containing a 5 or 6-membered lactone ring. Exemplary groups are shown below, but not limited thereto.

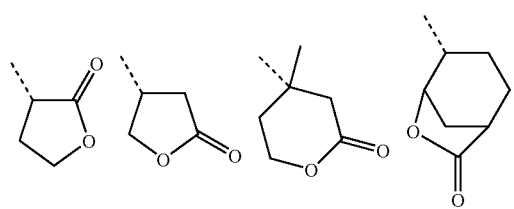
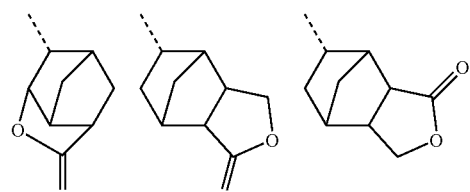
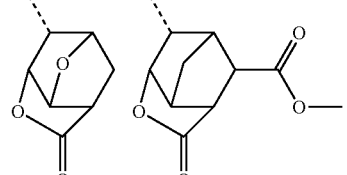
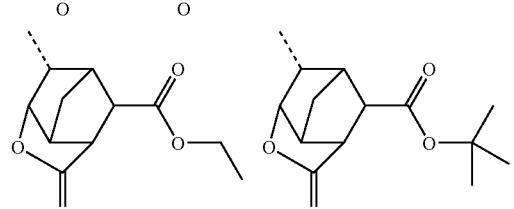
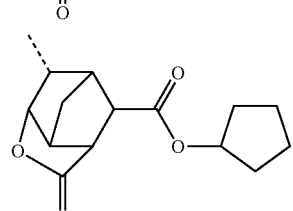
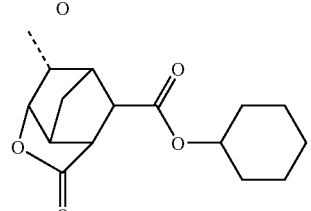
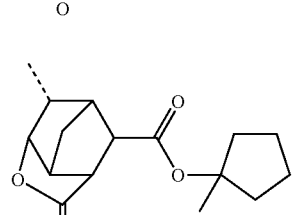
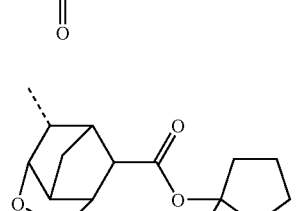
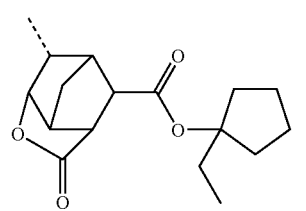
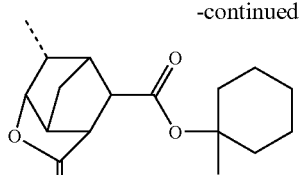
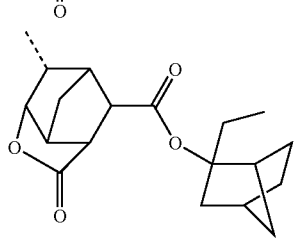
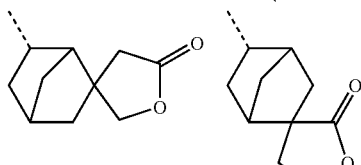
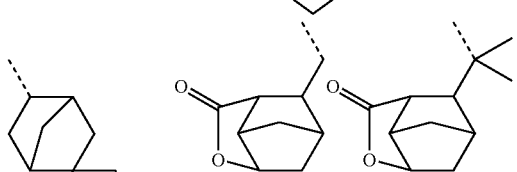
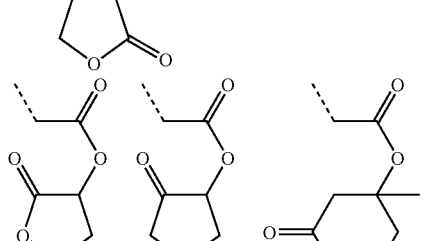
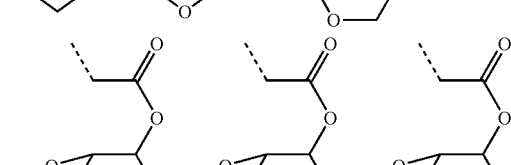
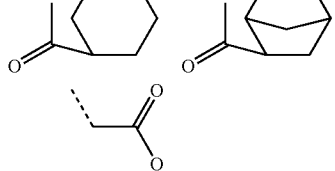
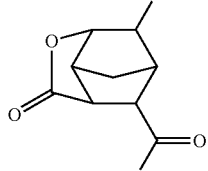
A proportion "t" of repeat units having lactone structure-containing group $R^{5B}$ is preferably $0 < t \leq 0.8$, more preferably $0.1 < t \leq 0.7$, and even more preferably $0.15 < t \leq 0.65$. Although values of t outside the range need not be positively excluded, sometimes a balance of properties required of resist material may be broken.

As depicted in formula (11) or (12), the acid labile group-containing repeat units represented by formula (1) or (2) which can afford a high resolution capability and a high sensitivity may be used in combination with repeat units of the following formula (15) or acidic repeat units having substituent $R^6$ of the following formula (16).

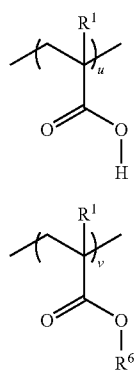

Examples of units of formula (15) include methacrylic acid and acrylic acid. Examples of substituent group $R^6$ are given below.

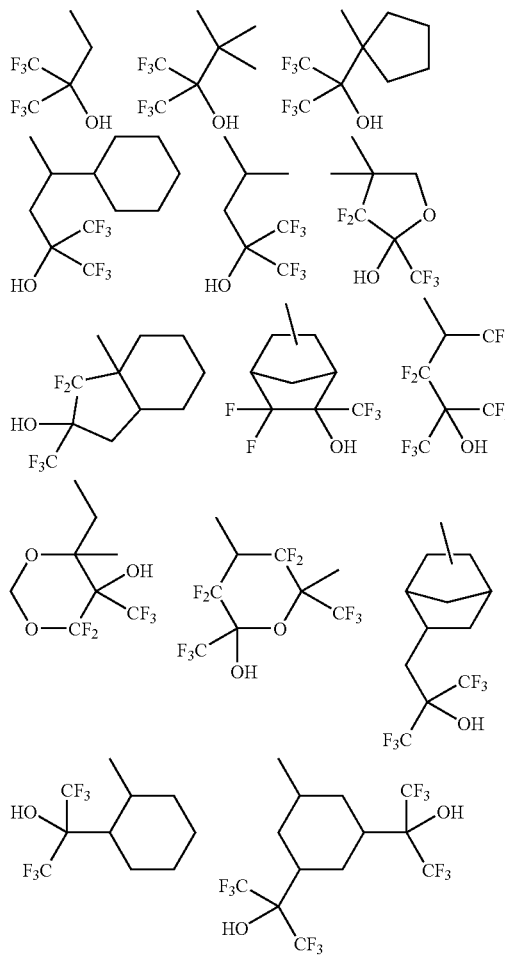

A proportion "u" of repeat units of formula (15) is preferably 0<u≤0.2, and more preferably 0<u≤0.1. A proportion "v" of acidic repeat units having substituent $R^6$ of formula (16) is preferably 0<v≤0.2, and more preferably 0<v≤0.1.

The polymer comprising the acid labile group-containing repeat units represented by formula (1) or (2) which can afford a high resolution capability and a high sensitivity may further comprise repeat units having another acid labile group, lactone-containing repeat units, and acidic repeat units as described above. The polymer may further comprise additional repeat units, as shown below, in a proportion of 0 to 30 mol %, especially 0 to 20 mol %.

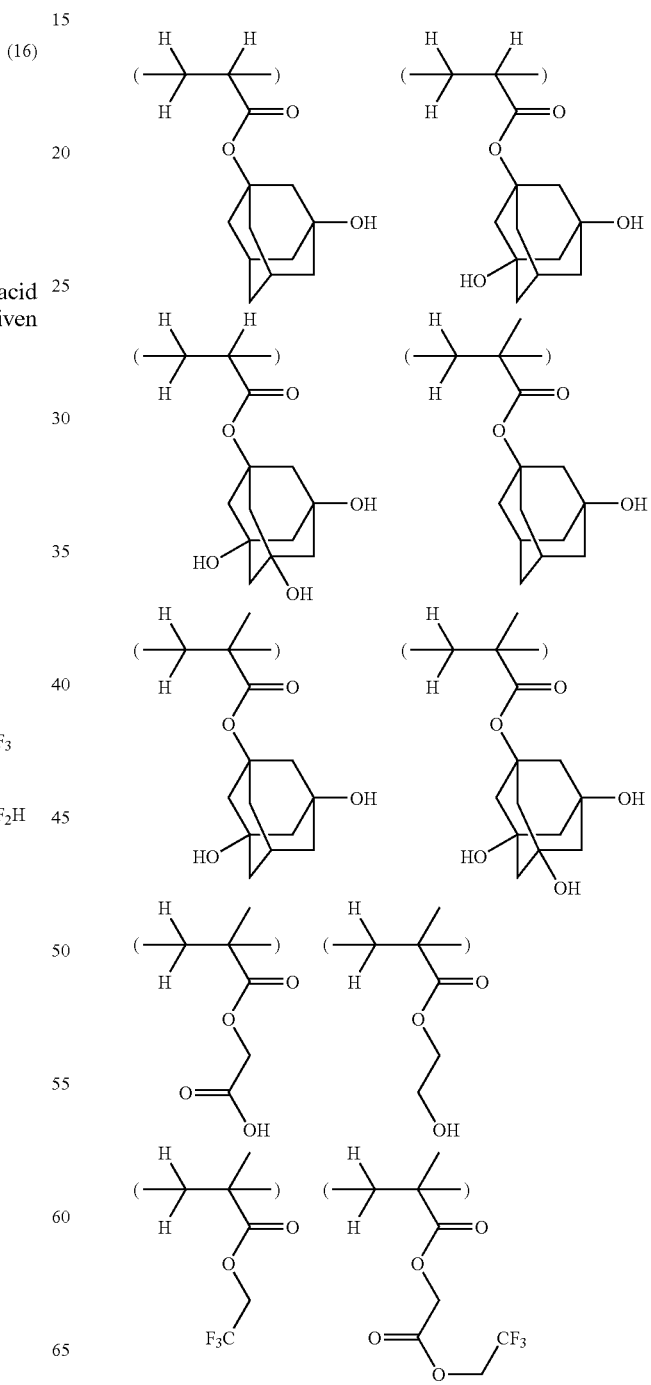

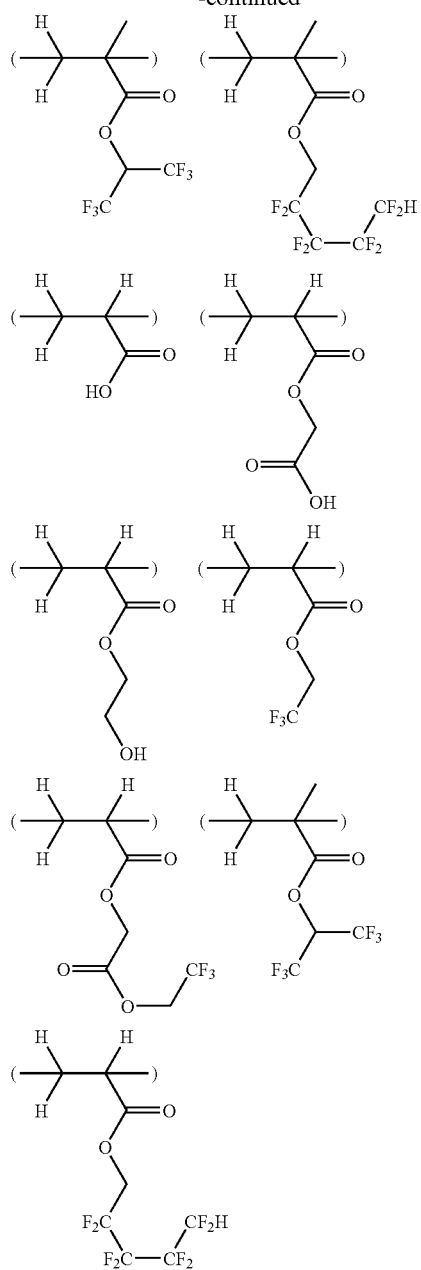
Examples of the polymer comprising the acid labile group-containing repeat units represented by formula (1) or (2) which can afford a high resolution capability and a high sensitivity are shown below, but not limited thereto.
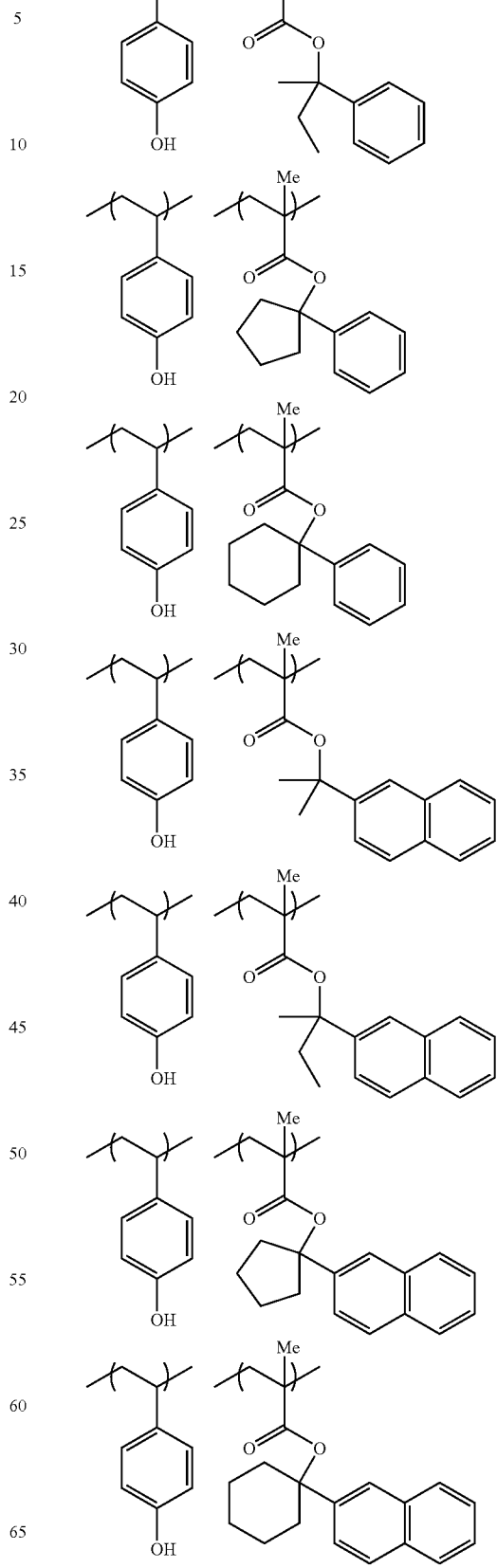

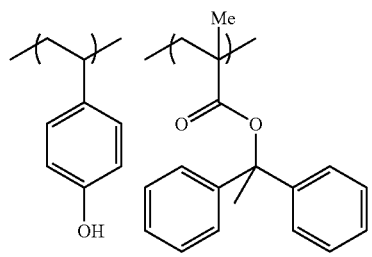
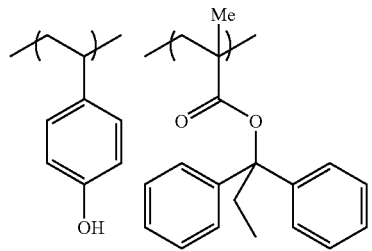
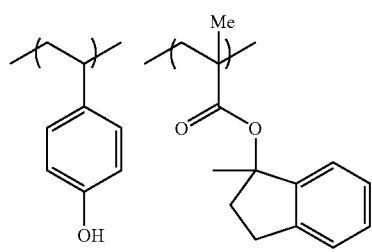
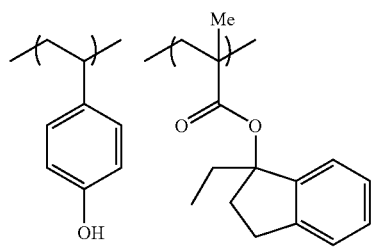
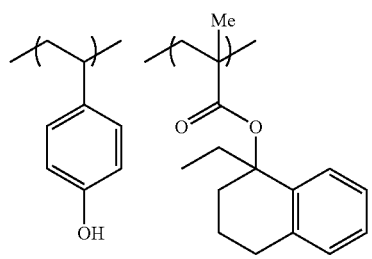
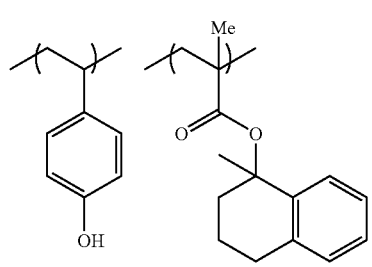
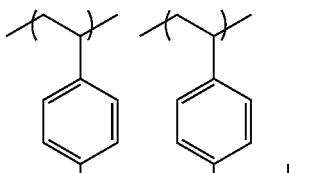
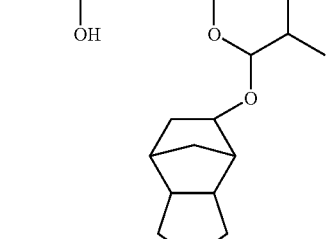
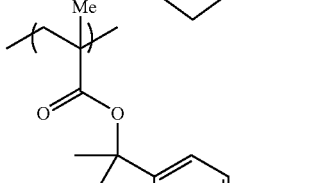
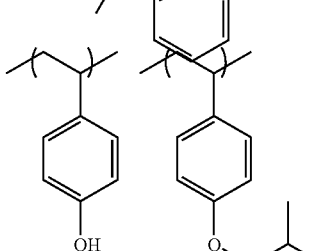
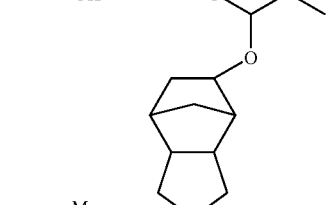
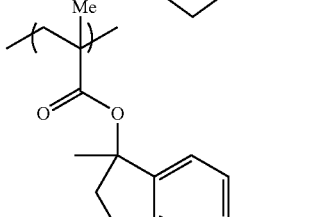
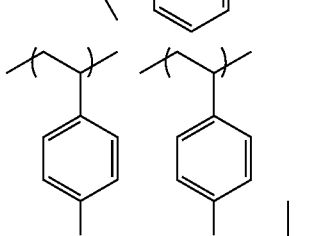
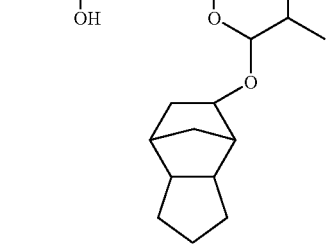

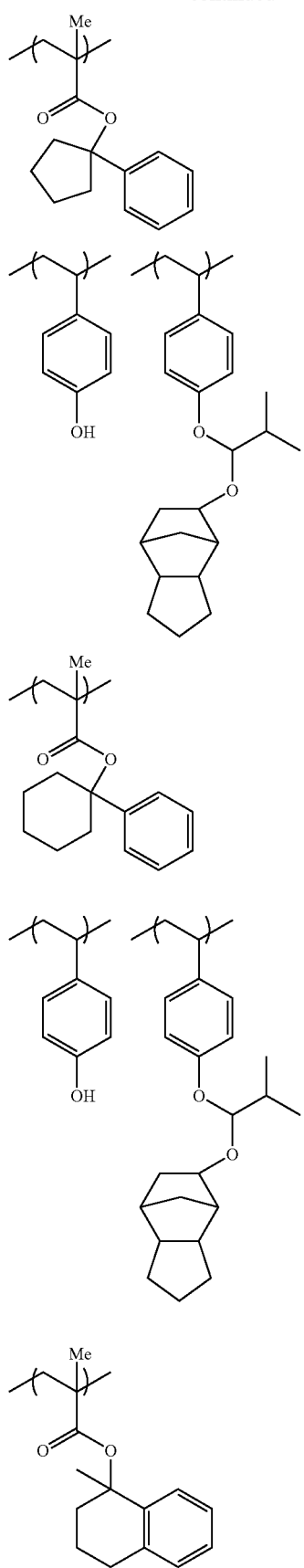
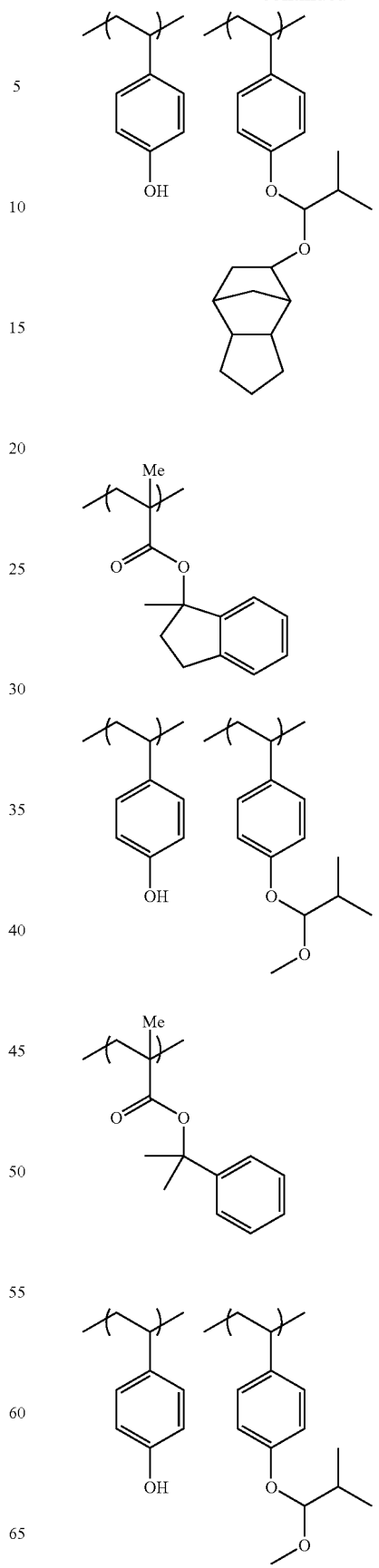

51
-continued
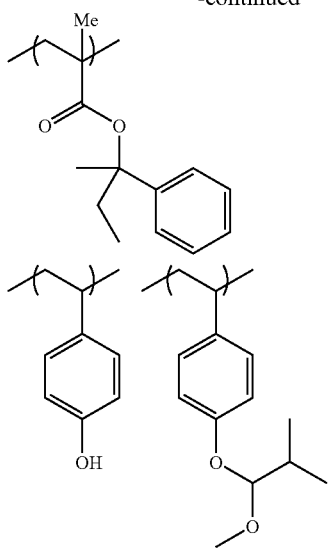
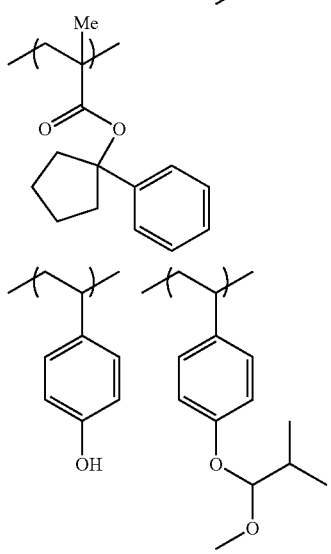
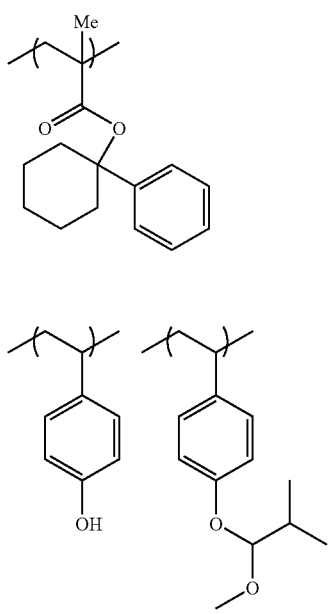
52
-continued
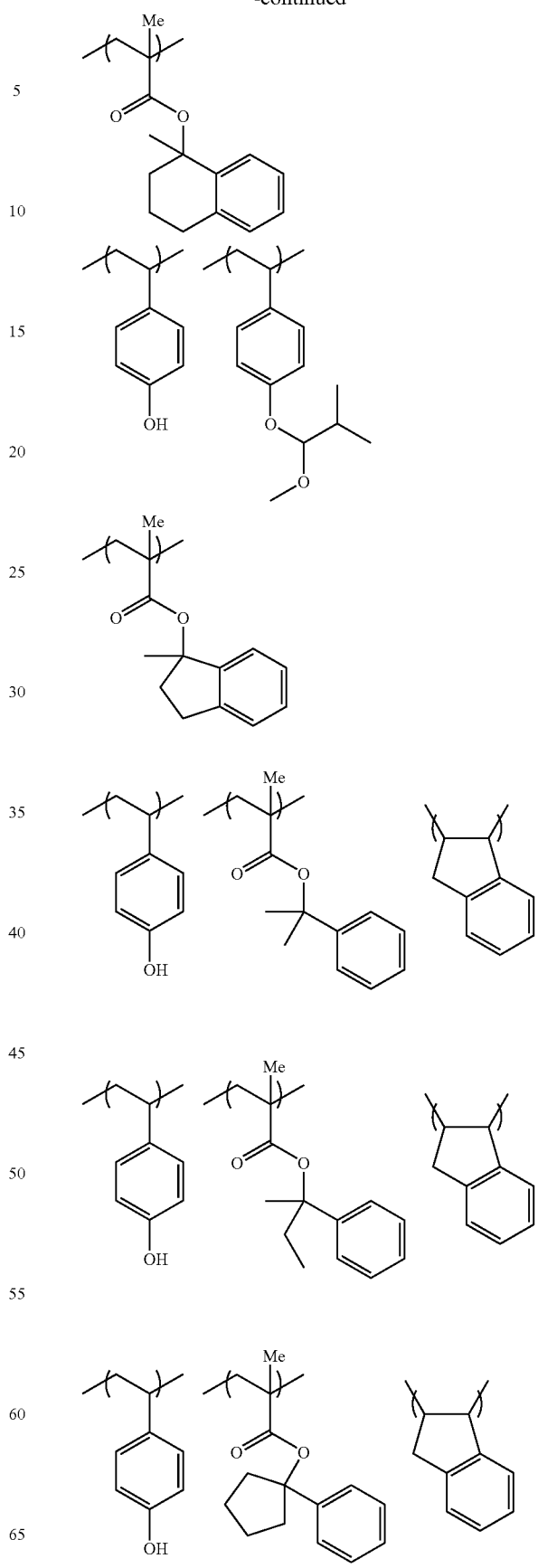

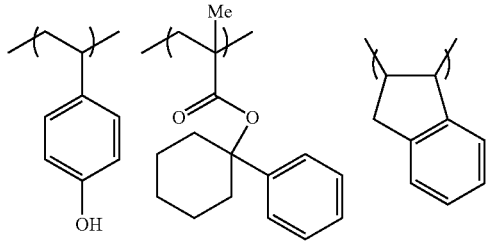
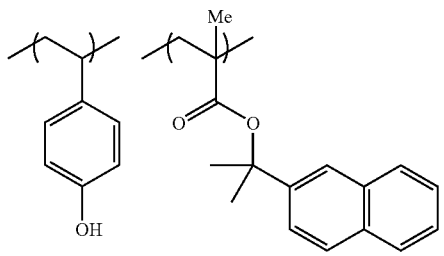
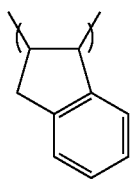
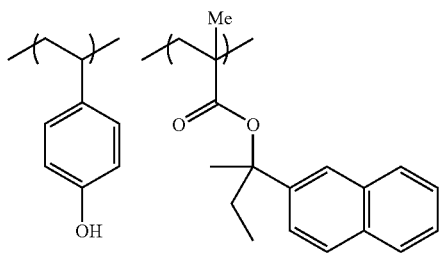
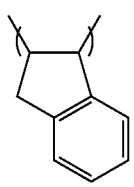
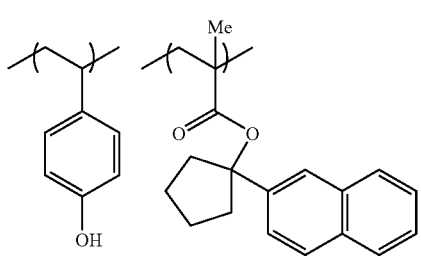
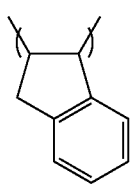
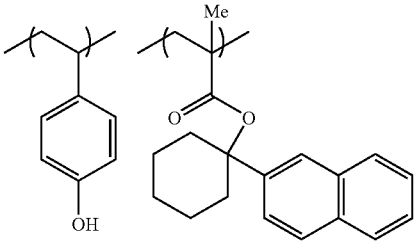
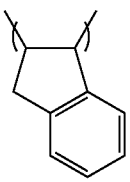
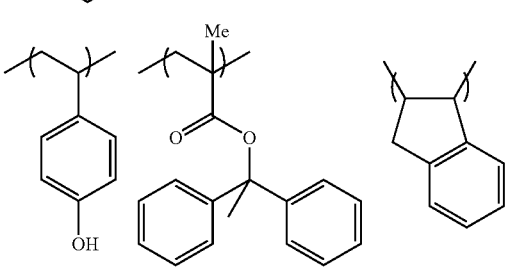
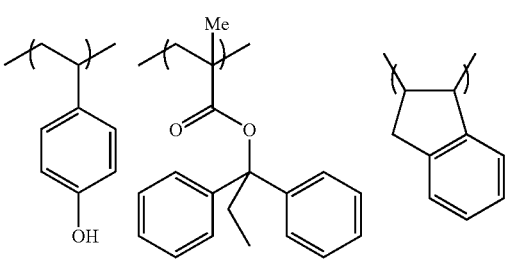
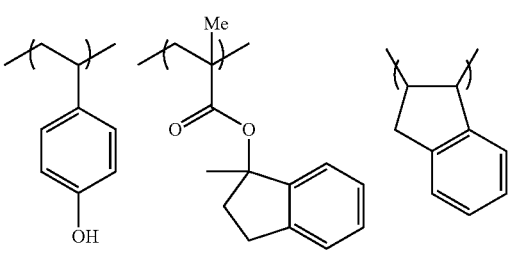
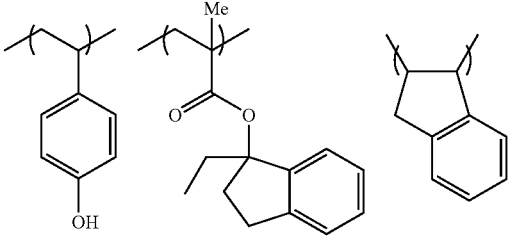
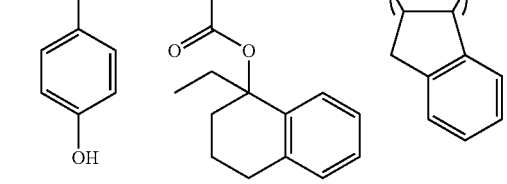

-continued
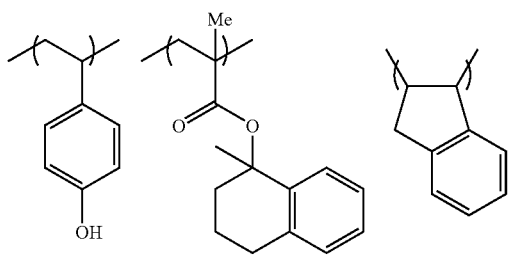
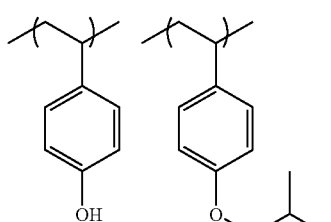
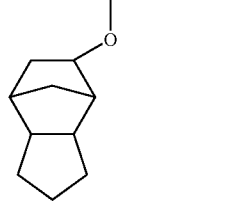
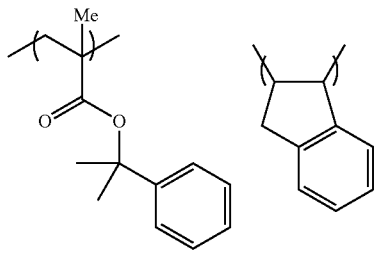
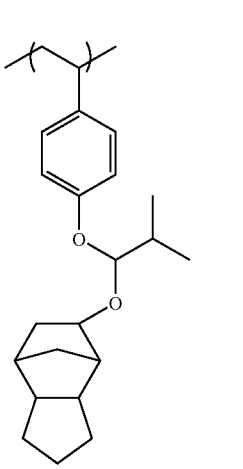
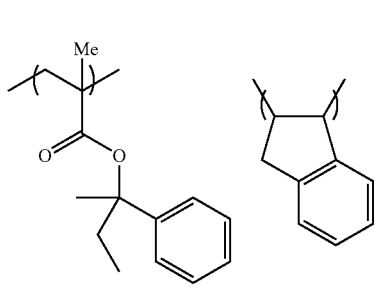
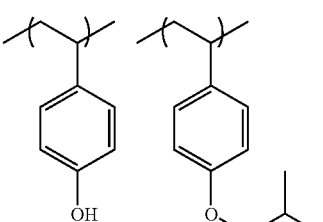
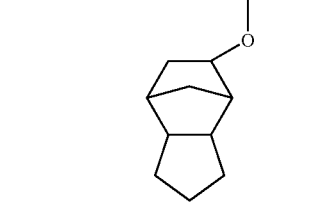
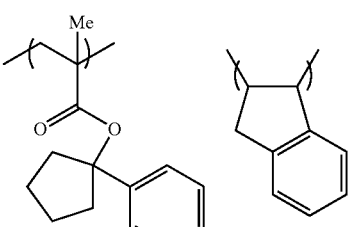
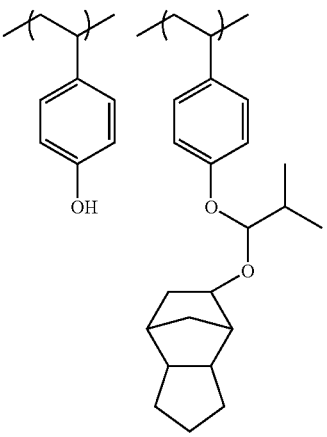
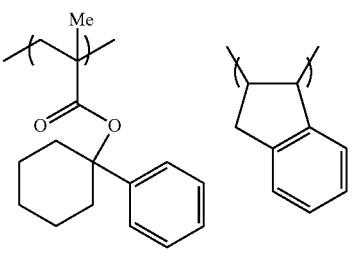

57
-continued
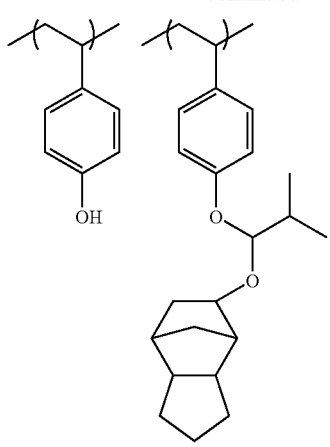
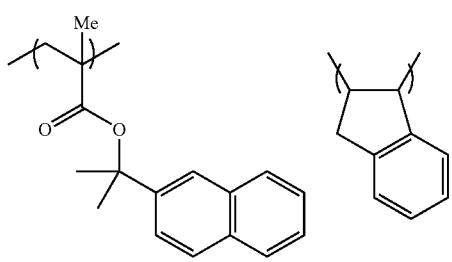
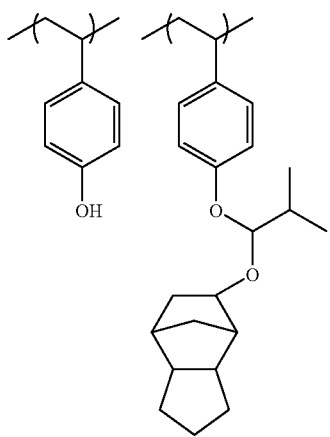
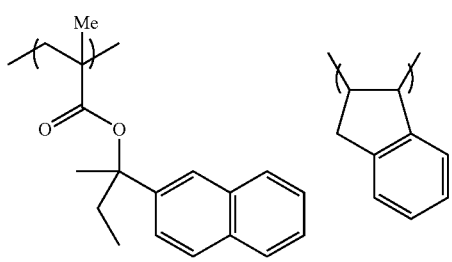
58
-continued
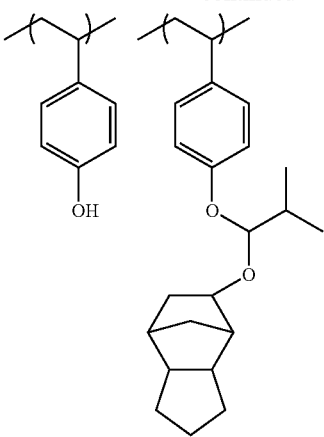
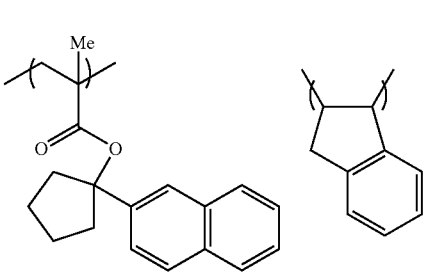
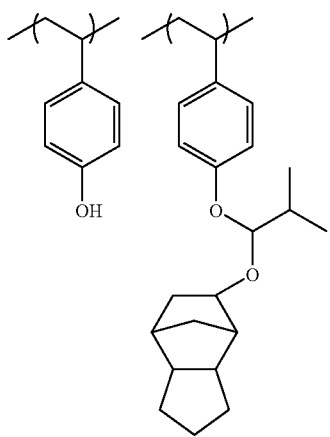
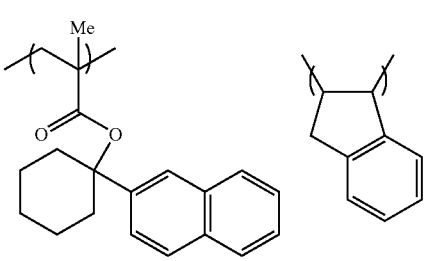

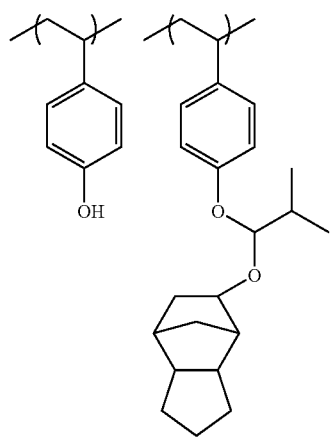
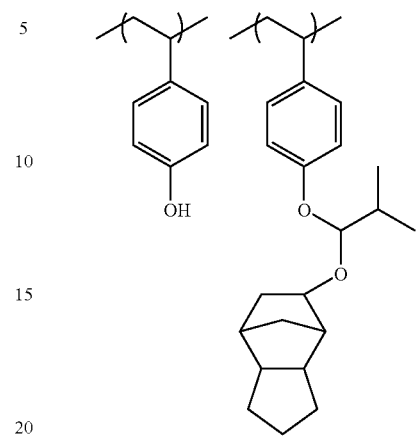
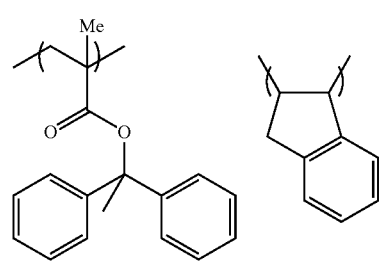
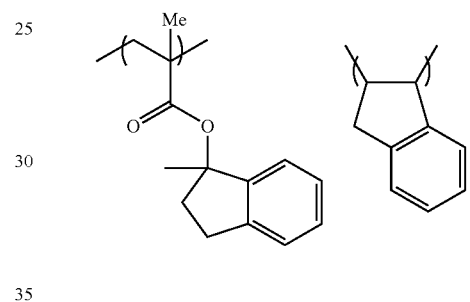
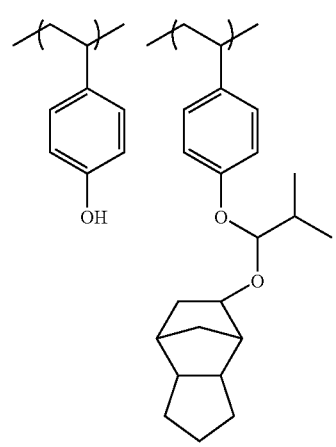
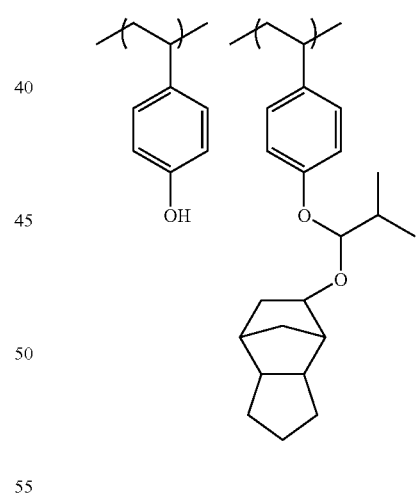
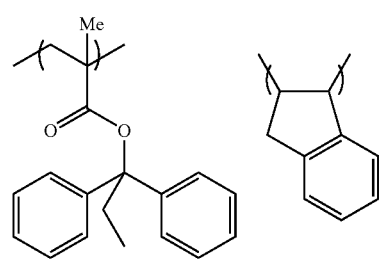
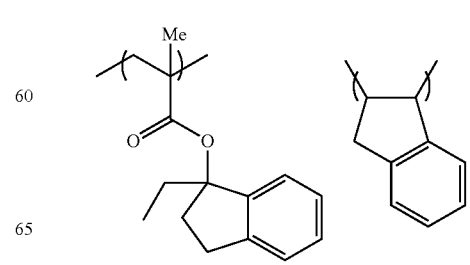

61
-continued
62
-continued
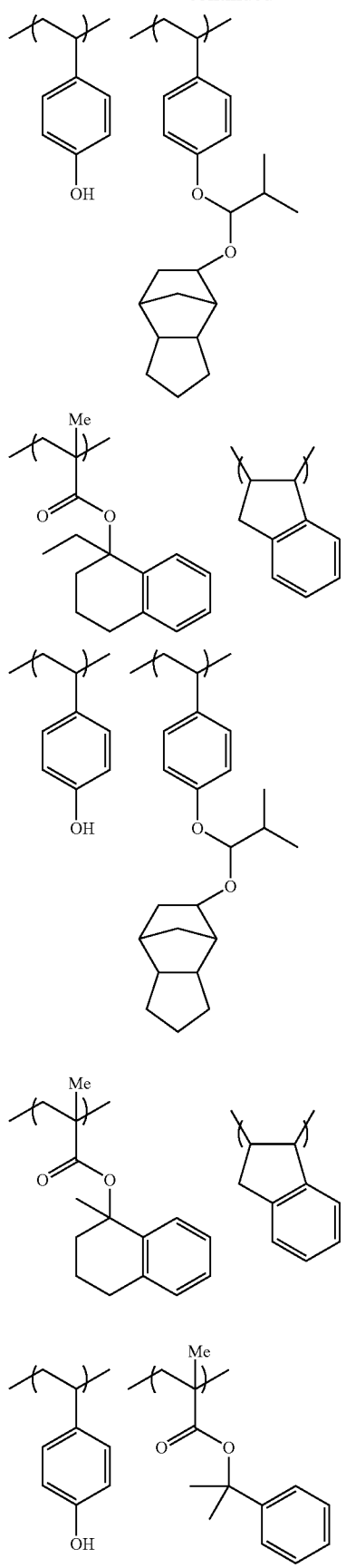
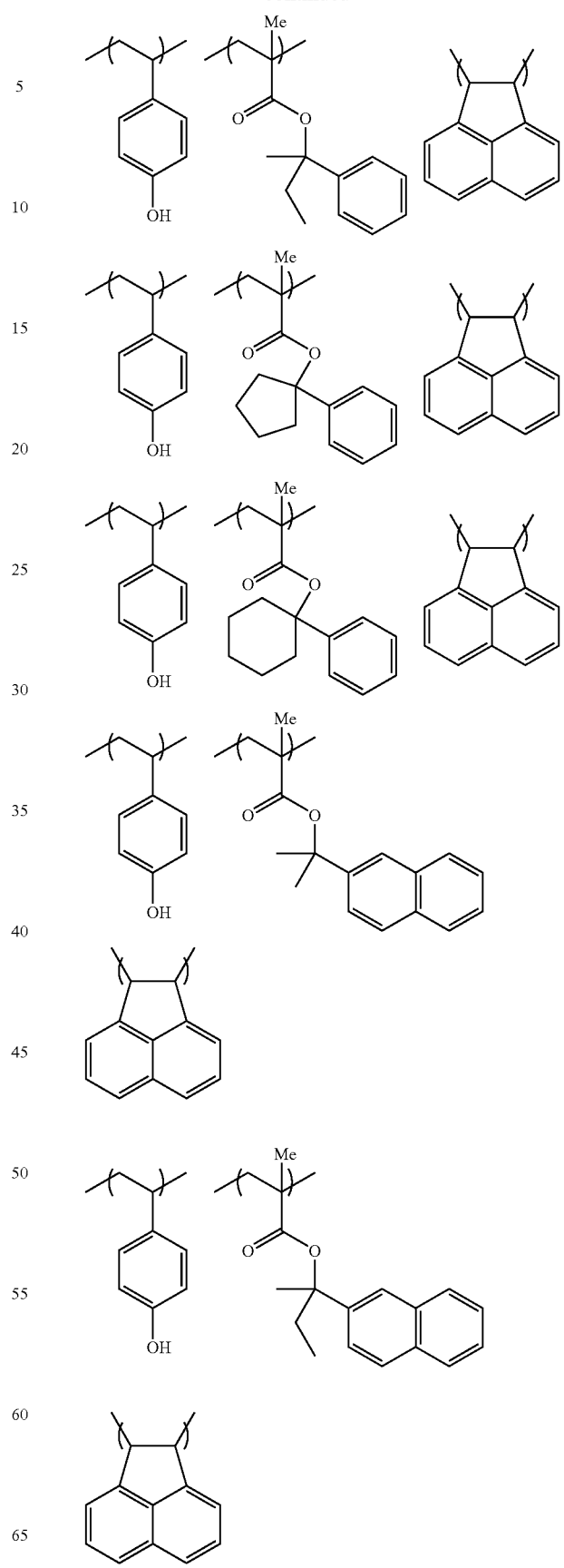

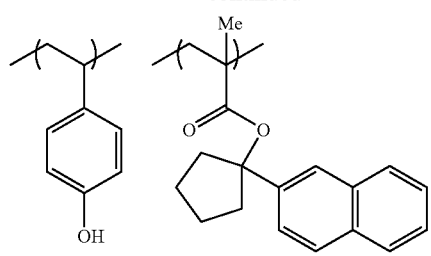
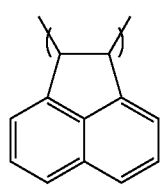
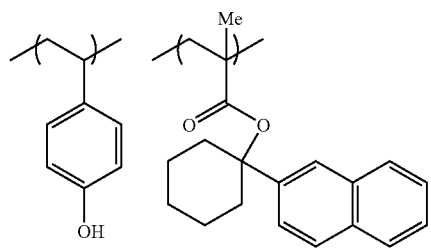
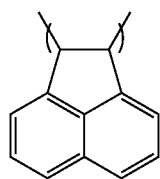
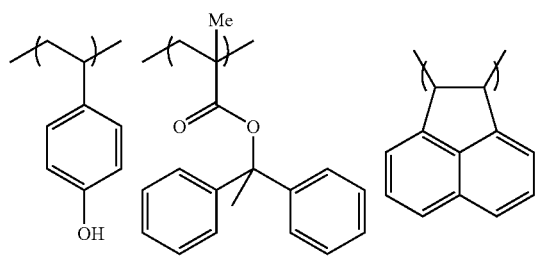
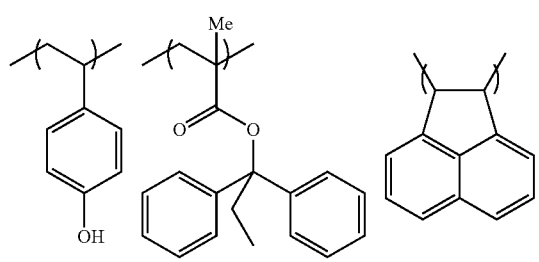
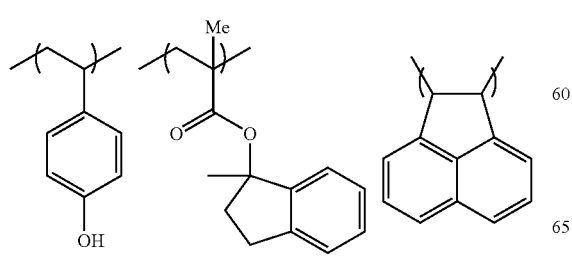
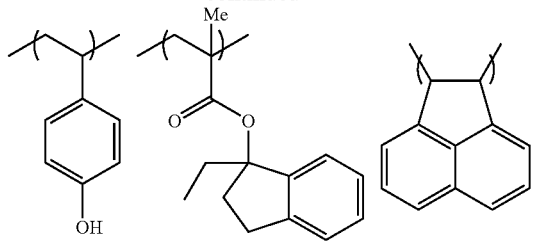
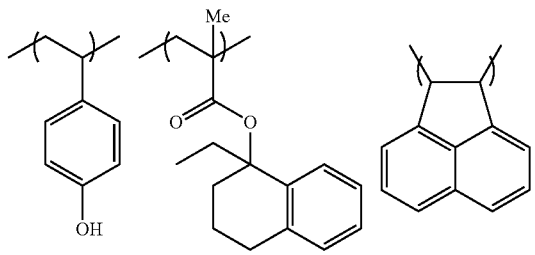
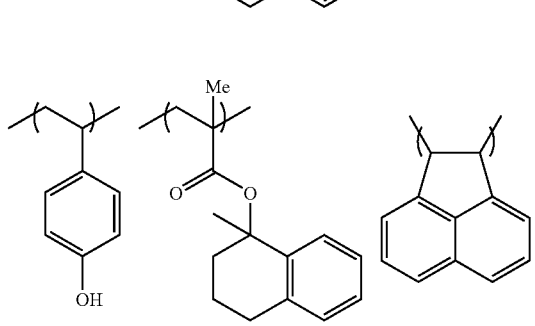
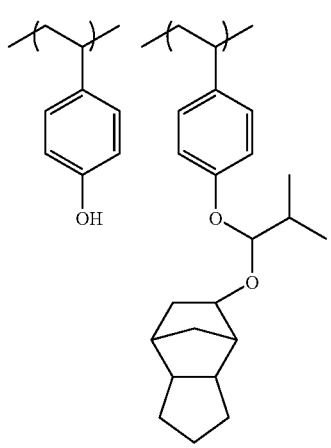
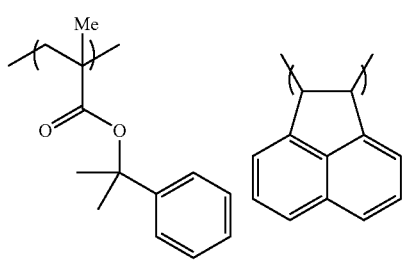

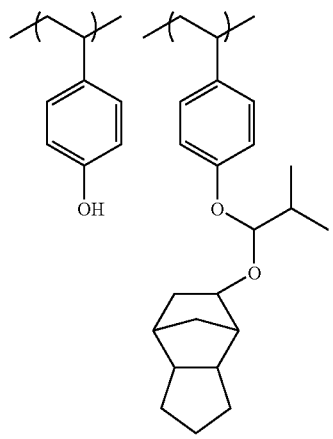
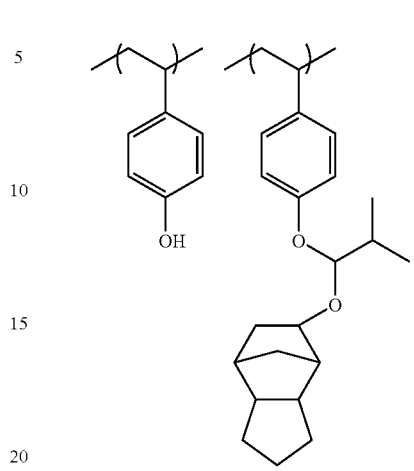
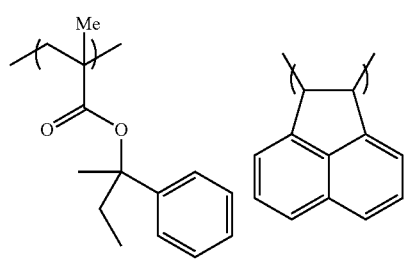
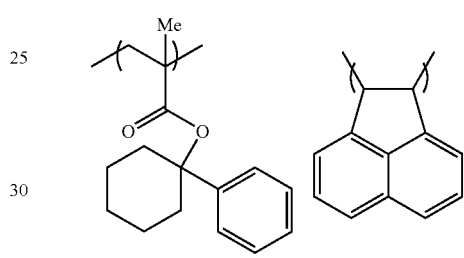
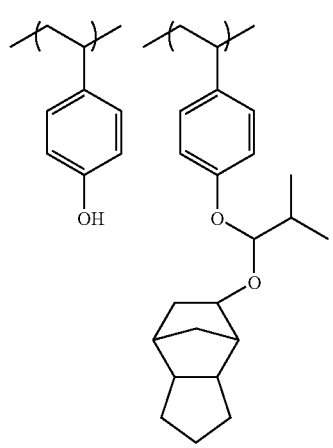
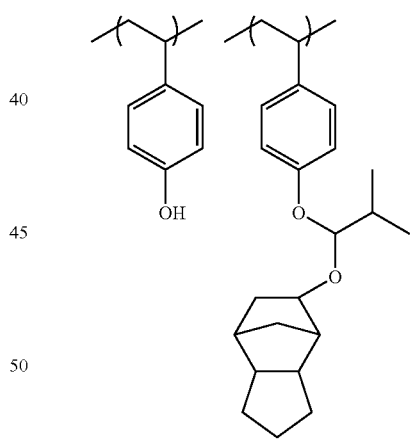
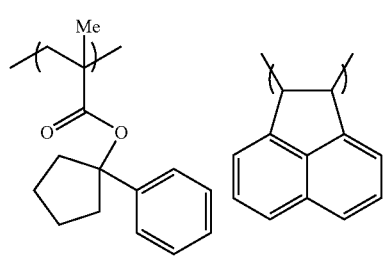
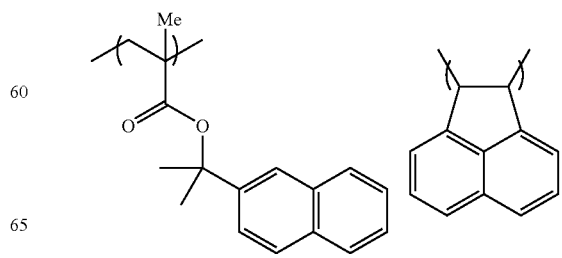

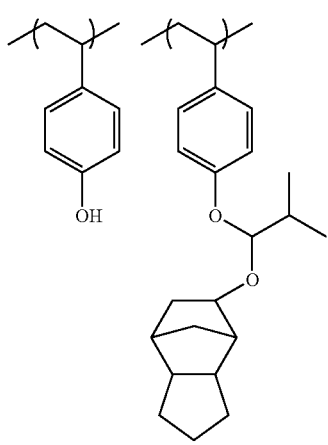
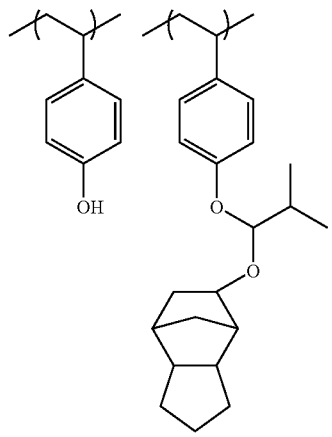
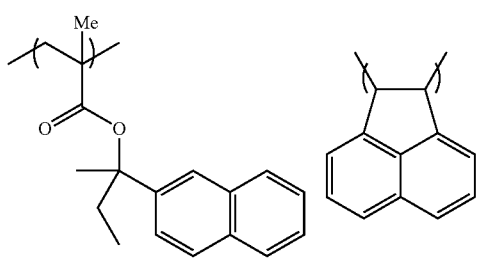
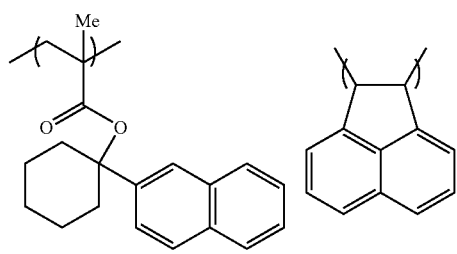
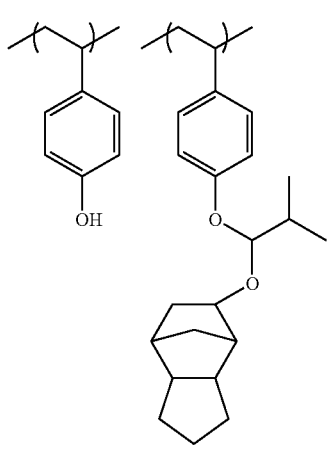
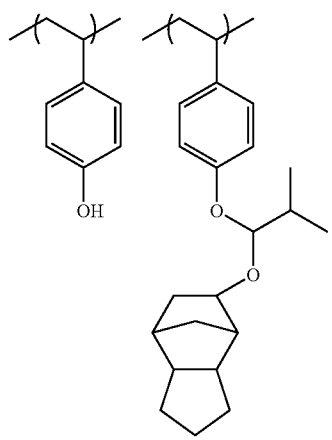
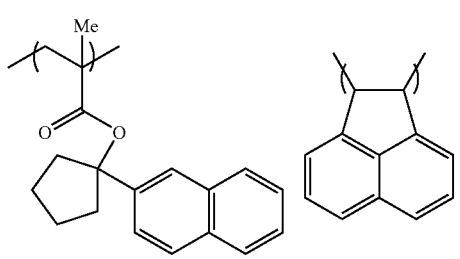
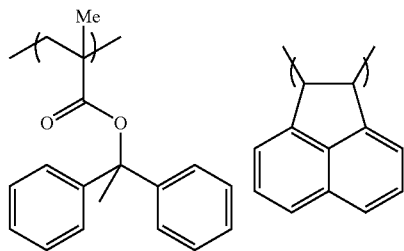

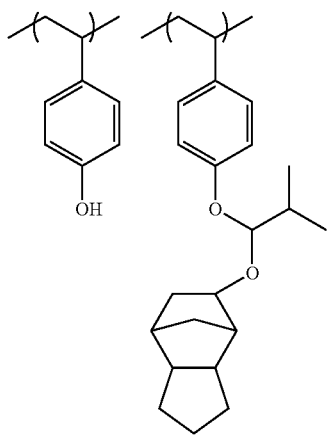
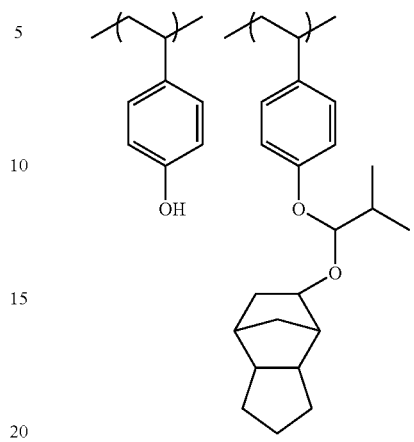
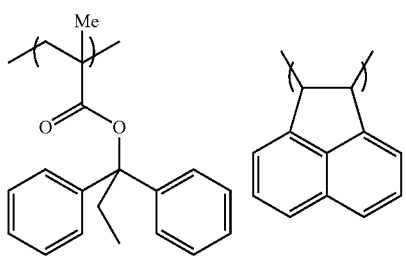
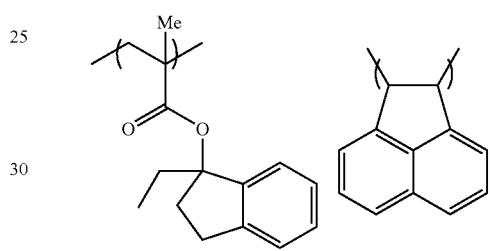
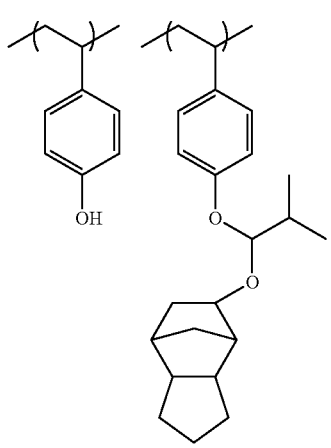
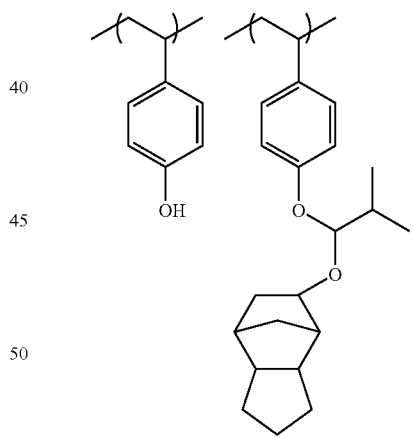
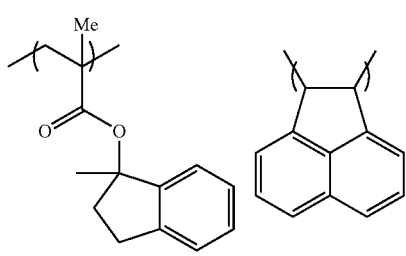
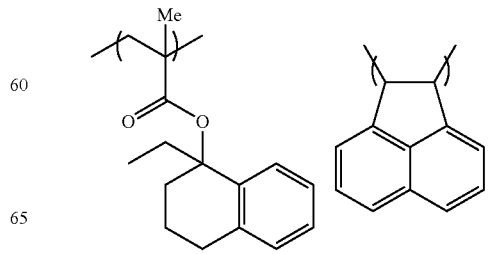

-continued
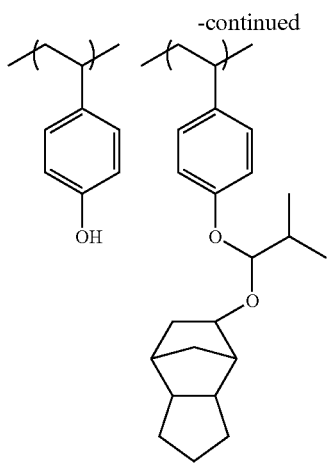
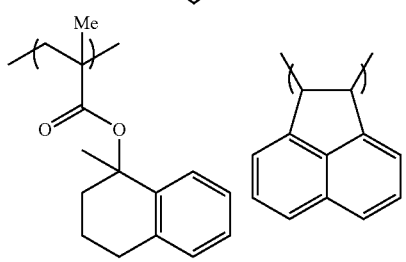
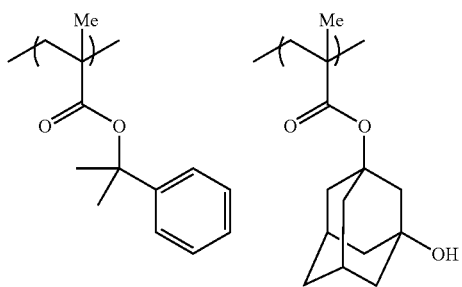
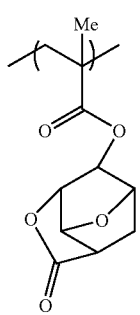
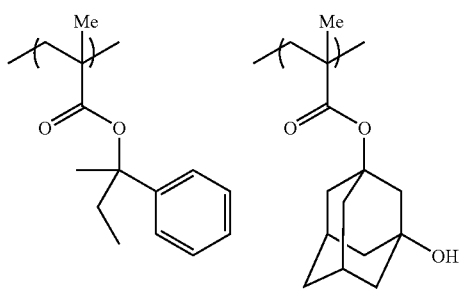
-continued
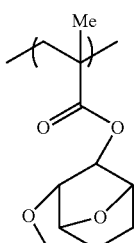
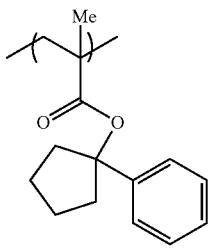
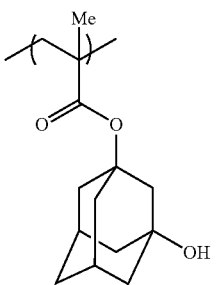
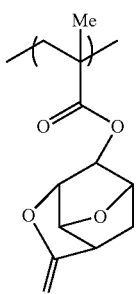
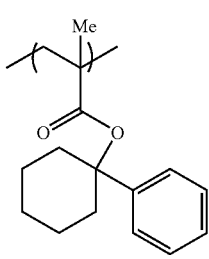
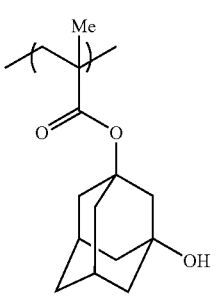
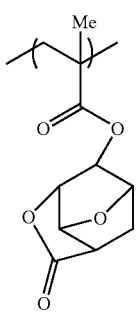

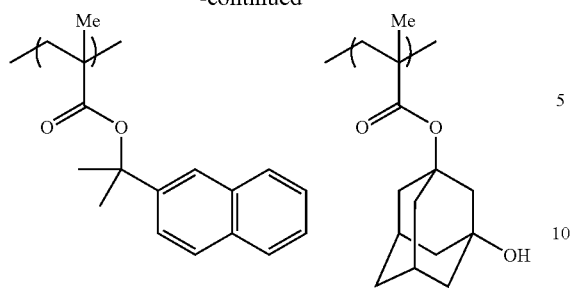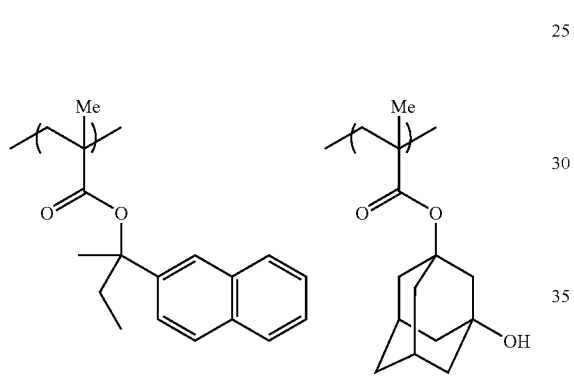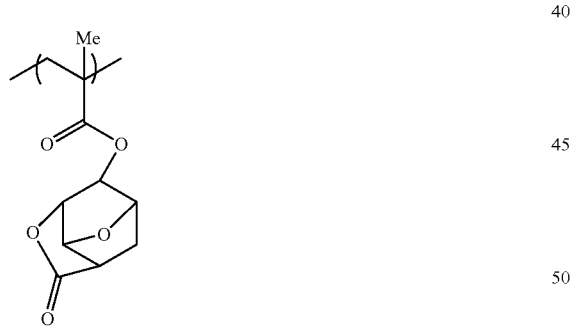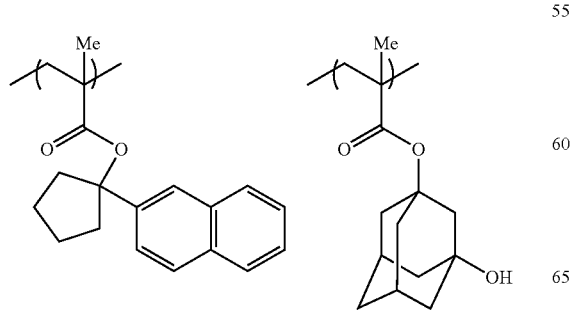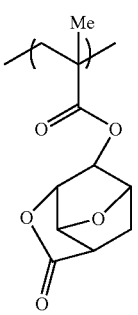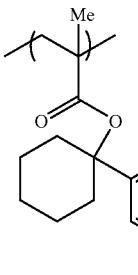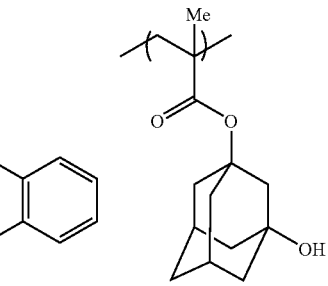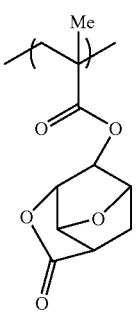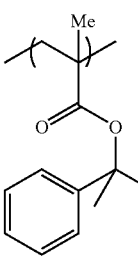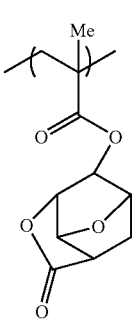

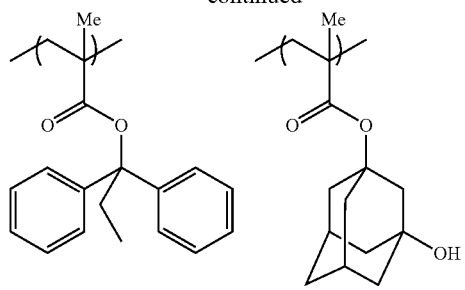
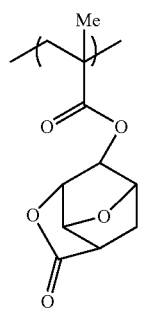
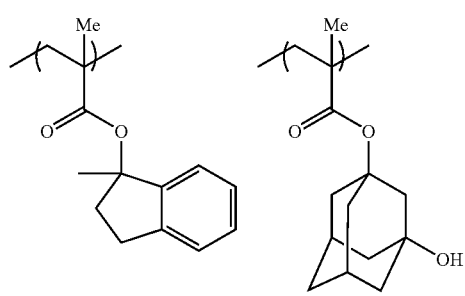
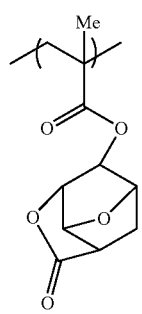
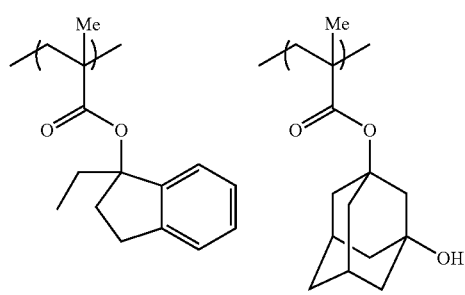
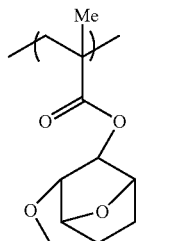
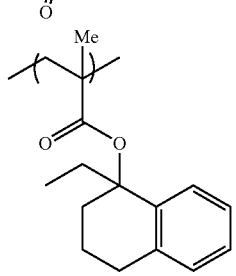
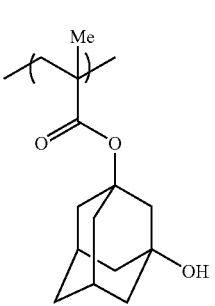
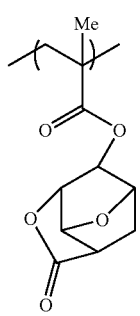
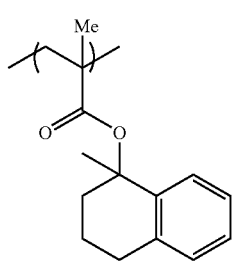
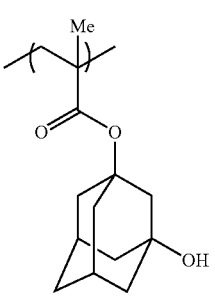
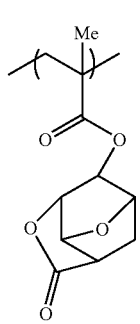

77
-continued
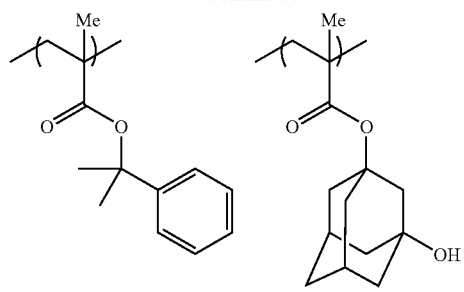
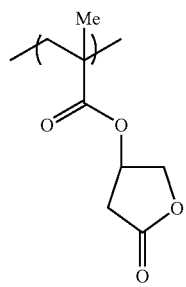
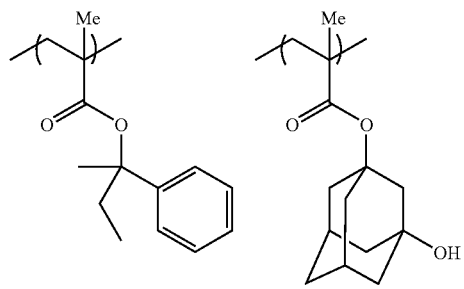
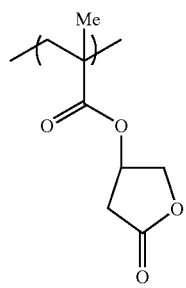
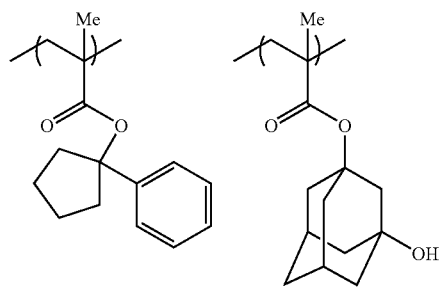
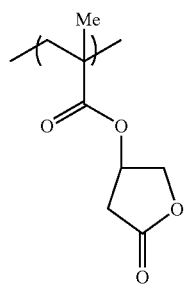
78
-continued
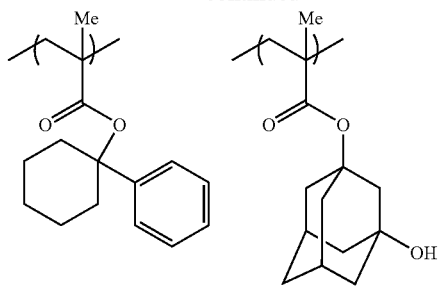
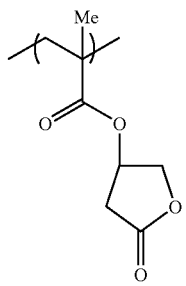
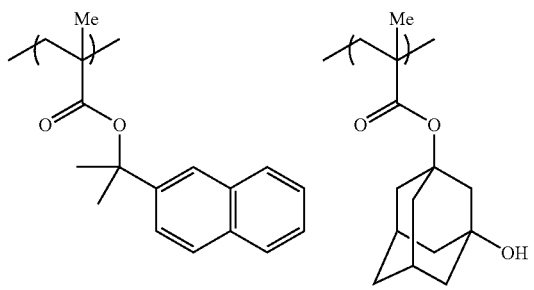
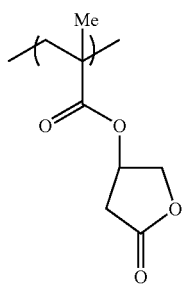
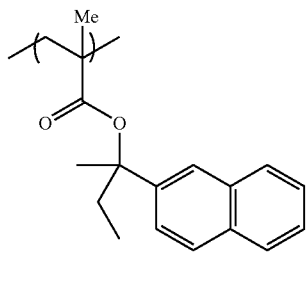
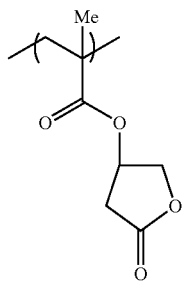

-continued
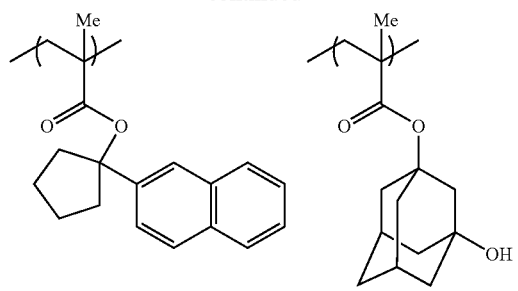
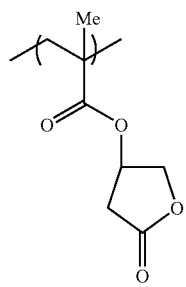
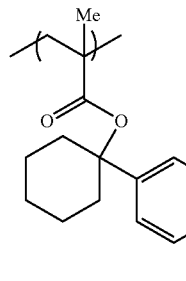
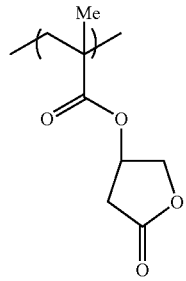
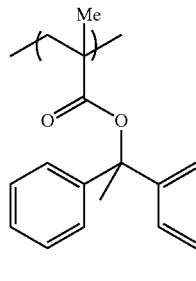
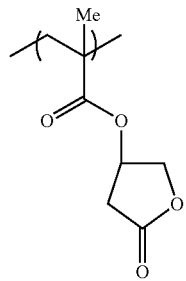
-continued
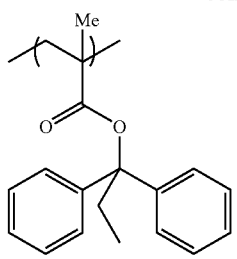
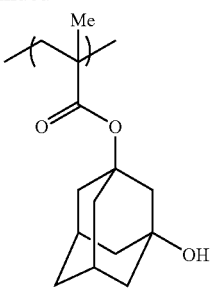
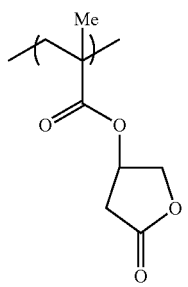
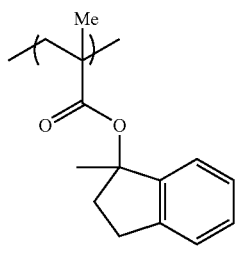
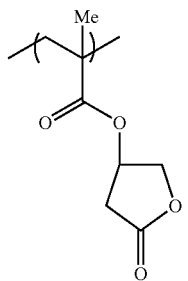
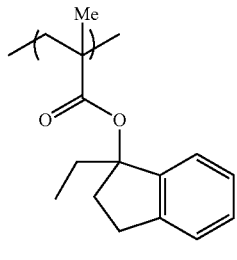
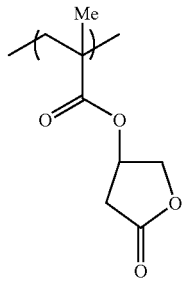

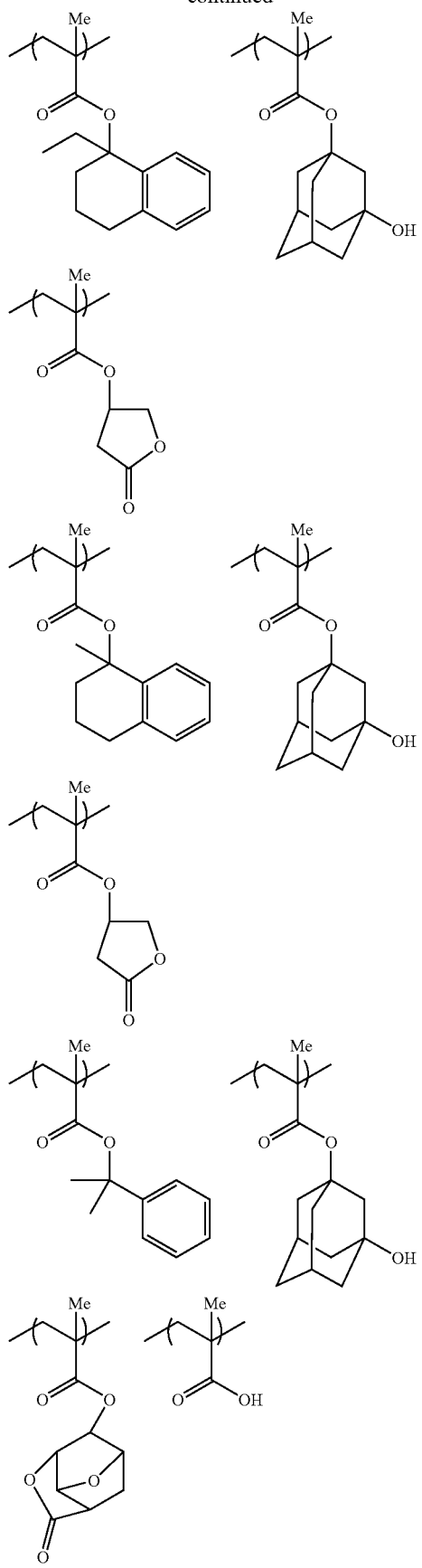
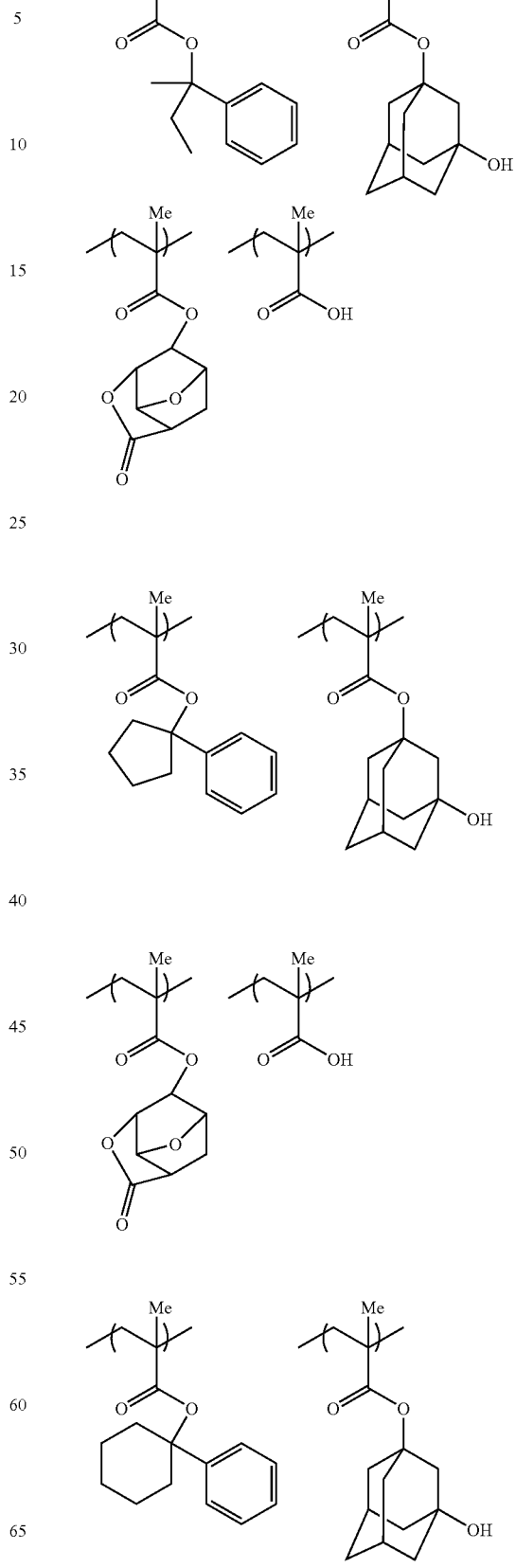

83
-continued
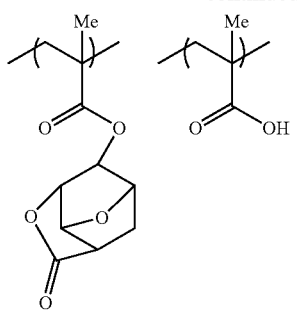
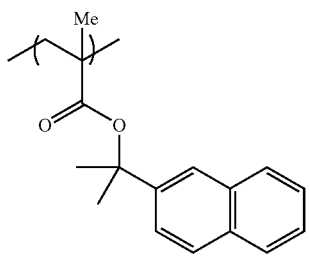
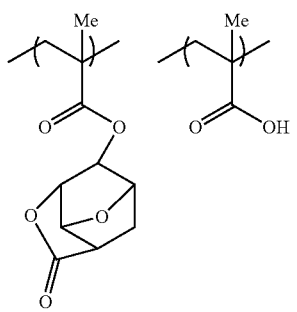
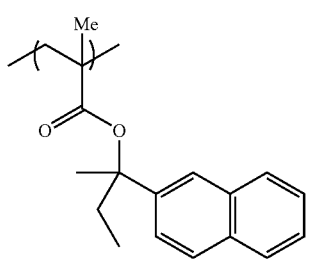
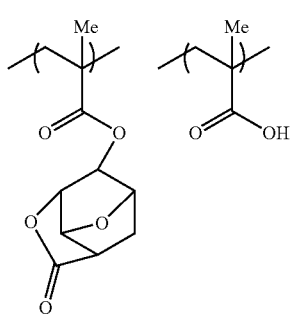
84
-continued
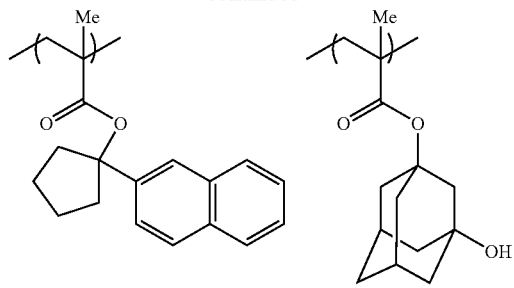
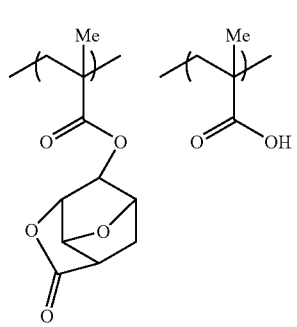
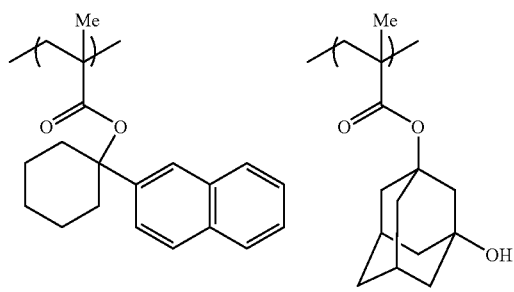
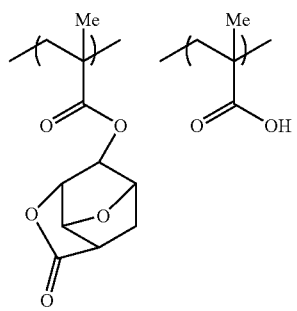
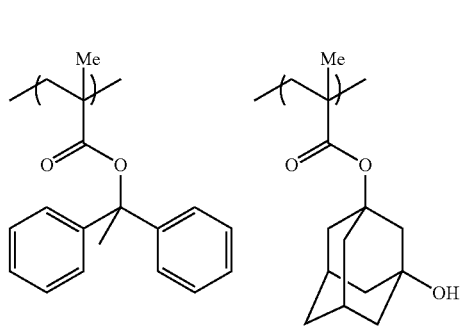

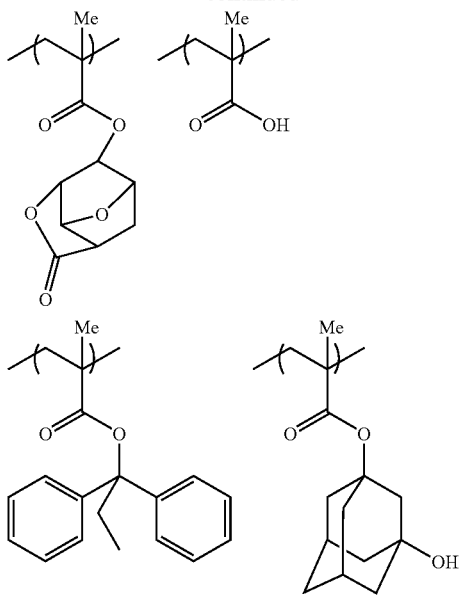
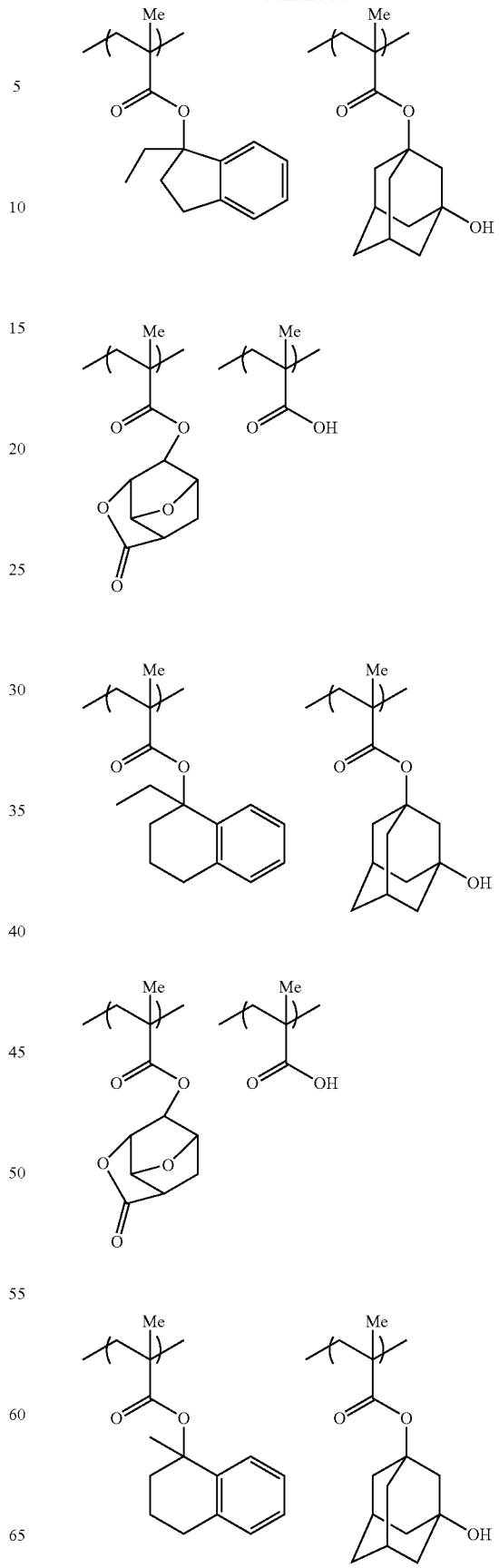

87
-continued
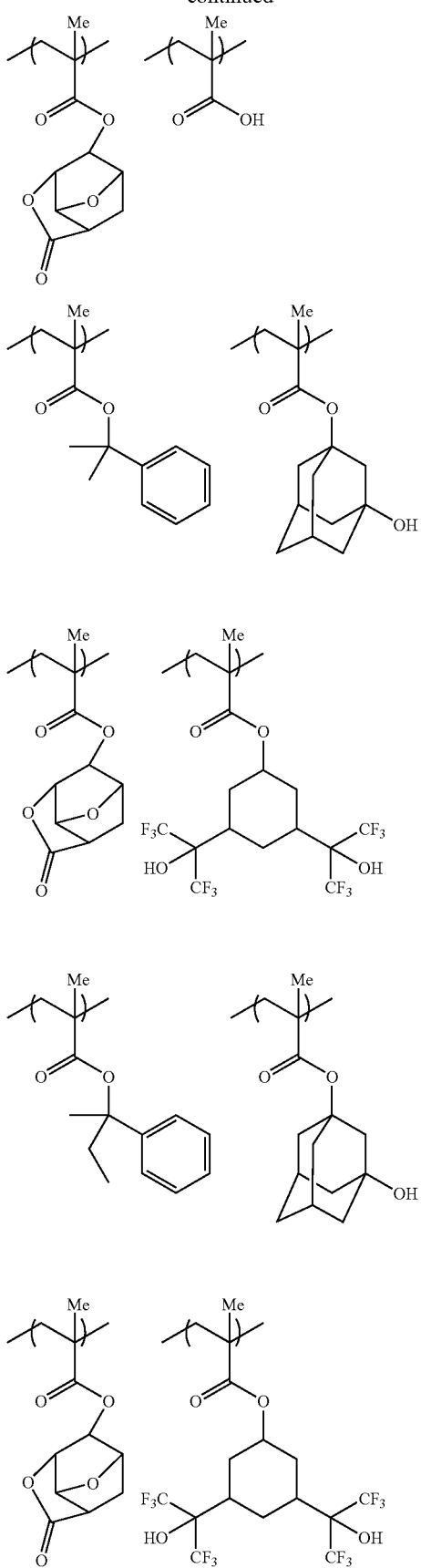
88
-continued
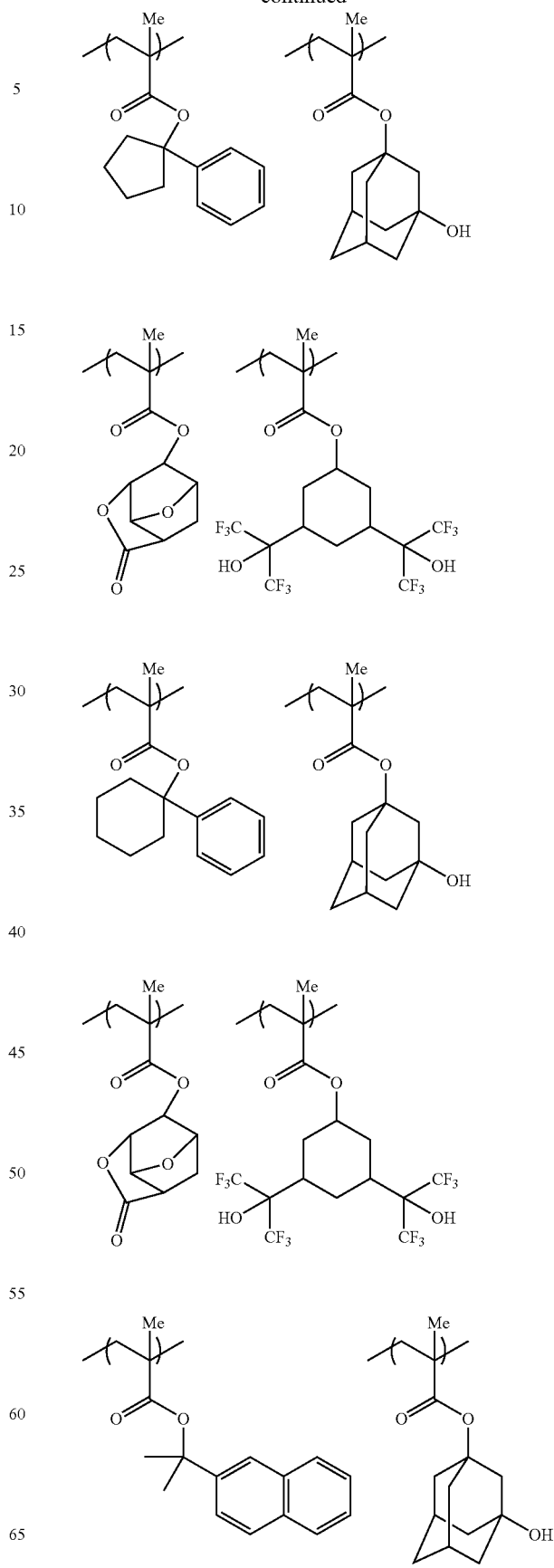

89
-continued
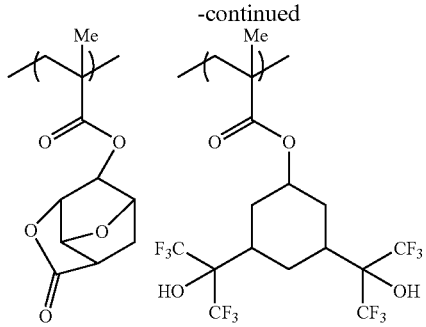
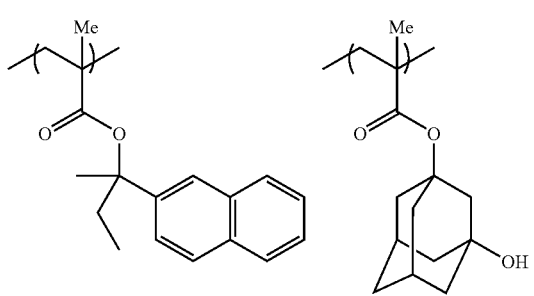
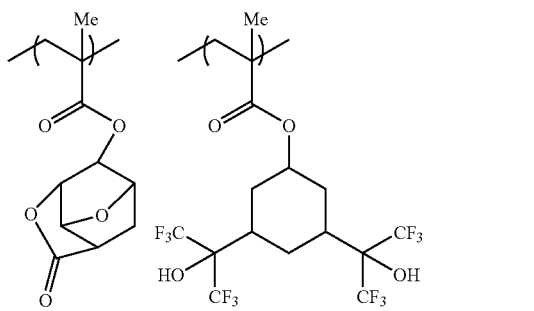
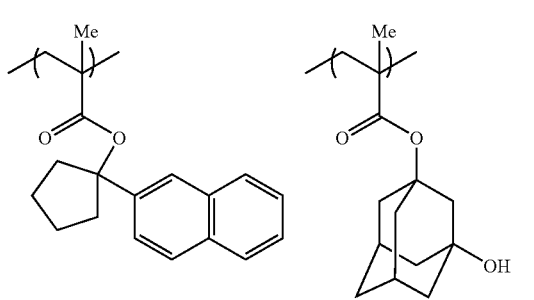
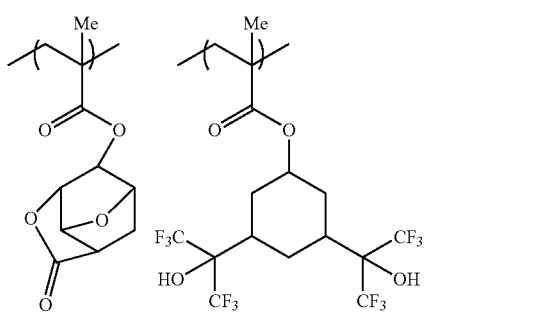
90
-continued
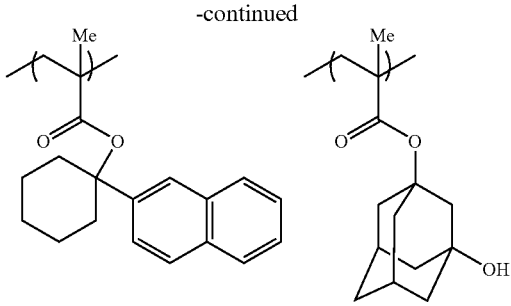
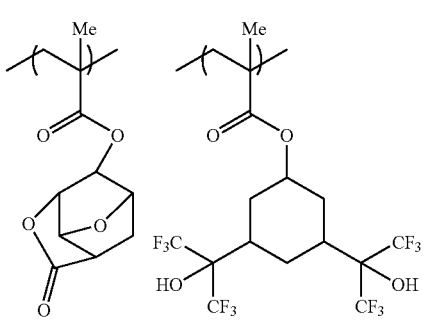
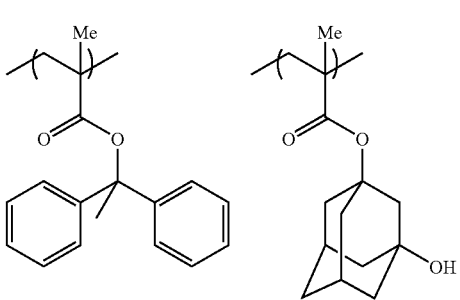
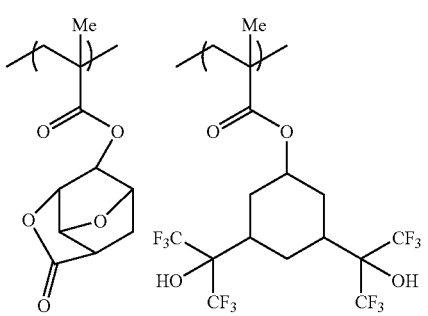
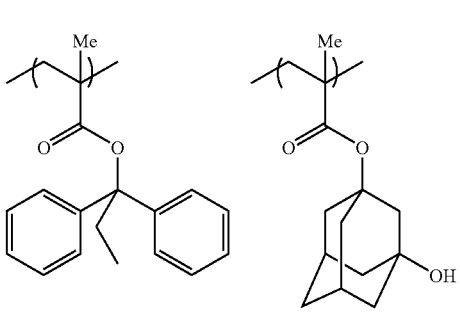

91
-continued
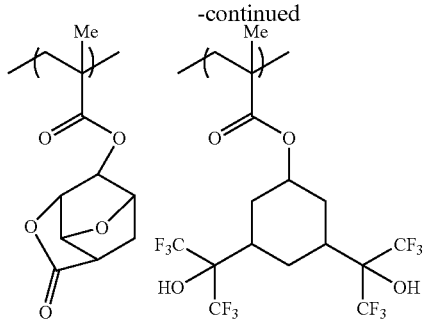
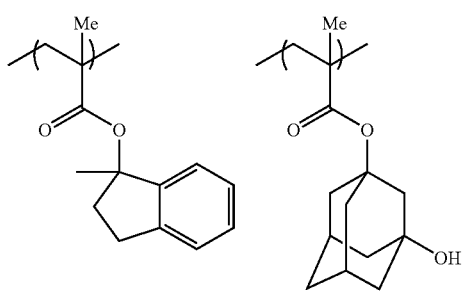
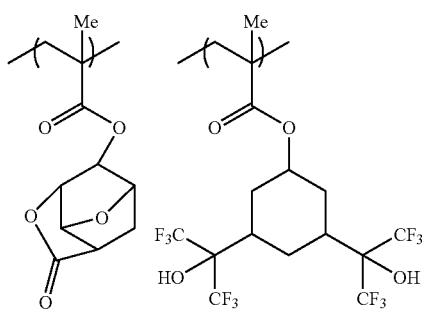
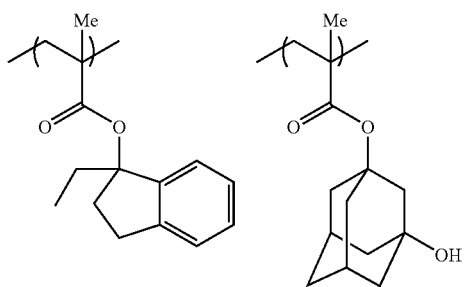
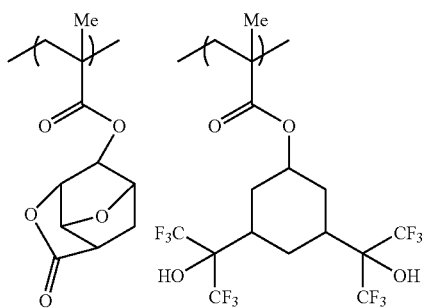
92
-continued
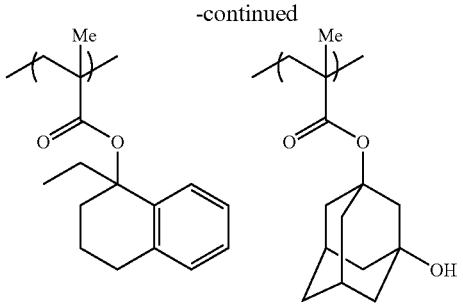
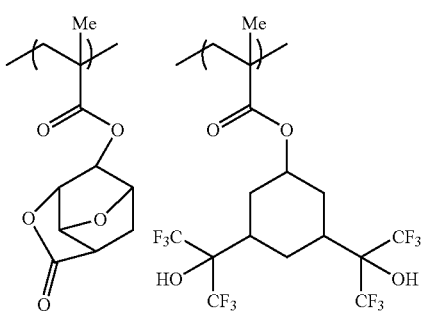
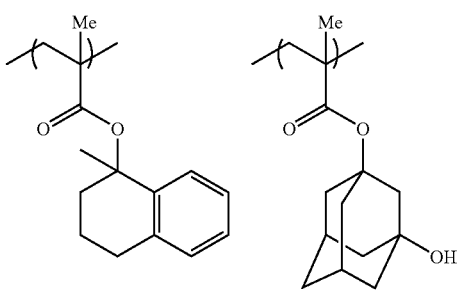
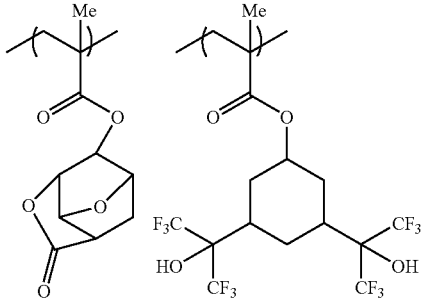
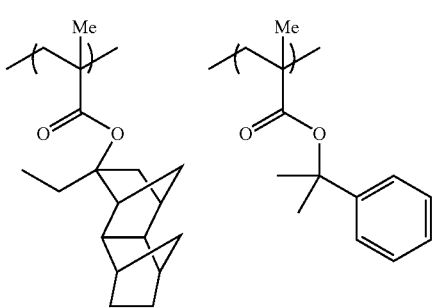

93
-continued
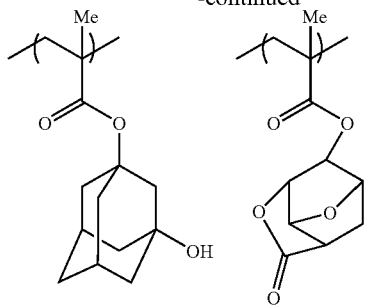
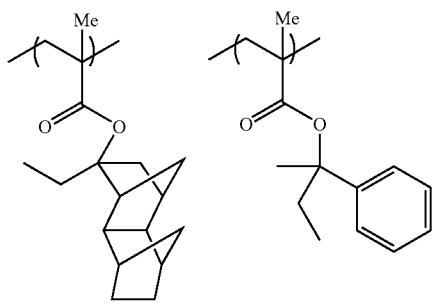
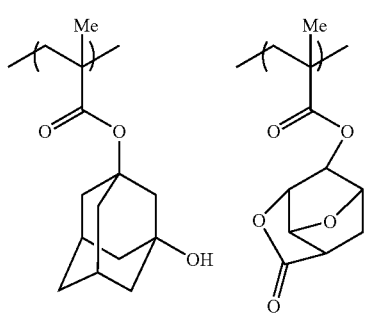
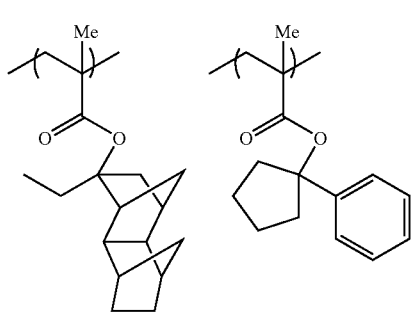
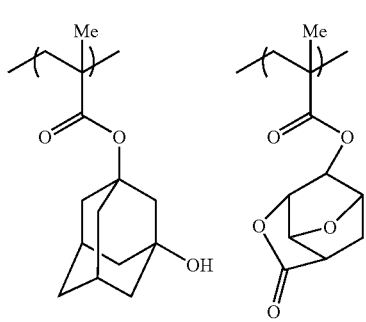
94
-continued
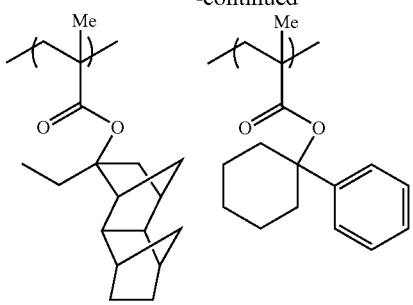
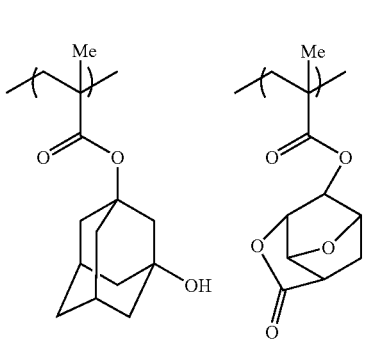
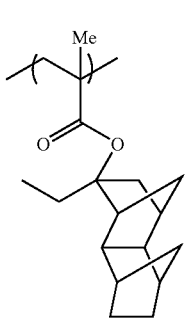
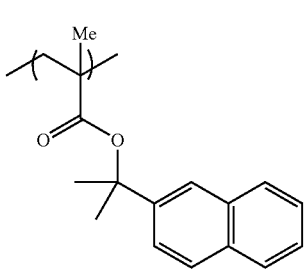
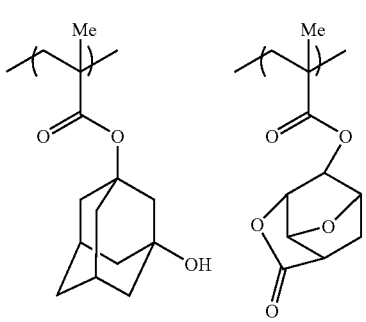

-continued
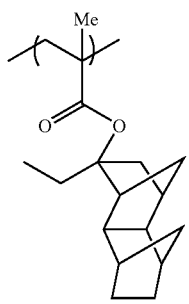
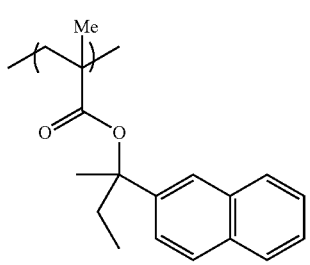
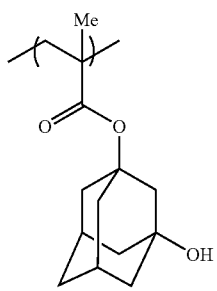
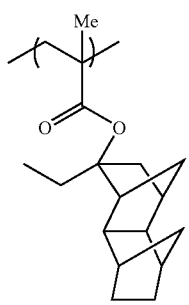
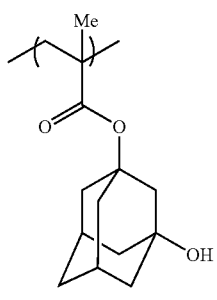
-continued
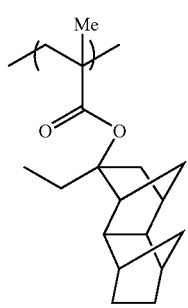 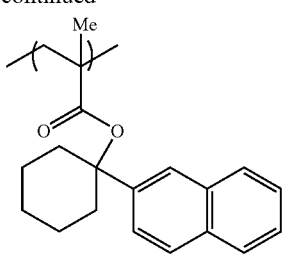
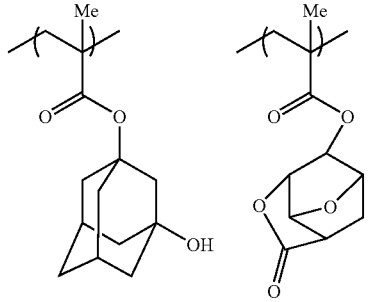
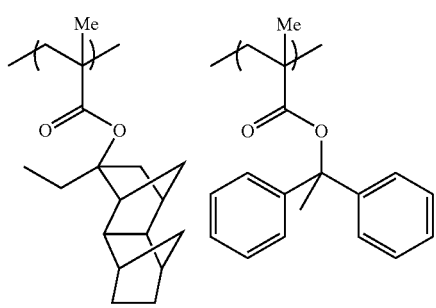
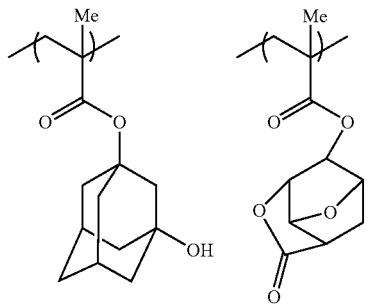
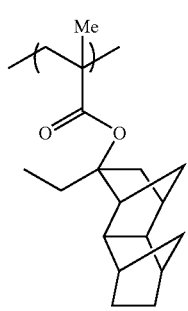

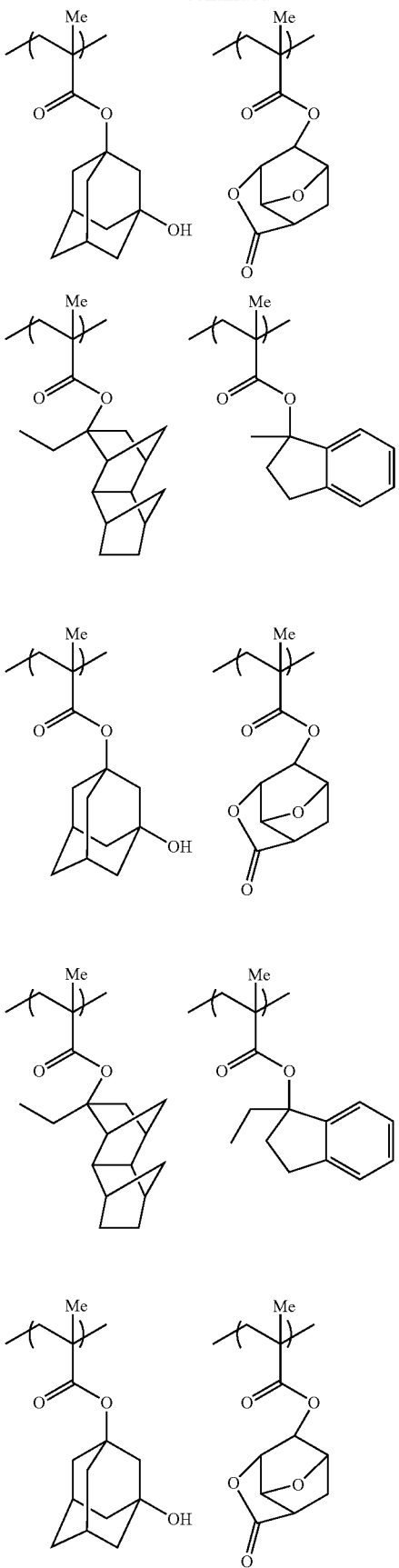
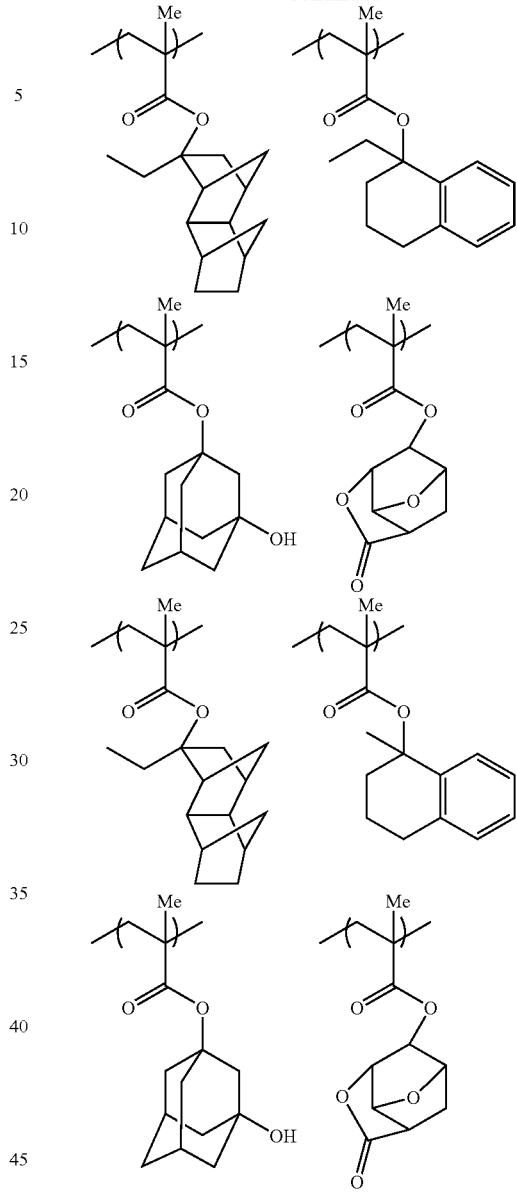

The polymers comprising repeat units of formula (1) or (2) preferably have a weight average molecular weight (Mw) of 1,000 to 50,000, and more preferably 2,000 to 30,000, as measured by gel permeation chromatography (GPC) using polystyrene standards.

The polymers may be prepared by copolymerizing (meth) acrylate derivative monomers corresponding to repeat units of formula (1) or (2) and other optional monomers in accordance with any well-known process such as radical polymerization. It is noted that all the polymers in Examples to be described later are synthesized by radical polymerization of selected (meth)acrylate derivative monomers.

In one embodiment, the resist composition is defined as comprising a polymer comprising recurring units having formula (1) or (2). In a preferred embodiment, a chemically amplified positive resist composition is defined as comprising
(A) an organic solvent,
(B) a base resin comprising a polymer comprising recurring units having formula (1) or (2), (C) a photoacid generator, and
(D) a basic compound.

Solvent

The organic solvent (A) used herein may be any organic solvent in which the base resin, acid generator, and other components are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combination of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is 200 to 3,000 parts, especially 400 to 2,500 parts by weight per 100 parts by weight of the base resin.

Resin

In addition to the polymer comprising recurring units having formula (1) or (2), the base resin in the resist composition may further comprise another resin component. Specifically the other resin component used herein includes, but is not limited to, those polymers comprising units of the following formula (R1) and/or (R2) and having a weight average molecular weight (Mw) of 1,000 to 100,000, especially 3,000 to 30,000, as measured by gel permeation chromatography (GPC) versus polystyrene standards.

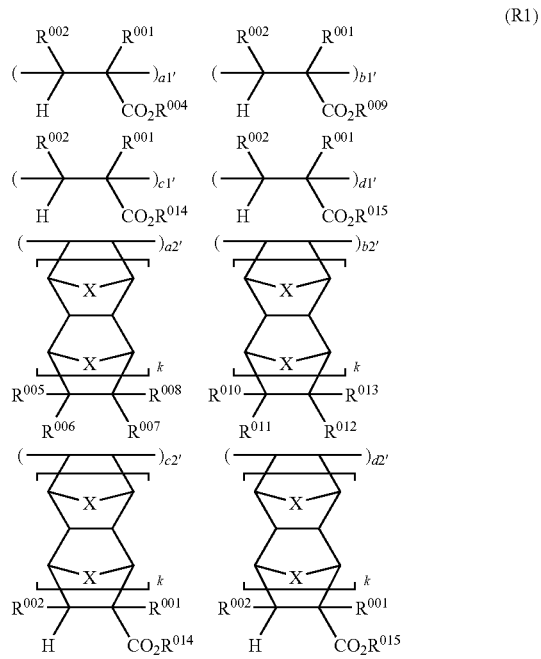

(R1)

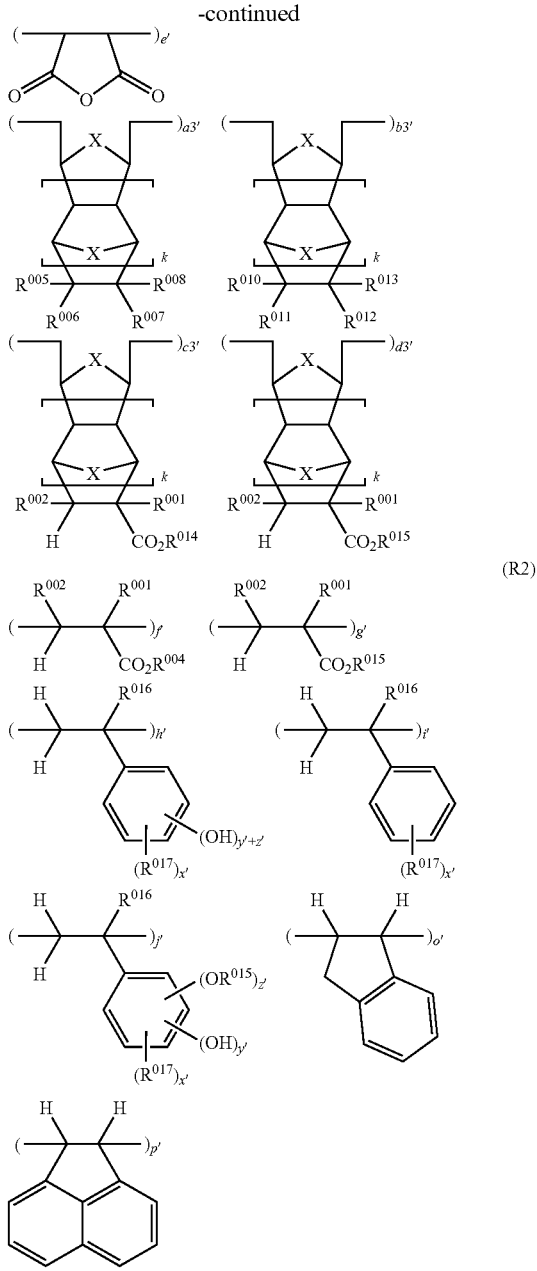

(R2)

Herein, $R^{001}$ is hydrogen, methyl or $CH_2CO_2R^{003}$.
$R^{002}$ is hydrogen, methyl or $CO_2R^{003}$.
$R^{003}$ is a straight, branched or cyclic $C_1$-$C_{15}$ alkyl group, examples of which include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent hydrocarbon group of 1 to 15 carbon atoms having at least one group selected from among fluorinated substituent groups, carboxyl groups and hydroxyl groups. Examples include hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, [2,2,2-trifluoro-1-hydroxy-1-(trifluoromethyl)ethyl]cyclohexyl, and bis[2,2,2-trifluoro-1-hydroxy-1-(trifluoromethyl)ethyl]-cyclohexyl.

At least one of $R^{005}$ to $R^{008}$ represents a carboxyl group or a monovalent hydrocarbon group of 1 to 15 carbon atoms having at least one group selected from among fluorinated substituent groups, carboxyl groups and hydroxyl groups while the remaining R's independently represent hydrogen or straight, branched or cyclic $C_1$-$C_{15}$ alkyl groups. Examples of suitable monovalent $C_1$-$C_{15}$ hydrocarbon groups having at least one group selected from among fluorinated substituent groups, carboxyl groups and hydroxyl groups include carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, [2,2,2-trifluoro-1-hydroxy-1-(trifluoromethyl)ethyl]cyclohexyloxycarbonyl, and bis[2,2,2-trifluoro-1-hydroxy-1-(trifluoromethyl)ethyl]cyclohexyloxycarbonyl. Suitable straight, branched or cyclic $C_1$-$C_{15}$ alkyl groups are as exemplified for $R^{003}$.

Two of $R^{005}$ to $R^{008}$ (for example, a pair of $R^{005}$ and $R^{006}$, $R^{006}$ and $R^{007}$, or $R^{007}$ and $R^{008}$) may bond together to form a ring with the carbon atom(s) to which they are attached, and in that event, at least one of $R^{005}$ to $R^{008}$ is a divalent hydrocarbon group of 1 to 15 carbon atoms having at least one group selected from fluorinated substituent groups, carboxyl groups and hydroxyl groups, while the remaining R's are independently single bonds, hydrogen atoms or straight, branched or cyclic $C_1$-$C_{15}$ alkyl groups. Suitable divalent $C_1$-$C_{15}$ hydrocarbon groups having at least one group selected from fluorinated substituent groups, carboxyl groups and hydroxyl groups include those exemplified above as the monovalent hydrocarbon groups having at least one group selected from fluorinated substituent groups, carboxyl groups and hydroxyl groups, with one hydrogen atom eliminated therefrom. Suitable straight, branched or cyclic $C_1$-$C_{15}$ alkyl groups are as exemplified for $R^{003}$.

$R^{009}$ is a monovalent hydrocarbon group of 3 to 15 carbon atoms containing a —$CO_2$— partial structure. Examples include 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent hydrocarbon group of 2 to 15 carbon atoms containing a —$CO_2$— partial structure, while the remaining R's are independently hydrogen atoms or straight, branched or cyclic $C_1$-$C_{15}$ alkyl groups. Illustrative examples of suitable monovalent $C_2$-$C_{15}$ hydrocarbon groups containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Suitable straight, branched or cyclic $C_1$-$C_{15}$ alkyl groups are as exemplified for $R^{003}$.

Two of $R^{010}$ to $R^{013}$ (for example, a pair of $R^{010}$ and $R^{011}$, $R^{011}$ and $R^{012}$, or $R^{012}$ and $R^{013}$) may bond together to form a ring with the carbon atom(s) to which they are attached, and in that event, at least one of $R^{010}$ to $R^{013}$ is a divalent hydrocarbon group of 1 to 15 carbon atoms containing a —$CO_2$— partial structure, while the remaining R's are independently single bonds, hydrogen atoms or straight, branched or cyclic $C_1$-$C_{15}$ alkyl groups. Illustrative examples of suitable divalent $C_1$-$C_{15}$ hydrocarbon groups containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as those exemplified as the monovalent hydrocarbon groups containing a —$CO_2$— partial structure, with one hydrogen atom eliminated therefrom. Suitable straight, branched or cyclic $C_1$-$C_{15}$ alkyl groups are as exemplified for $R^{003}$.

$R^{014}$ is a polycyclic hydrocarbon group having 7 to 15 carbon atoms or an alkyl group containing such a polycyclic hydrocarbon group. Examples include norbornyl, bicyclo[3.3.1]nonyl, tricyclo[5.2.1.0$^{2,6}$]decyl, adamantyl, norbornylmethyl, adamantylmethyl, and alkyl or cycloalkyl-substituted derivatives thereof.

$R^{015}$ is an acid labile group, examples of which are described above.

$R^{016}$ is hydrogen or methyl.

$R^{017}$ is a straight, branched or cyclic $C_1$-$C_8$ alkyl group, examples of which include methyl, ethyl, propyl, isopropyl, n-butyl, sec-butyl, tert-butyl, tert-amyl, n-pentyl, n-hexyl, cyclopentyl and cyclohexyl.

X is $CH_2$ or an oxygen atom. Letter k is 0 or 1.

In formulae (R1) and (R2), letters a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1; f', g', h', i', j', o', and p' are numbers from 0 to less than 1, satisfying f'+g'+h'+i'+j'+o'+p'=1; x', y' and z' are each an integer of 0 to 3, satisfying 1≤x'+y'+z'≤5 and 1≤y'+z'≤3.

With respect to the recurring units of formula (R1) and (R2), units of more than one type may be incorporated at the same time. Incorporation of units of more than one type enables to adjust the performance of a resist material in which the resulting polymer is formulated.

Understandably, the sum of respective units=1 means that in a polymer comprising recurring units, the total of the indicated recurring units is 100 mol % relative to the total of entire recurring units.

Examples of the recurring units incorporated at compositional ratio a1' in formula (R1) and the recurring units incorporated at compositional ratio f' in formula (R2) are given below, but not limited thereto.

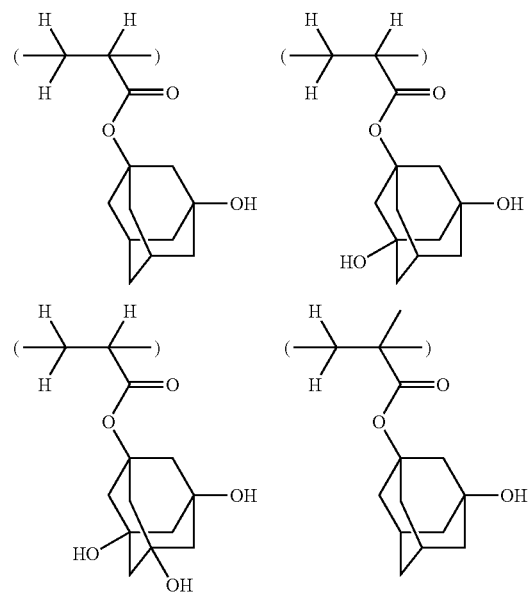

103
-continued
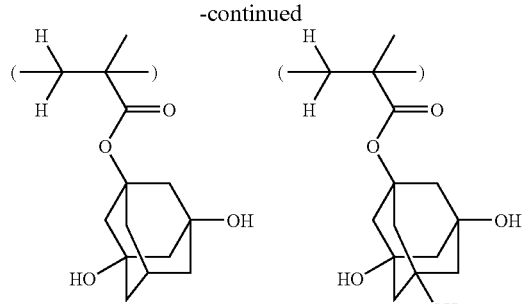
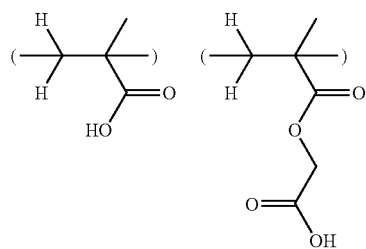
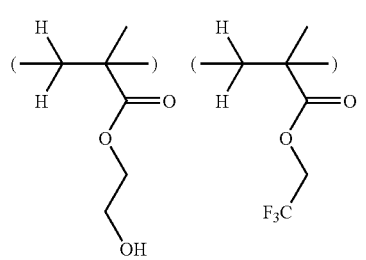
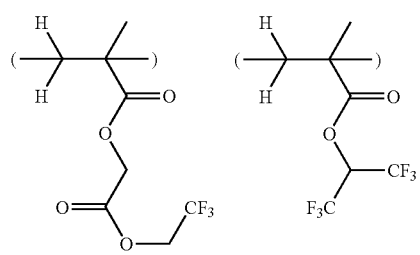
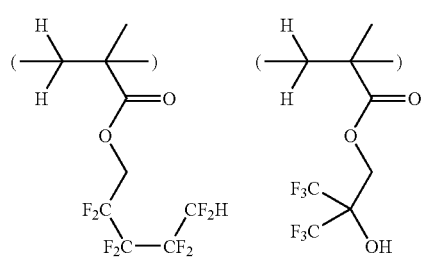
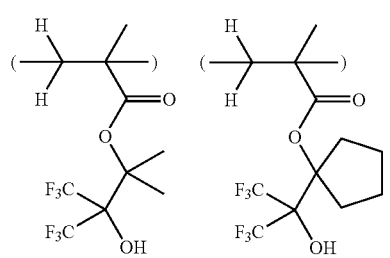
104
-continued
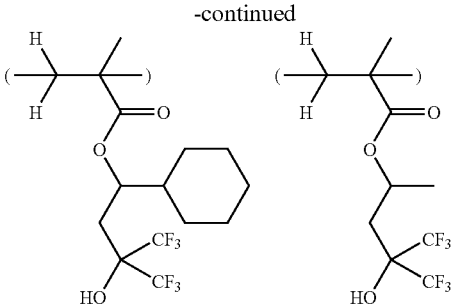
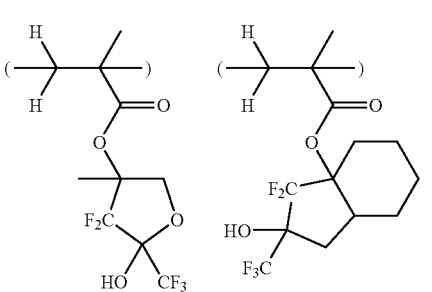
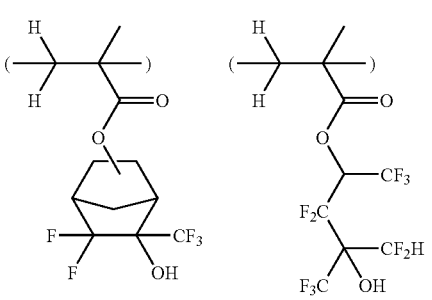
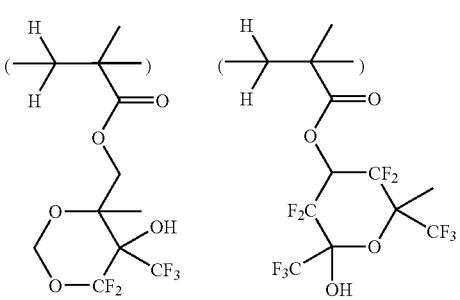
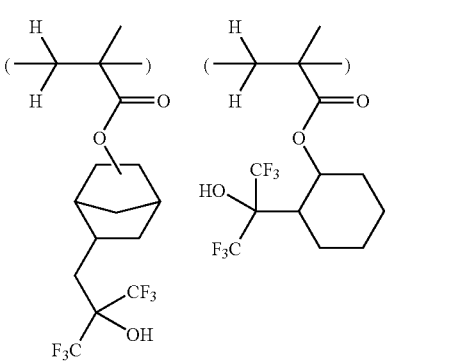

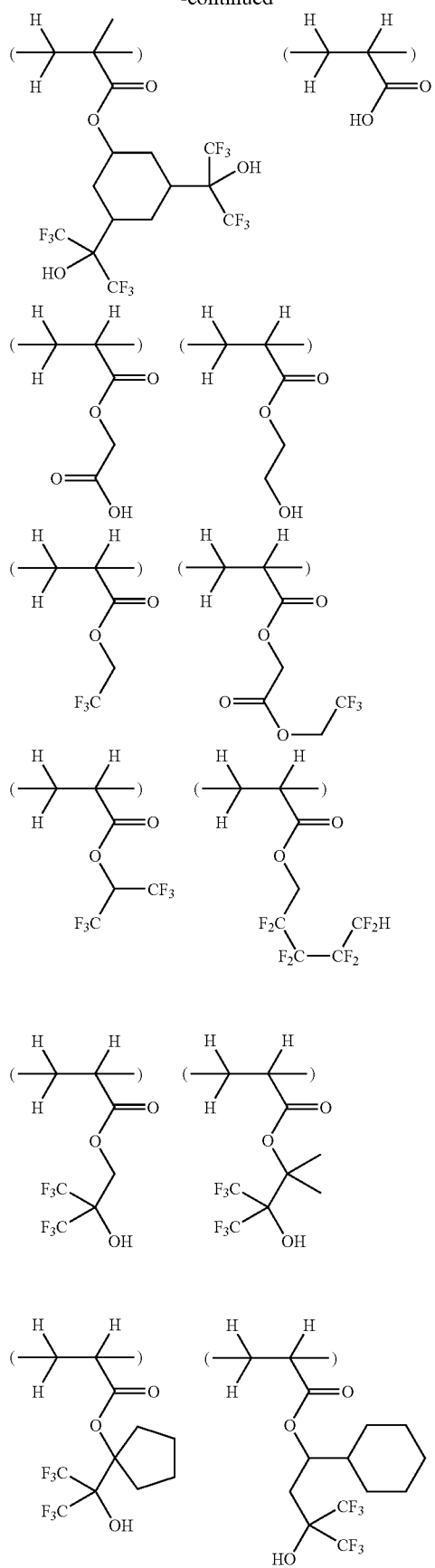
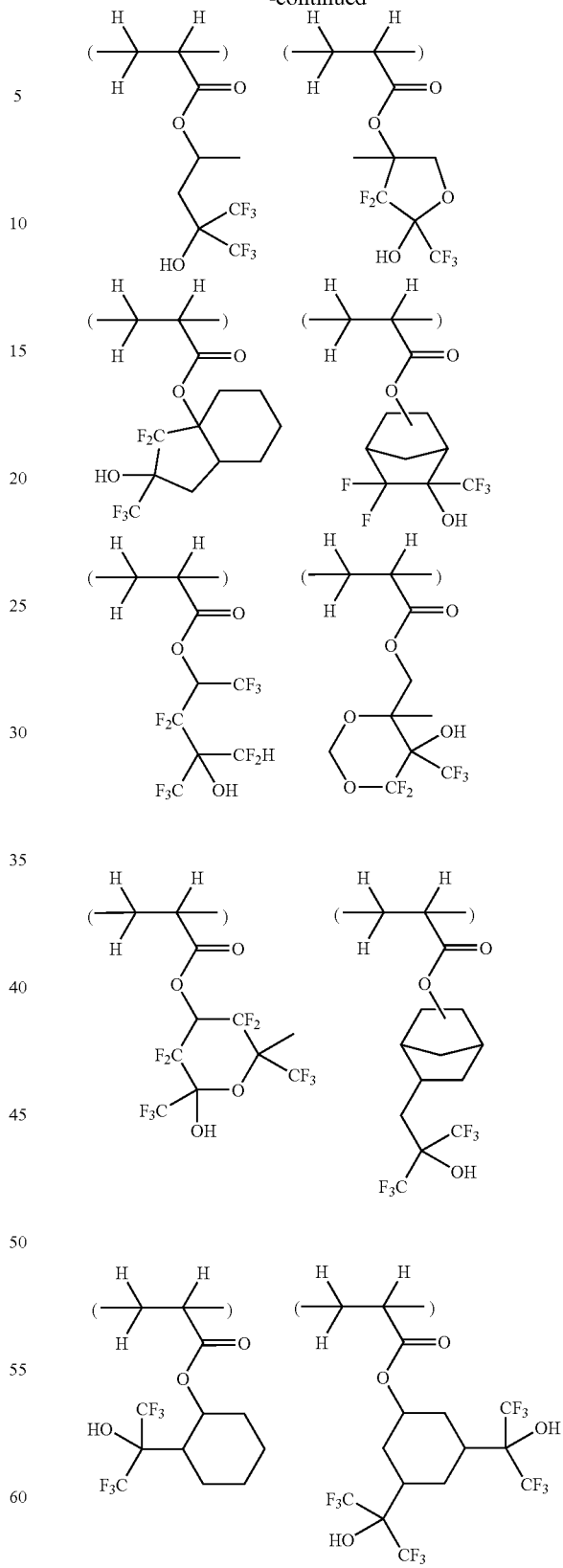
Examples of the recurring units incorporated at compositional ratio b1' in formula (R1) are given below, but not limited thereto.

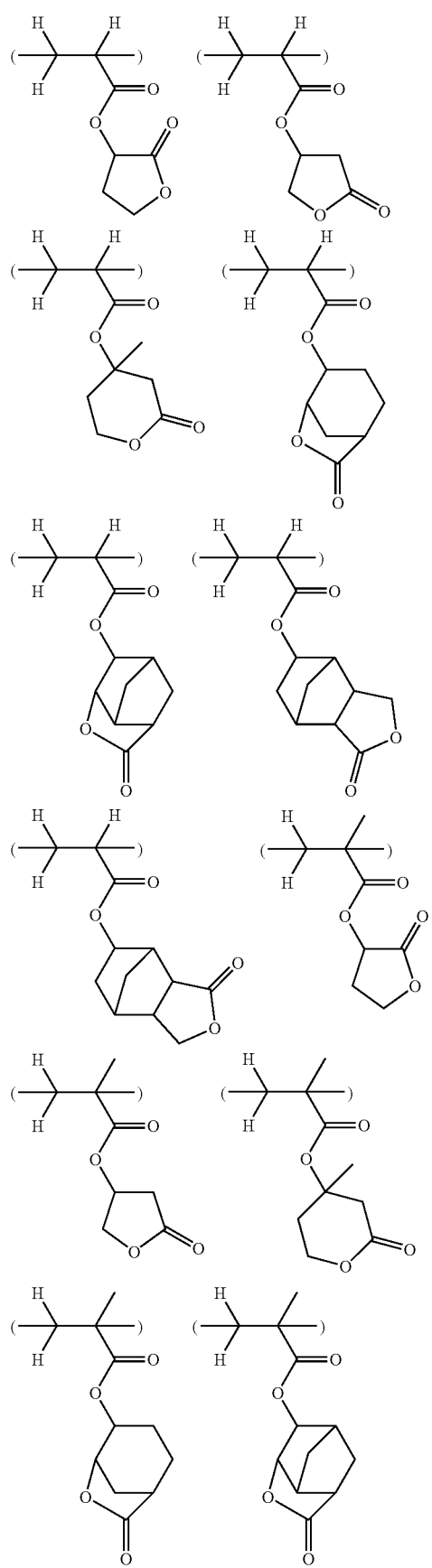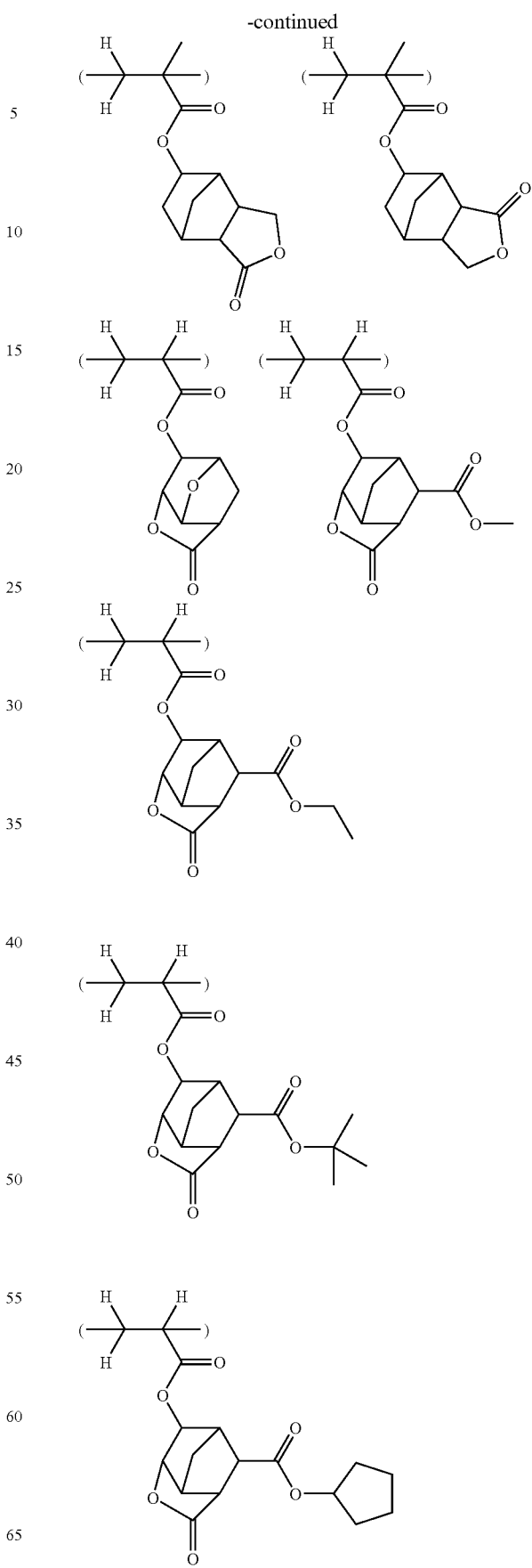

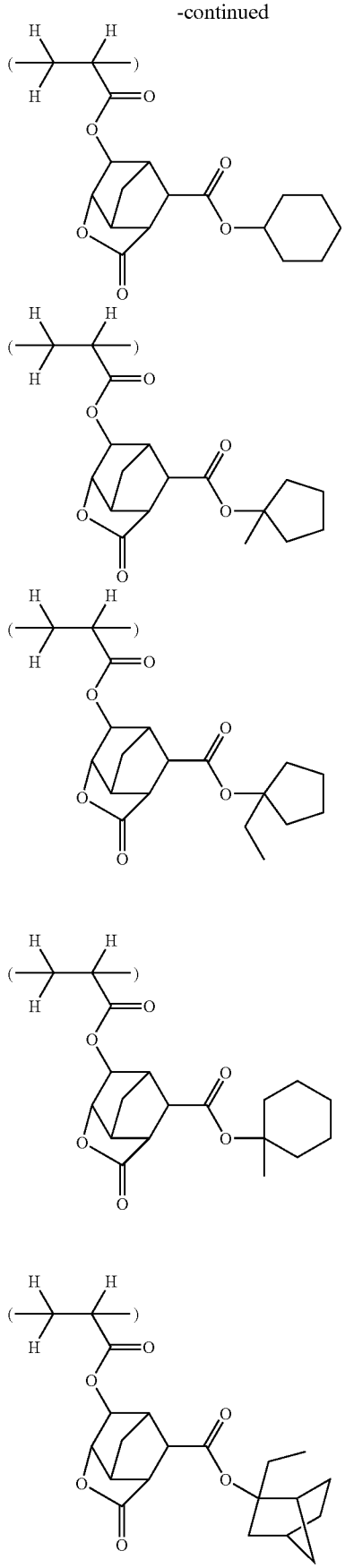
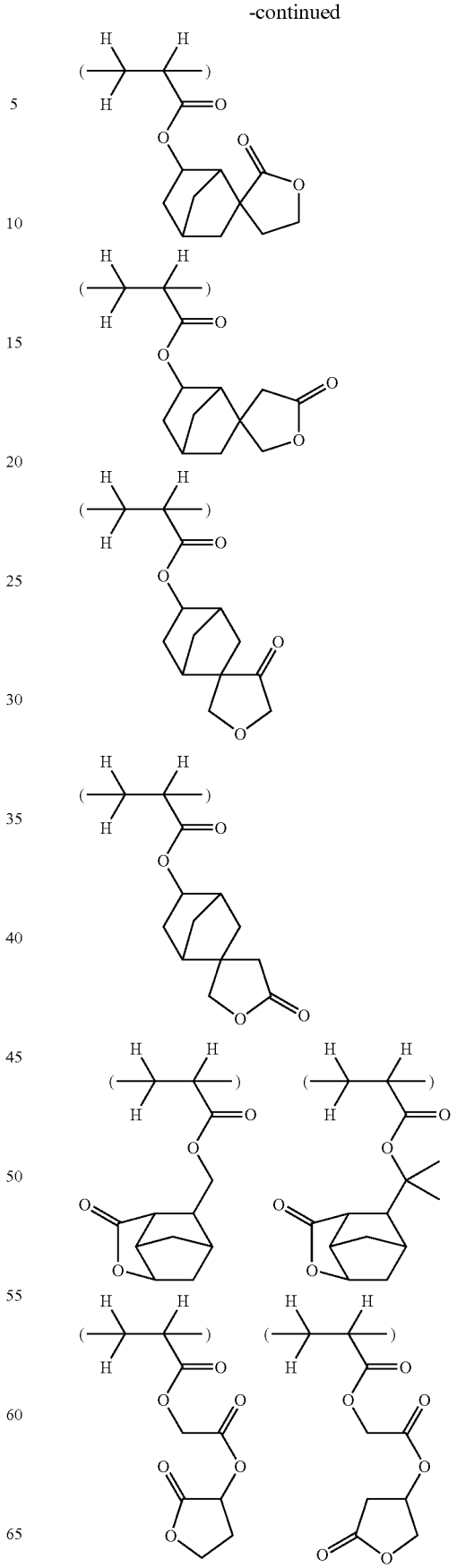

-continued
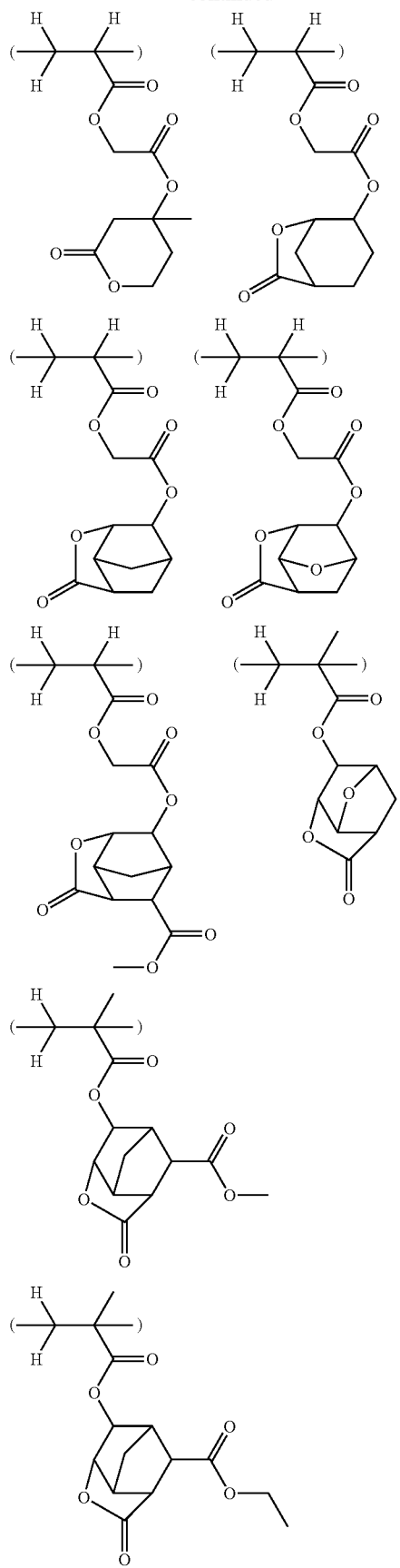
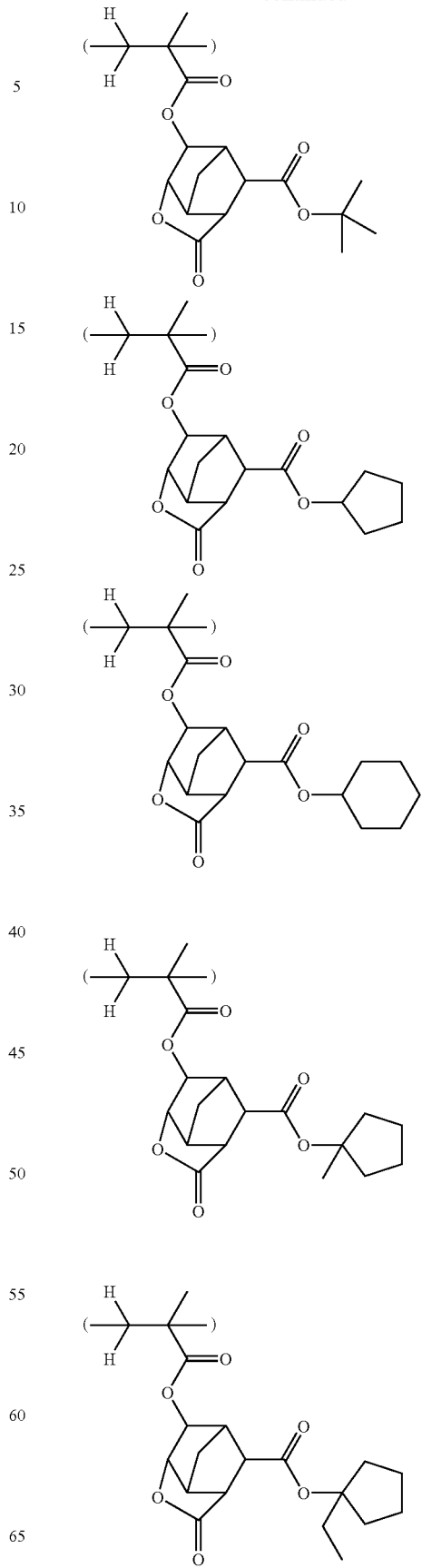

-continued
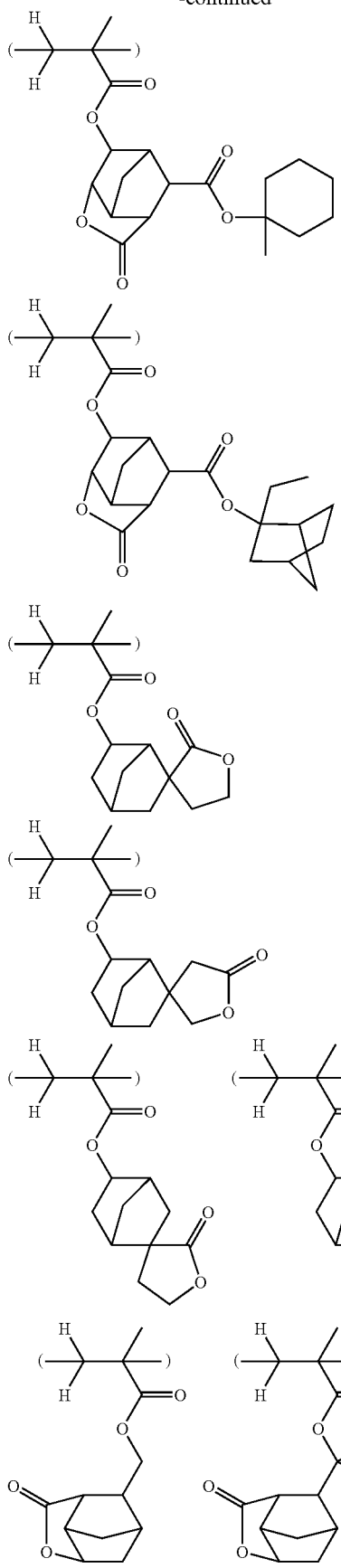
-continued
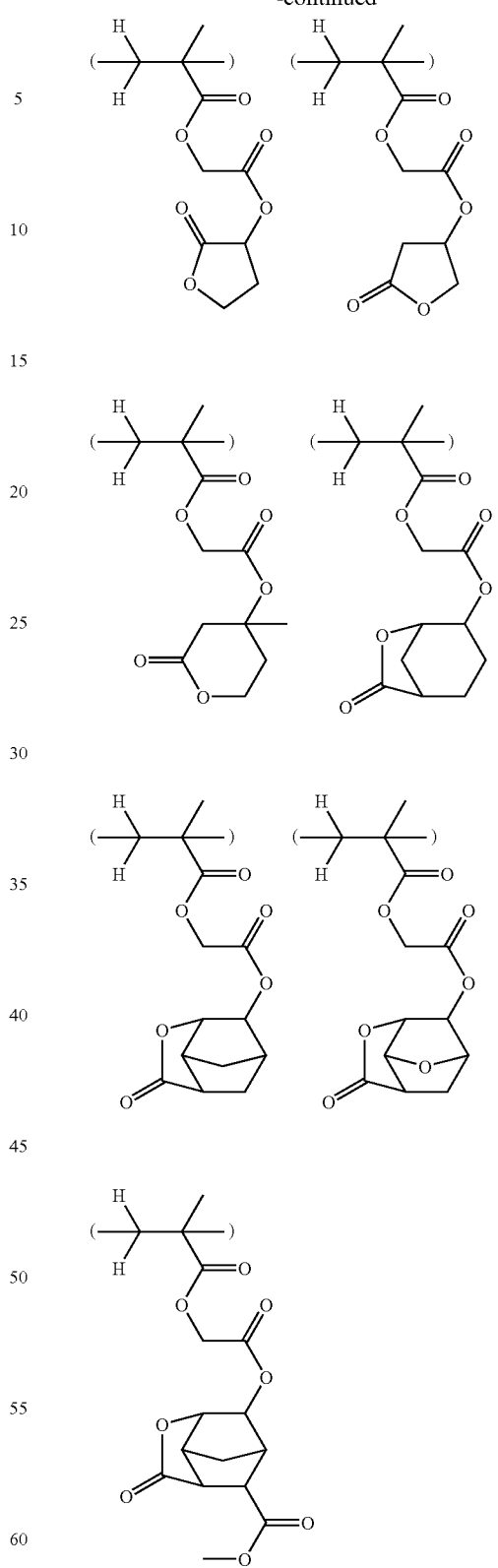
Examples of the recurring units incorporated at compositional ratio d1' in formula (R1) and the recurring units incorporated at compositional ratio g' in formula (R2) are given below, but not limited thereto.

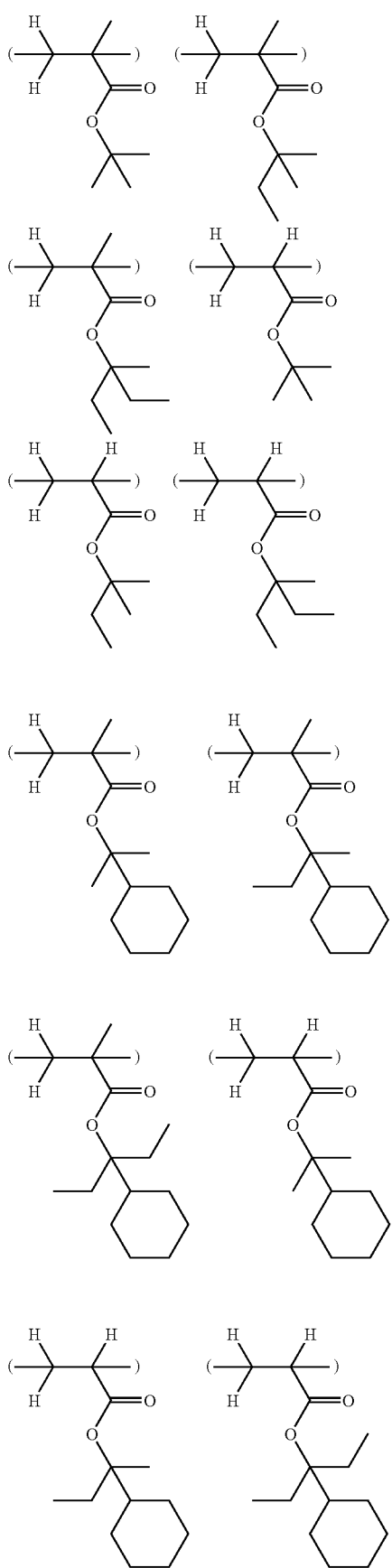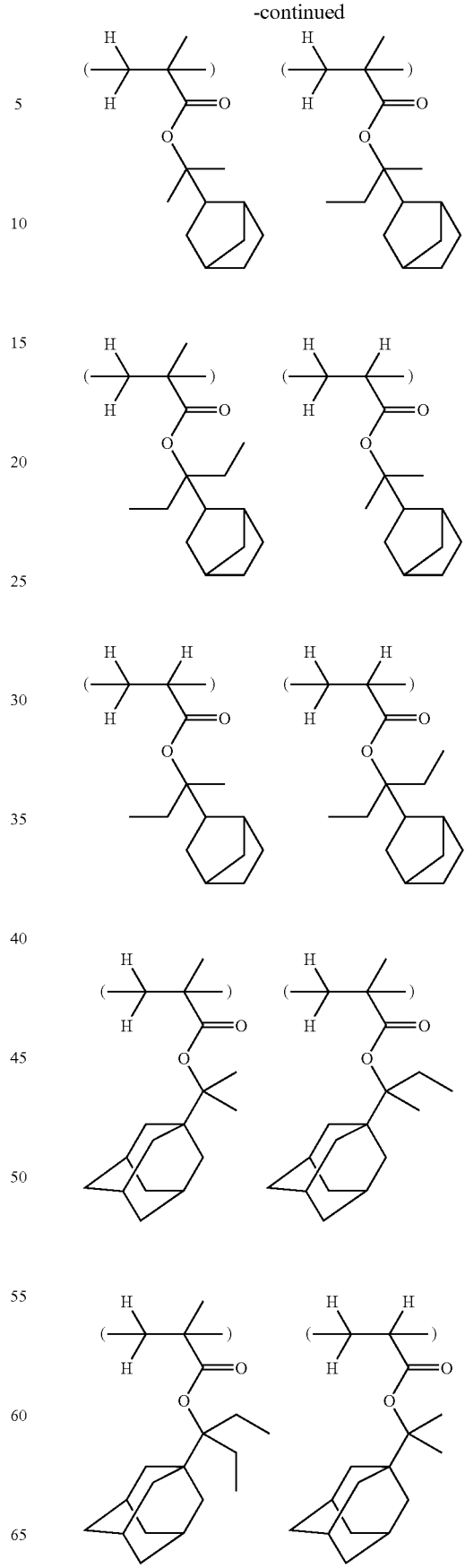

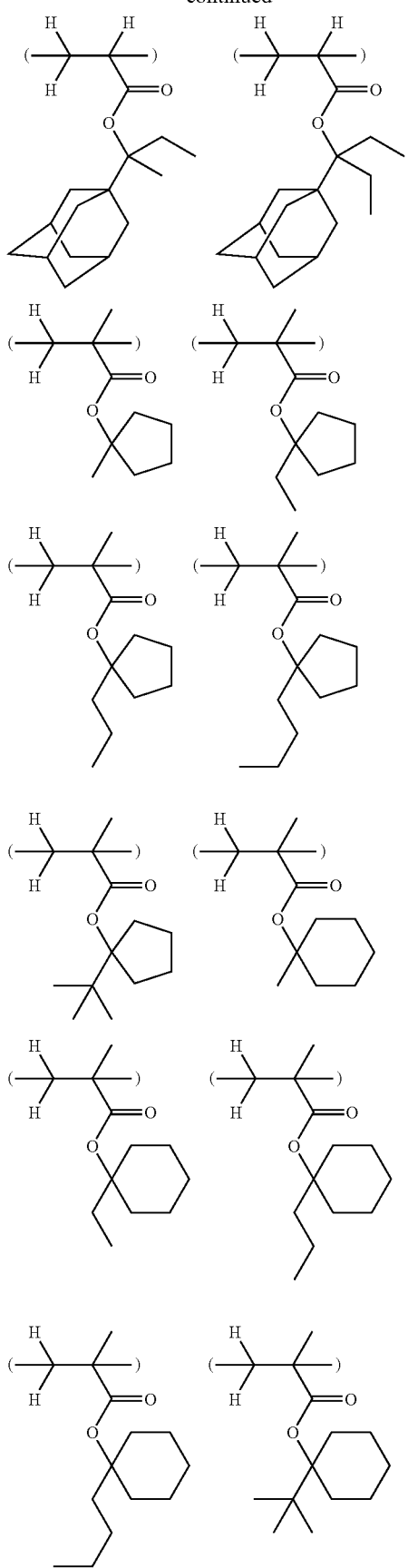
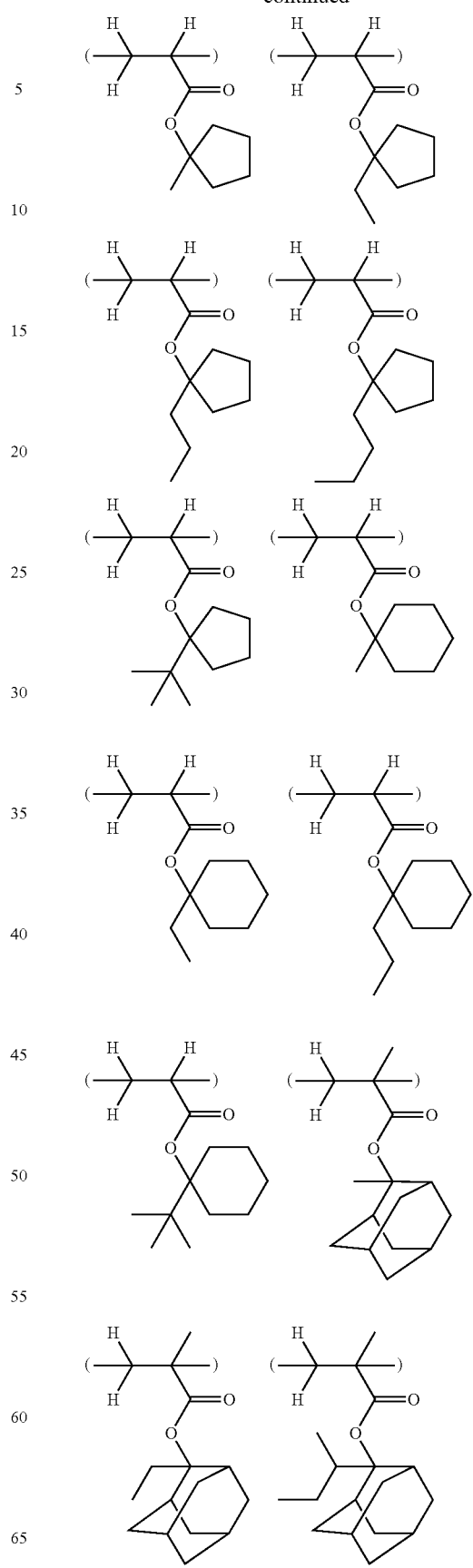

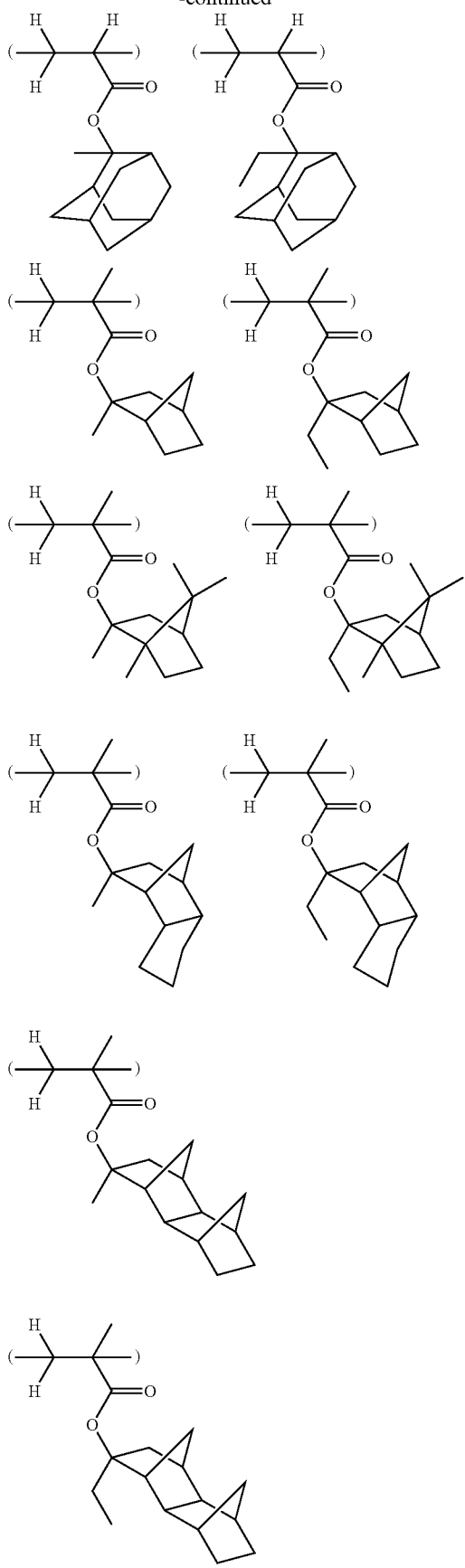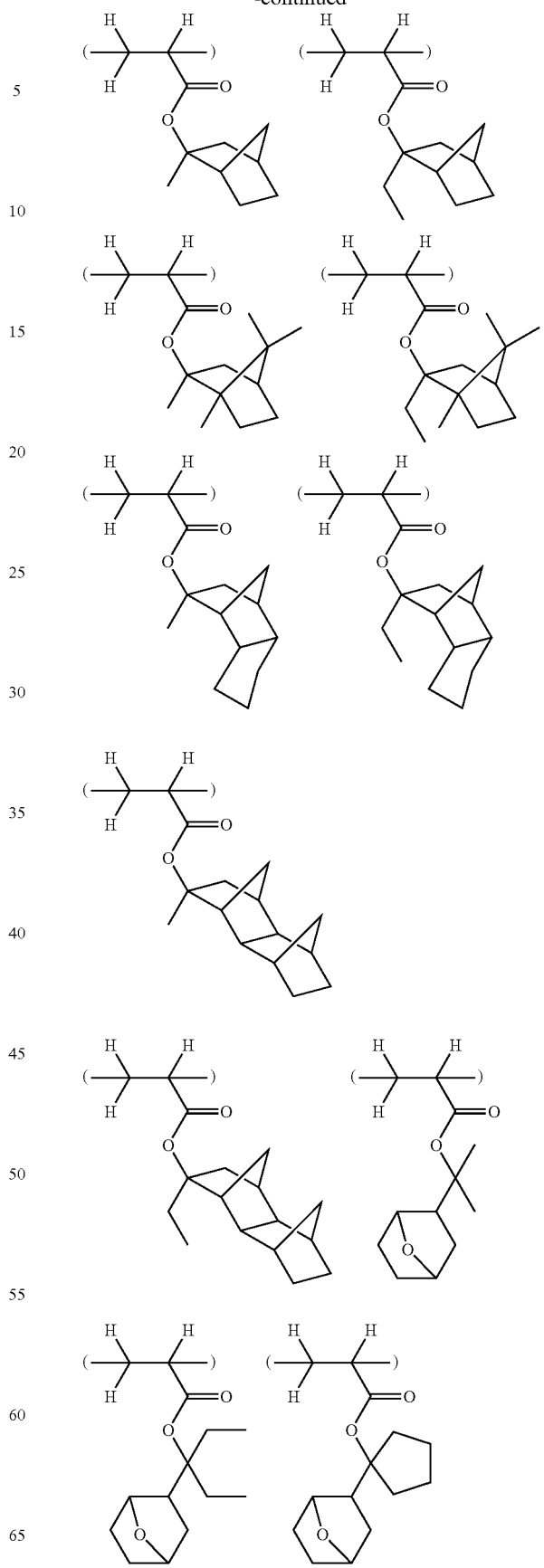

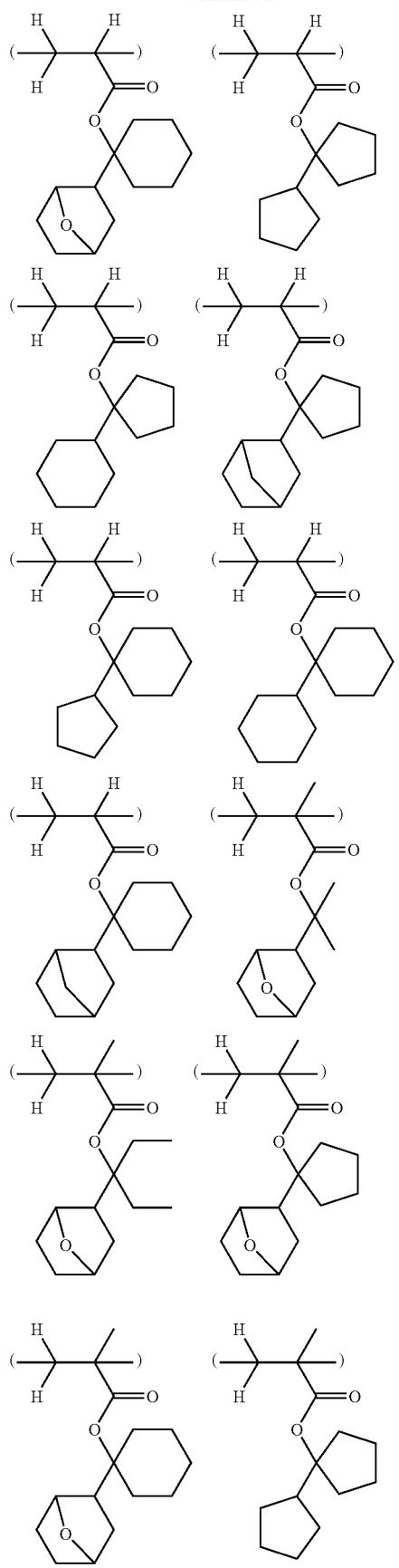
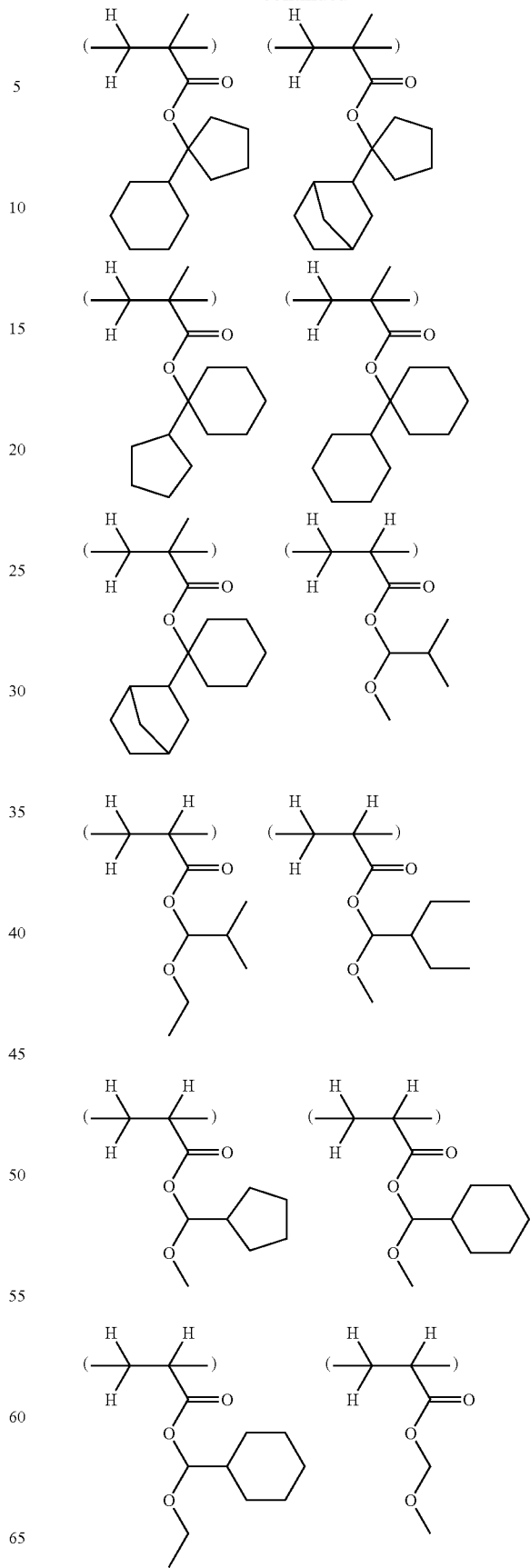

123
-continued
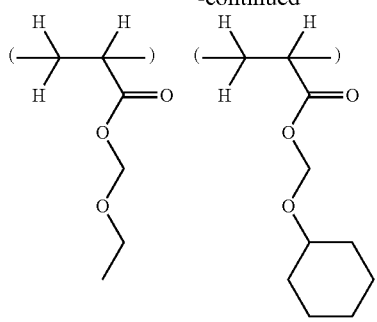
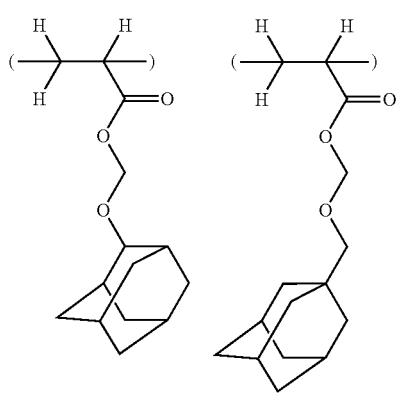
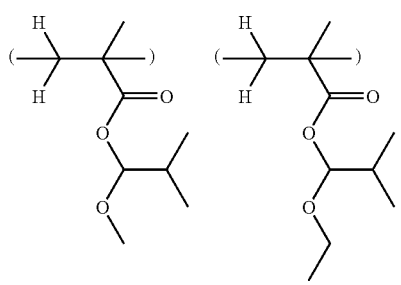
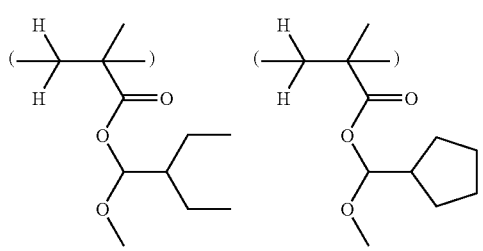
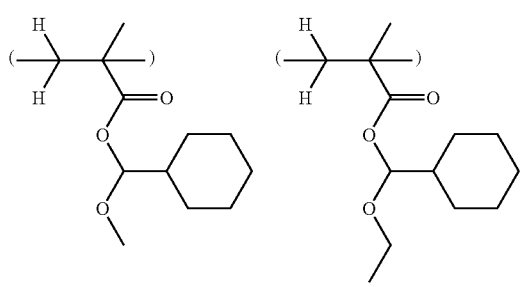
124
-continued
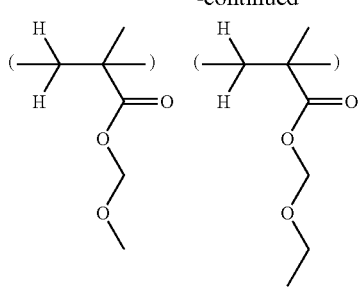
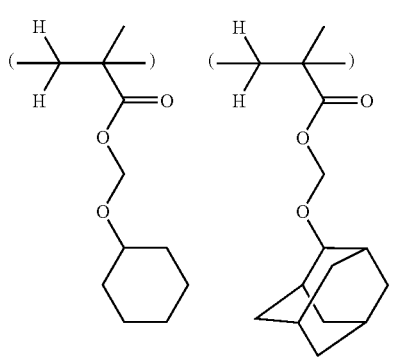
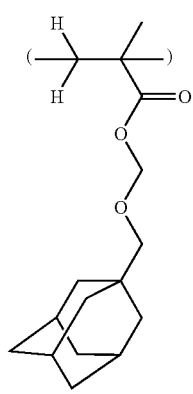
Exemplary polymers comprising recurring units incorporated at compositional ratios a1', b1', c1', and d1' in formula (R1) are shown below, but not limited thereto.
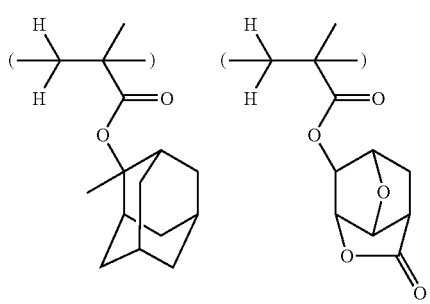

125
-continued
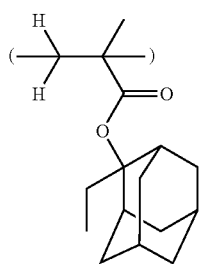
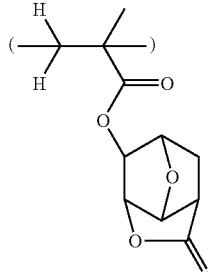
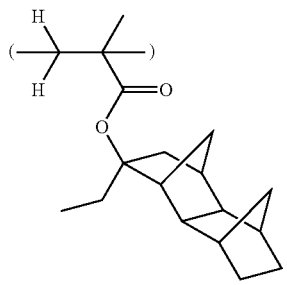
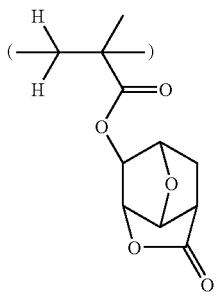
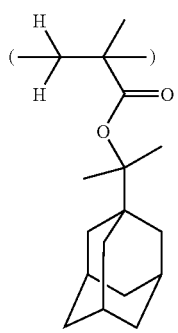
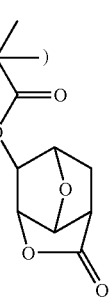
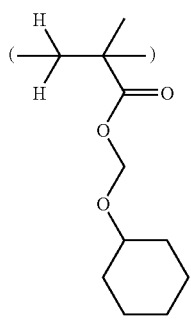
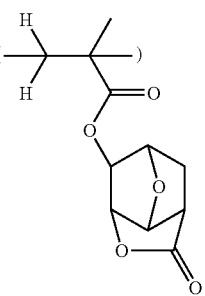
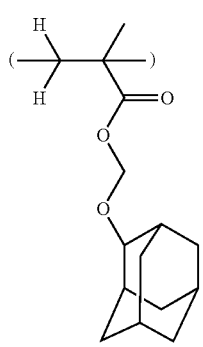
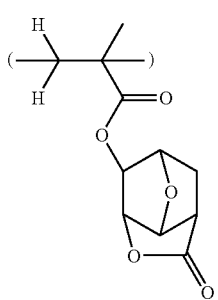
126
-continued
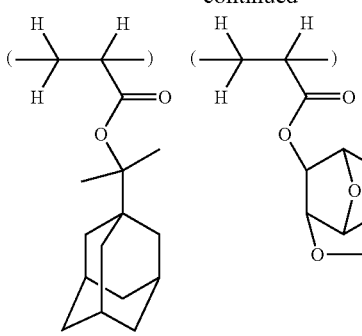
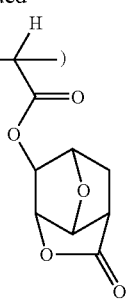
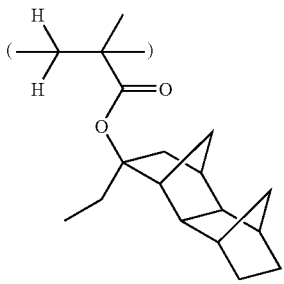
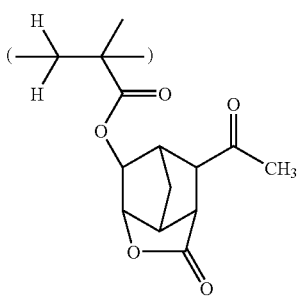
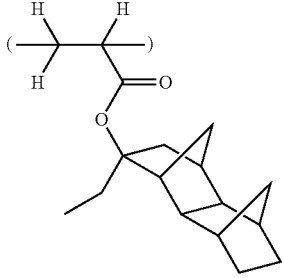
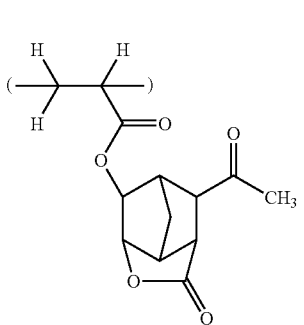

127
-continued
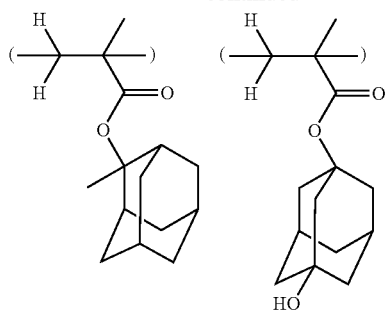
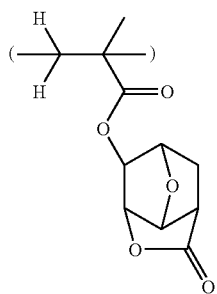
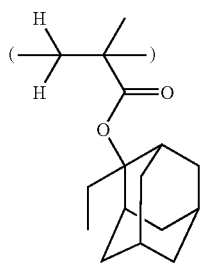
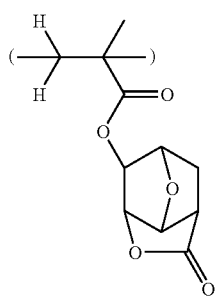
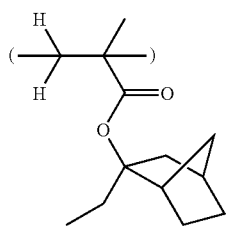 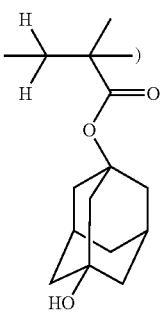
128
-continued
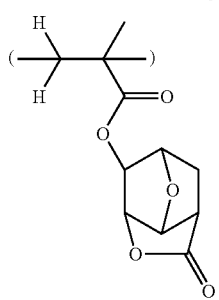
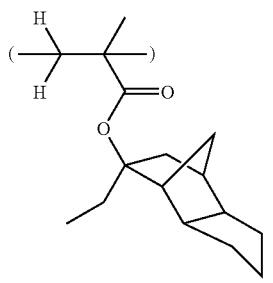
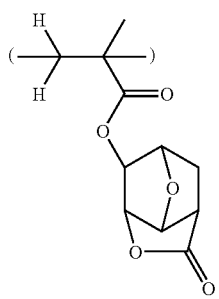
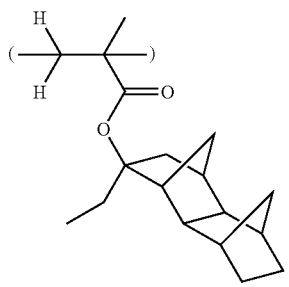 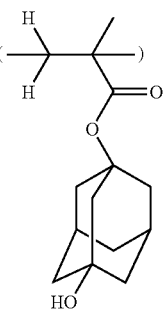
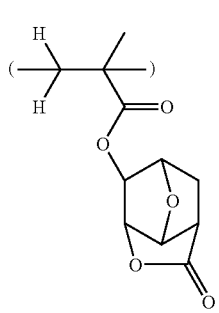

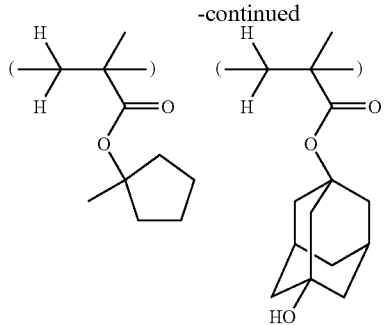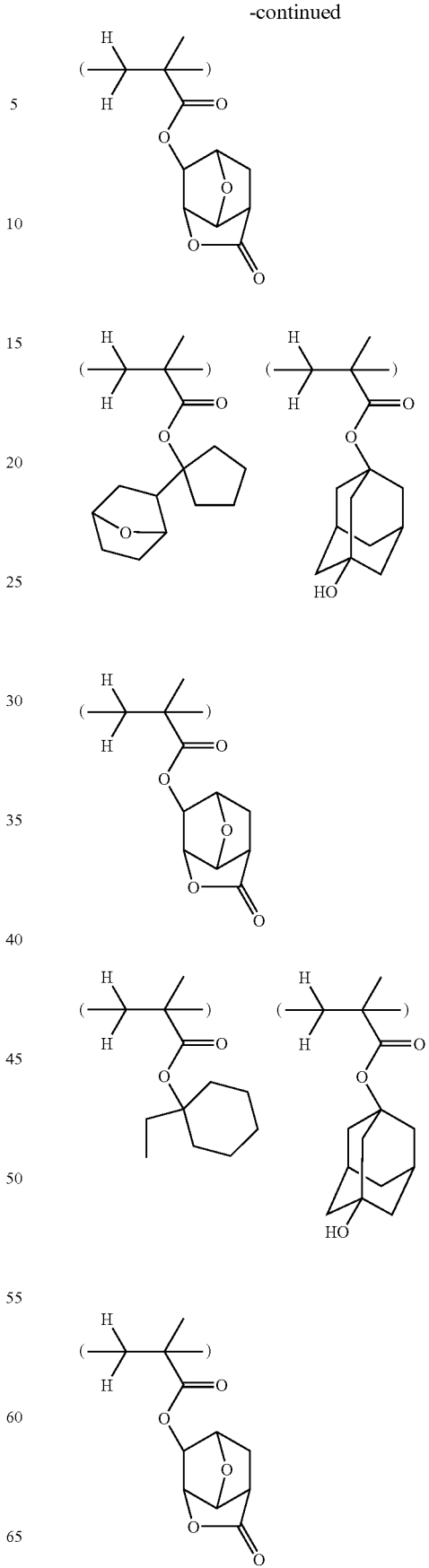

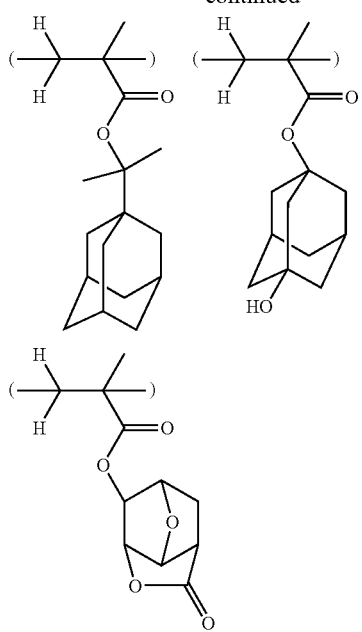
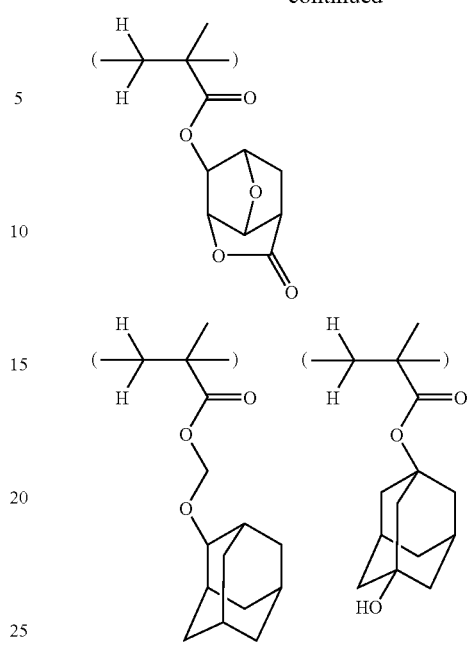
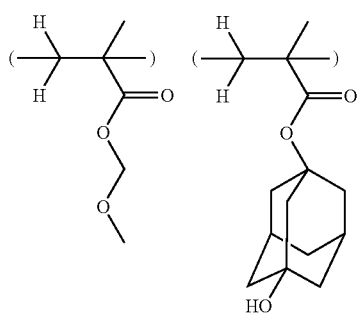
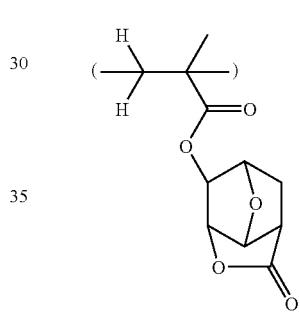
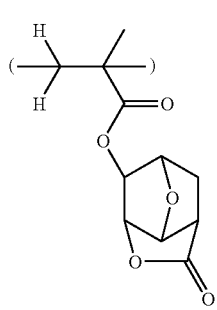
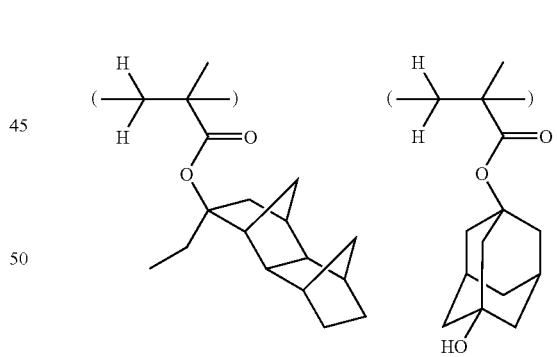
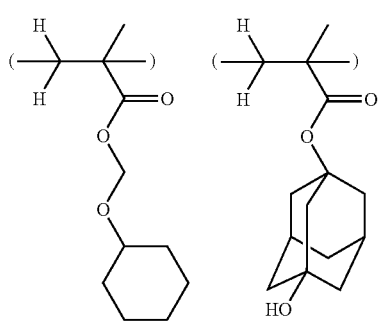
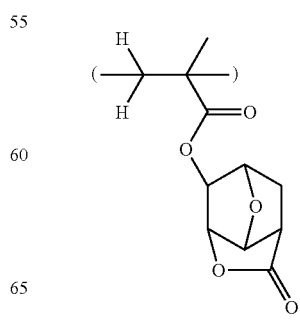

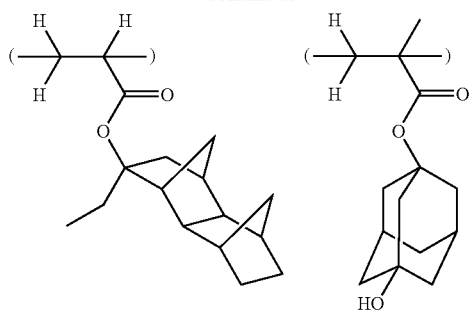
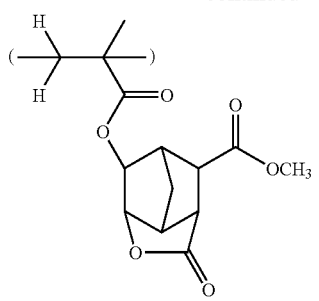
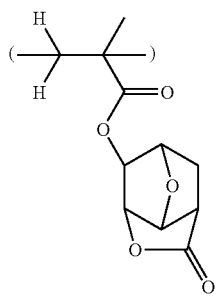
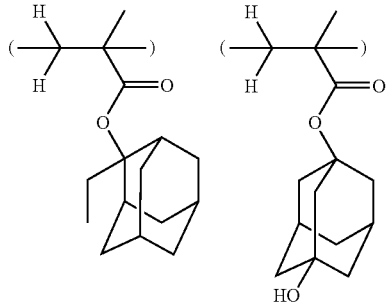
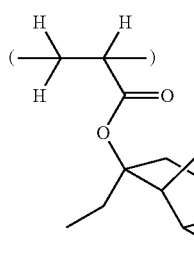
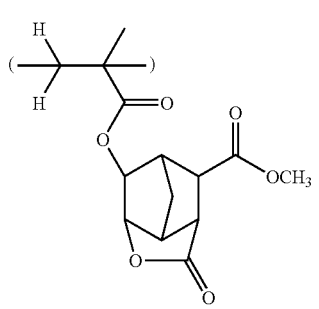
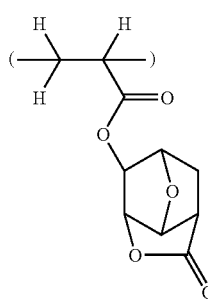
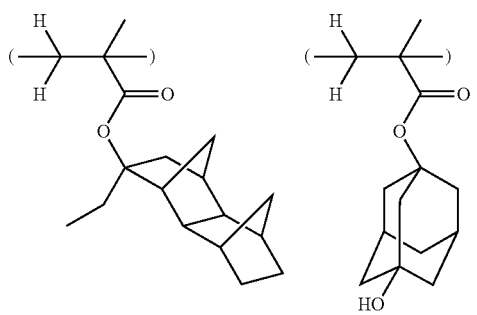
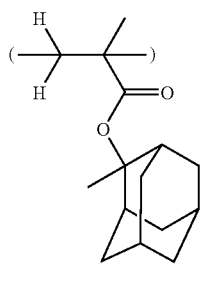
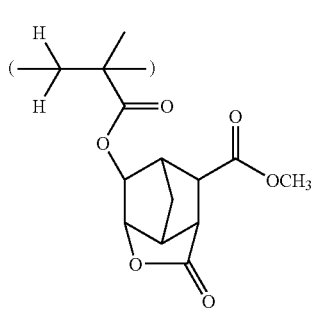

135
-continued
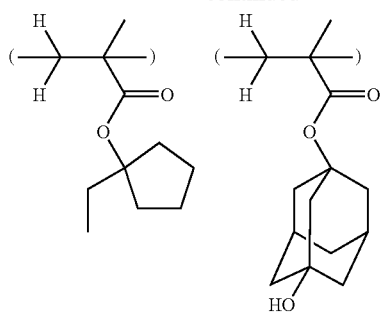
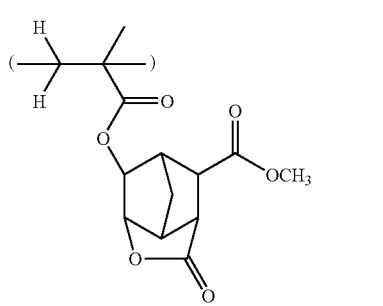
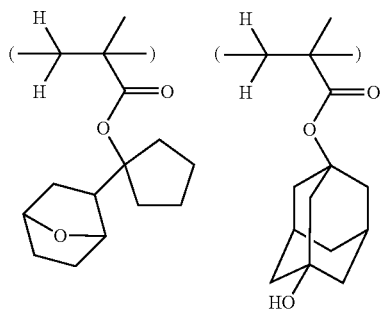
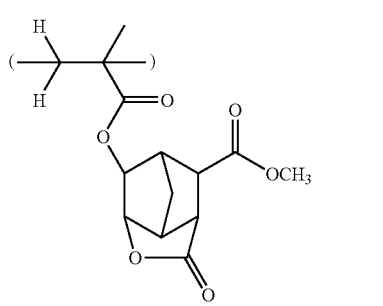
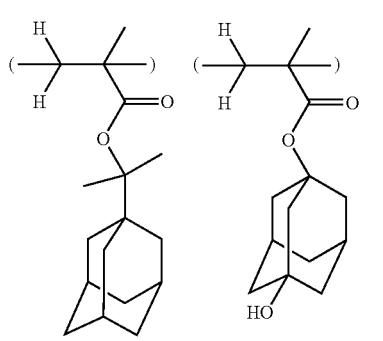
136
-continued
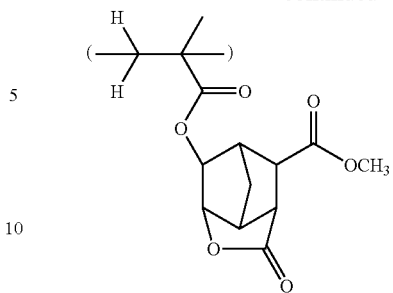
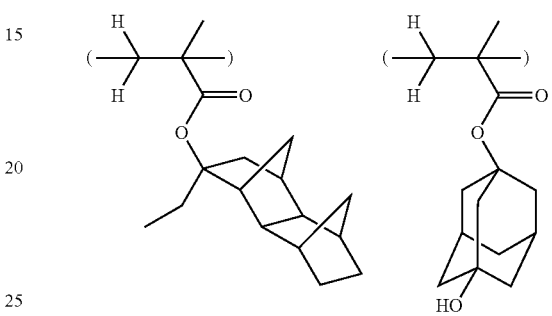
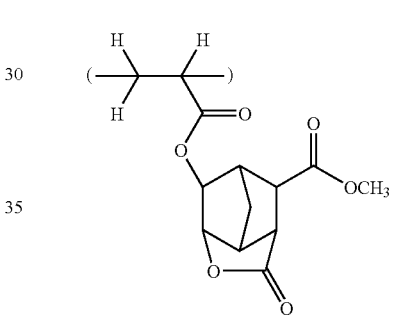
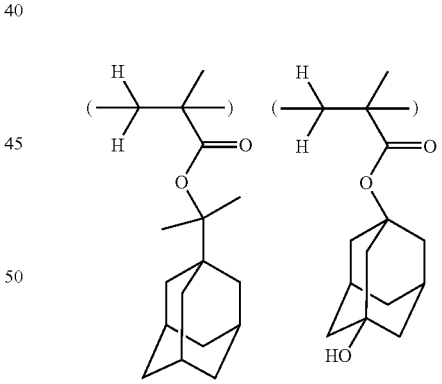
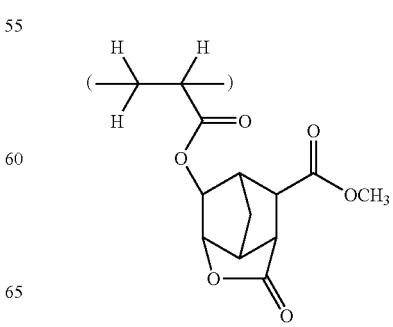

-continued
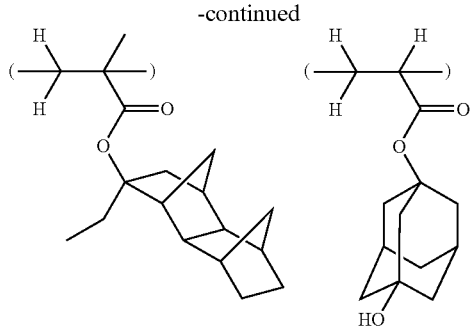
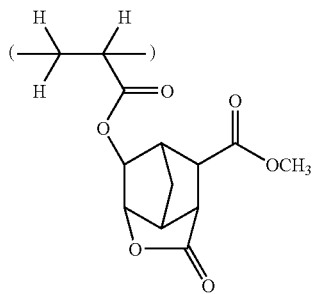
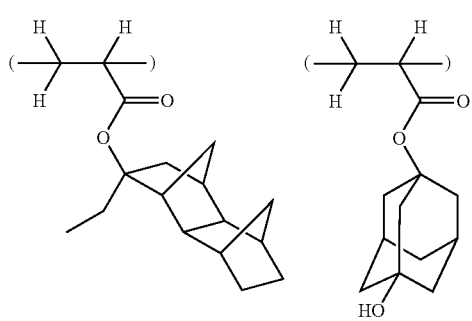
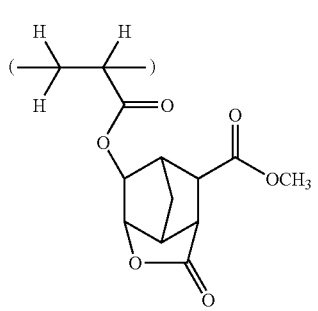
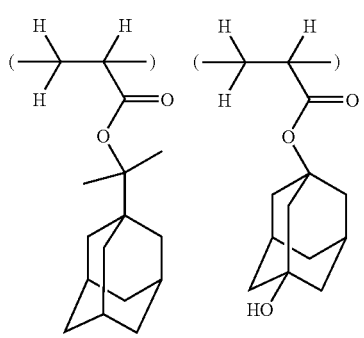
-continued
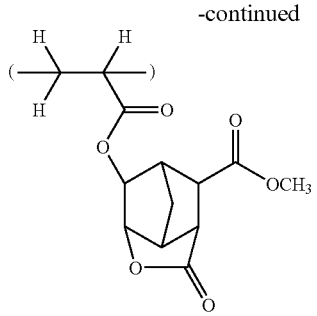
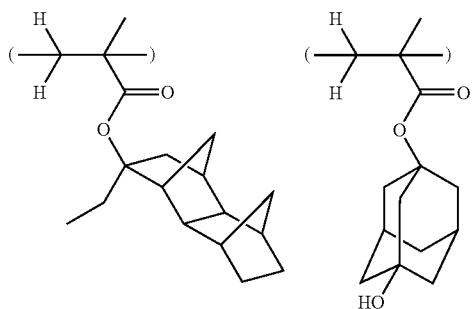
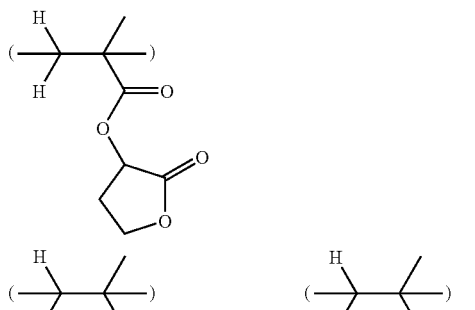
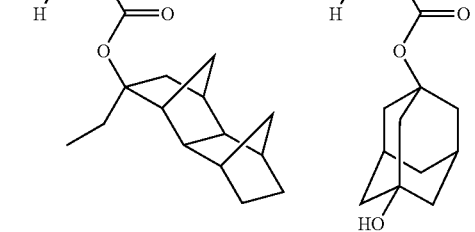
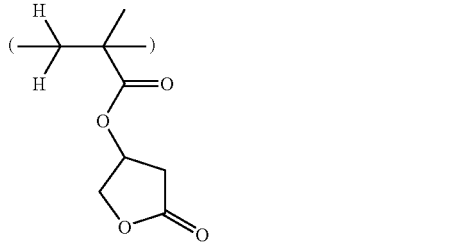
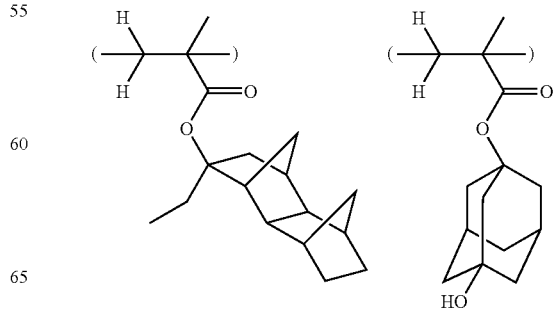

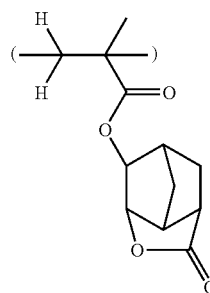
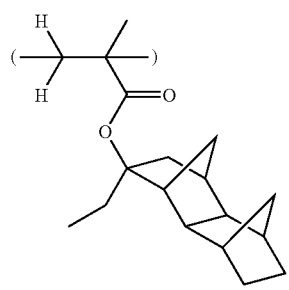
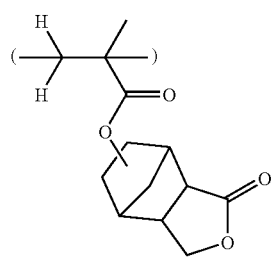
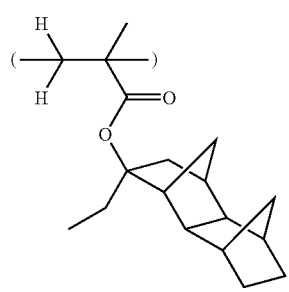
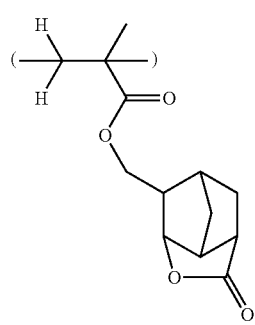
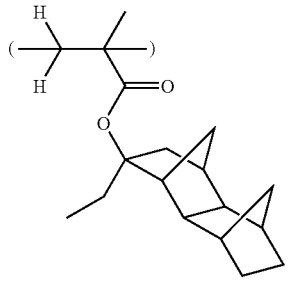
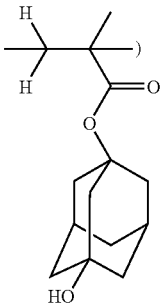
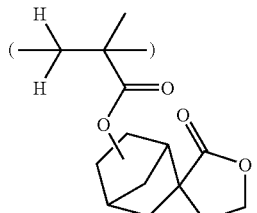
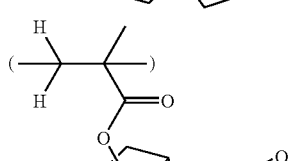
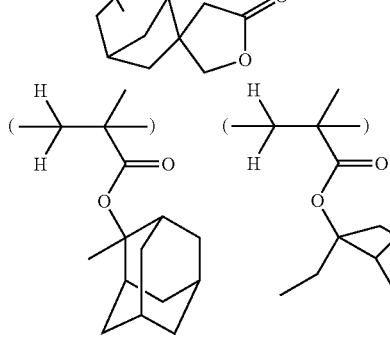
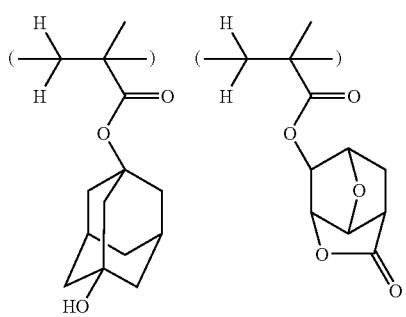
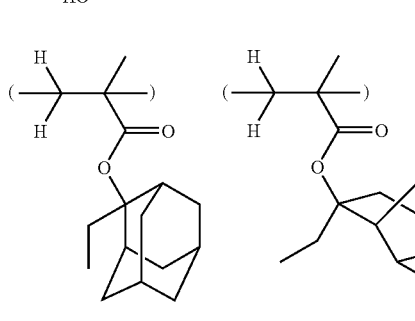

141
-continued
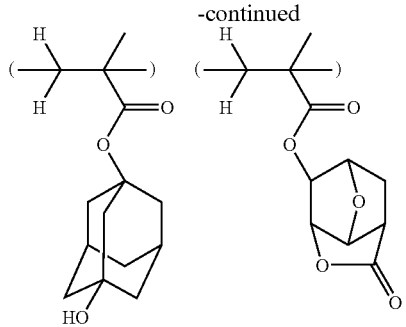
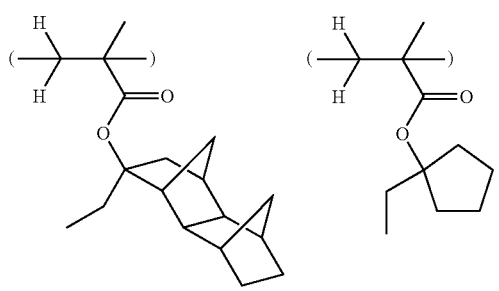
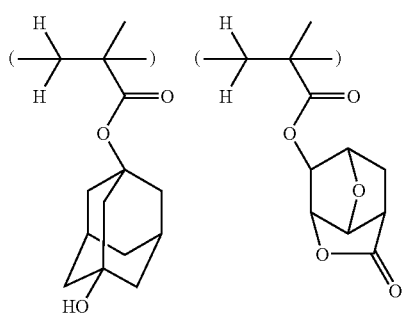
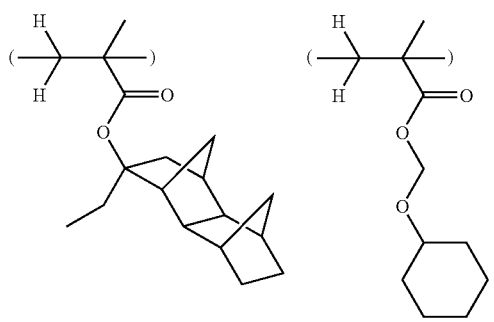
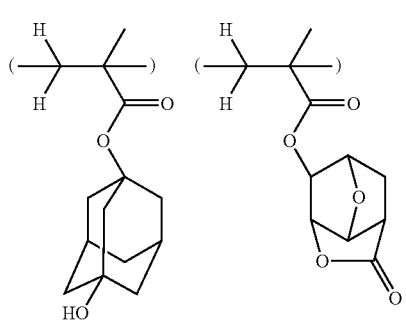
142
-continued
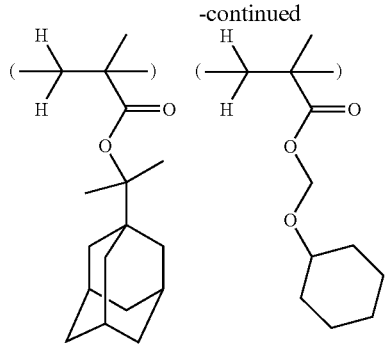
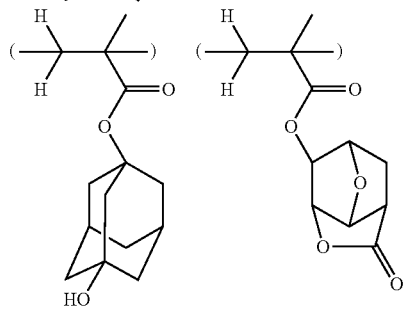
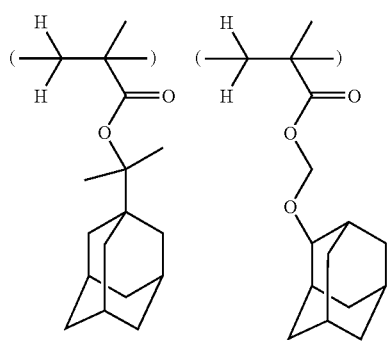
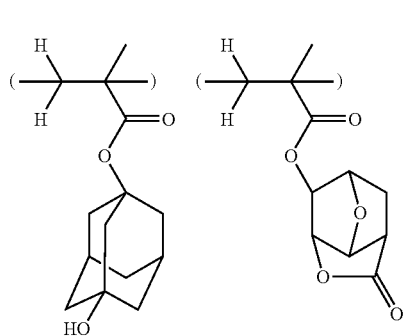
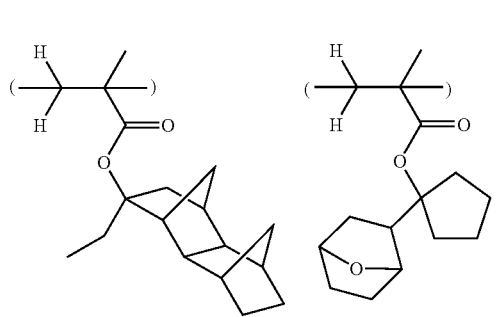

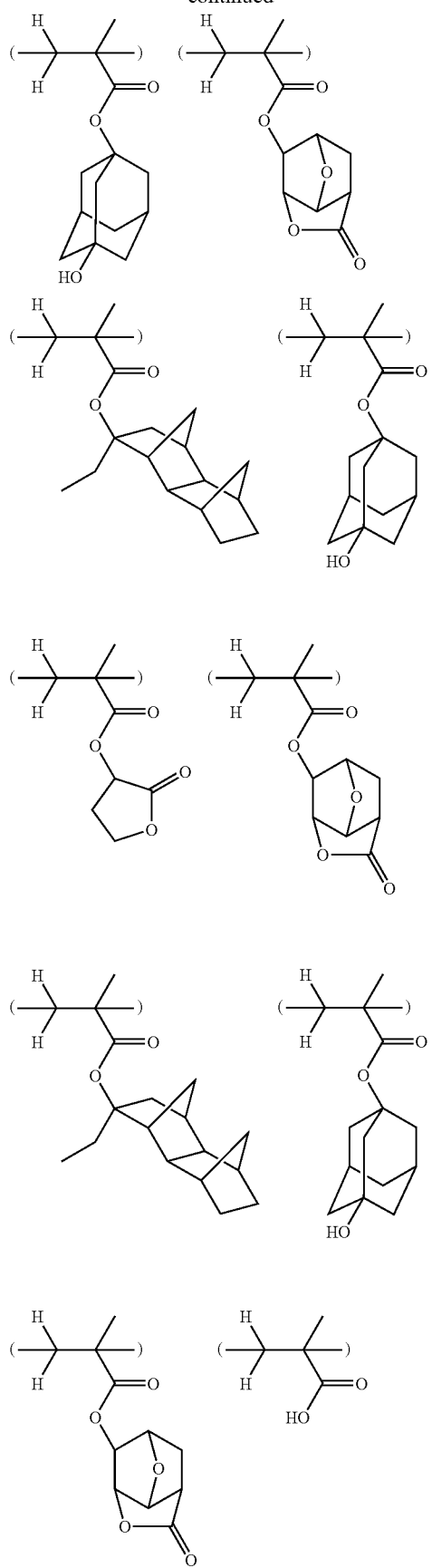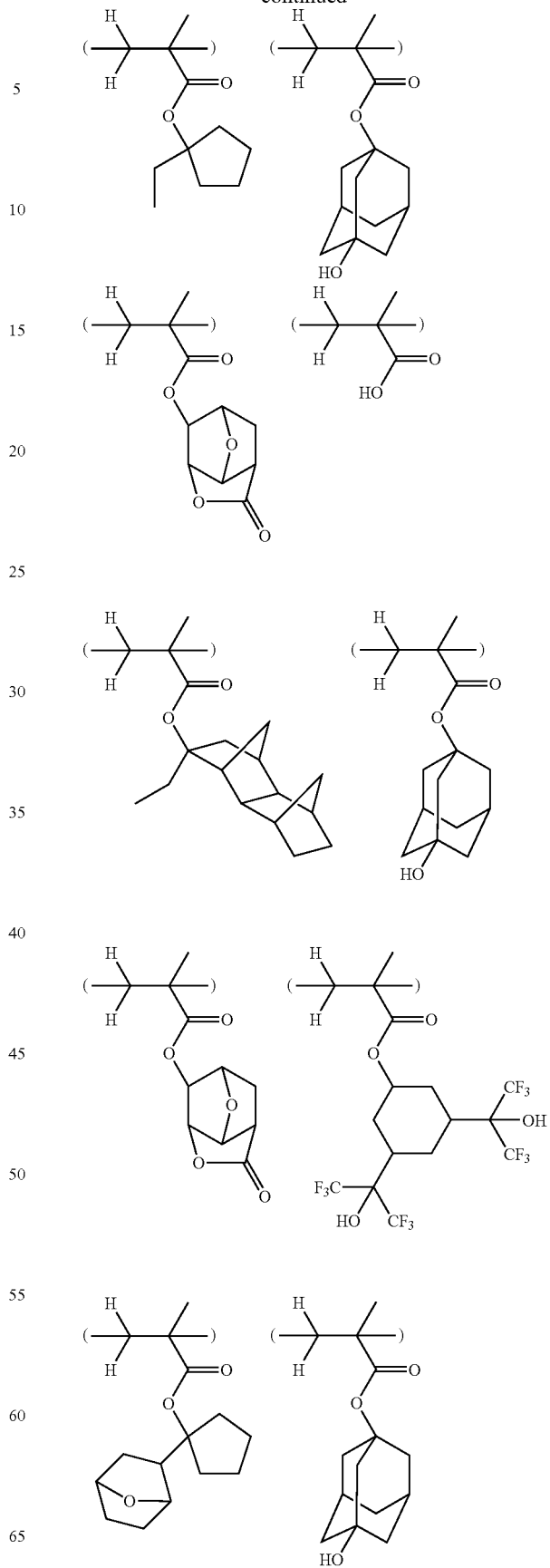

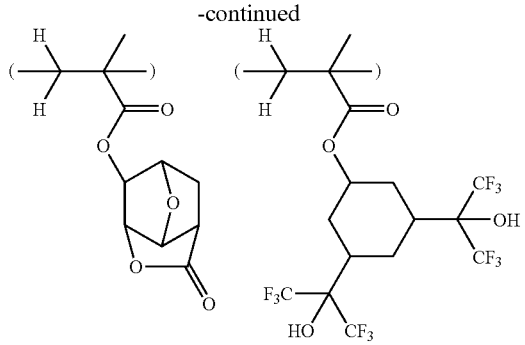
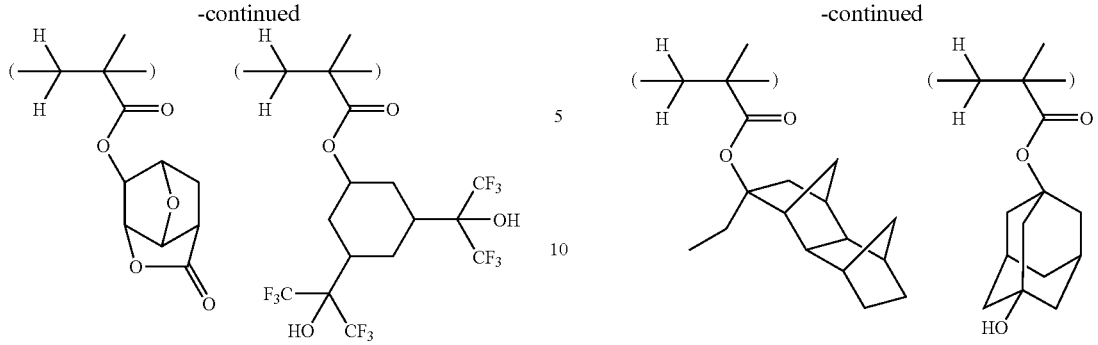
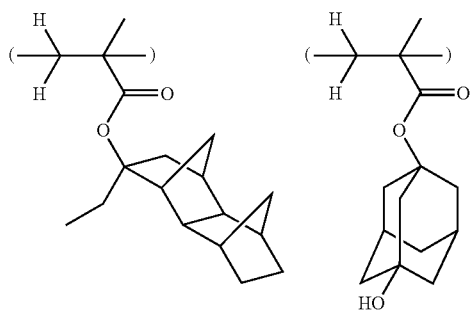
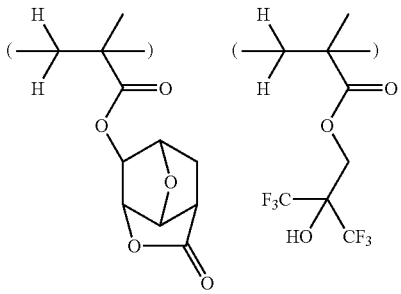
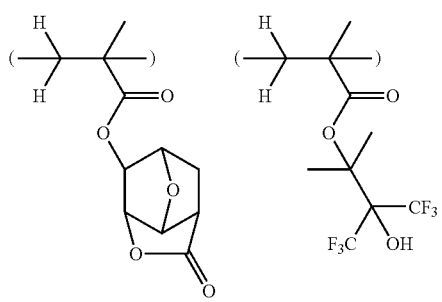
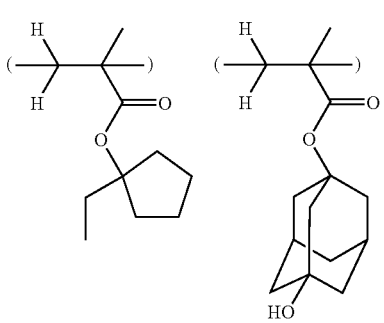
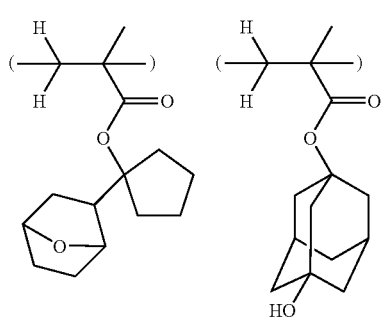
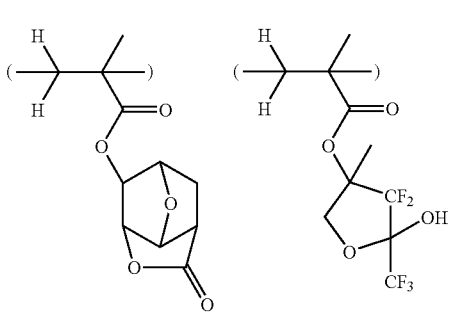
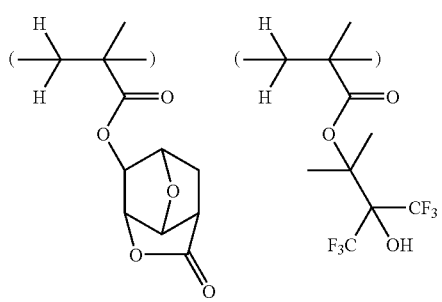
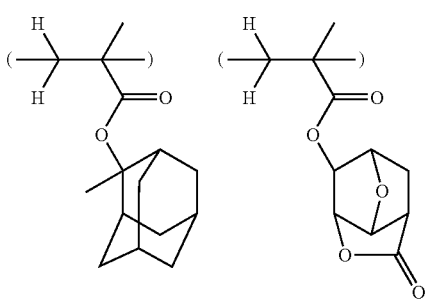

-continued
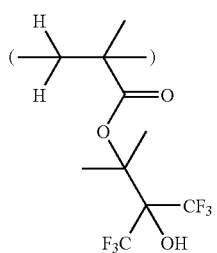
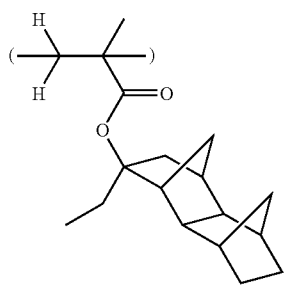
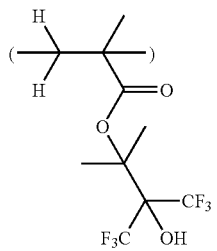
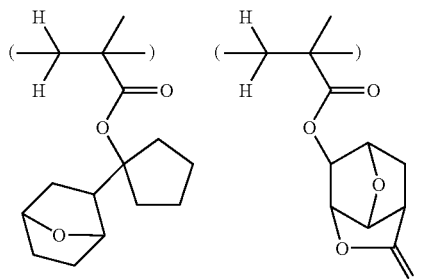
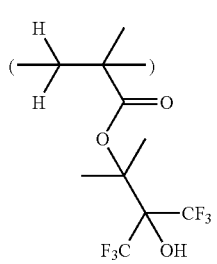
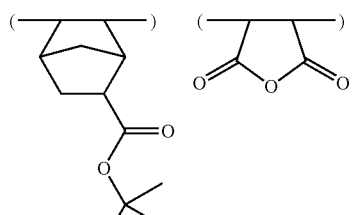
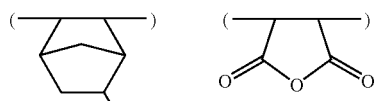
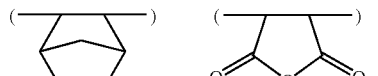
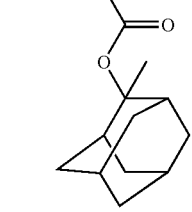
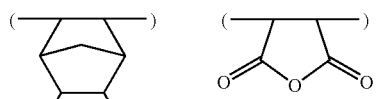
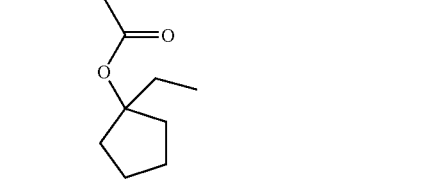
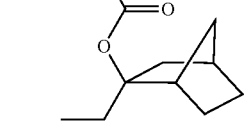
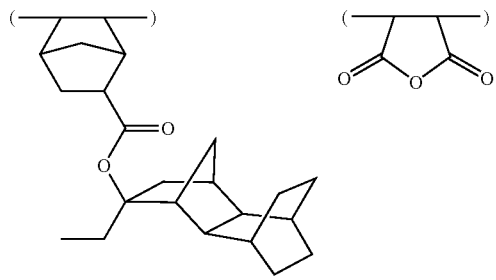
Exemplary polymers comprising recurring units incorporated at compositional ratios a2', b2', c2', d2', and e' in formula (R1) are shown below, but not limited thereto.

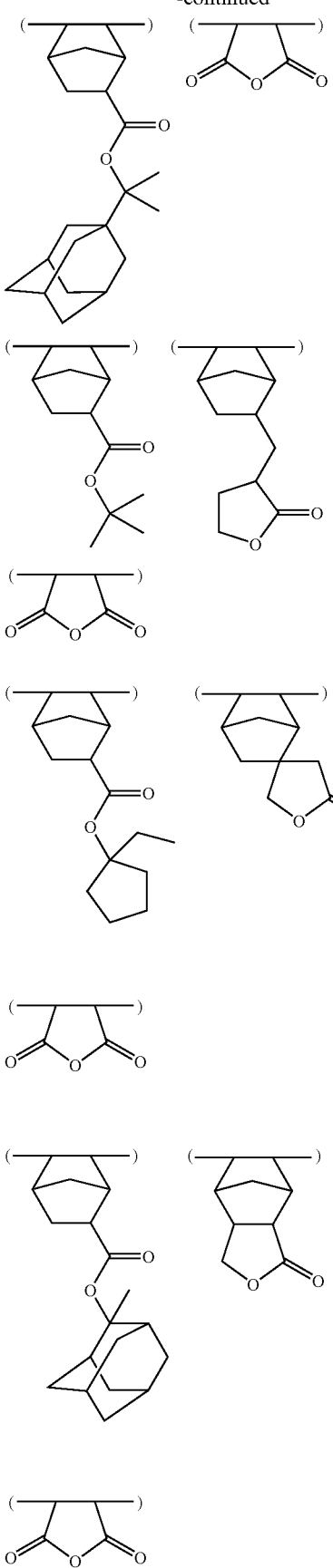
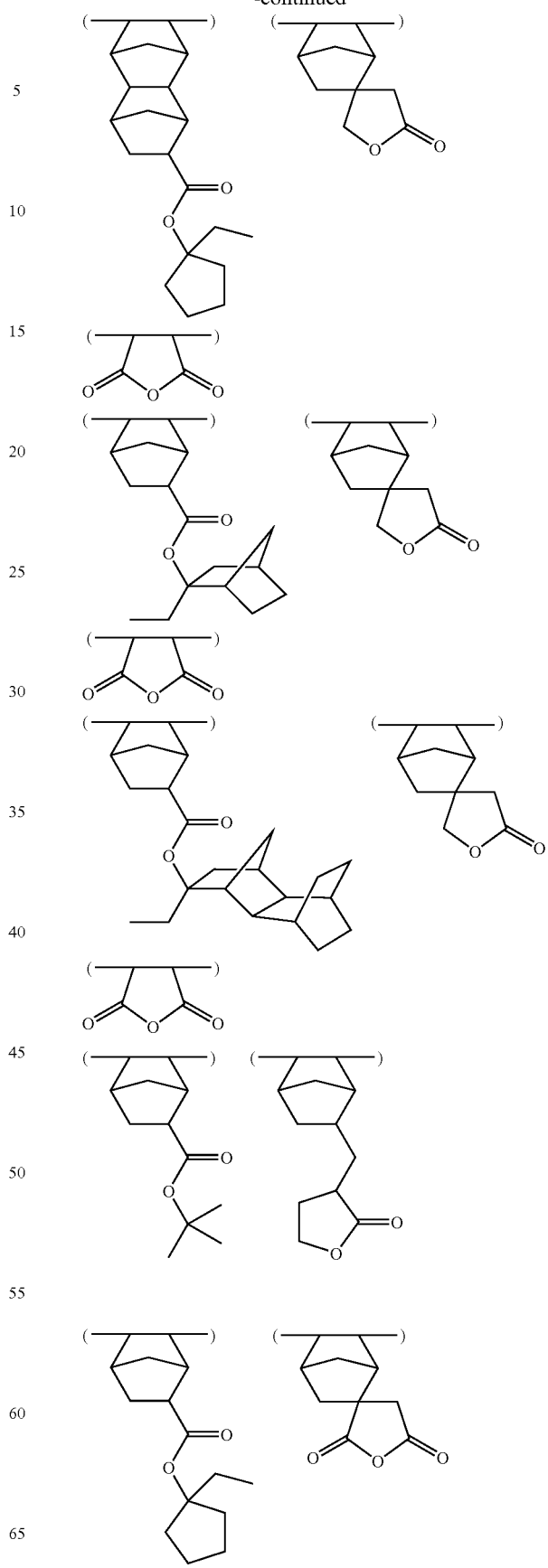

-continued
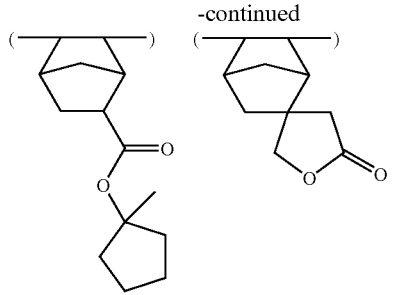
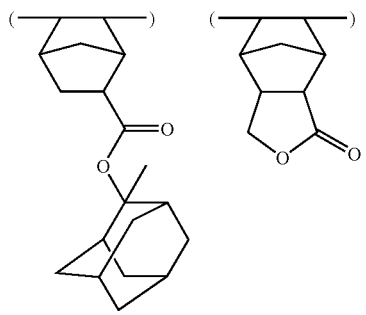
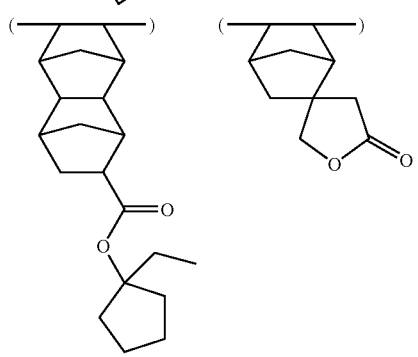
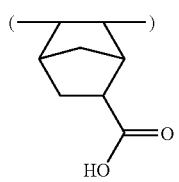
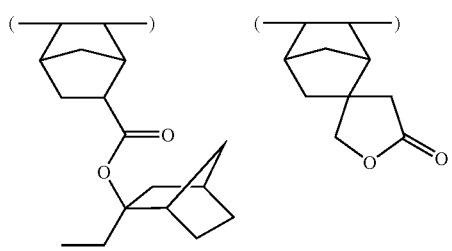
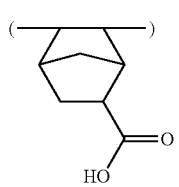
-continued
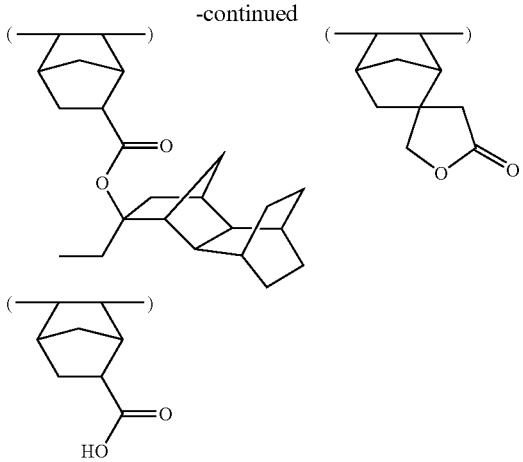
Exemplary polymers comprising recurring units incorporated at compositional ratios a3', b3', c3', and d3' in formula (R1) are shown below, but not limited thereto.
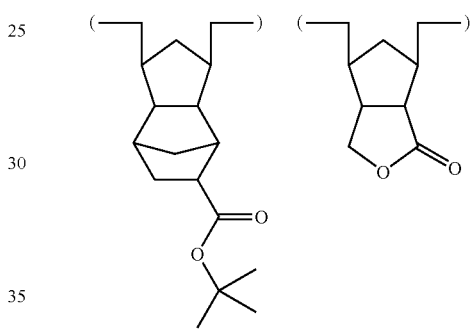
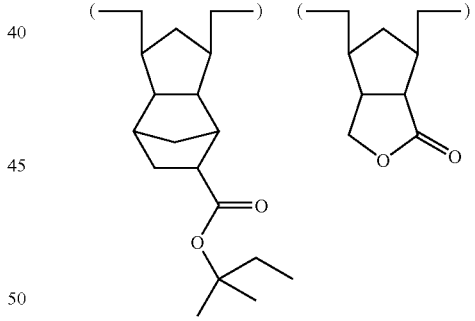
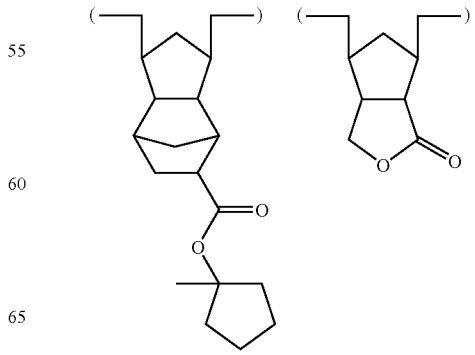

153
-continued
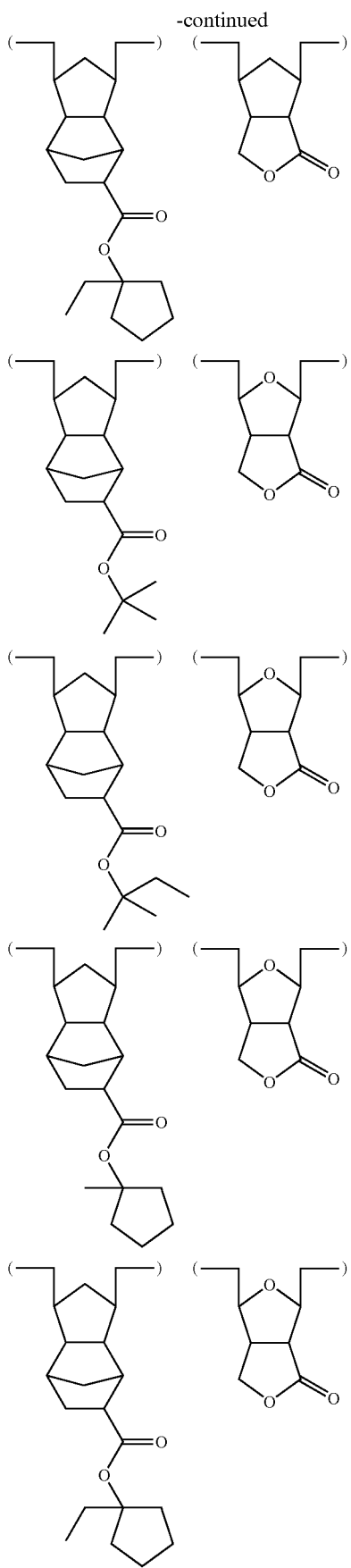
154
-continued
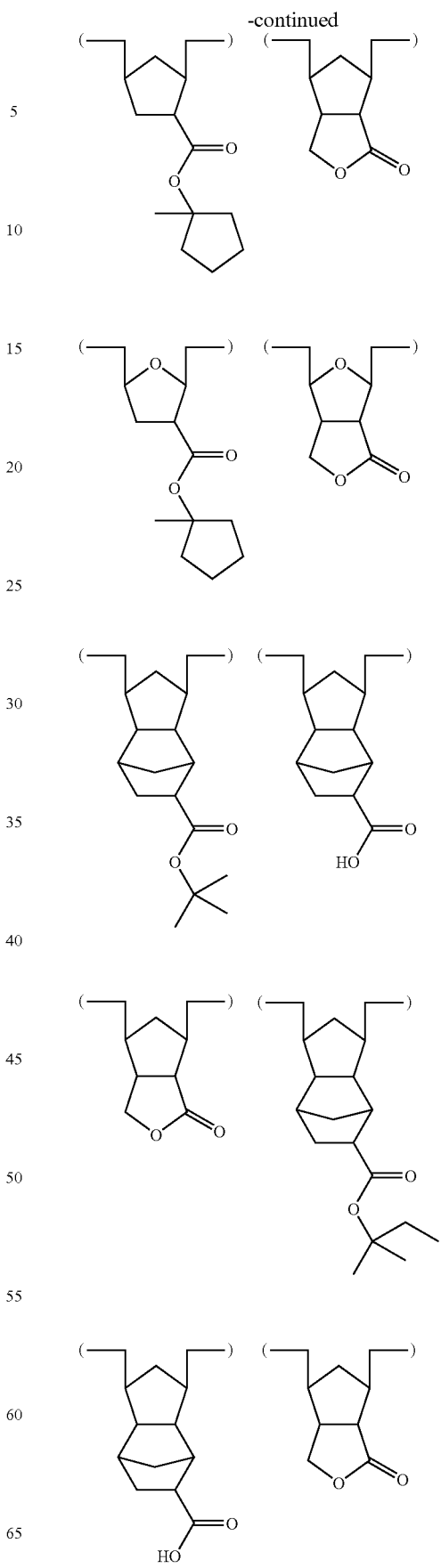

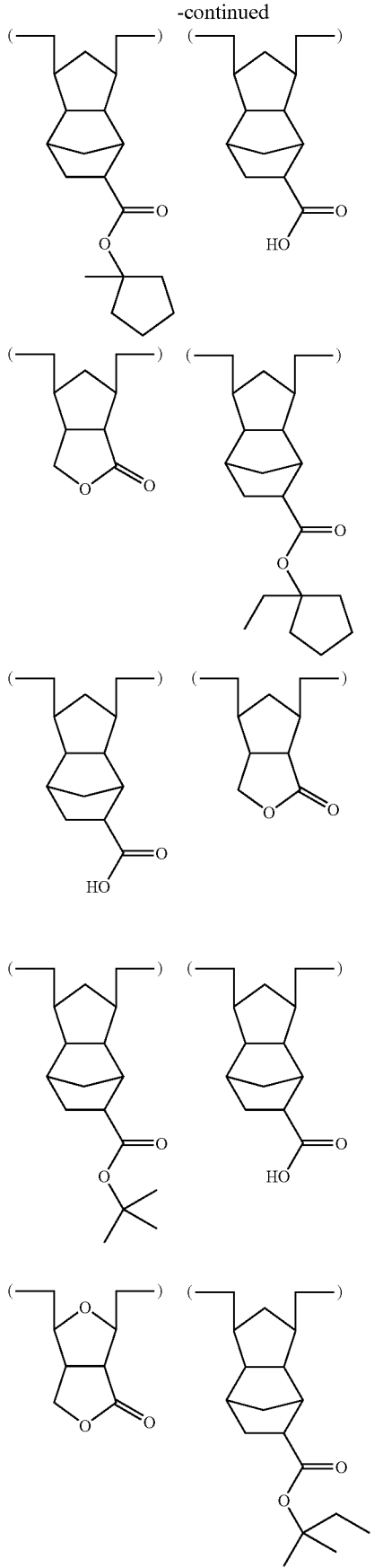
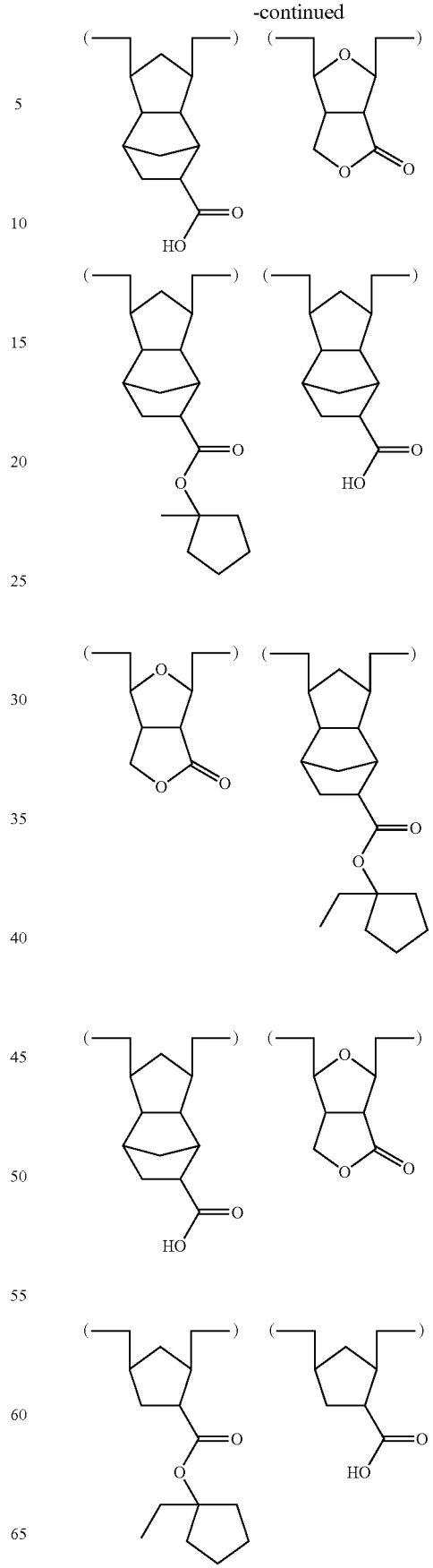

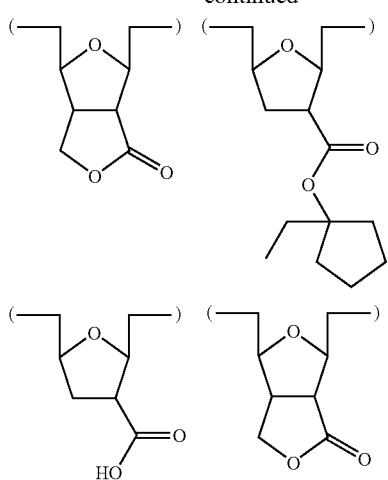
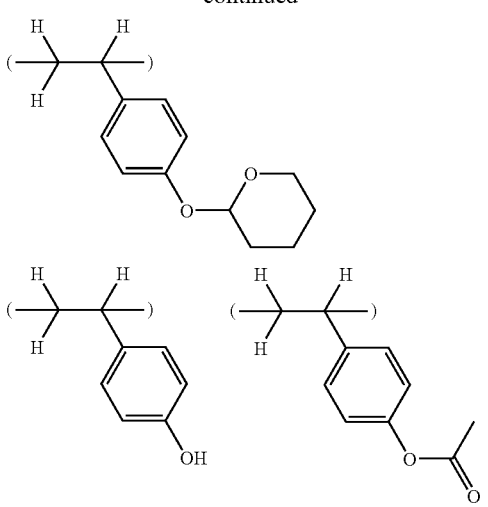
Examples of polymers having formula (R2) are shown below, but not limited thereto.
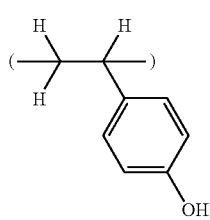
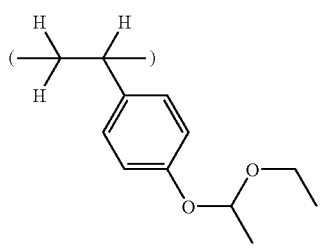
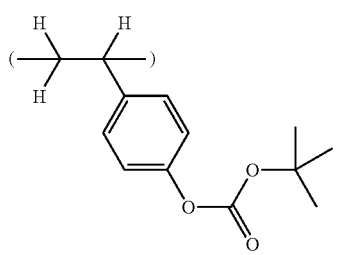
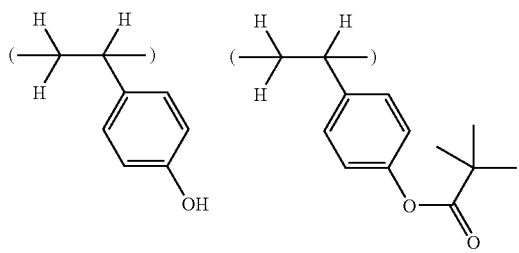
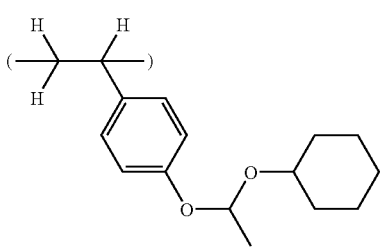
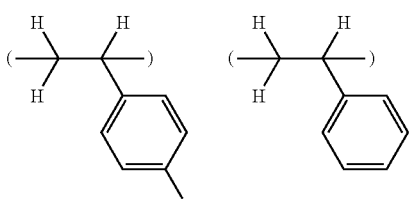
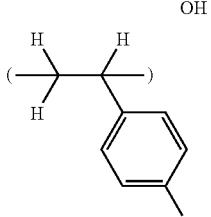
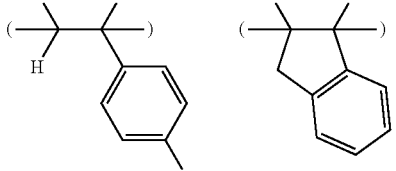
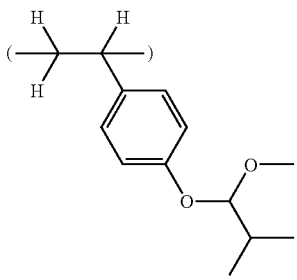

159
-continued
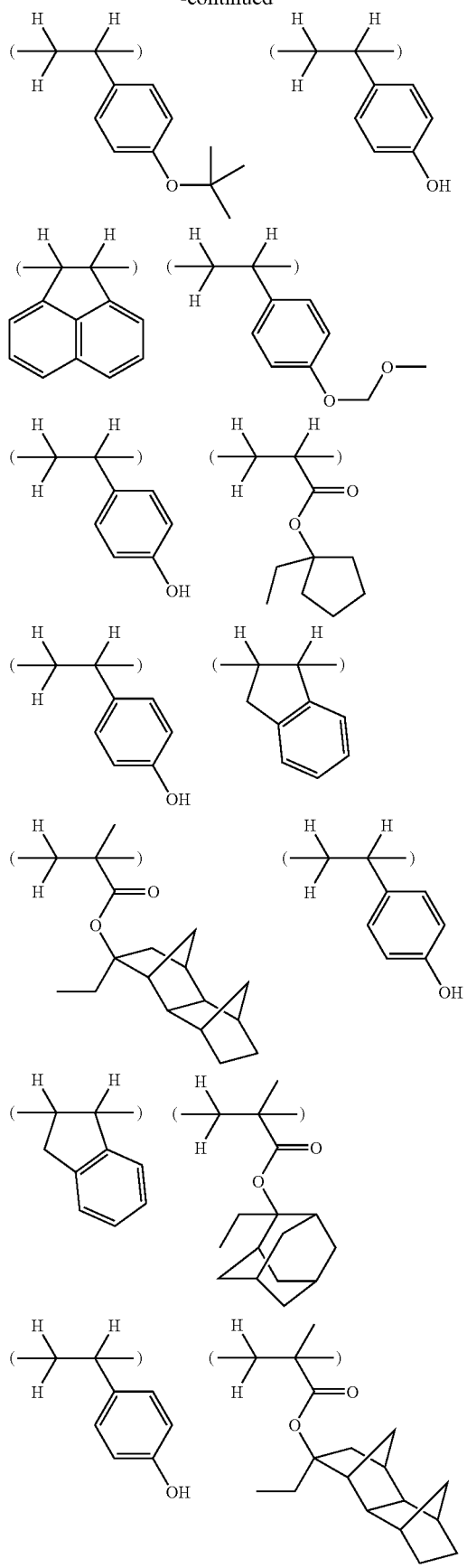
160
-continued
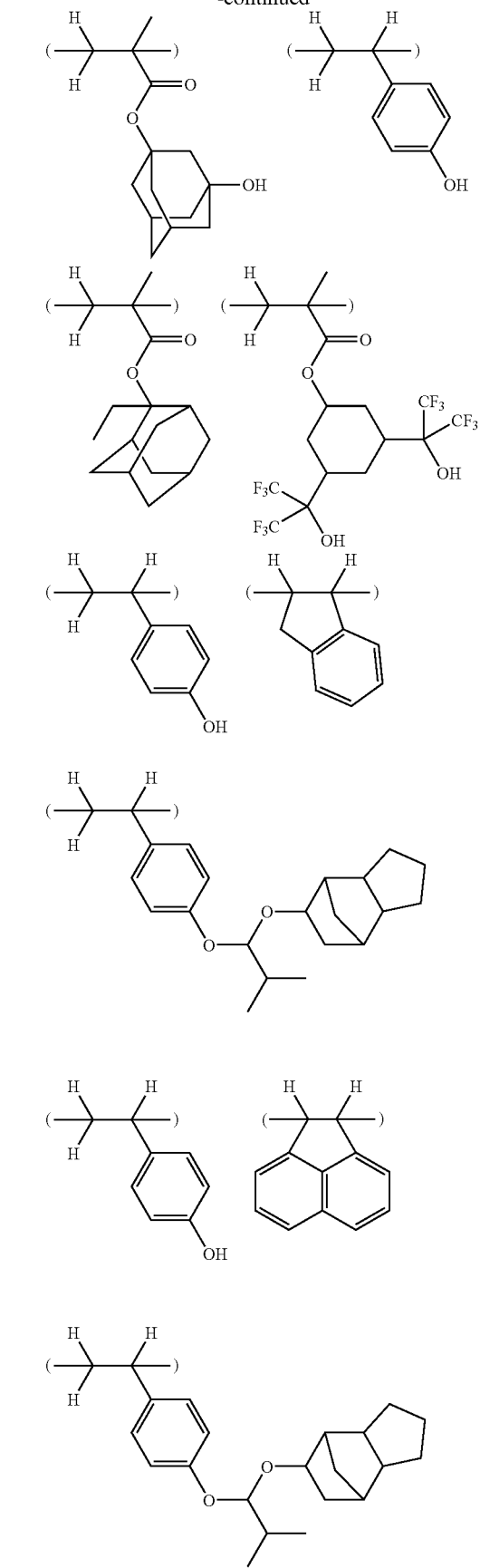

-continued

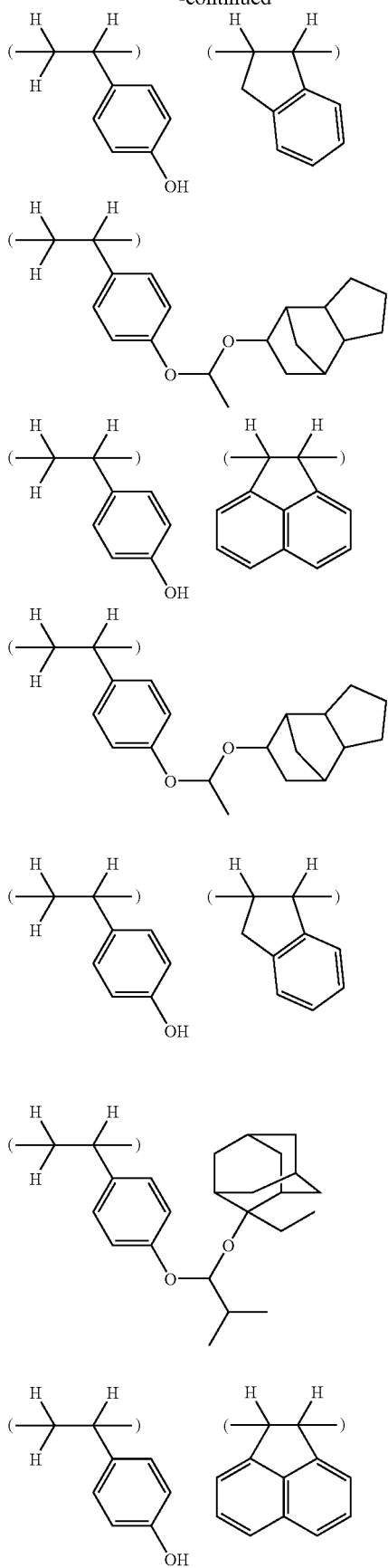

-continued

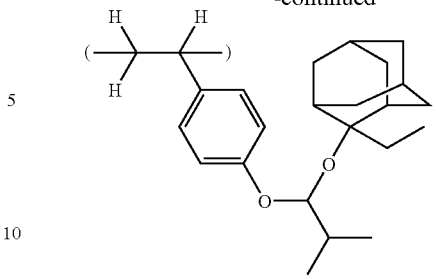

The other polymer is blended in an amount of preferably 0 to 80 parts, more preferably 0 to 60 parts, and even more preferably 0 to 50 parts by weight, provided that the total of the inventive polymer and the other polymer as resin component (B) is 100 parts by weight. When blended, the amount of the other polymer is preferably at least 20 parts, more preferably at least 30 parts by weight. Too much amounts of the other polymer may prevent the inventive polymer as resin component (B) from exerting its own effect, probably resulting in a lower resolution and degraded pattern profile. The other polymer is not limited to one type and a mixture of two or more other polymers may be added. The use of plural polymers allows for easy adjustment of resist properties.

Photoacid Generator

The resist composition of the invention also comprises (C) a compound which generates an acid in response to actinic light or radiation. Component (C) may be any compound which generates an acid upon exposure to high-energy radiation and specifically, any of well-known photoacid generators which are commonly used in prior art resist compositions, especially chemically amplified resist compositions. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 4-methylphenyldiphenylsulfonium, 4-tert-butylphenyldiphenylsulfonium, bis(4-methylphenyl)phenylsulfonium, bis(4-tert-butylphenyl)phenylsulfonium, tris(4-methylphenyl)sulfonium, tris(4-tert-butylphenyl)sulfonium, tris(phenylmethyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, trimethylsulfonium, diphenylmethylsulfonium, dimethylphenylsulfonium, 2-oxopropylthiacyclopentanium, 2-oxobutylthiacyclopentanium, 2-oxo-3,3-dimethylbutylthiacyclopentanium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate. Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Sulfonium salts based on combination of the foregoing examples are included.

Iodonium salts which can be used herein include those described in US 2008153030 (JP-A 2008-158339, paragraph [0206]). Iodonium salts are salts of iodonium cations with sulfonates, bis(substituted alkylsulfonyl)imides and tris(substituted alkylsulfonyl)methides. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include pentafluoroethylperfluorocyclohexanesulfonate, 2,2,2-trifluoroethanesulfonate, pentafluorobenzenesulfonate, 4-trifluoromethylbenzenesulfonate, and 4-fluorobenzenesulfonate. Exemplary bis(substituted alkylsulfonyl)imides include bistrifluoromethylsulfonylimide, bispentafluoroethylsulfonylimide, bisheptafluoropropylsulfonylimide, and perfluoro-1,3-propylenebissulfonylimide. A typical tris(substituted alkylsulfonyl)methide is tristrifluoromethylsulfonylmethide. Iodonium salts based on combination of the foregoing examples are included.

Sulfonyldiazomethane compounds which can be used herein include those described in U.S. Pat. No. 7,498,126 (JP-A 2007-333933, paragraph [0073]). Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators which can be used herein include those described in U.S. Pat. No. 7,498,126 (JP-A 2007-333933, paragraph [0074]). N-sulfonyloxydicarboxyimide photoacid generators include combinations of imide skeletons with sulfonates. Exemplary imide skeletons are succinimide, naphthalenedicarboxyimide, phthalimide, cyclohexyldicarboxyimide, 5-norbornene-2,3-dicarboxyimide, and 7-oxabicyclo[2.2.1]-5-heptene-2,3-dicarboxyimide. Exemplary sulfonates include trifluoromethanesulfonate, pentafluoroethanesulfonate, heptafluoropropanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Suitable O-arylsulfonyloxime compounds and O-alkylsulfonyloxime compounds (oxime sulfonates) include photoacid generators in the form of glyoxime derivatives; photoacid generators in the form of oxime sulfonates with a long conjugated system separated by thiophene or cyclohexadiene; oxime sulfonates having an electron withdrawing group such as trifluoromethyl incorporated for increased stability; oxime sulfonates using phenylacetonitrile or substituted acetonitrile derivatives; and bisoxime sulfonates.

Photoacid generators in the form of glyoxime derivatives which can be used herein include those described in JP-A 2006-178317, paragraph [0131]. Suitable glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedionedioxime, bis-O-(p-toluenesulfonyl)-2-methyl-3,4-pentanedionedioxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis- O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Photoacid generators in the form of oxime sulfonates with a long conjugated system separated by thiophene or cyclohexadiene which can be used herein include those described in JP-A 2008-133448, paragraph [0105]. Suitable examples include (5-(p-toluenesulfonyl)oxyimino-5H-thiophen-2-ylidene)phenylacetonitrile, (5-(10-camphorsulfonyl)oxyimino-5H-thiophen-2-ylidene)phenylacetonitrile, (5-n-octanesulfonyloxyimino-5H-thiophen-2-ylidene)phenylacetonitrile, (5-(p-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene) (2-methylphenyl)acetonitrile, (5-(4-(p-toluenesulfonyloxy)benzenesulfonyl)oxyimino-5H-thiophen-2-ylidene)phenylacetonitrile, and (5-(2,5-bis(p-toluenesulfonyloxy)benzenesulfonyl)oxyimino-5H-thiophen-2-ylidene)phenylacetonitrile.

Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate.

Suitable oxime sulfonates having an electron withdrawing group such as trifluoromethyl incorporated for increased stability which can be used herein include those described in JP-A 2008-133448, paragraph [0106]. Suitable examples include 2,2,2-trifluoro-1-phenyl-ethanone O-(methylsulfonyl)oxime, 2,2,2-trifluoro-1-phenyl-ethanone O-(10-camphorsulfonyl)oxime, 2,2,2-trifluoro-1-phenylethanone O-(4-methoxybenzenesulfonyl)oxime, 2,2,2-trifluoro-1-phenylethanone O-(1-naphthyl-sulfonyl)oxime, 2,2,2-trifluoro-1-phenylethanone O-(2-naphthylsulfonyl)oxime, 2,2,2-trifluoro-1-phenylethanone O-(2,4,6-trimethylphenylsulfonyl)oxime, 2,2,2-trifluoro-1-(4-methylphenyl)ethanone O-(10-camphorsulfonyl)oxime, 2,2,2-trifluoro-1-(4-methylphenyl)ethanone O-(methylsulfonyl)oxime, 2,2,2-trifluoro-1-(2-methylphenyl)ethanone O-(10-camphorsulfonyl)oxime, 2,2,2-trifluoro-1-(2,4-dimethylphenyl)ethanone O-(10-camphorsulfonyl)oxime, 2,2,2-trifluoro-1-(2,4-dimethylphenyl)ethanone O-(1-naphthylsulfonyl)oxime, 2,2,2-trifluoro-1-(2,4-dimethylphenyl)-ethanone O-(2-naphthylsulfonyl)oxime, 2,2,2-trifluoro-1-(2,4,6-trimethylphenyl)-ethanone O-(10-camphorsulfonyl)oxime, 2,2,2-trifluoro-1-(2,4,6-trimethylphenyl)ethanone O-(1-naphthylsulfonyl)oxime, 2,2,2-trifluoro-1-(2,4,6-trimethylphenyl)ethanone O-(2-naphthylsulfonyl)oxime, 2,2,2-trifluoro-1-(4-methoxyphenyl)ethanone O-(methylsulfonyl)oxime, 2,2,2-trifluoro-1-(4-methylthiophenyl)-ethanone O-(methylsulfonyl)oxime, 2,2,2-trifluoro-1-(3,4-dimethoxyphenyl)ethanone O-(methylsulfonyl)oxime, 2,2,2-trifluoro-1-(4-methoxyphenyl)ethanone O-(4-methylphenylsulfonyl)oxime, 2,2,2-trifluoro-1-(4-methoxyphenyl)ethanone O-(4-methoxyphenylsulfonyl)oxime, 2,2,2-trifluoro-1-(4-methoxyphenyl)ethanone O-(4-dodecyl-phenylsulfonyl)oxime, 2,2,2-trifluoro-1-(4-methoxyphenyl)-ethanone O-(octylsulfonyl)oxime, 2,2,2-trifluoro-1-(4-thiomethylphenyl)ethanone O-(4-methoxyphenylsulfonyl)oxime, 2,2,2-trifluoro-1-(4-thiomethylphenyl)ethanone O-(4-dodecylphenylsulfonyl)oxime, 2,2,2-trifluoro-1-(4-thiomethylphenyl)ethanone O-(octylsulfonyl)oxime, 2,2,2-trifluoro-1-(4-thiomethylphenyl)ethanone O-(2-naphthylsulfonyl)oxime, 2,2,2-trifluoro-1-(2-methylphenyl)ethanone O-(methylsulfonyl)oxime, 2,2,2-trifluoro-1-(4-methylphenyl)ethanone O-(phenylsulfonyl)oxime, 2,2,2-trifluoro-1-(4-chlorophenyl)-ethanone O-(phenylsulfonyl)oxime, 2,2,3,3,4,4,4-heptafluoro-1-phenylbutanone O-(10-camphorsulfonyl)oxime, 2,2,2-trifluoro-1-(1-naphthyl)ethanone O-(methylsulfonyl)oxime, 2,2,2-trifluoro-1-(2-naphthyl)ethanone O-(methylsulfonyl)oxime, 2,2,2-trifluoro-1-(4-benzylphenyl)ethanone O-(methylsulfonyl)oxime, 2,2,2-trifluoro-1-(4-(phenyl-1,4-dioxa-but-1-yl)phenyl)ethanone O-(methylsulfonyl)oxime, 2,2,2-trifluoro-1-(1-naphthyl)ethanone O-(propylsulfonyl)oxime, 2,2,2-trifluoro-1-(2-naphthyl)ethanone O-(propylsulfonyl)oxime, 2,2,2-trifluoro-1-(4-benzylphenyl)ethanone O-(propylsulfonyl)oxime, 2,2,2-trifluoro-1-(4-methylsulfonylphenyl)ethanone O-(propylsulfonyl)oxime, 2,2,2-trifluoro-1-(4-methylsulfonyloxyphenyl)ethanone O-(propylsulfonyl)oxime, 2,2,2-trifluoro-1-(4-methylcarbonyloxyphenyl)ethanone O-(propylsulfonyl)oxime, 2,2,2-trifluoro-1-(6H,7H-5,8-dioxonaphth-2-yl)ethanone O-(propylsulfonyl)oxime, 2,2,2-trifluoro-1-(4-methoxycarbonylmethoxyphenyl)ethanone O-(propylsulfonyl)oxime, 2,2,2-trifluoro-1-(4-methoxycarbonyl)-(4-amino-1-oxa-pent-1-yl)phenyl)ethanone O-(propylsulfonyl)oxime, 2,2,2-trifluoro-1-(3,5-dimethyl-4-ethoxyphenyl)ethanone O-(propylsulfonyl)oxime, 2,2,2-trifluoro-1-(4-benzyloxyphenyl)ethanone O-(propylsulfonyl)oxime, 2,2,2-trifluoro-1-(2-thiophenyl)ethanone O-(propylsulfonate)oxime, and 2,2,2-trifluoro-1-(1-dioxathiophen-2-yl)ethanone O-(propylsulfonate)oxime; 2,2,2-trifluoro-1-(4-(3-(4-(2,2,2-trifluoro-1-(trifluoromethanesulfonyloxyimino)ethyl)phenoxy)propoxy)phenyl)ethanone O-(trifluoromethanesulfonyl)oxime, 2,2,2-trifluoro-1-(4-(3-(4-(2,2,2-trifluoro-1-(1-propanesulfonyloxyimino)ethyl)phenoxy)-propoxy)phenyl)ethanone O-(propylsulfonyl)oxime, 2,2,2-trifluoro-1-(4-(3-(4-(2,2,2-trifluoro-1-(1-butanesulfonyloxyimino)ethyl)phenoxy)propoxy)phenyl)ethanone O-(butylsulfonyl)oxime, 2,2,2-trifluoro-1-(4-(3-(4-(2,2,2-trifluoro-1-(4-(4-methylphenylsulfonyloxy)phenylsulfonyloxyimino)ethyl)phenoxy)propoxy)phenyl)ethanone O-(4-(4-methylphenylsulfonyloxy)phenylsulfonyl)oxime, and 2,2,2-trifluoro-1-(4-(3-(4-(2,2,2-trifluoro-1-(2,5-bis(4-methylphenylsulfonyloxy)benzenesulfonyloxy)phenylsulfonyloxyimino)ethyl)phenoxy)propoxy)phenyl)ethanone O-(2,5-bis(4-methylphenylsulfonyloxy)benzenesulfonyloxy)

phenylsulfonyl)oxime. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentauoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Suitable other O-arylsulfonyloxime compounds and O-alkylsulfonyloxime compounds (oxime sulfonates) include oxime sulfonates having an electron attractive group such as trifluoromethyl incorporated therein for imparting stability, represented by the formula (Ox-1).

(Ox-1)

Herein $R^{401}$ is a substituted or unsubstituted $C_1$-$C_{10}$ haloalkylsulfonyl or halobenzenesulfonyl group, $R^{402}$ is a $C_1$-$C_{11}$ haloalkyl group, and $Ar^{401}$ is substituted or unsubstituted aromatic or hetero-aromatic group.

Examples include 2-[2,2,3,3,4,4,5,5-octafluoro-1-(nonafluorobutylsulfonyloxyimino)pentyl]fluorene, 2-[2,2,3,3,4,4-pentafluoro-1-(nonafluorobutylsulfonyloxyimino)butyl]fluorene, 2-[2,2,3,3,4,4,5,5,6,6-decafluoro-1-(nonafluorobutylsulfonyloxyimino)hexyl]fluorene, 2-[2,2,3,3,4,4,5,5-octafluoro-1-(nonafluorobutylsulfonyloxyimino)pentyl]-4-biphenyl, 2-[2,2,3,3,4,4-pentafluoro-1-(nonafluorobutylsulfonyloxyimino)butyl]-4-biphenyl, and 2-[2,2,3,3,4,4,5,5,6,6-decafluoro-1-(nonafluorobutylsulfonyloxyimino)hexyl]-4-biphenyl.

Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Suitable oxime sulfonate generators using substituted acetonitrile derivatives which can be used herein include those described in JP-A 2008-133448, paragraph [0109]. Examples include α-(p-toluenesulfonyloxyimino)-phenylacetonitrile, α-(p-chlorobenzenesulfonyloxyimino)-phenylacetonitrile, α-(4-nitrobenzenesulfonyloxvimino)-phenylacetonitrile, α-(4-nitro-2-trifluoromethylbenzenesulfonyloxyimino)phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl]acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

Suitable bisoxime sulfonate generators which can be used herein include those described in JP-A 2008-133448, paragraph [0110]. Suitable bisoxime sulfonates include bis(α-(p-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(trifluoromethanesulfonyloxy)imino)-p-phenylenediacetonitrile, bis(α-(4- methoxybenzenesulfonyloxy)imino)-p-phenylenediacetonitrile, bis(α-(p-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(trifluoromethanesulfonyloxy)imino)-m-phenylenediacetonitrile, bis(α-(4-methoxybenzenesulfonyloxy)imino)-m-phenylenediacetonitrile, etc. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate.

From the standpoints of sensitivity and stability, preference is given to sulfonium salts, bissulfonyldiazomethanes, N-sulfonyloxyimides and oxime-O-sulfonates. Preferred examples of the sulfonium salts include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(p-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(p-toluenesulfonyloxy)benzenesulfonate, 4-tert-butylphenyldiphenylsulfonium camphorsulfonate, 4-tert-butylphenyldiphenylsulfonium 2,4,6-triisopropylbenzenesulfonate, tris(4-methylphenyl)sulfonium camphorsulfonate, 10-phenylphenoxathiinium 2,4,6-triisopropylbenzenesulfonate, triphenylsulfonium trifluoromethanesulfonate, triphenylsulfonium pentafluoroethanesulfonate, triphenylsulfonium heptafluoropropanesulfonate, triphenylsulfonium nonafluorobutanesulfonate, triphenylsulfonium tridecafluorohexanesulfonate, triphenylsulfonium heptadecafluorooctanesulfonate, triphenylsulfonium perfluoro(4-ethylcyclohexane)sulfonate, 4-methylphenyldiphenylsulfonium nonafluorobutanesulfonate, 2-oxo-2-phenylethylthiacyclopentanium nonafluorobutanesulfonate, 4-tert-butylphenyldiphenylsulfonium nonafluorobutanesulfonate, 4-tert-butylphenyldiphenylsulfonium perfluoro(4-ethylcyclohexane)sulfonate, 4-tert-butylphenyldiphenylsulfonium heptafluorooctanesulfonate, triphenylsulfonium 1,1-difluoro-2-naphthylethanesulfonate, triphenylsulfonium 1,1,2,2-tetrafluoro-2-(norbornan-2-yl)ethanesulfonate, triphenylsulfonium 2-benzoyloxy-1,1,3,3,3-pentafluoropropanesulfonate, triphenylsulfonium 1,1,3,3,3-pentafluoro-2-(pivaloyloxy)propanesulfonate, triphenylsulfonium 2-(cyclohexanecarbonyloxy)-1,1,3,3,3-pentafluoropropanesulfonate, triphenylsulfonium 2-(2-naphthoyloxy)-1,1,3,3,3-pentafluoropropanesulfonate, triphenylsulfonium 2-(1-adamantanecarbonyloxy)-1,1,3,3,3-pentafluoropropanesulfonate, triphenylsulfonium 2-hydroxy-1,1,3,3,3-pentafluoropropanesulfonate, triphenylsulfonium adamantanemethoxycarbonyldifluoromethanesulfonate, triphenylsulfonium 1-(3-hydroxymethyladamantane)methoxycarbonyldifluoromethanesulfonate, triphenylsulfonium methoxycarbonyldifluoromethanesulfonate, 4-tert-butylphenyldiphenylsulfonium 2-benzoyloxy-1,1,3,3,3-pentafluoropropanesulfonate, 4-tert-butylphenyldiphenylsulfonium 1,1,3,3,3-pentafluoro-2-(pivaloyloxy)propanesulfonate, 4-tert-butylphenyldiphenylsulfonium 2-(cyclohexanecarbonyloxy)-1,1,3,3,3-pentafluoropropanesulfonate, 4-tert-butylphenyldiphenylsulfonium 2-(2-naphthoyloxy)-1,1,3,3,3-pentafluoropropanesulfonate, 4-tert-butylphenyldiphenylsulfonium 2-(1-adamantanecarbonyloxy)-1,1,3,3,3-pentafluoropropanesulfonate, 4-tert-butylphenyldiphenylsulfonium 2-hydroxy-1,1,3,3,3-pentafluoropropanesulfonate, 4-tert-butylphenyldiphenylsulfonium adamantanemethoxycarbonyldifluoromethanesulfonate, 4-tert-butylphenyldiphenylsulfonium 1-(3-hydroxymethyladamantane)methoxycarbonyldifluoromethanesulfonate, and 4-tert-butylphenyldiphenylsulfonium methoxycarbonyldifluoromethanesulfonate.

Preferred examples of the bissulfonyldiazomethanes include bis(tert-butylsulfonyl)diazomethane, bis(cyclohexylsulfonyl)diazomethane, bis(2,4-dimethylphenylsulfonyl)diazomethane, bis(4-n-hexyloxyphenylsulfonyl)diazomethane, bis(2-methyl-4-n-hexyloxyphenylsulfonyl)diazomethane, bis(2,5-dimethyl-4-n-hexyloxyphenylsulfonyl)diazomethane, bis(3,5-dimethyl-4-n-hexyloxyphenylsulfonyl)diazomethane, bis(2-methyl-5-isopropyl-4-n-hexyloxy)phenylsulfonyldiazomethane, bis(4-tert-butylphenylsulfonyl)diazomethane.

Preferred examples of the N-sulfonyloxyimides include N-camphorsulfonyloxy-5-norbornene-2,3-dicarboxylic acid imide, N-p-toluenesulfonyloxy-5-norbornene-2,3-dicarboxylic acid imide, (5-(10-camphorsulfonyl)oxyimino-5H-thiophen-2-ylidene)(2-methylphenyl)acetonitrile, and (5-(p-toluenesulfonyl)oxyimino-5H-thiophen-2-ylidene)(2-methylphenyl)acetonitrile.

Preferred examples of the oxime-O-sulfonates include 2-oxo-2-phenylethylthiacyclopentanium 2-benzoyloxy-1,1,3,3,3-pentafluoropropanesulfonate, 2-oxo-2-phenylethylthiacyclopentanium 2-cyclohexanecarbonyloxy-1,1,3,3,3-pentafluoropropanesulfonate, triphenylsulfonium perfluoro(1,3-propylenebissulfonyl)imide, triphenylsulfonium bis(pentafluoroethylsulfonyl)imide, 2-(2,2,3,3,4,4,5,5-octafluoro-1-(nonafluorobutylsulfonyloxyimino)pentyl)fluorene, 2-(2,2,3,3,4,4-pentafluoro-1-(nonafluorobutylsulfonyloxyimino)butyl)fluorene, 2-(2,2,3,3,4,4,5,5,6,6-decafluoro-1-(nonafluorobutylsulfonyloxyimino)hexyl)fluorene, 2-(2,2,3,3,4,4,5,5-octafluoro-1-(2-(cyclohexanecarbonyloxy)-1,1,3,3-pentafluoropropanesulfonyloxyimino)pentyl)fluorene, 2-(2,2,3,3,4,4-pentafluoro-1-(2-(cyclohexanecarbonyloxy)-1,1,3,3,3-pentafluoropropanesulfonyloxyimino)butyl)fluorene, and 2-(2,2,3,3,4,4,5,5,6,6-decafluoro-1-(nonafluorobutylsulfonyloxyimino)hexyl)fluorene.

The acid generator (C) is preferably added in an amount of 0.1 to 50 parts, more preferably 0.5 to 20 parts, and even more preferably 1 to 10 parts by weight, per 100 parts by weight of the base resin (B). Less than 0.1 phr of the acid generator may generate a less amount of acid upon exposure, sometimes leading to a poor sensitivity and resolution. More than 50 phr of the acid generator may adversely affect the transmittance and resolution of resist. While crosslinking reaction to render the resist pattern insoluble in both organic solvent and alkaline developer is effected by high-temperature heating, the acid generator added to the resist composition can act as a plasticizer in this step to allow for a thermal flow in the resist pattern. This imposes a certain limit on the amount of the acid generator added. In this sense, the upper limit of addition is preferably up to 10 parts by weight of the acid generator per 100 parts by weight of the base resin.

In the resist composition of the invention, there may be added a compound which is decomposed with an acid to generate another acid, that is, acid amplifier compound. For these compounds, reference should be made to J. Photopolym. Sci. and Tech., 8, 43-44, 45-46 (1995), and ibid., 9, 29-30 (1996). Examples of the acid amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior. In the resist composition, an appropriate amount of the acid amplifier compound is 0 to 2 parts, and especially 0 to 1 part by weight per 100 parts by weight of the base resin. Excessive amounts of the acid amplifier compound make diffusion control difficult, leading to degradation of resolution and pattern profile.

Basic Compound

In the resist composition, a basic compound or organic nitrogen-containing compound (D) may be compounded. The organic nitrogen-containing compound used herein is preferably a compound capable of suppressing the rate of diffusion when the acid generated by the acid generator diffuses within the resist film. The inclusion of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

The organic nitrogen-containing compound may be any of well-known organic nitrogen-containing compounds used in conventional resist compositions, typically chemically amplified resist compositions. Examples of organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, carbamate derivatives, and ammonium salts.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl) pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, methoxyalanine, and dibutylaminobenzoic acid). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

Examples of suitable ammonium salts include pyridinium p-toluenesulfonate, triethylammonium p-toluenesulfonate, trioctylammonium p-toluenesulfonate, triethylammonium 2,4,6-triisopropylbenzenesulfonate, trioctylammonium 2,4,6-triisopropylbenzenesulfonate, triethylammonium camphorsulfonate, trioctylammonium camphorsulfonate, tetramethylammonium hydroxide, tetraethylammonium hydroxide, tetrabutylammonium hydroxide, benzyltrimethylammonium hydroxide, tetramethylammonium, p-toluenesulfonate, tetrabutylammonium p-toluenesulfonate, benzyltrimethylammonium p-toluenesulfonate, tetramethylammonium camphorsulfonate, tetrabutylammonium camphorsulfonate, benzyltrimethylammonium camphorsulfonate, tetramethylammonium 2,4,6-triisopropylbenzenesulfonate, tetrabutylammonium 2,4,6-triisopropylbenzenesulfonate, benzyltrimethylammonium 2,4,6-triisopropylbenzenesulfonate, tetramethylammonium acetate, tetrabutylammonium acetate, benzyltrimethylammonium acetate, tetramethylammonium benzoate, tetrabutylammonium benzoate, and benzyltrimethylammonium benzoate.

In addition, organic nitrogen-containing compounds of the following general formula (D)-1 may also be included alone or in admixture.

$$N(X)_n(Y)_{3-n} \quad (D)\text{-}1$$

In the formula, n is equal to 1, 2 or 3; side chain Y is independently hydrogen or a straight, branched or cyclic $C_1$-$C_{20}$ alkyl group which may contain an ether or hydroxyl group; and side chain X is independently selected from groups of the following general formulas (X1) to (X3), and two or three X's may bond together to form a ring.

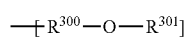  (X1)

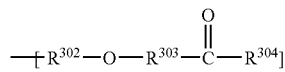  (X2)

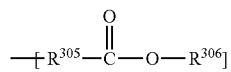  (X3)

Herein, $R^{300}$, $R^{302}$ and $R^{305}$ are independently straight or branched $C_1$-$C_4$ alkylene groups; $R^{301}$ and $R^{304}$ are independently hydrogen, straight, branched or cyclic $C_1$-$C_{20}$ alkyl groups, which may contain one or more hydroxyl, ether, ester group or lactone ring; $R^{303}$ is a single bond or a straight or branched $C_1$-$C_4$ alkylene group; and $R^{306}$ is a straight, branched or cyclic $C_1$-$C_{20}$ alkyl group, which may contain one or more hydroxyl, ether, ester group or lactone ring.

Illustrative examples of the compounds of formula (D)-1 include tris(2-methoxymethoxyethyl)amine, tris(2-(2-methoxyethoxy)ethyl)amine, tris(2-(2-methoxyethoxymethoxy)ethyl)amine, tris(2-(1-methoxyethoxy)ethyl)amine, tris(2-(1-ethoxyethoxy)ethyl)amine, tris(2-(1-ethoxypropoxy)ethyl)amine, tris[2-(2-(2-hydroxyethoxy)ethoxy)ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis (methoxycarbonylmethyl)amine, N-hexyl-bis(methoxycarbonylmethyl)amine, and β-(diethylamino)-δ-valerolactone.

Also useful are one or more organic nitrogen-containing compounds having cyclic structure represented by the following general formula (D)-2.

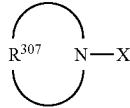

(D)-2

Herein X is as defined above, and $R^{307}$ is a straight or branched $C_2$-$C_{20}$ alkylene group which may contain one or more carbonyl, ether, ester or sulfide groups.

Illustrative examples of the organic nitrogen-containing compounds having formula (D)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, and 2-morpholinoethyl stearate.

Also, one or more organic nitrogen-containing compounds having cyano group represented by the following general formulae (D)-3 to (D)-6 may be blended.

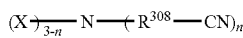

(D)-3

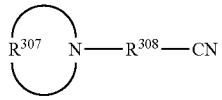

(D)-4

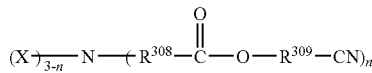

(D)-5

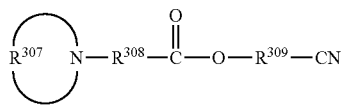

(D)-6

Herein, X, $R^{307}$ and n are as defined above, and $R^{308}$ and $R^{309}$ are each independently a straight or branched $C_1$-$C_4$ alkylene group.

Illustrative examples of the organic nitrogen-containing compounds having cyano represented by formulae (D)-3 to (D)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl)aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N- bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are organic nitrogen-containing compounds of imidazole structure having a polar functional group, represented by the general formula (D)-7.

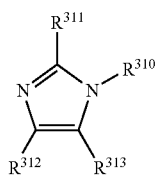
(D)-7

Herein, $R^{310}$ is a straight, branched or cyclic $C_2$-$C_{20}$ alkyl group bearing at least one polar functional group selected from among hydroxyl, carbonyl, ester, ether, sulfide, carbonate, cyano and acetal groups; $R^{311}$, $R^{312}$ and $R^{313}$ are each independently hydrogen, a straight, branched or cyclic $C_1$-$C_{10}$ alkyl group, aryl group or aralkyl group.

Also included are organic nitrogen-containing compounds of benzimidazole structure having a polar functional group, represented by the general formula (D)-8.

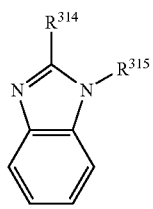
(D)-8

Herein, $R^{314}$ is hydrogen, a straight, branched or cyclic $C_1$-$C_{10}$ alkyl group, aryl group or aralkyl group. $R^{315}$ is a polar functional group-bearing, straight, branched or cyclic $C_1$-$C_{20}$ alkyl group, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (D)-9 and (D)-10.

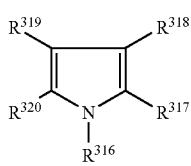
(D)-9

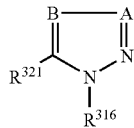
(D)-10

Herein, A is a nitrogen atom or $=$C—$R^{322}$, B is a nitrogen atom or $=$C—$R^{323}$, $R^{316}$ is a straight, branched or cyclic $C_2$-$C_{20}$ alkyl group bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently hydrogen, a straight, branched or cyclic $C_1$-$C_{10}$ alkyl group or aryl group, or a pair of $R^{317}$ and $R^{318}$ and a pair of $R^{319}$ and $R^{320}$ may bond together to form a benzene, naphthalene or pyridine ring with the carbon atom to which they are attached; $R^{321}$ is hydrogen, a straight, branched or cyclic $C_1$-$C_{10}$ alkyl group or aryl group; $R^{322}$ and $R^{323}$ each are hydrogen, a straight, branched or cyclic $C_1$-$C_{10}$ alkyl group or aryl group, or a pair of $R^{321}$ and $R^{323}$ may bond together to form a benzene or naphthalene ring with the carbon atom to which they are attached.

Also included are organic nitrogen-containing compounds of aromatic carboxylic ester structure having the general formulae (D)-11 to (D)-14.

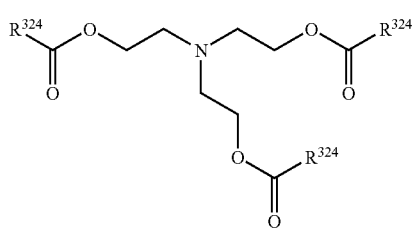
(D)-11

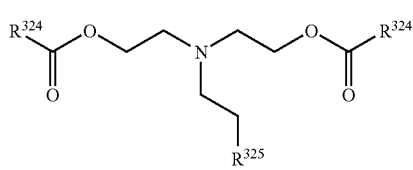
(D)-12

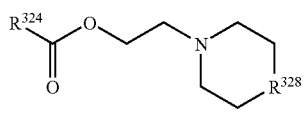
(D)-13

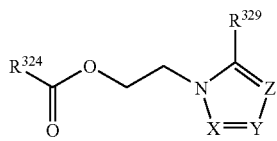
(D)-14

Herein $R^{324}$ is a $C_6$-$C_{20}$ aryl group or $C_4$-$C_{20}$ hetero-aromatic group, in which some or all of hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —O(CH$_2$CH$_2$O)$_n$— group wherein n is 0, 1, 2, 3 or 4. $R^{329}$ is hydrogen, methyl, ethyl or phenyl. X is a nitrogen atom or $CR^{330}$. Y is a nitrogen atom or $CR^{331}$. Z is a nitrogen atom or $CR^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ heteroaromatic ring with the carbon atom to which they are attached.

Further included are organic nitrogen-containing compounds of 7-oxanorbornane-2-carboxylic ester structure having the general formula (D)-15.

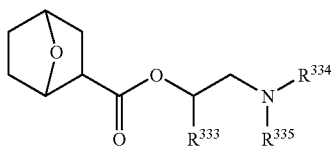

(D)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a heterocyclic or hetero-aromatic ring of 2 to 20 carbon atoms with the nitrogen atom to which they are attached.

Also useful as the basic component are basic compounds of amine oxide structure which is oxidized on nitrogen. Examples include tris(2-(methoxymethoxy)ethyl)amine oxide, 2,2',2''-nitrilotriethylpropionate N-oxide, and N-2-((2-methoxyethoxy)methoxyethylmorpholine N-oxide.

The organic nitrogen-containing compounds may be used alone or in admixture of two or more. The organic nitrogen-containing compound (D) is preferably formulated in an amount of 0.001 to 4 parts, and especially 0.01 to 2 parts by weight, per 100 parts by weight of the entire base resin. Less than 0.001 part of the nitrogen-containing compound achieves no or little addition effect whereas more than 4 parts may result in too low a sensitivity.

Surfactant

Optionally, the resist composition of the invention may further comprise a surfactant which is commonly used for facilitating the coating operation. The surfactant may be added in conventional amounts so long as this does not compromise the objects of the invention.

Illustrative, non-limiting examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (JEMCO Inc.), Megaface F171, F172, F173, R08, R30, R90 and R94 (DIC Corp.), Fluorad FC-430, FC-431, FC-4430 and FC-4432 (Sumitomo 3M Co., Ltd.), Asahiguard AG710, Surflon S-381, S-382, S-386, SC101, SC102, SC103, SC104, SC105, SC106, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.).

Additional useful surfactants include partially fluorinated oxetane ring-opened polymers having the structural formula (surf-1).

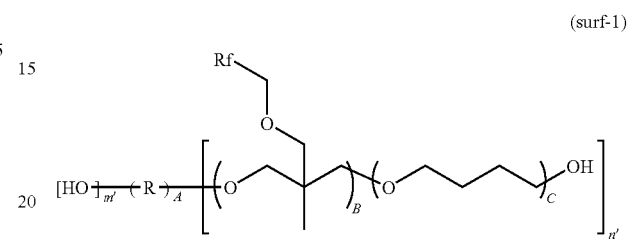

(surf-1)

It is provided herein that R, Rf, A, B, C, m', and n' are applied to only formula (surf-1), independent of their descriptions other than for the surfactant. R is a di- to tetra-valent $C_2$-$C_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

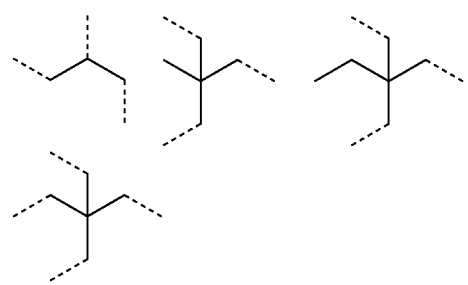

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m' is an integer of 0 to 3, n' is an integer of 1 to 4, and the sum of m' and n', which represents the valence of R, is an integer of 2 to 4. A is equal to 1, B is an integer of 2 to 25, and C is an integer of 0 to 10. Preferably, B is an integer of 4 to 20, and C is 0 or 1. Note that the above structural formula does not prescribe the arrangement of respective constituent units while they may be arranged either in blocks or randomly. For the preparation of surfactants in the form of partially fluorinated oxetane ring-opened polymers, reference should be made to U.S. Pat. No. 5,650,483, for example.

Of the foregoing surfactants, FC-4430, Surflon 5-381, KH-20, KH-30, and oxetane ring-opened polymers of formula (surf-1) are preferred. These surfactants may be used alone or in admixture.

In the resist composition, the surfactant is preferably compounded in an amount of up to 2 parts, and especially up to 1 part by weight, per 100 parts by weight of the base resin. The amount of the surfactant, if added, is preferably at least 0.01 phr.

In the resist composition, an additive polymer may be added as another optional ingredient. This additive polymer tends to segregate in the sub-surface region of the resist film and has the functions of tailoring the hydrophilic/hydrophobic balance of the surface, enhancing water repellency, and/or preventing low-molecular-weight fractions from flowing into or out of the resist film when the resist film is in contact with water or another liquid. Such a segregating polymer may be added in conventional amounts as long as the objects of the invention are not compromised.

The segregating polymer is preferably selected from homopolymers and copolymers comprising fluorine-containing units of one or more types, and copolymers comprising fluorine-containing units and other units. Exemplary fluorine-containing units and other units are illustrated below, but not limited thereto.

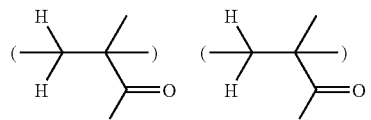
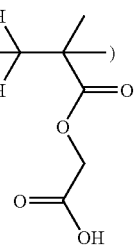
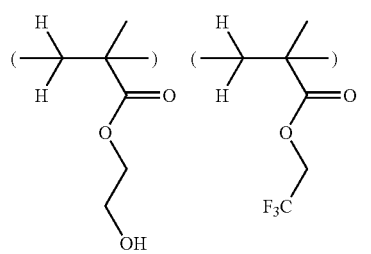
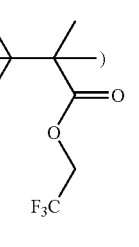
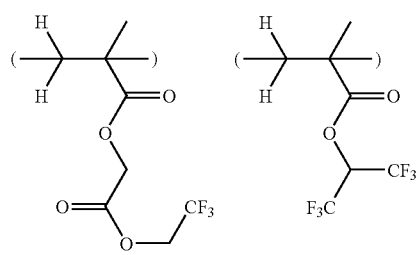
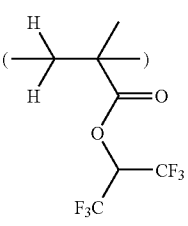
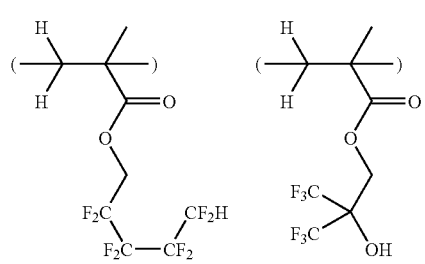
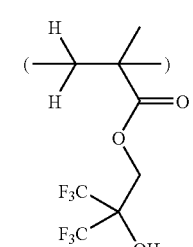

-continued

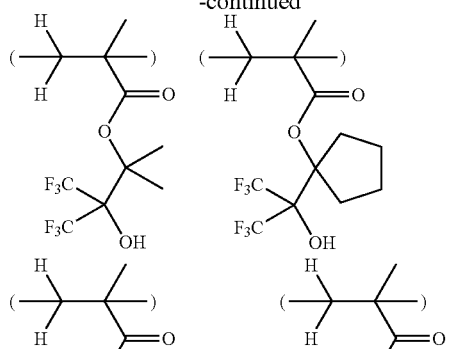
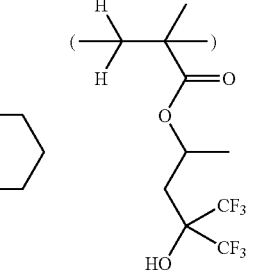
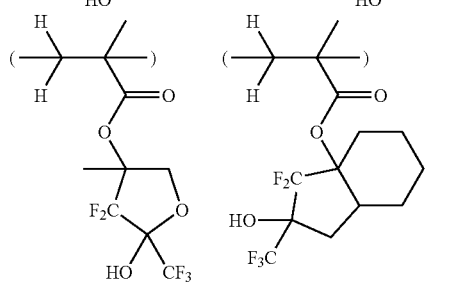
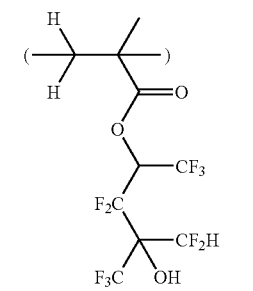
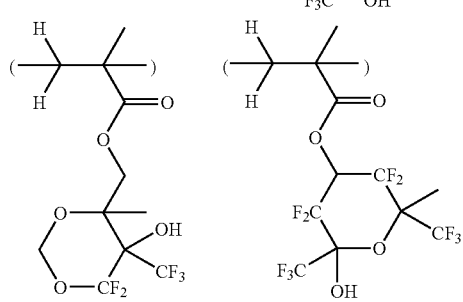
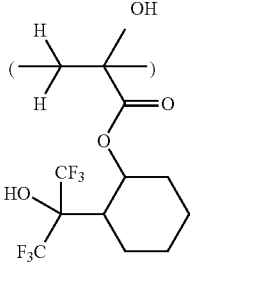

-continued

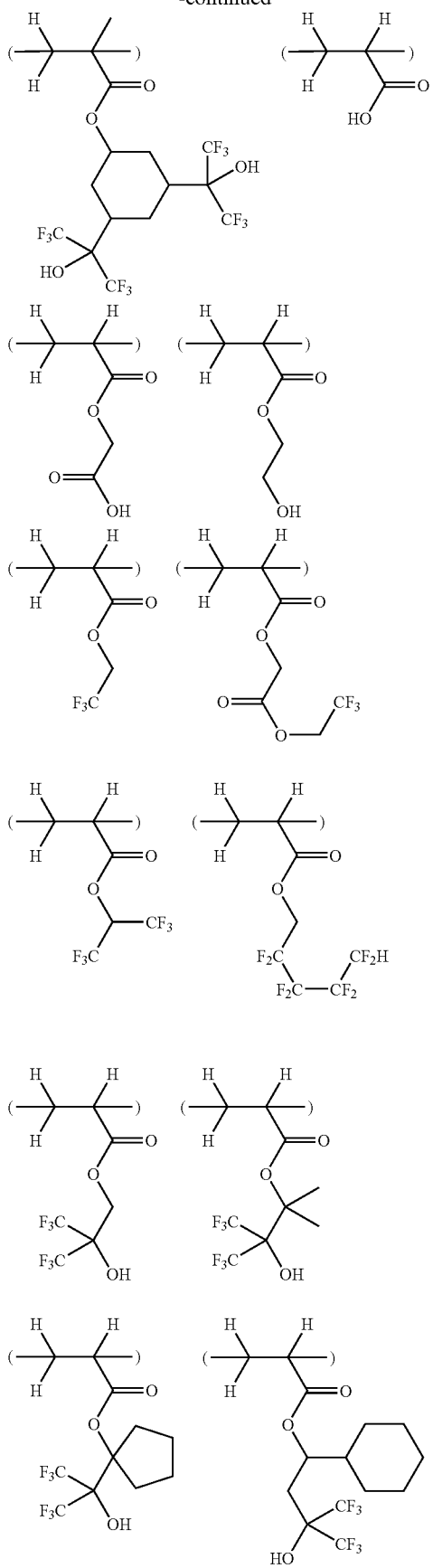

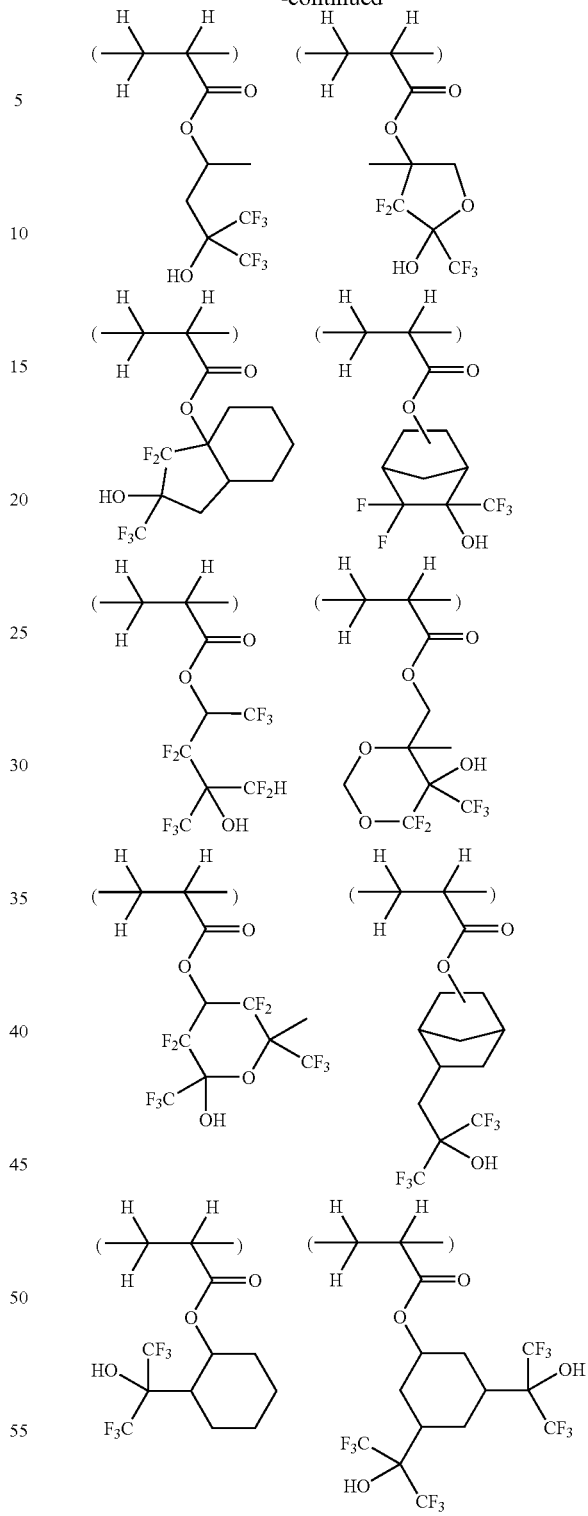

Preferably the segregating polymer has a weight average molecular weight of 1,000 to 50,000, and more preferably 2,000 to 20,000, as measured by GPC versus polystyrene standards. Outside the range, the surface modifying effect may be insufficient or development defects may form.

While the resist composition of the invention typically comprises an organic solvent, a base resin comprising the polymer, a photoacid generator, and a basic compound as described above, there may be added optional other ingredients such as dissolution regulators, carboxylic acids, and acetylene alcohol derivatives. Optional ingredients may be added in conventional amounts so long as this does not compromise the objects of the invention.

Dissolution Regulator

To the resist composition, a dissolution regulator may be added. The dissolution regulator is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

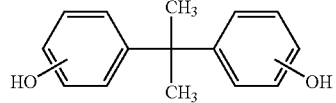
(D1)

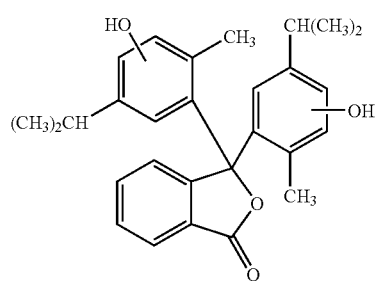
(D2)

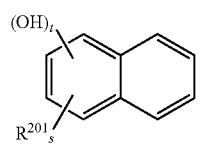
(D3)

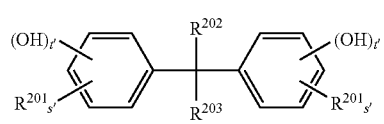
(D4)

-continued

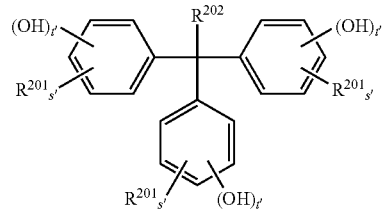
(D5)

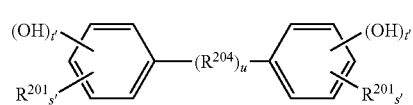
(D6)

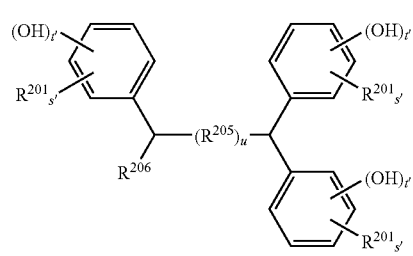
(D7)

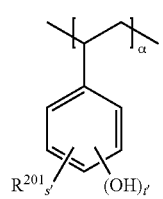
(D8)

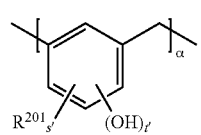
(D9)

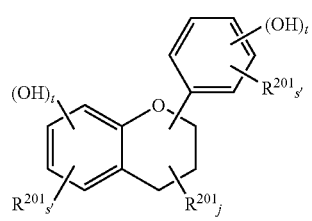
(D10)

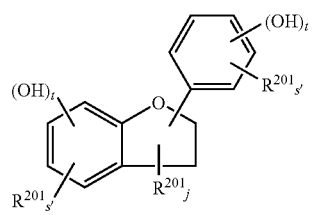
(D11)

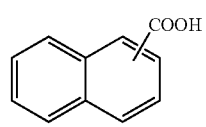
(D12)

-continued

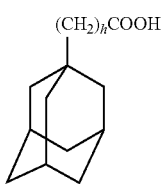
(D13)

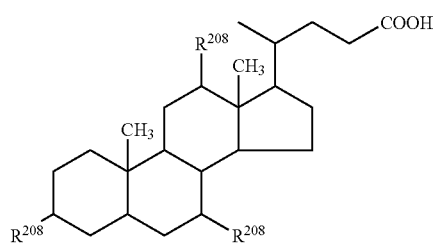
(D14)

In these formulas, $R^{201}$ and $R^{202}$ are each hydrogen or a straight or branched $C_1$-$C_8$ alkyl or alkenyl, for example, hydrogen, methyl, ethyl, butyl, propyl, ethynyl, and cyclohexyl. $R^{203}$ is hydrogen, a straight or branched $C_1$-$C_8$ alkyl or alkenyl, or —$(R^{207})_h$—COOH wherein $R^{207}$ is a straight or branched $C_1$-$C_{10}$ alkylene, for example, the same groups as exemplified for $R^{201}$ and $R^{202}$, and —COOH and —CH$_2$COOH. $R^{204}$ is —(CH$_2$)$_i$— (where i=2 to 10), a $C_6$-$C_{10}$ arylene, carbonyl, sulfonyl, an oxygen atom, or a sulfur atom, for example, ethylene, phenylene, carbonyl, sulfonyl, oxygen, and sulfur. $R^{205}$ is a $C_1$-$C_{10}$ alkylene, a $C_6$-$C_{10}$ arylene, carbonyl, sulfonyl, an oxygen atom, or a sulfur atom, for example, methylene and the same groups as exemplified for $R^{204}$. $R^{206}$ is hydrogen, a straight or branched $C_1$-$C_8$ alkyl or alkenyl, or a hydroxyl-substituted phenyl or naphthyl, for example, hydrogen, methyl, ethyl, butyl, propyl, ethynyl, cyclohexyl, and hydroxyl-substituted phenyl or naphthyl. $R^{208}$ is hydrogen or hydroxyl. The letter j is an integer from 0 to 5; u and h are each 0 or 1; s, t, s', t', s", and t" are each numbers which satisfy s+t=8, s'+t'=5, and s"+t"=4, and are such that each phenyl skeleton has at least one hydroxyl group; and α is a number such that the compounds of formula (D8) or (D9) have a weight average molecular weight of from 100 to 1,000.

The acid labile groups on the dissolution regulator may be selected from a variety of such groups and include groups of the general formulae (L1) to (L4) shown above, tertiary $C_4$-$C_{20}$ alkyl groups, trialkylsilyl groups in which each of the alkyls has 1 to 6 carbon atoms, and oxoalkyl groups of 4 to 20 carbon atoms. Examples of these groups are the same as described above.

The dissolution regulator may be formulated in an amount of 0 to 50 parts, preferably 0 to 40 parts, and more preferably 0 to 30 parts by weight, per 100 parts by weight of the base resin, and may be used singly or as a mixture of two or more thereof. More than 50 phr of the dissolution regulator would lead to slimming of the patterned film, and thus a decline in resolution.

The dissolution regulator can be synthesized by introducing acid labile groups into a compound having phenolic hydroxyl or carboxyl groups in accordance with an organic chemical formulation.

To the resist composition, a carboxylic acid compound may be added if necessary. The carboxylic acid compound which can be added to the resist composition is at least one compound selected from Groups I and II below, but not limited thereto. Inclusion of this compound improves the post-exposure delay (PED) stability of the resist and ameliorates edge roughness on nitride film substrates.

Group I:
Compounds of general formulas (A1) to (A10) below in which some or all of the hydrogen atoms on the phenolic hydroxyl groups are replaced by —$R^{401}$—COOH (wherein $R^{401}$ is a straight or branched $C_1$-$C_{10}$ alkylene group) and in which the molar ratio C/(C+D) of phenolic hydroxyl groups [C] to =C—COOH groups [D] in the molecule is from 0.1 to 1.0.

Group II:
Compounds of general formulas (A11) to (A15) below.

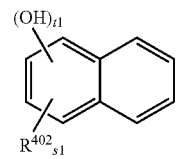
(A1)

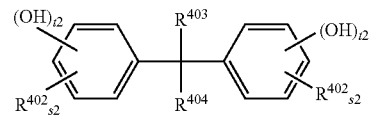
(A2)

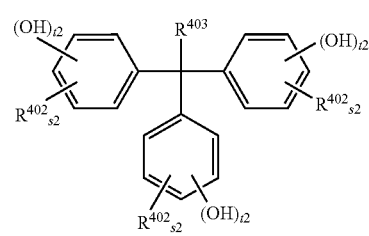
(A3)

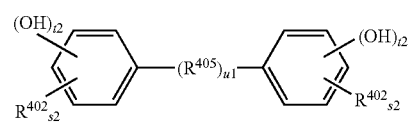
(A4)

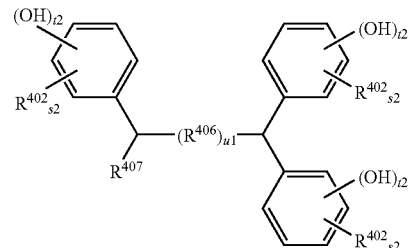
(A5)

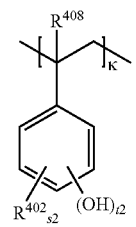
(A6)

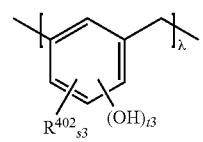
(A7)

-continued

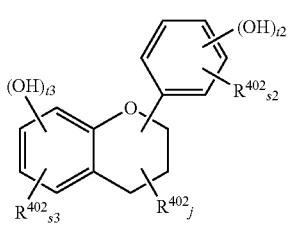 (A8)

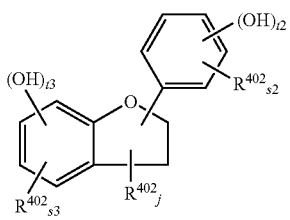 (A9)

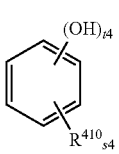 (A10)

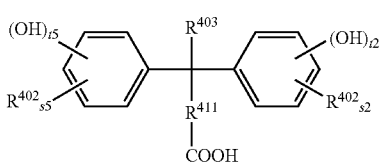 (A11)

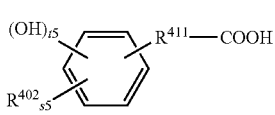 (A12)

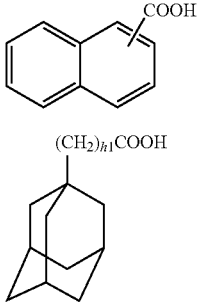 (A13)

(CH₂)ₕ₁COOH (A14)

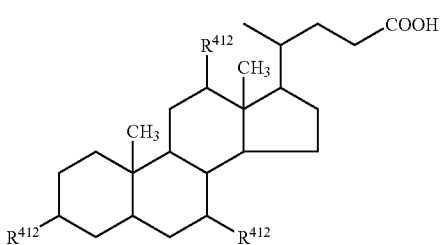 (A15)

In these formulas, $R^{402}$ and $R^{402}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl- substituted phenyl or naphthyl; $R^{408}$ is hydrogen or methyl; $R^{409}$ is a straight or branched $C_1$-$C_{10}$ alkylene; $R^{410}$ is hydrogen, a straight or branched $C_1$-$C_8$ alkyl or alkenyl, or a —$R^{411}$—COOH group; $R^{412}$ is a straight or branched $C_1$-$C_{10}$ alkylene; $R^{412}$ is hydrogen or hydroxyl; the letter j is an integer from 0 to 3; s1, t1, s2, t2, s3, t3, s4, and t4 are each integers which satisfy s1+t1=8, s2+t2=5, s3+t3=4, and s4+t4=6, and are such that each phenyl structure has at least one hydroxyl group; s5 and t5 are numbers which satisfy s5≥0, t5≥0, and s5+t5=5; u1 is a number 1≤u1≤4; h1 is a number 0≤h1≤4; κ is a number such that the compound of formula (A6) may have a weight average molecular weight of 1,000 to 5,000; and λ is a number such that the compound of formula (A7) may have a weight average molecular weight of 1,000 to 10,000.

Illustrative, non-limiting examples of the compound having a carboxyl group include compounds of the general formulas (AI-1) to (AI-14) and (AII-1) to (AII-10) below.

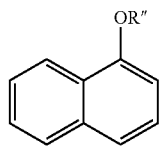 (AI-1)

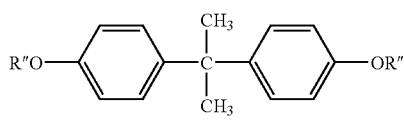 (AI-2)

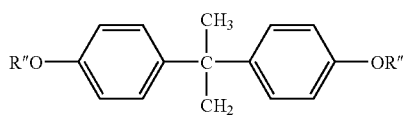 (AI-3)

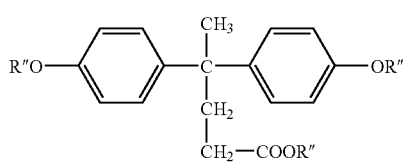 (AI-4)

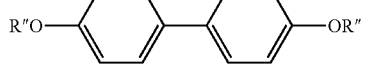 (AI-5)

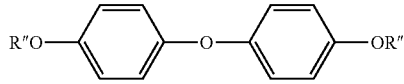 (AI-6)

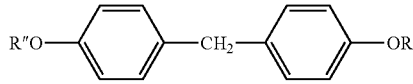 (AI-7)

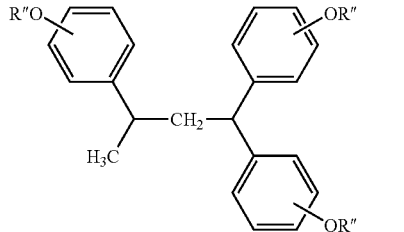 (AI-8)

-continued (AI-9) 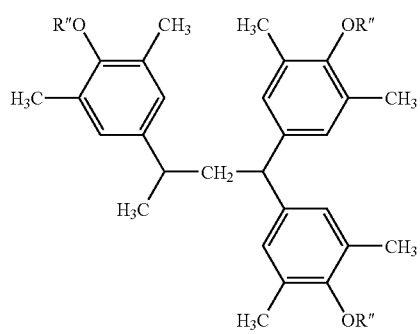

(AI-10) 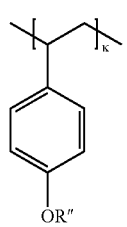

(AI-11) 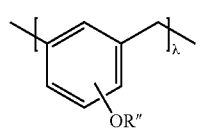

(AI-12) 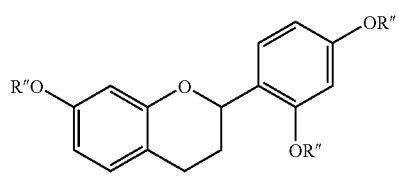

(AI-13) 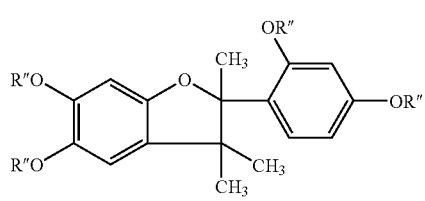

(AI-14) 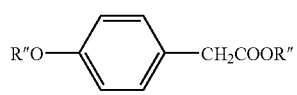

(AII-1) 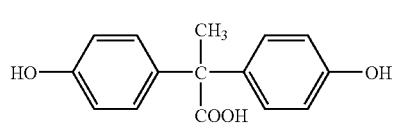

(AII-2) 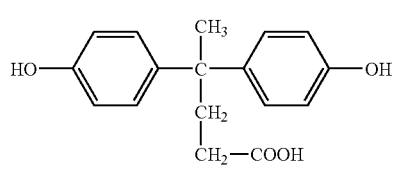

(AII-3) 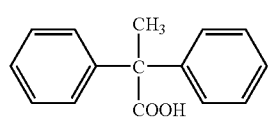

-continued (AII-4) 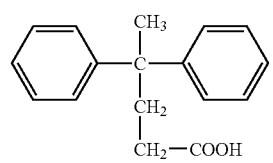

(AII-5) 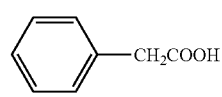

(AII-6) 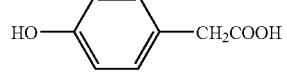

(AII-7) 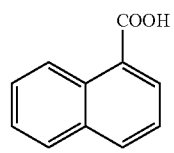

(AII-8) 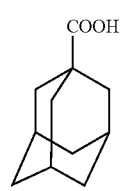

(AII-9) 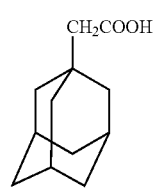

(AII-10) 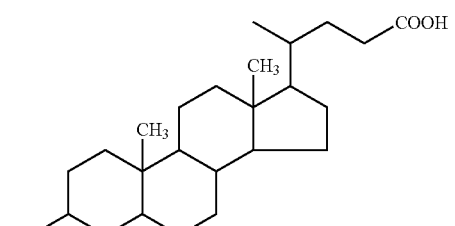

In the above formulas, R" is hydrogen or a —CH$_2$COOH group such that the —CH$_2$COOH group accounts for 10 to 100 mol % of R" in each compound, κ and λ are as defined above.

The compound having a ≡C—COOH group may be used singly or as combinations of two or more thereof. The compound having a ≡C—COOH group is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 phr of the compound may reduce the resolution of the resist composition.

To the resist composition, an acetylene alcohol derivative may be added. The preferred acetylene alcohol derivatives used herein include those having the general formulae (S1) and (S2).

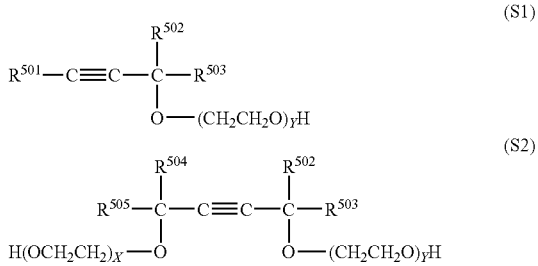

In the formulas, $R^{501}$, $R^{502}$, $R^{503}$, $R^{504}$, and $R^{505}$ are each hydrogen or a straight, branched or cyclic $C_1$-$C_8$ alkyl; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industries Ltd.

The acetylene alcohol derivative is preferably added in an amount of 0 to 2 parts, more preferably 0.01 to 2 parts, and even more preferably 0.02 to 1 part by weight per 100 parts by weight of the base resin. More than 2 phr of the derivative may reduce the resolution of the resist composition.

Process

Pattern formation using the resist composition of the invention may be performed by well-known lithography processes. The process generally involves coating, heat treatment (or prebaking), exposure, heat treatment (post-exposure baking, PEB), and development. If necessary, any additional steps may be added.

For pattern formation, the resist composition is first applied onto an integrated circuit-forming substrate (e.g., Si, $SiO_2$, SiN, SiON, TiN, WSi, BPSG, SOG, organic antireflective coating, Cr, CrO, CrON, MoSi, etc.) or mask-forming substrate by a suitable coating technique such as spin coating, roll coating, flow coating, dip coating, spray coating or doctor coating. The coating is prebaked on a hot plate at a temperature of 60 to 150° C. for 1 to 10 minutes, preferably 80 to 140° C. for 1 to 5 minutes. The resulting resist film is generally 0.01 to 2.0 µm thick.

A relationship of a reduced thickness of resist film to an etch selectivity ratio between resist film and processable substrate imposes severer limits on the process. Under consideration is the tri-layer process in which a resist layer, a silicon-containing intermediate layer, an undercoat layer having a high carbon density and high etch resistance, and a processable substrate are laminated in sequence from top to bottom. On etching with oxygen gas, hydrogen gas, ammonia gas or the like, a high etch selectivity ratio is available between the silicon-containing intermediate layer and the undercoat layer, which allows for thickness reduction of the silicon-containing intermediate layer. A relatively high etch selectivity ratio is also available between the monolayer resist and the silicon-containing intermediate layer, which allows for thickness reduction of the monolayer resist. The method for forming the undercoat layer in this case includes a coating and baking method and a CVD method. In the case of coating, novolac resins and resins obtained by polymerization of fused ring-containing olefins are used. In the CVD film formation, gases such as butane, ethane, propane, ethylene and acetylene are used. For the silicon-containing intermediate layer, either a coating method or a CVD method may be employed. The coating method uses silsesquioxane, polyhedral oligomeric silsesquioxane (POSS) and the like while the CVD method uses silane gases as the reactant. The silicon-containing intermediate layer may have an antireflection function with a light absorbing ability and have photo-absorptive groups like phenyl groups, or it may be a SiON film. An organic film may be formed between the silicon-containing intermediate layer and the photoresist, and the organic film in this case may be an organic antireflective coating. After the photoresist film is formed, deionized water rinsing (or post-soaking) may be carried out for extracting the photoacid generator and the like from the film surface or washing away particles, or a protective film may be coated.

With a mask having a desired pattern placed above the resist film, the resist film is then exposed to actinic radiation such as UV, deep-UV, electron beams, x-rays, excimer laser light, γ-rays and synchrotron radiation. The exposure dose is preferably about 1 to 200 mJ/cm$^2$, more preferably about 10 to 100 mJ/cm$^2$. The film is further baked on a hot plate at 60 to 150° C. for 1 to 5 minutes, preferably 80 to 120° C. for 1 to 3 minutes (post-exposure baking=PEB). Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle or spray techniques. In this way, a desired resist pattern is formed on the substrate. It is appreciated that the resist composition of the invention is suited for micro-patterning using such high-energy radiation as deep UV with a wavelength of 254 to 193 nm, vacuum UV with a wavelength of 157 nm, electron beams, soft x-rays, x-rays, excimer laser light, γ-rays and synchrotron radiation, and best suited for micropatterning using high-energy radiation in the wavelength range of 180 to 200 nm.

Immersion lithography can be applied to the resist composition of the invention. The ArF immersion lithography uses a liquid having a refractive index of at least 1 and highly transparent at the exposure wavelength such as deionized water or alkanes as the immersion solvent. The immersion lithography involves prebaking a resist film and exposing the resist film to light through a projection lens, with deionized water or similar liquid interposed between the resist film and the projection lens. Since this allows projection lenses to be designed to a numerical aperture (NA) of 1.0 or higher, formation of finer patterns is possible. The immersion lithography is important for the ArF lithography to survive to the 45-nm node, with a further development thereof being accelerated. In the case of immersion lithography, deionized water rinsing (or post-soaking) may be carried out after exposure for removing water droplets left on the resist film, or a protective coating may be applied onto the resist film after pre-baking for preventing any dissolution from the resist and improving water slip on the film surface.

The resist protective coating used in the immersion lithography is preferably formed from a solution of a polymer having 1,1,1,3,3,3-hexafluoro-2-propanol residue which is insoluble in water, but dissolvable in an alkaline developer liquid, in a solvent selected from alcohols of at least 4 carbon atoms, ethers of 8 to 12 carbon atoms, and mixtures thereof.

The technique enabling the ArF lithography to survive to the 32-nm node is a double patterning process. The double patterning process includes a trench process of processing an underlay to a 1:3 trench pattern by a first step of exposure and etching, shifting the position, and forming a 1:3 trench pattern by a second step of exposure for forming a 1:1 pattern; and a line process of processing a first underlay to a 1:3 isolated left pattern by a first step of exposure and etching, shifting the position, processing a second underlay formed below the first underlay by a second step of exposure through the 1:3 isolated left pattern, for forming a half-pitch 1:1 pattern.

A further embodiment of the invention provides a photomask blank comprising a chromium compound film and a coating of the positive resist composition deposited thereon. In this embodiment, a pattern may be formed by heat treating the photomask blank, subjecting the resist coating to patternwise exposure to high-energy radiation through a photomask or patternwise exposure to high-energy beam, optionally heat treating the exposed resist coating, and developing it with a developer. The chromium compound film may be of CrO, CrC, CrN, CrON, CrOC, CrONC, CrNC or the like.

EXAMPLES

Examples of the invention are given below by way of illustration and not by way of limitation. The copolymer composition is expressed in molar ratio. The abbreviation Me is methyl, AIBN is azobisisobutyronitrile, NMR is nuclear magnetic resonance. Mw is a weight average molecular weight, Mn is a number average molecular weight, both as measured by gel permeation chromatography (GPC) versus polystyrene standards, and Mw/Mn is a molecular weight dispersity.

Synthesis Example 1

A 100-mL flask was charged with 13.0 g of acetoxystyrene, 4.1 g of a monomer of formula (20) below, and 20 g of toluene as a solvent. The reactor was cooled to −70° C. in a nitrogen atmosphere, whereupon vacuum deaeration and nitrogen flow were repeated three times. The reactor was warmed up to room temperature, 1.4 g of AIBN was added as a polymerization initiator, and the reactor was further heated to 55° C., at which reaction was effected for 40 hours.

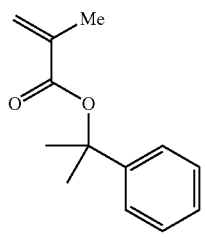

(20)

The reaction solution was concentrated to a ½ volume and precipitated in 5.0 L of methanol. The resulting white solids were filtered and vacuum dried at 40° C., obtaining 15.5 g of a white polymer. The polymer was dissolved in a mixture of 0.4 L methanol and 0.5 L tetrahydrofuran again, to which 140 g of triethylamine and 30 g of water were added. The reactor was heated to 60° C., allowing deprotection reaction to occur. The reaction solution was neutralized with acetic acid, concentrated, dissolved in 0.5 L of acetone, and precipitated in 10 L of water. Filtration and drying in the same way as above gave 12.4 g of a white polymer.

The polymer was analyzed by $^{13}$C-NMR, $^{1}$H-NMR and GPC, with the analytical results shown below.

Copolymer Compositional Ratio

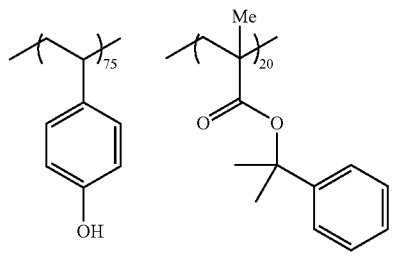

Mw=6,500
Mw/Mn=1.65
This polymer is designated Poly-1.

Synthesis Example 2

Synthesis was carried out by the same procedure as in Synthesis Example 1 aside from using 4.6 g of a monomer of formula (21) instead of the monomer of formula (20). There was obtained 12.4 g of a white polymer.

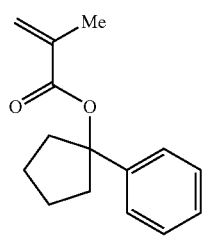

(21)

The polymer was analyzed by $^{13}$C-NMR, $^{1}$H-NMR and GPC, with the analytical results shown below.

Copolymer Compositional Ratio

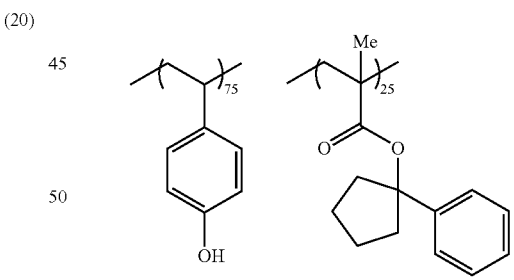

Mw=7,400
Mw/Mn=1.76
This polymer is designated Poly-2.

Synthesis Example 3

Synthesis was carried out by the same procedure as in Synthesis Example 2 except that 2.4 g of indene was further added. There was obtained 13.0 g of a white polymer.

The polymer was analyzed by $^{13}$C-NMR, $^{1}$H-NMR and GPC, with the analytical results shown below.

Copolymer Compositional Ratio

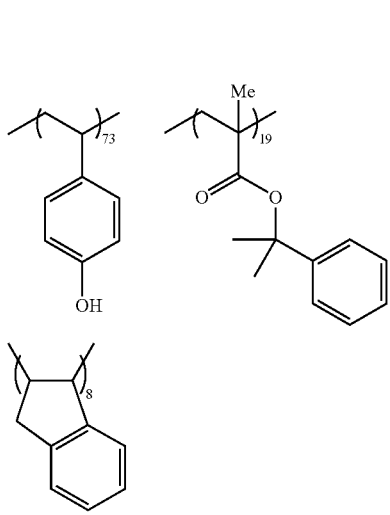

Mw=7,000
Mw/Mn=1.70
This polymer is designated Poly-3.

Synthesis Example 4

A 1-L flask was charged with 20.0 g of the hydroxystyrene-indene-methacrylate copolymer (Poly-3) and 180 g of tetrahydrofuran as a solvent. To the reactor about 25° C. in a nitrogen atmosphere, 12 g of triethylamine was added, and 5.04 g of 8-(1-chloro-2-methylpropoxy)tricyclo[5.2.1.0$^{2,6}$]decane as an acetalizing agent was added dropwise over 10 minutes. At room temperature, reaction was allowed to occur for 3 hours. The reaction solution was concentrated, dissolved in 40 g of acetone, neutralized with acetic acid, and poured into 1.0 L of water for crystallization and precipitation. The resulting white solids were filtered and dried in a reduced pressure at 40° C., obtaining 21 g of a white polymer.

The polymer was analyzed by $^{13}$C-NMR, $^{1}$H-NMR and GPC, with the analytical results shown below.

Copolymer Compositional Ratio

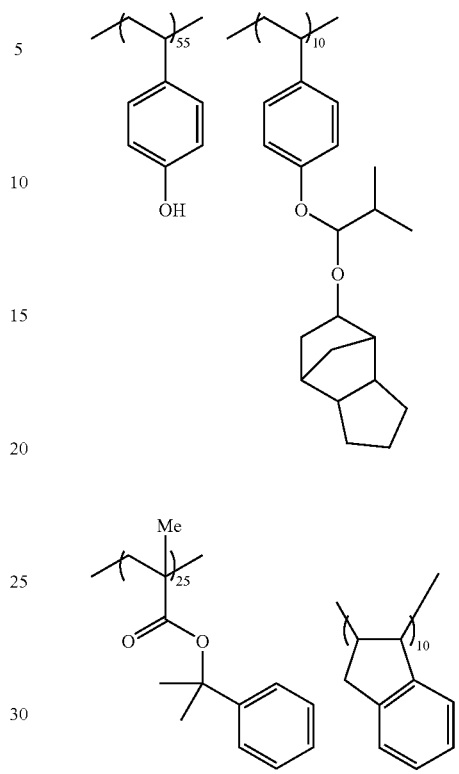

Mw=6,500
Mw/Mn=1.70
This polymer is designated Polymer 4.

Synthesis Examples 5 to 17

Polymers shown in Tables 1 to 3 were synthesized as in Synthesis Examples 1 to 4 except that the type and amount of monomers were changed. The polymers were analyzed by $^{13}$C-NMR, $^{1}$H-NMR and GPC to determine a copolymer composition, copolymer compositional ratio, weight average molecular weight (Mw) and molecular weight dispersity (Mw/Mn). The analytical results are also shown in Tables 1 to 3.

TABLE 1

| Copolymer composition and ratio | Mw | Mw/Mn | Designation |
|---|---|---|---|
| Synthesis Example 5 | 6,000 | 1.60 | Poly-5 |

TABLE 1-continued
| Copolymer composition and ratio | | Mw | Mw/Mn | Designation |
|---|---|---|---|---|
| Synthesis Example 6 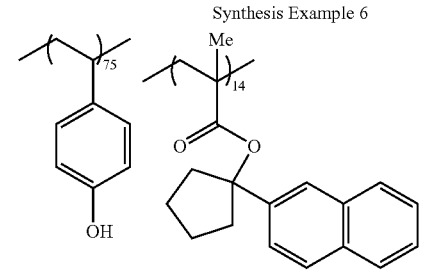 | | 6,700 | 1.65 | Poly-6 |
| Synthesis Example 7 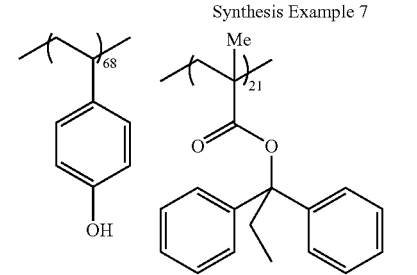 | | 6,200 | 1.65 | Poly-7 |
| Synthesis Example 8 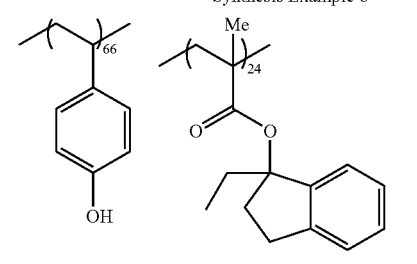 | | 6,350 | 1.67 | Poly-8 |
| Synthesis Example 9 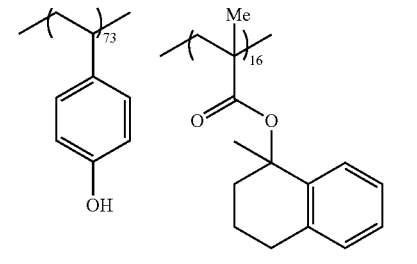 | | 6,750 | 1.60 | Poly-9 |
TABLE 2
| Copolymer composition and ratio | Mw | Mw/Mn | Designation |
|---|---|---|---|
| Synthesis Example 10 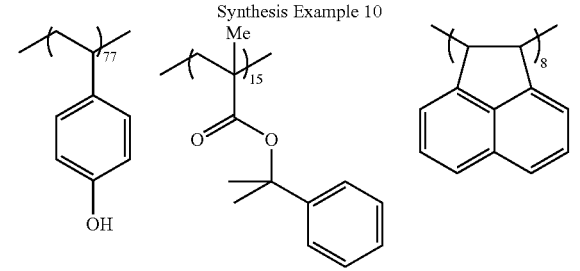 | 5,250 | 1.49 | Poly-10 |

TABLE 2-continued
| Copolymer composition and ratio | | | Mw | Mw/Mn | Designation |
|---|---|---|---|---|---|
| Synthesis Example 11 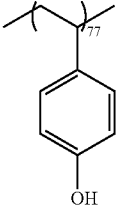 | 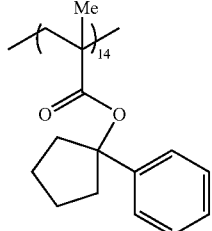 | 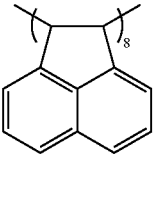 | 4,900 | 1.48 | Poly-11 |
| Synthesis Example 12 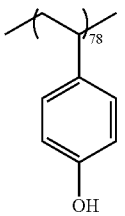 | 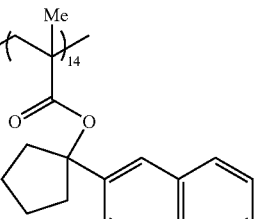 | 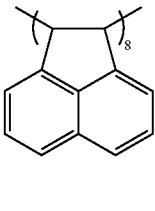 | 5,760 | 1.61 | Poly-12 |
| Synthesis Example 13 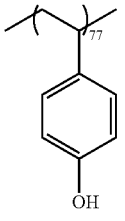 | 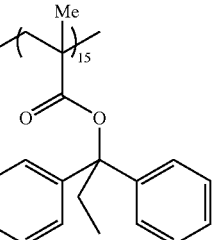 | 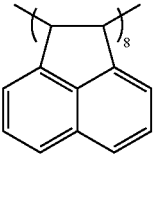 | 6,050 | 1.58 | Poly-13 |
| Synthesis Example 14 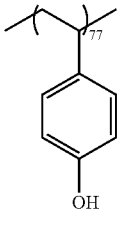 | 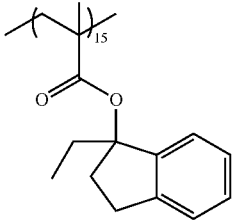 | 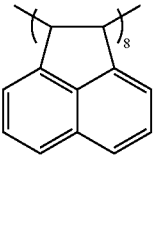 | 5,800 | 1.58 | Poly-14 |
TABLE 3
| Copolymer composition and ratio | | | Mw | Mw/Mn | Designation |
|---|---|---|---|---|---|
| Synthesis Example 15 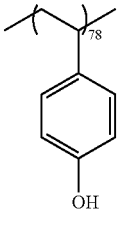 | 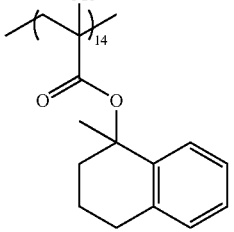 | 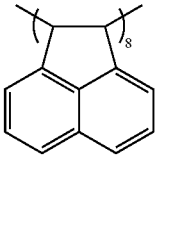 | 5,000 | 1.57 | Poly-15 |

TABLE 3-continued

| Copolymer composition and ratio | Mw | Mw/Mn | Designation |
|---|---|---|---|
| Synthesis Example 16 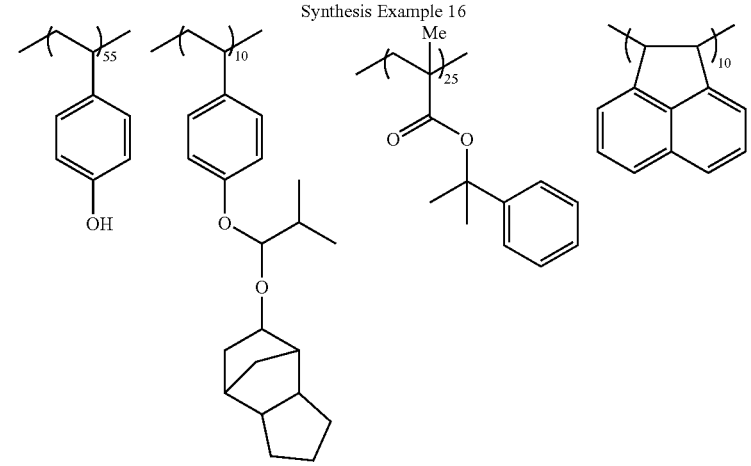 | 6,600 | 1.50 | Poly-16 |
| Synthesis Example 17 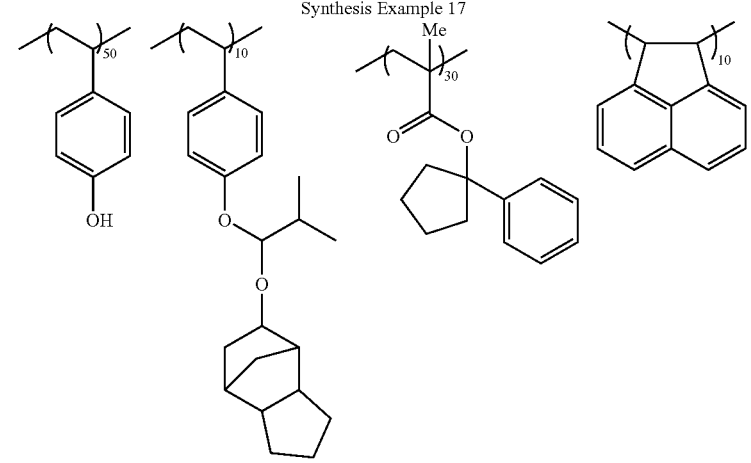 | 6,200 | 1.49 | Poly-17 |

Synthesis Examples 18 and 19

For comparative purposes, polymers shown in Table 4 were synthesized as in Synthesis Examples 1 to 3 except that the type and amount of monomers were changed. The polymers were analyzed by $^{13}$C-NMR, $^1$H-NMR and GPC to determine a copolymer composition, copolymer compositional ratio, Mw and Mw/Mn. The analytical results are also shown in Table 4.

TABLE 4

| Copolymer composition and ratio | Mw | Mw/Mn | Designation |
|---|---|---|---|
| Synthesis Example 18 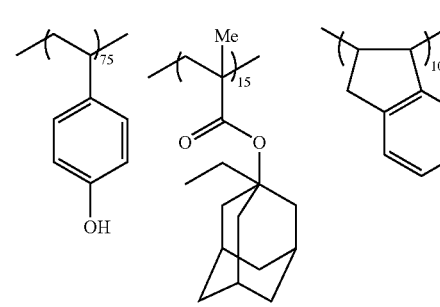 | 10,010 | 1.91 | Comparative Poly-18 |

TABLE 4-continued

| Copolymer composition and ratio | Mw | Mw/Mn | Designation |
|---|---|---|---|
| Synthesis Example 19 | 10,100 | 1.93 | Comparative Poly-19 |

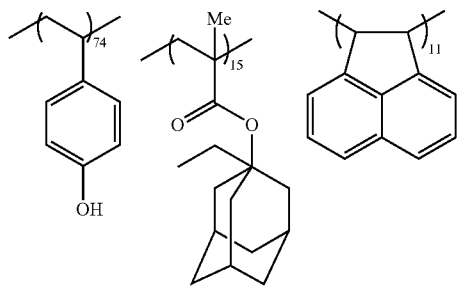

Synthesis Example 20

A 100-mL flask was charged with 2.5 g of a monomer of formula (22) below, 5.0 g of 3-hydroxy-1-adamantyl methacrylate, 5.6 g of 3-oxo-2,7-dioxatricyclo[4.2.1.0$^{4,8}$]-nonan-9-yl methacrylate, and 30 g of tetrahydrofuran as a solvent. The reactor was cooled to –70° C. in a nitrogen atmosphere, whereupon vacuum deaeration and nitrogen flow were repeated three times. The reactor was warmed up to room temperature, 0.2 g of AIBN was added as a polymerization initiator, and the reactor was further heated to 60° C., at which reaction was effected for 15 hours. The reaction solution was precipitated in 500 mL of isopropyl alcohol. The resulting white solids were filtered and vacuum dried at 60° C., obtaining 21.8 g of a white polymer.

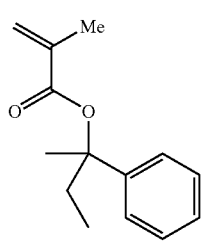

(22)

The polymer was analyzed by $^{13}$C-NMR, $^1$H-NMR and GPC, with the analytical results shown below.

Copolymer Compositional Ratio

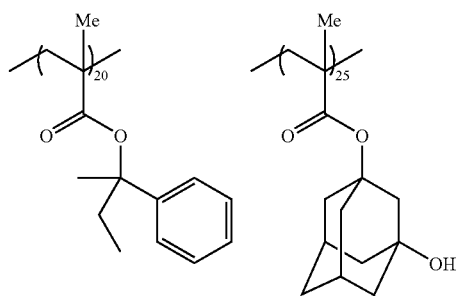

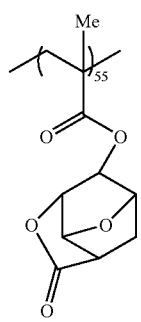

Mw=8,800
Mw/Mn=1.72
This polymer is designated Poly-20.

Synthesis Examples 21 to 41

Polymers shown in Tables 5 to 10 were synthesized as in Synthesis Example 20 except that the type and amount of monomers were changed. The polymers were analyzed by $^{13}$C-NMR, $^1$H-NMR and GPC to determine a copolymer composition, copolymer compositional ratio, Mw and Mw/Mn. The analytical results are also shown in Tables 5 to 10.

TABLE 5

| Copolymer composition and ratio | Mw | Mw/Mn | Designation |
|---|---|---|---|
| Synthesis Example 21 | 8,600 | 1.70 | Poly-21 |
| Synthesis Example 22 | 8,900 | 1.76 | Poly-22 |
| Synthesis Example 23 | 9,500 | 1.88 | Poly-23 |
| Synthesis Example 24 | 8,050 | 1.69 | Poly-24 |

TABLE 6

| Copolymer composition and ratio | Mw | Mw/Mn | Designation |
|---|---|---|---|
| Synthesis Example 25 | 9,100 | 1.87 | Poly-25 |
| Synthesis Example 26 | 8,900 | 1.76 | Poly-26 |
| Synthesis Example 27 | 8,900 | 1.77 | Poly-27 |
| Synthesis Example 28 | 9,300 | 1.88 | Poly-28 |

TABLE 7

| Copolymer composition and ratio | Mw | Mw/Mn | Designation |
|---|---|---|---|
| Synthesis Example 29 | 8,550 | 1.76 | Poly-29 |
| Synthesis Example 30 | 8,900 | 1.81 | Poly-30 |
| Synthesis Example 31 | 8,810 | 1.77 | Poly-31 |
| Synthesis Example 32 | 9,100 | 1.83 | Poly-32 |

TABLE 8

| Copolymer composition and ratio | Mw | Mw/Mn | Designation |
|---|---|---|---|
| Synthesis Example 33 | 9,950 | 1.90 | Poly-33 |
| Synthesis Example 34 | 8,910 | 1.77 | Poly-34 |
| Synthesis Example 35 | 8,910 | 1.74 | Poly-35 |
| Synthesis Example 36 | 7,800 | 1.70 | Poly-36 |

TABLE 9
| Copolymer composition and ratio | Mw | Mw/Mn | Designation |
|---|---|---|---|
| Synthesis Example 37 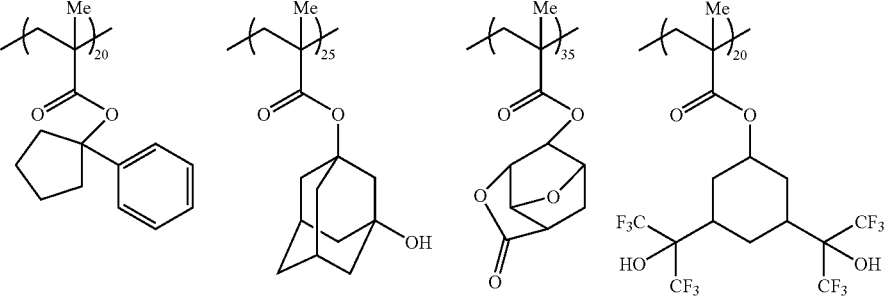 | 7,960 | 1.73 | Poly-37 |
| Synthesis Example 38 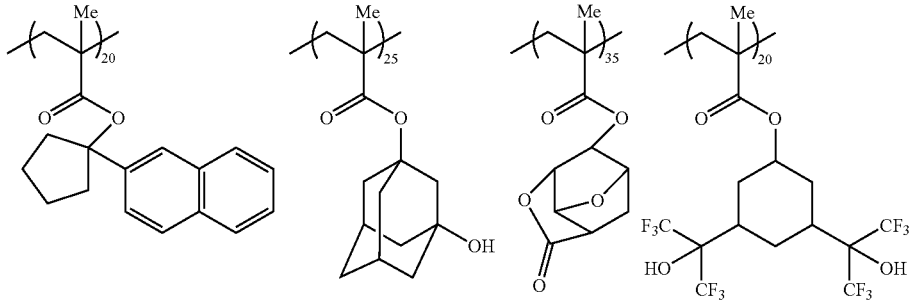 | 7,700 | 1.74 | Poly-38 |
| Synthesis Example 39 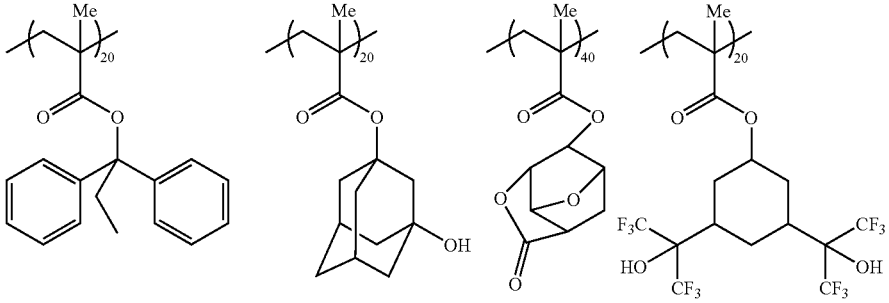 | 8,850 | 1.88 | Poly-39 |
| Synthesis Example 40 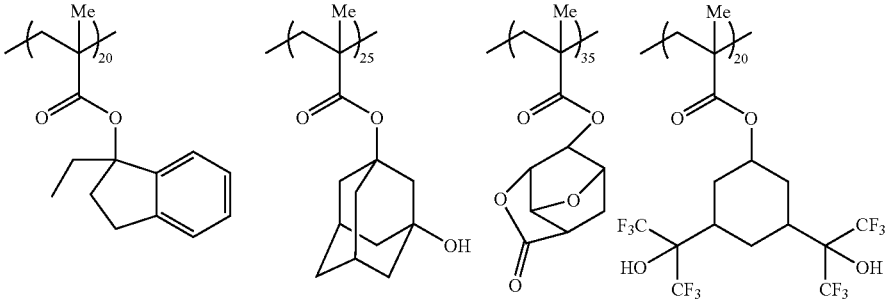 | 8,850 | 1.88 | Poly-40 |

TABLE 10

| Copolymer composition and ratio | Mw | Mw/Mn | Designation |
|---|---|---|---|
| Synthesis Example 41 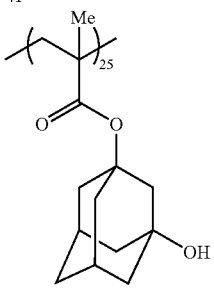 | 8,000 | 1.74 | Poly-41 |

Synthesis Examples 42 to 47

For comparative purposes, polymers shown in Tables 11 and 12 were synthesized as in Synthesis Example 20 except that the type and amount of monomers were changed. The polymers were analyzed by $^{13}$C-NMR, $^{1}$H-NMR and GPC to determine a copolymer composition, copolymer compositional ratio, Mw and Mw/Mn. The analytical results are also shown in Tables 11 and 12.

TABLE 11

| Copolymer composition and ratio | Mw | Mw/Mn | Designation |
|---|---|---|---|
| Synthesis Example 42 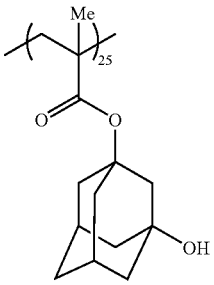 | 8700 | 1.71 | Comparative Poly-42 |
| Synthesis Example 43 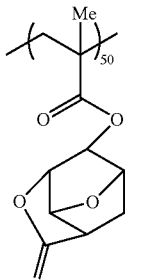 | 8,830 | 1.77 | Comparative Poly-43 |

TABLE 11-continued

| Copolymer composition and ratio | Mw | Mw/Mn | Designation |
|---|---|---|---|
| Synthesis Example 44 | 8,880 | 1.80 | Comparative Poly-44 |
| Synthesis Example 45 | 8,900 | 1.77 | Comparative Poly-45 |

TABLE 12

| Copolymer composition and ratio | Mw | Mw/Mn | Designation |
|---|---|---|---|
| Synthesis Example 46 | 8,700 | 1.78 | Comparative Poly-46 |
| Synthesis Example 47 | 8,850 | 1.77 | Comparative Poly-47 |

Examples and Comparative Examples

Preparation of Positive Resist Compositions

Positive resist compositions were prepared by using inventive polymers (Poly-1 to 17, Poly-20 to 41) or comparative polymers (Comparative Poly-18, 19, Poly-42 to 47) as the base resin, and dissolving the polymer, an acid generator (PAG1 to 5), and a basic compound (Amine 1 to 3) in an organic solvent (PGMEA and EL or CyHO) in accordance with the recipe shown in Tables 13 and 14. These compositions were each filtered through a filter having a pore diameter 0.2 μm, thereby giving inventive and comparative resist solutions.

(PAG1)

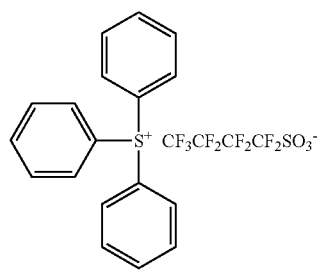

(PAG2)

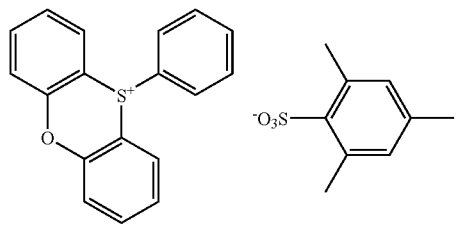

(PAG3)

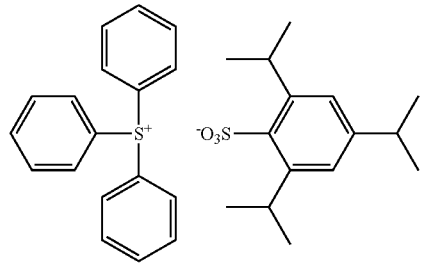

(PAG4)

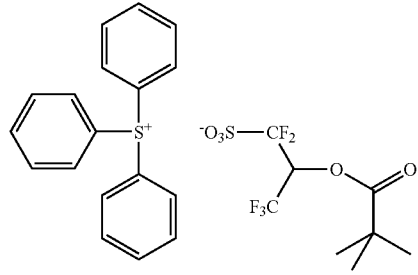

(PAG5)

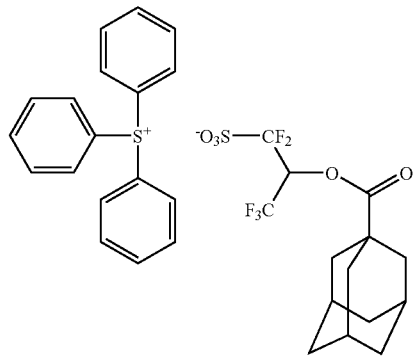

(Amine 1)

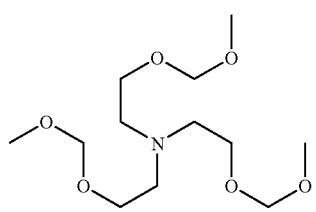

(Amine 2)

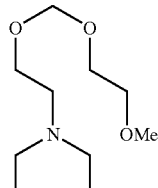

(Amine 3)

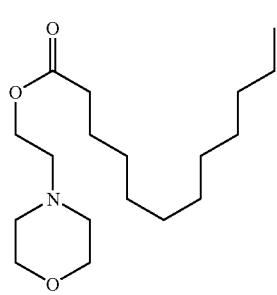

In Tables 13 and 14, the organic solvents are propylene glycol monomethyl ether acetate (PGMEA), ethyl lactate (EL) and cyclohexanone (CyHO). Each resist composition contained 0.075 part by weight of surfactant KH-20 (Tama Chemical Co., Ltd.).

TABLE 13

|  |  | Polymer (pbw) | PAG (pbw) | Basic compound (pbw) | Organic solvent (pbw) |
|---|---|---|---|---|---|
| Example | 1 | Poly-1(100) | PAG2(7.5) PAG3(2.5) | Amine1(0.34) | PGMEA(600) EL(1,400) |

TABLE 13-continued

|  |  | Polymer (pbw) | PAG (pbw) | Basic compound (pbw) | Organic solvent (pbw) |
|---|---|---|---|---|---|
|  | 2 | Poly-2(100) | PAG2(7.5) PAG3(2.5) | Amine1(0.34) | PGMEA(600) EL(1,400) |
|  | 3 | Poly-3(100) | PAG2(7.5) PAG3(2.5) | Amine1(0.34) | PGMEA(600) EL(1,400) |
|  | 3 | Poly-3(100) | PAG2(7.5) PAG3(2.5) | Amine2(0.27) | PGMEA(600) EL(1,400) |
|  | 4 | Poly-3(100) | PAG1(10) | Amine1(0.34) | PGMEA(600) EL(1,400) |
|  | 5 | Poly-4(100) | PAG2(7.5) PAG3(2.5) | Amine1(0.34) | PGMEA(600) EL(1,400) |
|  | 6 | Poly-4(100) | PAG2(7.5) PAG3(2.5) | Amine2(0.27) | PGMEA(600) EL(1,400) |
|  | 7 | Poly-4(100) | PAG1(10) | Amine1(0.34) | PGMEA(600) EL(1,400) |
|  | 8 | Poly-5(100) | PAG2(7.5) PAG3(2.5) | Amine1(0.34) | PGMEA(600) EL(1,400) |
|  | 9 | Poly-6(100) | PAG2(7.5) PAG3(2.5) | Amine1(0.34) | PGMEA(600) EL(1,400) |
|  | 10 | Poly-7(100) | PAG2(7.5) PAG3(2.5) | Amine1(0.34) | PGMEA(600) EL(1,400) |
|  | 11 | Poly-8(100) | PAG2(7.5) PAG3(2.5) | Amine1(0.34) | PGMEA(600) EL(1,400) |
|  | 12 | Poly-9(100) | PAG2(7.5) PAG3(2.5) | Amine1(0.34) | PGMEA(600) EL(1,400) |
|  | 13 | Poly-9(100) | PAG2(7.5) PAG3(2.5) | Amine2(0.27) | PGMEA(600) EL(1,400) |
|  | 14 | Poly-9(100) | PAG1(10) | Amine1(0.34) | PGMEA(600) EL(1,400) |
|  | 15 | Poly-10(100) | PAG2(7.5) PAG3(2.5) | Amine1(0.34) | PGMEA(600) EL(1,400) |
|  | 16 | Poly-10(100) | PAG2(7.5) PAG3(2.5) | Amine2(0.27) | PGMEA(600) EL(1,400) |
|  | 17 | Poly-10(100) | PAG1(10) | Amine1(0.34) | PGMEA(600) EL(1,400) |
|  | 18 | Poly-11(100) | PAG2(7.5) PAG3(2.5) | Amine1(0.34) | PGMEA(600) EL(1,400) |
|  | 19 | Poly-12(100) | PAG2(7.5) PAG3(2.5) | Amine1(0.34) | PGMEA(600) EL(1,400) |
|  | 20 | Poly-13(100) | PAG2(7.5) PAG3(2.5) | Amine1(0.34) | PGMEA(600) EL(1,400) |
|  | 21 | Poly-14(100) | PAG2(7.5) PAG3(2.5) | Amine1(0.34) | PGMEA(600) EL(1,400) |
|  | 22 | Poly-15(100) | PAG2(7.5) PAG3(2.5) | Amine1(0.34) | PGMEA(600) EL(1,400) |
|  | 23 | Poly-16(100) | PAG2(10) | Amine1(0.34) | PGMEA(600) EL(1,400) |
|  | 24 | Poly-17(100) | PAG2(10) | Amine1(0.34) | PGMEA(600) EL(1,400) |
| Comparative Example | 1 | Poly-18(100) | PAG2(7.5) PAG3(2.5) | Amine1(0.34) | PGMEA(600) EL(1,400) |
|  | 2 | Poly-18(100) | PAG2(7.5) PAG3(2.5) | Amine2(0.27) | PGMEA(600) EL(1,400) |
|  | 3 | Poly-18(100) | PAG1(10) | Amine1(0.34) | PGMEA(600) EL(1,400) |
|  | 4 | Poly-19(100) | PAG2(7.5) PAG3(2.5) | Amine1(0.34) | PGMEA(600) EL(1,400) |
|  | 5 | Poly-19(100) | PAG2(7.5) PAG3(2.5) | Amine2(0.27) | PGMEA(600) EL(1,400) |
|  | 6 | Poly-19(100) | PAG1(10) | Amine1(0.34) | PGMEA(600) EL(1,400) |

TABLE 14

|  |  | Polymer (pbw) | PAG (pbw) | Basic compound (pbw) | Organic solvent (pbw) |
|---|---|---|---|---|---|
| Example | 25 | Poly-20(100) | PAG5(11.6) | Amine3(0.38) | PGMEA(1,400) CyHO(600) |
|  | 26 | Poly-21(100) | PAG5(11.6) | Amine3(0.38) | PGMEA(1,400) CyHO(600) |
|  | 27 | Poly-21(100) | PAG4(10.5) | Amine3(0.38) | PGMEA(1,400) CyHO(600) |

TABLE 14-continued

| | | Polymer (pbw) | PAG (pbw) | Basic compound (pbw) | Organic solvent (pbw) |
|---|---|---|---|---|---|
| | 28 | Poly-22(100) | PAG5(11.6) | Amine3(0.38) | PGMEA(1,400) CyHO(600) |
| | 29 | Poly-23(100) | PAG5(11.6) | Amine3(0.38) | PGMEA(1,400) CyHO(600) |
| | 30 | Poly-24(100) | PAG5(11.6) | Amine3(0.38) | PGMEA(1,400) CyHO(600) |
| | 31 | Poly-25(100) | PAG5(11.6) | Amine3(0.38) | PGMEA(1,400) CyHO(600) |
| | 32 | Poly-26(100) | PAG5(11.6) | Amine3(0.38) | PGMEA(1,400) CyHO(600) |
| | 33 | Poly-27(100) | PAG5(11.6) | Amine3(0.38) | PGMEA(1,400) CyHO(600) |
| | 34 | Poly-28(100) | PAG5(11.6) | Amine3(0.38) | PGMEA(1,400) CyHO(600) |
| | 35 | Poly-29(100) | PAG5(11.6) | Amine3(0.38) | PGMEA(1,400) CyHO(600) |
| | 36 | Poly-29(100) | PAG4(10.5) | Amine3(0.38) | PGMEA(1,400) CyHO(600) |
| | 37 | Poly-30(100) | PAG5(11.6) | Amine3(0.38) | PGMEA(1,400) CyHO(600) |
| | 38 | Poly-31(100) | PAG5(11.6) | Amine3(0.38) | PGMEA(1,400) CyHO(600) |
| | 39 | Poly-32(100) | PAG5(11.6) | Amine3(0.38) | PGMEA(1,400) CyHO(600) |
| | 40 | Poly-32(100) | PAG5(11.6) | Amine3(0.38) | PGMEA(1,400) CyHO(600) |
| | 41 | Poly-33(100) | PAG5(11.6) | Amine3(0.38) | PGMEA(1,400) CyHO(600) |
| | 42 | Poly-34(100) | PAG5(11.6) | Amine3(0.38) | PGMEA(1,400) CyHO(600) |
| | 43 | Poly-35(100) | PAG5(11.6) | Amine3(0.38) | PGMEA(1,400) CyHO(600) |
| | 44 | Poly-36(100) | PAG5(11.6) | Amine3(0.38) | PGMEA(1,400) CyHO(600) |
| | 45 | Poly-37(100) | PAG5(11.6) | Amine3(0.38) | PGMEA(1,400) CyHO(600) |
| | 46 | Poly-38(100) | PAG5(11.6) | Amine3(0.38) | PGMEA(1,400) CyHO(600) |
| | 47 | Poly-39(100) | PAG5(11.6) | Amine3(0.38) | PGMEA(1,400) CyHO(600) |
| | 48 | Poly-40(100) | PAG5(11.6) | Amine3(0.38) | PGMEA(1,400) CyHO(600) |
| | 49 | Poly-41(100) | PAG5(11.6) | Amine3(0.38) | PGMEA(1,400) CyHO(600) |
| | 50 | Poly-41(100) | PAG4(10.5) | Amine3(0.38) | PGMEA(1,400) CyHO(600) |
| Comparative Example | 7 | Poly-43(100) | PAG5(11.6) | Amine3(0.38) | PGMEA(1,400) CyHO(600) |
| | 8 | Poly-44(100) | PAG5(11.6) | Amine3(0.38) | PGMEA(1,400) CyHO(600) |
| | 9 | Poly-45(100) | PAG5(11.6) | Amine3(0.38) | PGMEA(1,400) CyHO(600) |
| | 10 | Poly-46(100) | PAG5(11.6) | Amine3(0.38) | PGMEA(1,400) CyHO(600) |
| | 11 | Poly-46(100) | PAG5(11.6) | Amine3(0.38) | PGMEA(1,400) CyHO(600) |
| | 12 | Poly-47(100) | PAG5(11.6) | Amine3(0.38) | PGMEA(1,400) CyHO(600) |

EB Writing Test

Using a coater/developer system Clean Track ACT-M (Tokyo Electron Ltd.), each of the positive resist compositions prepared above was spin-coated onto a 152-mm square mask blank having a chromium oxynitride film at the outermost surface and pre-baked on a hot plate at 90° C. for 600 seconds to form a resist film of 150 nm thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The coated mask blanks were exposed to electron beam using an EB mask writer system EBM-5000Plus (NuFlare Technology Inc., accelerating voltage 50 keV), then baked (PEB) for 600 seconds, and developed with a 2.38 wt % tetramethylammonium hydroxide aqueous solution, thereby yielding positive patterns.

A proper PEB temperature at which the resist film could be resolved to a satisfactory pattern profile and a minimum line width as evaluated below was sought for.

The resist pattern was evaluated as follows. Sensitivity was the optimum exposure dose ($\mu C/cm^2$) which provided a 1:1 resolution at the top and bottom of a 0.20-μm line-and-space pattern. Resolution was the minimum line width (μm) that was resolved at the optimum exposure dose. The edge roughness of a 100-nm line-and-space pattern was measured by SEM.

For a particular resist composition, an optimum PEB temperature for EB writing, sensitivity, and resolution are reported in Table 15.

(PEB) for 60 seconds, and puddle developed with a 2.38 wt % tetramethylammonium hydroxide aqueous solution for 30 seconds, forming a 1:1 line-and-space pattern and a 1:10 isolated line pattern. During the PEB, an optimum temperature for each resist composition was employed.

TABLE 15

|   |   | Optimum PEB temp., °C. | Sensitivity, µC/cm² | Pattern profile | Resolution, µm |
|---|---|---|---|---|---|
| Example | 1 | 100 | 12 | rectangular | 0.075 |
|  | 2 | 100 | 10 | somewhat rounded | 0.070 |
|  | 3 | 100 | 11 | rectangular | 0.050 |
|  | 4 | 100 | 11 | rectangular | 0.055 |
|  | 5 | 100 | 11 | rectangular | 0.055 |
|  | 6 | 100 | 12 | rectangular | 0.050 |
|  | 7 | 90 | 10 | rectangular | 0.055 |
|  | 8 | 100 | 12 | rectangular | 0.055 |
|  | 9 | 100 | 11 | rectangular | 0.060 |
|  | 10 | 100 | 10 | rectangular | 0.050 |
|  | 11 | 100 | 10 | rectangular | 0.065 |
|  | 12 | 100 | 14 | rectangular | 0.055 |
|  | 13 | 100 | 10 | rectangular | 0.055 |
|  | 14 | 90 | 10 | somewhat rounded | 0.050 |
|  | 15 | 100 | 10 | rectangular | 0.055 |
|  | 16 | 100 | 11 | rectangular | 0.055 |
|  | 17 | 90 | 10 | rectangular | 0.055 |
|  | 18 | 100 | 12 | rectangular | 0.055 |
|  | 19 | 100 | 13 | rectangular | 0.060 |
|  | 20 | 100 | 8 | somewhat rounded | 0.055 |
|  | 21 | 90 | 9 | somewhat rounded | 0.055 |
|  | 22 | 90 | 10 | rectangular | 0.055 |
|  | 23 | 90 | 11 | rectangular | 0.050 |
|  | 24 | 90 | 9 | rectangular | 0.050 |
| Comparative Example | 1 | 120 | 16 | slightly tapered | 0.090 |
|  | 2 | 120 | 16 | slightly tapered | 0.090 |
|  | 3 | 110 | 14 | rectangular | 0.090 |
|  | 4 | 120 | 18 | tapered | 0.085 |
|  | 5 | 120 | 18 | tapered | 0.085 |
|  | 6 | 110 | 16 | tapered | 0.085 |

As seen from Table 15, the resist compositions within the scope of the invention exhibit a high sensitivity and high resolution as compared with the comparative resist compositions. The optimum PEB temperature for the inventive resist compositions is lower than that for the comparative resist compositions, indicating that the inventive resist compositions have a higher sensitivity. Examples 3 to 24 exhibit better resolution than Examples 1 and 2, indicating that copolymerization of indene or acenaphthylene units provides a higher contrast.

Evaluation of ArF Excimer Laser Lithography

Each of positive resist compositions (Examples 25 to 50 and Comparative Examples 7 to 12) was spin coated on a silicon wafer having an antireflective coating (ARC-29A, Nissan Chemical Industries, Ltd.) of 78 nm thick and baked at 110° C. for 60 seconds, forming a resist film of 120 nm thick. The coated wafer was exposed by means of an ArF excimer laser stepper (Nikon Corp., NA 0.85), post-exposure baked The patterned wafer was observed under a top-down scanning electron microscope (TDSEM). The optimum exposure (Eop) was defined as the exposure dose (mJ/cm²) which provided a 1:1 resolution at the top and bottom of a 80-nm 1:1 line-and-space pattern. The maximum resolution of the resist was defined as the minimum line width (on-mask size, in increments of 5 nm) of a 1:1 line-and-space pattern that was resolved and separated at the optimum exposure, with smaller values indicating better resolution. The 1:10 isolated line pattern at the optimum exposure was also observed for determining an actual on-wafer size of the isolated line pattern with an on-mask size of 140 nm, which was reported as mask fidelity (on-wafer size, a larger size being better). The pattern was visually observed to see whether or not its profile was rectangular.

Table 16 tabulates the test results (maximum resolution, mask fidelity and profile) of the inventive and comparative resist compositions.

TABLE 16

|   |   | Optimum PEB temp., °C. | Eop, mJ/cm² | Maximum resolution, nm | Mask fidelity, nm | Pattern profile |
|---|---|---|---|---|---|---|
| Example | 25 | 90 | 37 | 70 | 88 | rectangular |
|  | 26 | 90 | 34 | 70 | 90 | rectangular |
|  | 27 | 90 | 36 | 70 | 91 | rectangular |
|  | 28 | 90 | 37 | 70 | 91 | rectangular |
|  | 29 | 90 | 34 | 70 | 92 | rectangular |

TABLE 16-continued

|  |  | Optimum PEB temp., °C. | Eop, mJ/cm² | Maximum resolution, nm | Mask fidelity, nm | Pattern profile |
| --- | --- | --- | --- | --- | --- | --- |
|  | 30 | 90 | 35 | 70 | 88 | rectangular |
|  | 31 | 100 | 37 | 70 | 87 | rectangular |
|  | 32 | 90 | 34 | 70 | 90 | rectangular |
|  | 33 | 90 | 35 | 70 | 86 | rectangular |
|  | 34 | 90 | 37 | 70 | 90 | slightly tapered |
|  | 35 | 95 | 33 | 70 | 88 | rectangular |
|  | 36 | 90 | 35 | 70 | 93 | rectangular |
|  | 37 | 100 | 37 | 70 | 92 | rectangular |
|  | 38 | 90 | 34 | 70 | 88 | rectangular |
|  | 39 | 90 | 35 | 70 | 87 | rectangular |
|  | 40 | 95 | 32 | 70 | 87 | rectangular |
|  | 41 | 90 | 37 | 70 | 98 | rectangular |
|  | 42 | 100 | 34 | 70 | 88 | rectangular |
|  | 43 | 100 | 35 | 70 | 87 | rectangular |
|  | 44 | 100 | 37 | 70 | 91 | rectangular |
|  | 45 | 100 | 34 | 70 | 90 | rectangular |
|  | 46 | 100 | 35 | 70 | 98 | slightly tapered |
|  | 47 | 100 | 37 | 70 | 100 | slightly tapered |
|  | 48 | 100 | 37 | 70 | 92 | rectangular |
|  | 49 | 100 | 37 | 70 | 88 | rectangular |
|  | 50 | 100 | 37 | 70 | 92 | rectangular |
| Comparative | 7 | 120 | 41 | 75 | 95 | tapered |
| Example | 8 | 120 | 42 | 75 | 92 | tapered |
|  | 9 | 120 | 43 | 75 | 96 | tapered |
|  | 10 | 120 | 42 | 75 | 96 | tapered |
|  | 11 | 120 | 44 | 75 | 92 | tapered |
|  | 12 | 120 | 45 | 75 | 92 | tapered |

As seen from Table 16, the inventive resist compositions display a high sensitivity and resolution, as compared with the comparative resist compositions. The optimum PEB temperature for the inventive resist compositions is lower than that for the comparative resist compositions, indicating that the inventive resist compositions have a higher sensitivity.

Dry Etching Test

Each polymer, 2 g, was thoroughly dissolved in 10 g of PGMEA, and passed through a filter having a pore size of 0.2 obtaining a polymer solution. The polymer solution was spin coated onto a silicon substrate and baked, forming a polymer film of 300 nm thick. Dry etching tests were carried out on the polymer films by etching them under two sets of conditions.

(1) $CHF_3/CF_4$ Gas Etching Test

Using a dry etching instrument TE-8500P (Tokyo Electron Ltd.), the polymer film was etched with $CHF_3/CF_4$ gas under the following conditions. The difference in polymer film thickness before and after etching was determined, from which an etching rate was computed.

| Chamber pressure | 40.0 Pa |
| --- | --- |
| RF power | 1000 W |
| Gap | 9 mm |
| $CHF_3$ gas flow rate | 30 ml/min |
| $CF_4$ gas flow rate | 30 ml/min |
| Ar gas flow rate | 100 ml/min |
| Time | 60 sec |

(2) $Cl_2/BCl_3$ Gas Etching Test

Using a dry etching instrument L-507D-L (Nichiden Anerba K.K.), the polymer film was etched with $Cl_2/BCl_3$ gas under the following conditions. The difference in polymer film thickness before and after etching was determined, from which an etching rate was computed.

| Chamber pressure | 40.0 Pa |
| --- | --- |
| RF power | 300 W |
| Gap | 9 mm |
| $Cl_2$ gas flow rate | 30 ml/min |
| $BCl_3$ gas flow rate | 30 ml/min |
| $CHF_3$ gas flow rate | 100 ml/min |
| $O_2$ gas flow rate | 2 ml/min |
| Time | 60 sec |

The etching rates are reported in Table 17 as a relative value, provided that comparative polymer Poly-42 has an etching rate of 1.00 in each test. A smaller value indicates a polymer having better etching resistance.

TABLE 17

| Polymer | $CHF_3/CF_4$ gas etching rate (nm/min) | $Cl_2/BCl_3$ gas etching rate (nm/min) |
| --- | --- | --- |
| Poly-1 | 0.70 | 0.45 |
| Poly-2 | 0.72 | 0.42 |
| Poly-3 | 0.50 | 0.32 |
| Poly-4 | 0.51 | 0.33 |
| Poly-5 | 0.49 | 0.30 |
| Poly-6 | 0.49 | 0.30 |
| Poly-7 | 0.52 | 0.32 |
| Poly-8 | 0.51 | 0.32 |
| Poly-9 | 0.54 | 0.35 |
| Poly-10 | 0.52 | 0.34 |
| Poly-11 | 0.50 | 0.32 |
| Poly-12 | 0.51 | 0.33 |
| Poly-13 | 0.49 | 0.31 |
| Poly-14 | 0.49 | 0.31 |
| Poly-15 | 0.47 | 0.34 |
| Poly-16 | 0.49 | 0.30 |
| Poly-17 | 0.48 | 0.34 |
| Comparative Poly-18 | 0.50 | 0.33 |
| Comparative Poly-19 | 0.58 | 0.34 |
| Poly-20 | 0.97 | 0.64 |
| Poly-21 | 0.98 | 0.63 |
| Poly-22 | 0.95 | 0.60 |

TABLE 17-continued

| Polymer | $CHF_3/CF_4$ gas etching rate (nm/min) | $Cl_2/BCl_3$ gas etching rate (nm/min) |
| --- | --- | --- |
| Poly-23 | 0.89 | 0.54 |
| Poly-24 | 0.92 | 0.54 |
| Poly-25 | 0.91 | 0.55 |
| Poly-26 | 0.95 | 0.60 |
| Poly-27 | 0.96 | 0.61 |
| Poly-28 | 0.89 | 0.54 |
| Poly-29 | 0.90 | 0.56 |
| Poly-30 | 0.91 | 0.55 |
| Poly-31 | 0.97 | 0.68 |
| Poly-32 | 0.96 | 0.61 |
| Poly-33 | 0.89 | 0.54 |
| Poly-34 | 0.93 | 0.55 |
| Poly-35 | 0.92 | 0.55 |
| Poly-36 | 1.00 | 0.80 |
| Poly-37 | 0.99 | 0.82 |
| Poly-38 | 0.95 | 0.60 |
| Poly-39 | 0.95 | 0.61 |
| Poly-40 | 0.99 | 0.75 |
| Poly-41 | 0.98 | 0.76 |
| Comparative Poly-42 | 1.00 | 1.00 |
| Comparative Poly-43 | 1.01 | 1.02 |
| Comparative Poly-44 | 1.03 | 1.03 |
| Comparative Poly-45 | 1.05 | 0.98 |
| Comparative Poly-46 | 1.10 | 1.11 |
| Comparative Poly-47 | 1.11 | 1.12 |

Japanese Patent Application No. 2008-297828 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist composition comprising a polymer comprising repeat units having the general formula (3) or (4):

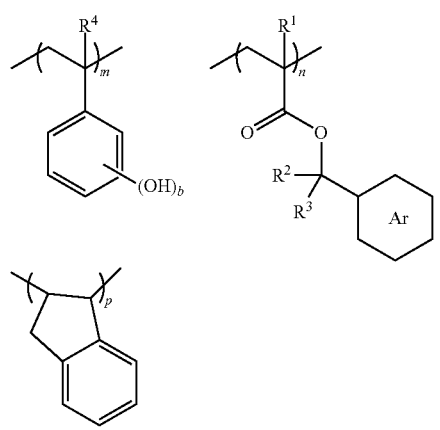

(3)

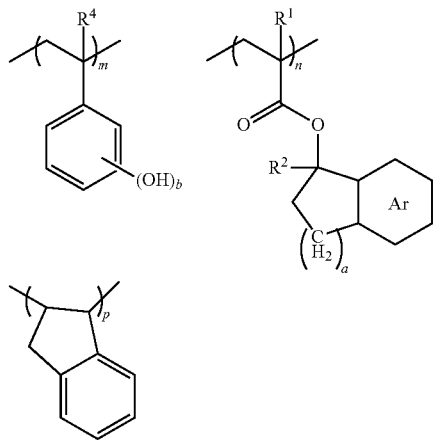

(4)

wherein

Ar denotes a substituted or unsubstituted aromatic hydrocarbon group, $R^1$ is each independently hydrogen, methyl or trifluoromethyl, $R^2$ is a straight, branched or cyclic $C_1$-$C_{12}$ alkyl or aromatic hydrocarbon group, $R^3$ is a straight, branched or cyclic $C_1$-$C_{12}$ alkyl group, or $R^2$ and $R^3$ may bond together to form a ring with the carbon atom to which they are attached, wherein $R^2$ and $R^3$, taken together, denote a $C_5$-$C_{12}$ alkylene group, $R^4$ is hydrogen or methyl, a is 1 or 2, b is an integer of 1 to 5, m, n, and p are numbers in the range: $0 \leq m < 1.0$, $0 < n < 1.0$, and $0.08 \leq p < 0.5$.

2. A process for forming a pattern, comprising the steps of applying the positive resist composition of claim 1 onto a substrate to form a resist coating; heat treating the resist coating, then exposing it to high-energy radiation, EUV or electron beam through a photomask; and optionally heat treating the exposed resist coating, then developing with a developer.

3. A process for forming a pattern, comprising the steps of applying the positive resist composition of claim 1 onto a substrate to form a resist coating; heat treating the resist coating, then exposing it to high-energy radiation or electron beam through a photomask; and heat treating the exposed resist coating, then developing with a developer,
said exposing step being performed by immersion lithography including holding a high refractive index liquid having a refractive index of at least 1.0 between the resist coating and a projection lens.

4. A process for forming a pattern, comprising the steps of applying the positive resist composition of claim 1 onto a substrate to form a resist coating, heat treating the resist coating, forming a protective film on the resist coating, exposing the resist coating to high-energy radiation or electron beam through a photomask, heat treating the exposed resist coating, and developing with a developer,
said exposing step being performed by immersion lithography including holding a high refractive index liquid having a refractive index of at least 1.0 between the protective film and a projection lens.

5. A photomask blank comprising a chromium compound film and a coating of the resist composition of claim 1 thereon.

6. A process for forming a pattern, comprising the steps of heat treating the photomask blank of claim 5, subjecting the resist coating to patternwise exposure to high-energy radiation through a photomask or patternwise exposure to high-energy beam, optionally heat treating the exposed resist coating, and developing it with a developer.

7. The composition of claim 1 wherein p is a number in the range of $0.1 \leq p < 0.5$.

8. A chemically amplified positive resist composition comprising a polymer comprising repeat units having the general formula (5) or (6):

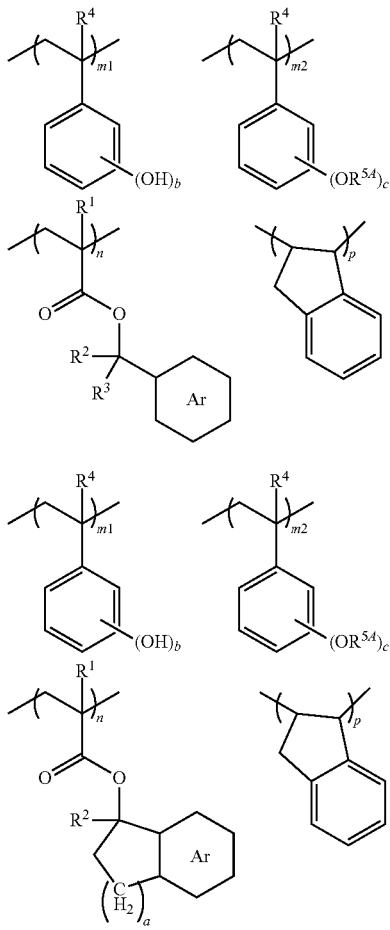

wherein

denotes a substituted or unsubstituted aromatic hydrocarbon group, $R^1$ is each independently hydrogen, methyl or trifluoromethyl, $R^2$ is a straight, branched or cyclic $C_1$-$C_{12}$ alkyl or aromatic hydrocarbon group, $R^3$ is a straight, branched or cyclic $C_1$-$C_{12}$ alkyl group, or $R^2$ and $R^3$ may bond together to form a ring with the carbon atom to which they are attached, wherein $R^2$ and $R^3$, taken together, denote a $C_5$-$C_{12}$ alkylene group, $R^4$ is hydrogen or methyl, $R^{5A}$ is an acid labile group, a is 1 or 2, b and c each are an integer of 1 to 5, m1, m2, n, and p are numbers in the range: $0 < m1 < 1.0$, $0 < m2 < 1.0$, $0 < n < 1.0$, and $0.08 \leq p < 0.5$.

9. The composition of claim 8 wherein p is a number in the range of $0.1 \leq p < 0.5$.

10. A positive resist composition comprising a polymer comprising repeat units having the general formula (11) or (12):

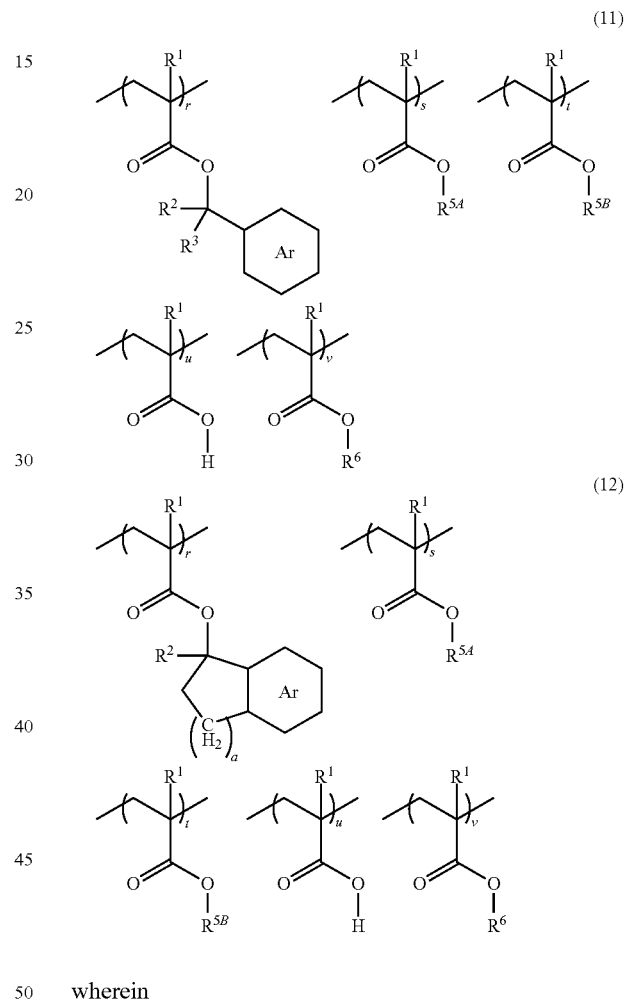

wherein

denotes a substituted or unsubstituted aromatic hydrocarbon group, $R^1$ is each independently hydrogen, methyl or trifluoromethyl, $R^2$ is hydrogen or a straight, branched or cyclic $C_1$-$C_{12}$ alkyl or aromatic hydrocarbon group, $R^3$ is a straight, branched or cyclic $C_1$-$C_{12}$ alkyl group, or $R^2$ and $R^3$ may bond together to form a ring with the carbon atom to which they are attached, wherein $R^2$ and $R^3$, taken together, denote a $C_5$-$C_{12}$ alkylene group, $R^{5A}$ is an acid labile group, $R^{5B}$ is a lactone-containing adhesive group, $R^6$ is a substituent group of the formula (13) or (14):

(13)

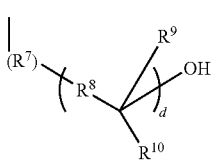

wherein $R^7$ is a divalent $C_1$-$C_{20}$ hydrocarbon group which may contain a heteroatom, $R^8$ is a single bond, a $C_1$-$C_4$ alkylene, or a substituted $C_1$-$C_4$ alkylene in which all or some hydrogen atoms are substituted by fluorine, $R^9$ and $R^{10}$ are each independently hydrogen, fluorine, a $C_1$-$C_4$ alkyl, or a substituted $C_1$-$C_4$ alkyl in which all or some hydrogen atoms are substituted by fluorine, at least either one of $R^9$ and $R^{10}$ contains fluorine, or either one of $R^9$ and $R^{10}$ may bond with $R^8$ to form a ring, and d is 1 or 2, (14)

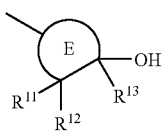

where

denotes a $C_3$-$C_{12}$ cyclic hydrocarbon group or a bridged cyclic hydrocarbon group, which may contain hydroxyl, —O— or —S—, $R^{11}$, $R^{12}$ and $R^{13}$ are each independently hydrogen, fluorine or trifluoromethyl, at least either one of $R^{11}$, $R^{12}$ and $R^{13}$ contains at least one fluorine atom, a is 1 or 2, r, s, t, u and v are numbers in the range: 0<r<1.0, 0<s≤0.8, 0<t≤0.8, 0<u≤0.2, and 0<v≤0.2.

11. A chemically amplified positive resist composition comprising (A) an organic solvent, (B) a base resin comprising a polymer, (C) a photoacid generator, and (D) a basic compound;

wherein the polymer comprises repeat units having the general formula (3) or (4):

(3)

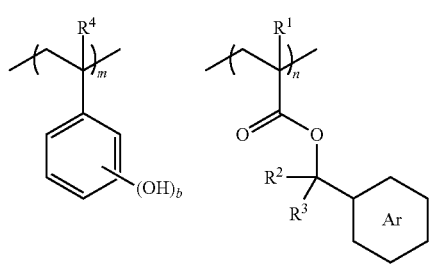

(4)

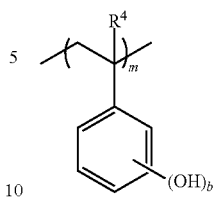

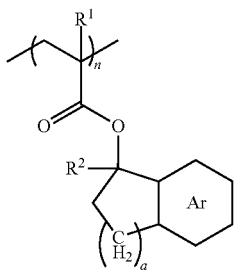

wherein

denotes a substituted or unsubstituted aromatic hydrocarbon group, $R^1$ is each independently hydrogen, methyl or trifluoromethyl, $R^2$ is a straight, branched or cyclic $C_1$-$C_{12}$ alkyl or aromatic hydrocarbon group, $R^3$ is a straight, branched or cyclic $C_1$-$C_{12}$ alkyl group, or $R^2$ and $R^3$ may bond together to form a ring with the carbon atom to which they are attached, wherein $R^2$ and $R^3$, taken together, denote a $C_5$-$C_{12}$ alkylene group, $R^4$ is hydrogen or methyl, a is 1 or 2, b is an integer of 1 to 5, m, n, and p are numbers in the range: 0≤m<1.0, 0<n<1.0, and 0.08≤p<0.5.

12. A chemically amplified positive resist composition comprising a polymer comprising repeat units having the general formula (3') or (4'):

(3')

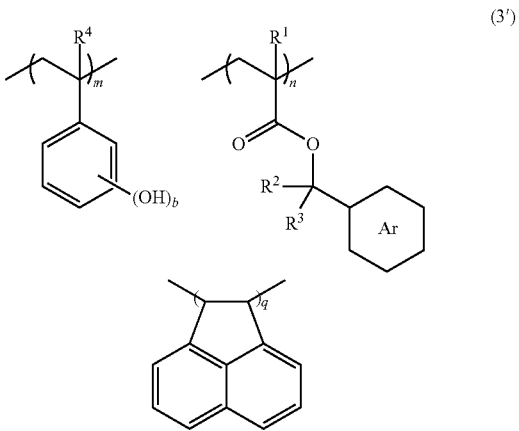

(4')

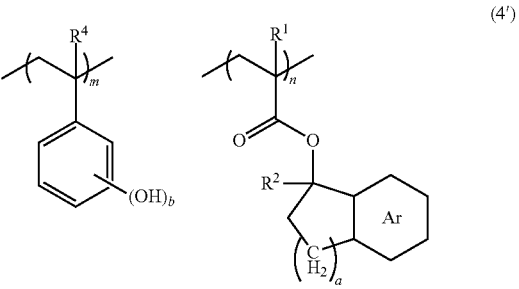

237

-continued

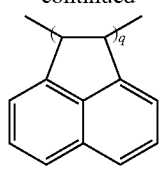

wherein

denotes a substituted or unsubstituted aromatic hydrocarbon group, $R^1$ is each independently hydrogen, methyl or trifluoromethyl, $R^2$ is a straight, branched or cyclic $C_1$-$C_{12}$ alkyl or aromatic hydrocarbon group, $R^3$ is a straight, branched or cyclic $C_1$-$C_{12}$ alkyl group, or $R^2$ and $R^3$ may bond together to form a ring with the carbon atom to which they are attached, wherein $R^2$ and $R^3$, taken together, denote a $C_5$-$C_{12}$ alkylene group, $R^4$ is hydrogen or methyl, a is 1 or 2, b is an integer of 1 to 5, m, n and q are numbers in the range: $0 \leq m < 1.0$, $0 < n < 1.0$, and $0.08 \leq q < 0.5$.

13. The composition of claim 12 wherein q is a number in the range of $0.1 \leq q < 0.5$.

14. A chemically amplified positive resist composition comprising a polymer comprising repeat units having the general formula (5') or (6'):

(5')

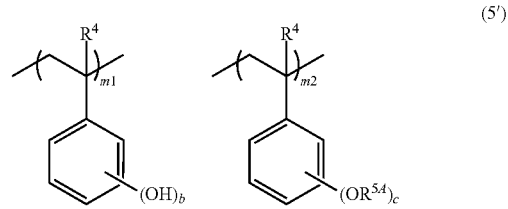

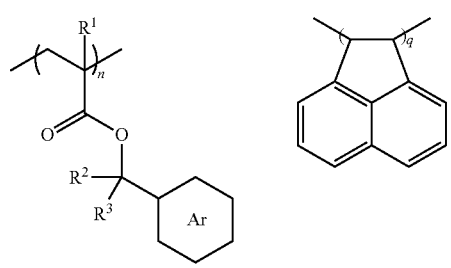

(6')

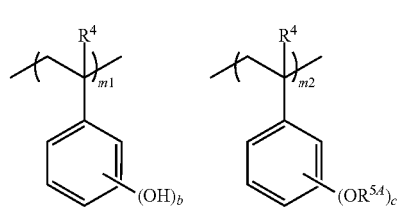

238

-continued

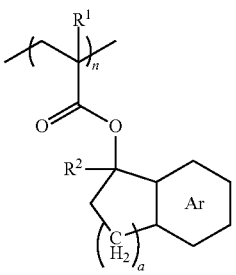

wherein

denotes a substituted or unsubstituted aromatic hydrocarbon group, $R^1$ is each independently hydrogen, methyl or trifluoromethyl, $R^2$ is a straight, branched or cyclic $C_1$-$C_{12}$ alkyl or aromatic hydrocarbon group, $R^3$ is a straight, branched or cyclic $C_1$-$C_{12}$ alkyl group, or $R^2$ and $R^3$ may bond together to form a ring with the carbon atom to which they are attached, wherein $R^2$ and $R^3$, taken together, denote a $C_5$-$C_{12}$ alkylene group, $R^4$ is hydrogen or methyl, $R^{5A}$ is an acid labile group, a is 1 or 2, b and c each are an integer of 1 to 5, m1, m2, n and q are numbers in the range: $0 < m1 < 1.0$, $0 < m2 < 1.0$, $0 < n < 1.0$, and $0.08 \leq q < 0.5$.

15. The composition of claim 14 wherein q is a number in the range of $0.1 \leq q < 0.5$.

16. A chemically amplified positive resist composition comprising a polymer being selected from the group consisting of the following formulae:

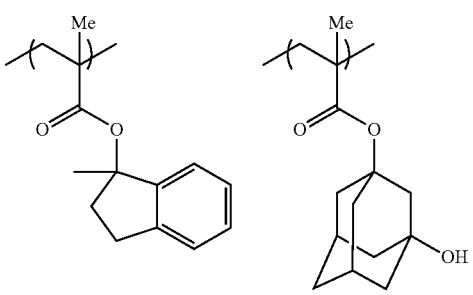

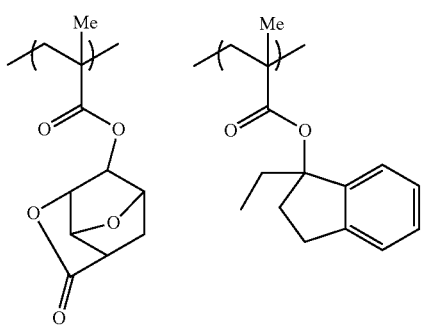

239
-continued
240
-continued
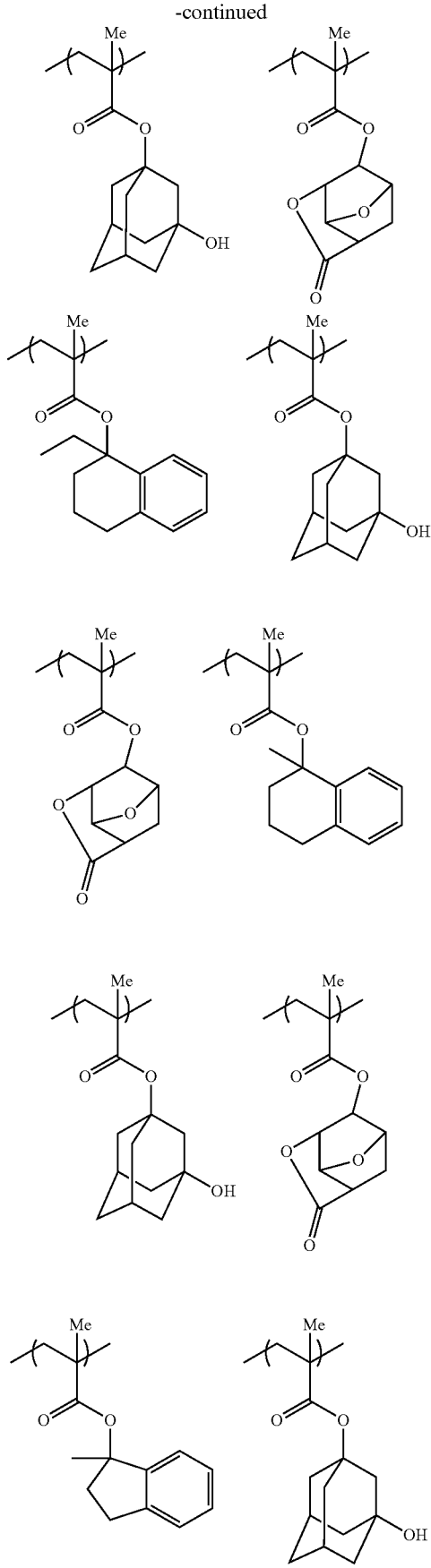
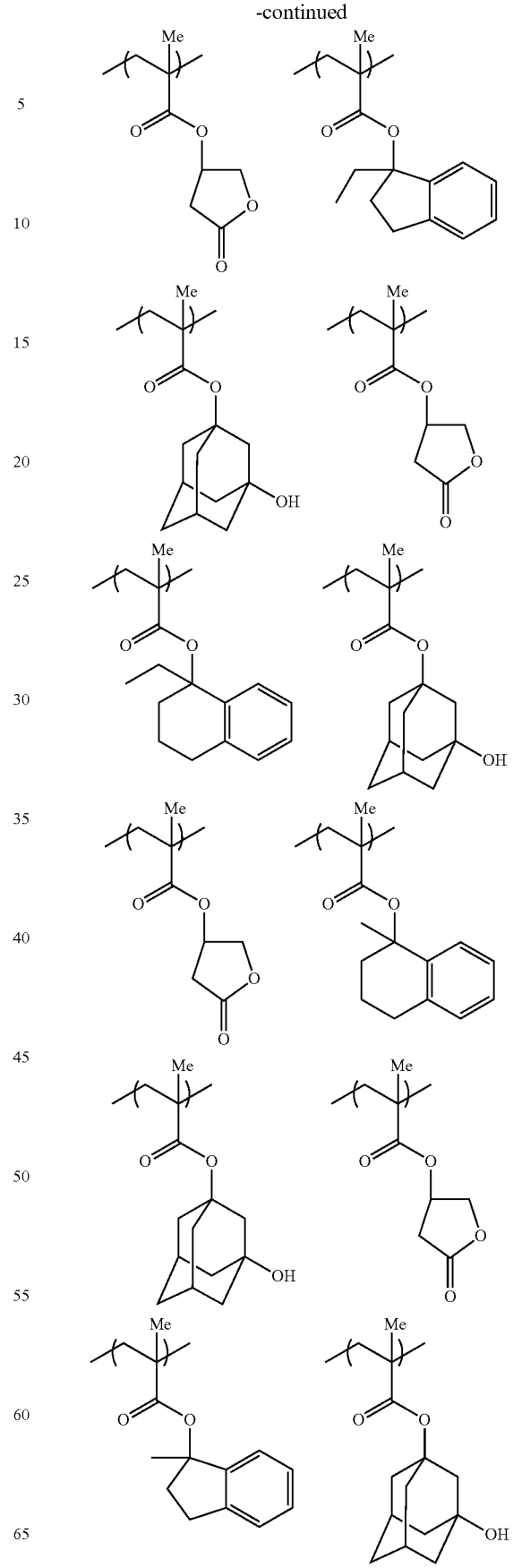

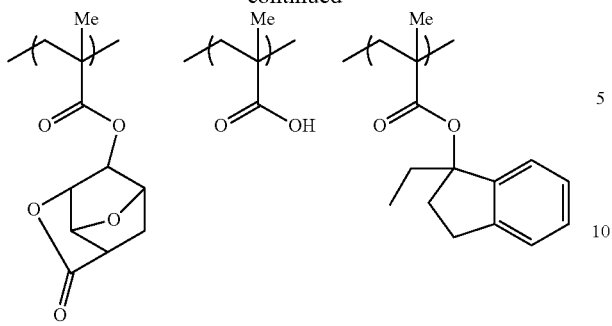
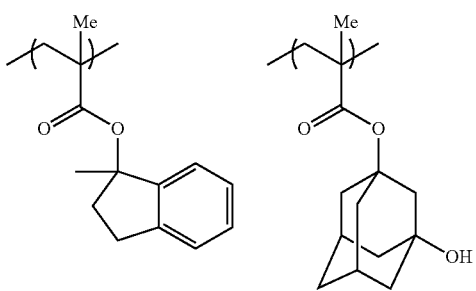
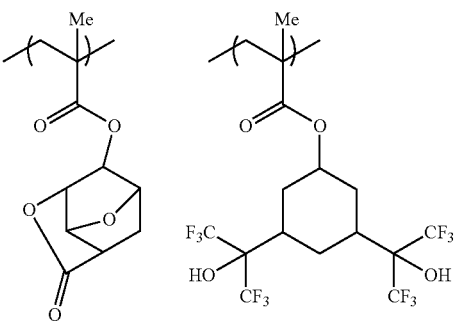
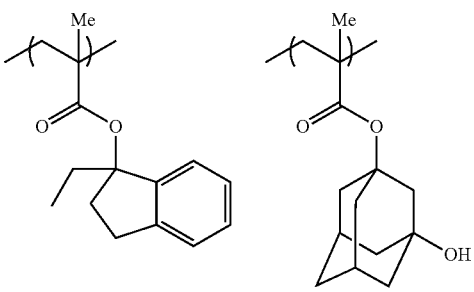
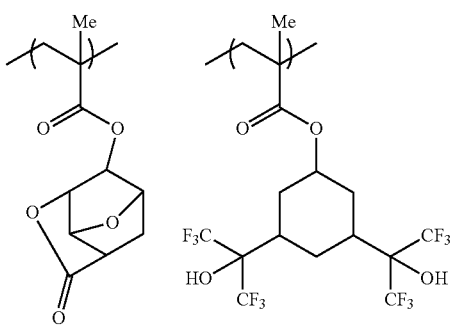

243
-continued
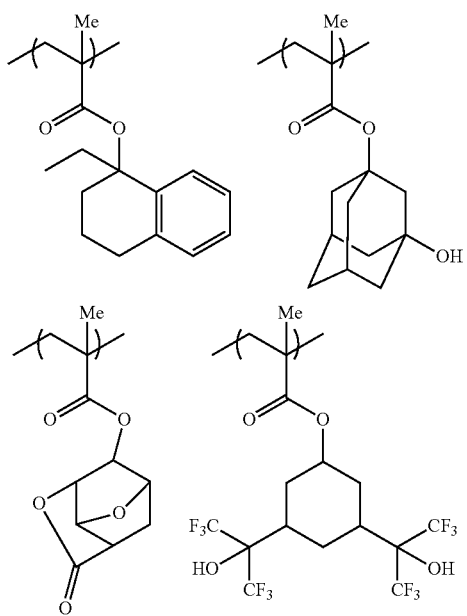
244
-continued
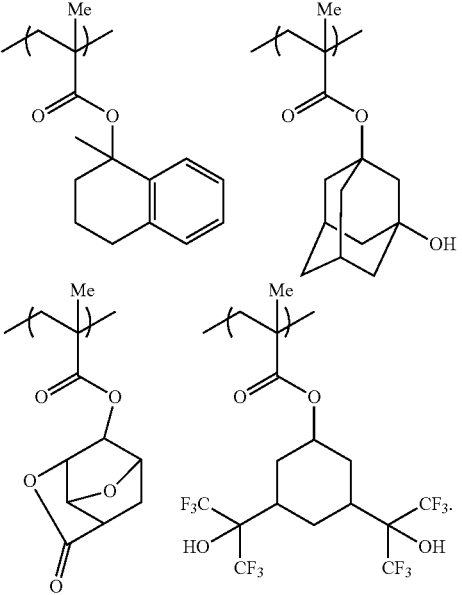
* * * * *